US009146041B2

(12) United States Patent
Novotny et al.

(10) Patent No.: US 9,146,041 B2
(45) Date of Patent: Sep. 29, 2015

(54) BATTERY COMPARTMENT FOR AN HVAC CONTROLLER

(71) Applicant: Honeywell International Inc., Morristown, NJ (US)

(72) Inventors: Josef Novotny, Kuncina (CZ); Tomas Losak, Breclav (CZ); Eugene J. Takach, Eden Prairie, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 14/671,720

(22) Filed: Mar. 27, 2015

(65) Prior Publication Data

US 2015/0204572 A1    Jul. 23, 2015

Related U.S. Application Data

(63) Continuation of application No. 14/267,672, filed on May 1, 2014, which is a continuation of application No. 14/266,552, filed on Apr. 30, 2014.

(60) Provisional application No. 61/817,777, filed on Apr. 30, 2013.

(51) Int. Cl.
*F24F 11/02* (2006.01)
*F24F 11/053* (2006.01)
(Continued)

(52) U.S. Cl.
CPC ........... *F24F 11/053* (2013.01); *F24F 11/0086* (2013.01); *G05D 23/19* (2013.01); *G05D 23/1917* (2013.01); *G05D 23/1919* (2013.01); *H02H 9/04* (2013.01); *H05K 7/1427* (2013.01); *H05K 13/0023* (2013.01);
(Continued)

(58) Field of Classification Search
CPC ................ F24F 11/053; F24F 11/0086; F24F 2011/0091; G05D 23/19; G05D 23/1917; G05D 23/1919; H05K 7/1427; H05K 13/0023; Y10T 29/49126; Y10T 29/49117
USPC ........................................................... 236/94
See application file for complete search history.

(56) References Cited

U.S. PATENT DOCUMENTS 2,789,160 A    4/1957 Gage
4,152,551 A    5/1979 Hiller
(Continued)

OTHER PUBLICATIONS

Bose Wave, "Setting up the Remote Control," 1 page, prior to Jun. 28, 2004.
(Continued)

*Primary Examiner* — Marc Norman
(74) *Attorney, Agent, or Firm* — Seager Tufte & Wickhem LLP

(57) ABSTRACT

An HVAC controller may include a first sub-assembly and a second sub-assembly releasably securable to the first sub-assembly. The first sub-assembly may include a housing having the back and a cover, a printed circuit board at least substantially enclosed by the housing, a battery compartment formed in the back of the housing for receiving one or more batteries, and a display exposed for viewing through an aperture in the cover of the housing for viewing the display by a user. The printed circuit board may include one or more battery terminals that extend from the printed circuit board through the back of the housing and into the battery compartment. In some cases, the battery compartment may define a cup-shaped reservoir that may be configured to collect leakage from one or more of the batteries.

8 Claims, 104 Drawing Sheets

(51) Int. Cl.
  *G05D 23/19* (2006.01)
  *F24F 11/00* (2006.01)
  *H02H 9/04* (2006.01)
  *H05K 7/14* (2006.01)
  *H05K 13/00* (2006.01)
  *H05K 1/02* (2006.01)
  *F21V 8/00* (2006.01)

(52) U.S. Cl.
  CPC ...... *F24F 2011/0091* (2013.01); *G02B 6/0031* (2013.01); *G02B 6/0088* (2013.01); *H05K 1/0215* (2013.01); *Y10T 29/49117* (2015.01); *Y10T 29/49126* (2015.01)

(56) References Cited

U.S. PATENT DOCUMENTS

| | | | |
|---|---|---|---|
| 4,257,555 A * | 3/1981 | Neel | 236/94 |
| 4,300,199 A * | 11/1981 | Yoknis et al. | 700/278 |
| 4,391,883 A | 7/1983 | Williamson et al. | |
| 4,506,827 A | 3/1985 | Jamieson et al. | |
| 4,641,370 A | 2/1987 | Oyamada | |
| 4,885,219 A | 12/1989 | Miller | |
| 4,904,549 A | 2/1990 | Goodwin et al. | |
| 4,959,640 A | 9/1990 | Hall | |
| 4,972,508 A | 11/1990 | King | |
| 4,991,225 A | 2/1991 | Holcomb et al. | |
| 5,039,580 A | 8/1991 | Mori et al. | |
| 5,188,912 A | 2/1993 | Katoh et al. | |
| 5,193,051 A | 3/1993 | Ma | |
| 5,198,638 A | 3/1993 | Massacesi | |
| 5,244,755 A | 9/1993 | Benoist et al. | |
| 5,280,273 A | 1/1994 | Goldstein | |
| 5,281,954 A | 1/1994 | Harrison et al. | |
| 5,337,215 A | 8/1994 | Sunderland et al. | |
| 5,644,302 A | 7/1997 | Hana et al. | |
| 5,654,870 A | 8/1997 | Havener | |
| 5,804,332 A | 9/1998 | Shimizu et al. | |
| 5,843,595 A | 12/1998 | Kawakatsu | |
| 5,927,599 A | 7/1999 | Kath | |
| 5,931,513 A | 8/1999 | Conti | |
| 6,093,056 A | 7/2000 | Donauer et al. | |
| 6,117,575 A | 9/2000 | Dinsdale | |
| 6,120,932 A | 9/2000 | Slipy et al. | |
| 6,225,777 B1 | 5/2001 | Garcia et al. | |
| 6,409,042 B1 | 6/2002 | Hirano et al. | |
| 6,428,924 B1 | 8/2002 | Suganuma et al. | |
| 6,636,018 B2 | 10/2003 | Hirota | |
| 6,806,681 B1 | 10/2004 | Cheiky et al. | |
| 7,431,568 B2 | 10/2008 | Brown et al. | |
| 7,438,469 B1 | 10/2008 | Moore | |
| 7,662,507 B2 | 2/2010 | Schwendinger et al. | |
| 7,832,652 B2 | 11/2010 | Barton et al. | |
| 7,867,646 B2 | 1/2011 | Rhodes | |
| 9,017,844 B2 | 4/2015 | Ota et al. | |
| 2002/0160255 A1 | 10/2002 | Babcock et al. | |
| 2004/0048638 A1 | 3/2004 | Inomata et al. | |
| 2004/0196621 A1 | 10/2004 | Nakamura | |
| 2006/0071087 A1 | 4/2006 | Kates | |
| 2006/0172182 A1 | 8/2006 | Barton et al. | |
| 2012/0229064 A1 | 9/2012 | Jeung | |
| 2013/0099010 A1 * | 4/2013 | Filson et al. | 236/1 C |
| 2014/0262481 A1 * | 9/2014 | Khoury et al. | 174/480 |
| 2014/0268452 A1 * | 9/2014 | Khoury et al. | 361/56 |
| 2015/0163945 A1 * | 6/2015 | Barton et al. | H05K 7/12 |

OTHER PUBLICATIONS

Honeywell, "RTH2510/RTH2410 Series Programmable Thermostat, Operating Manual," 48 pages, Revised Nov. 2013.
Honeywell, "VisionPro 8000 Touchscreen Programmable Thermostat," Product Data, 40 pages, Revised Mar. 2011.

* cited by examiner

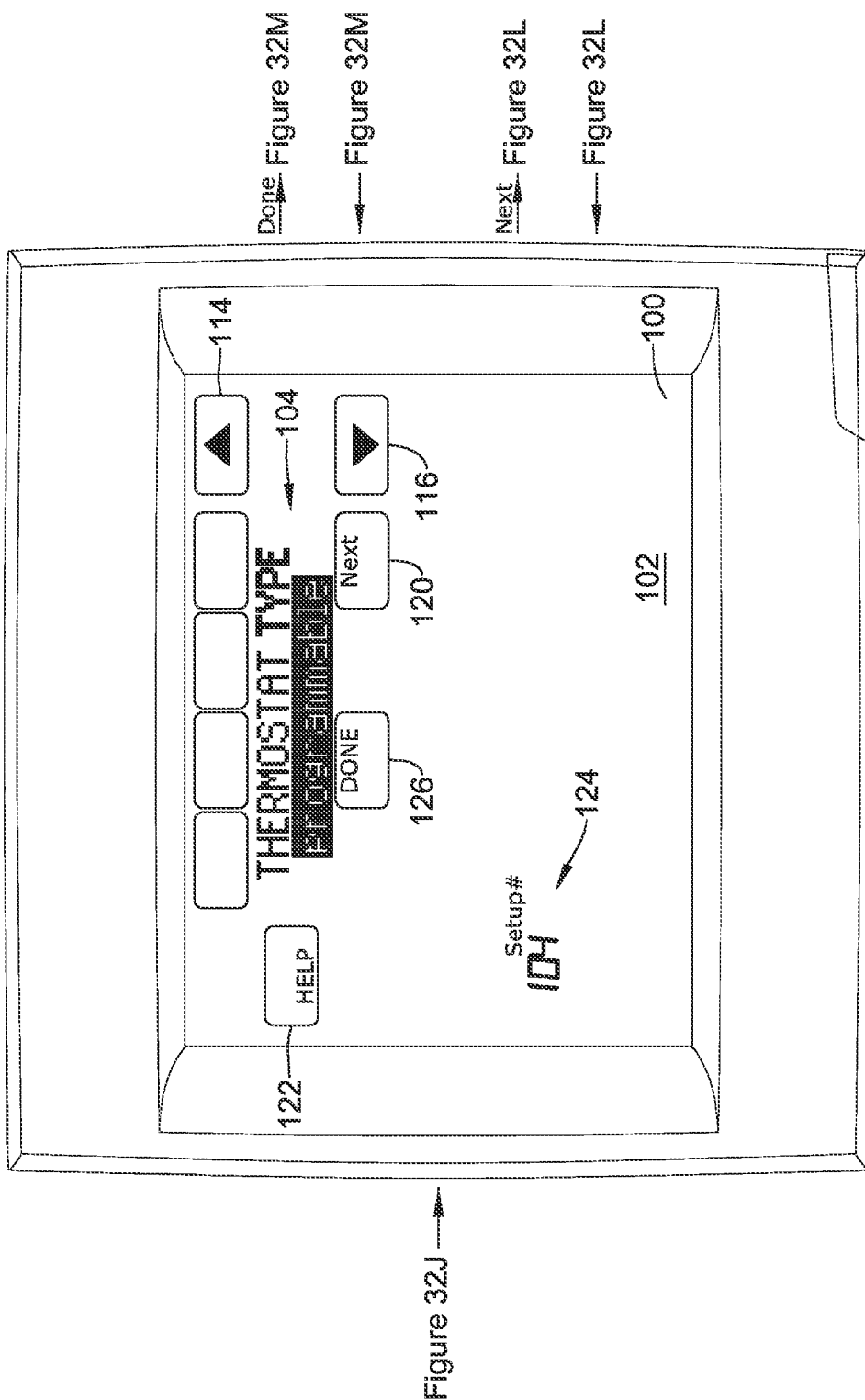

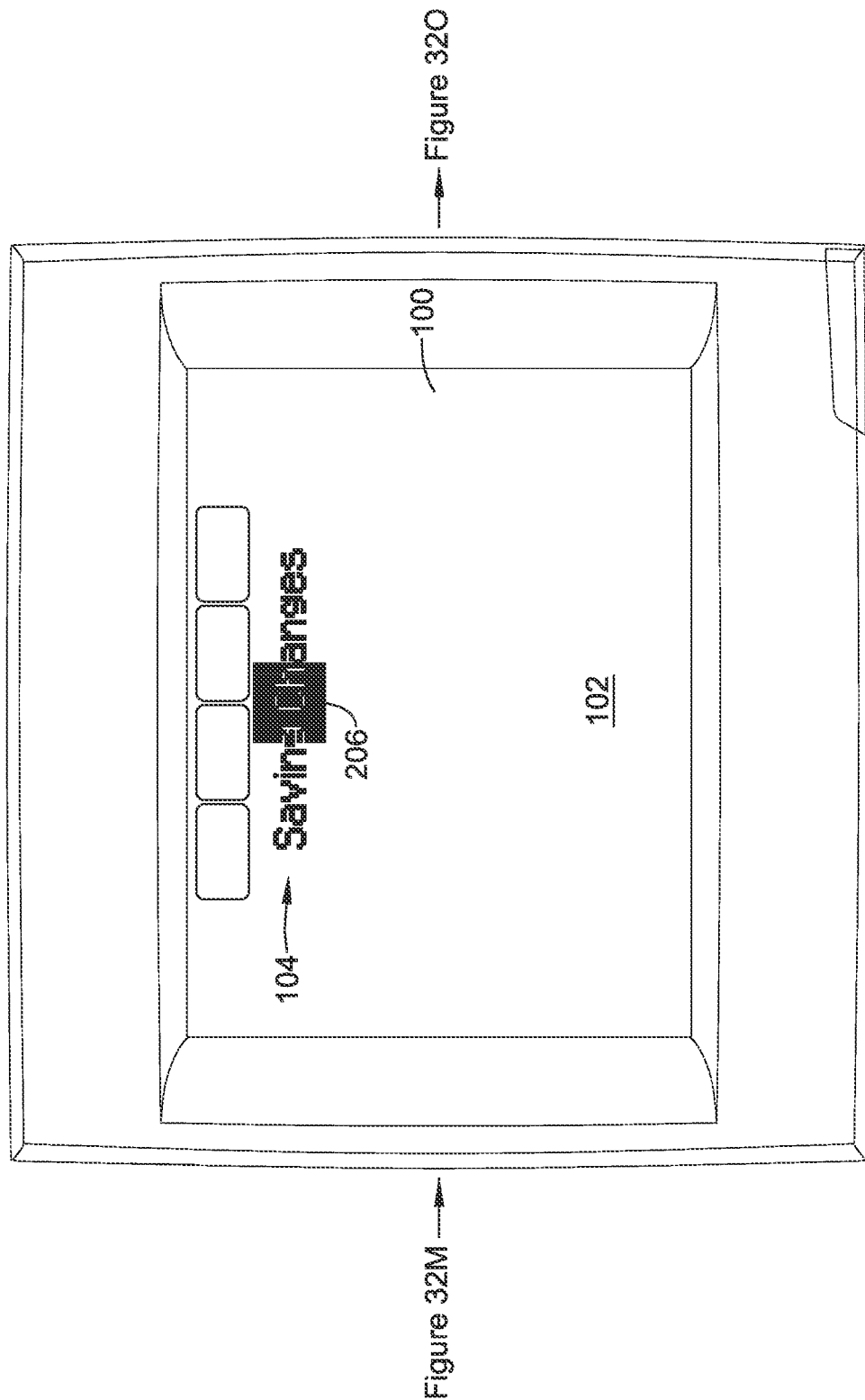

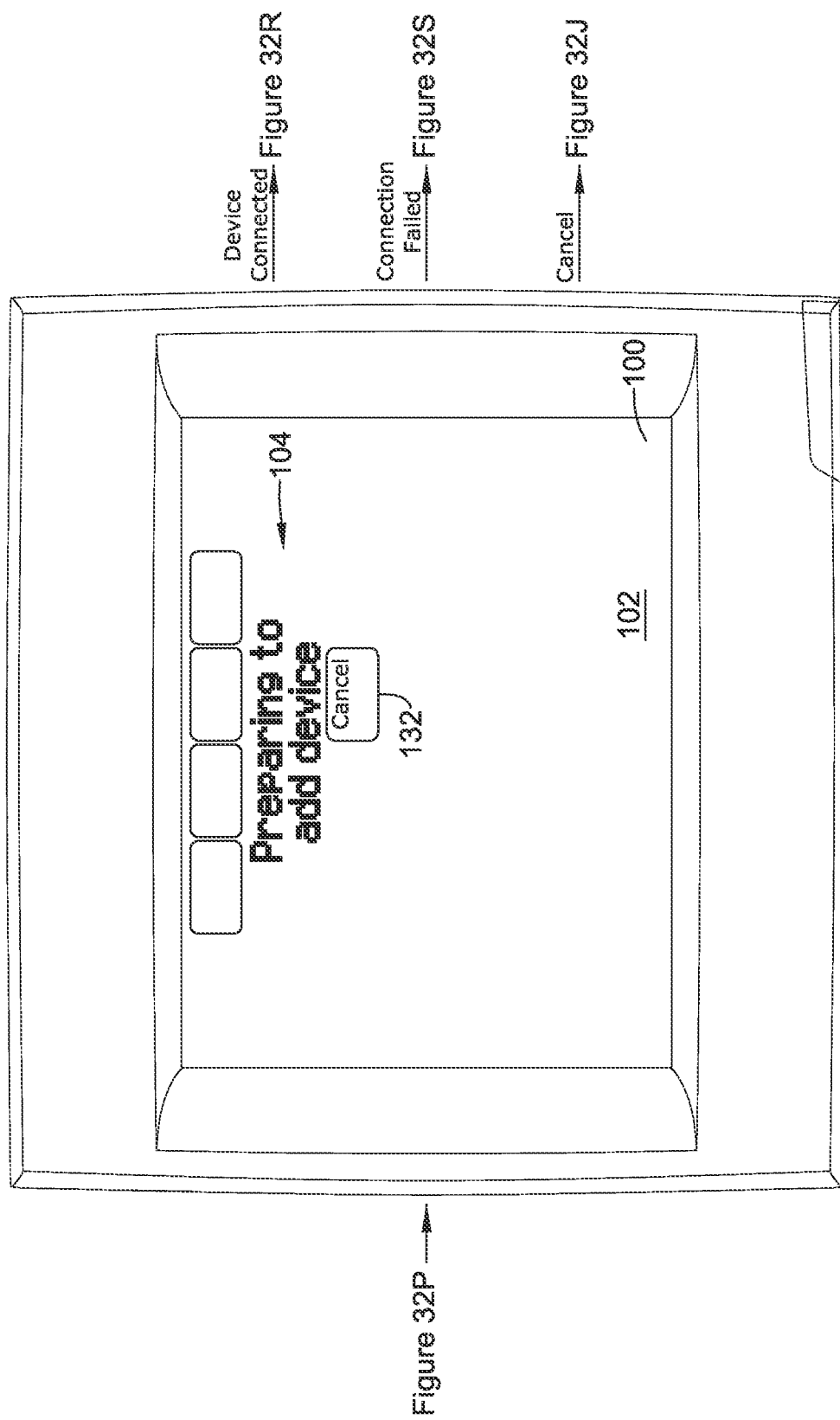

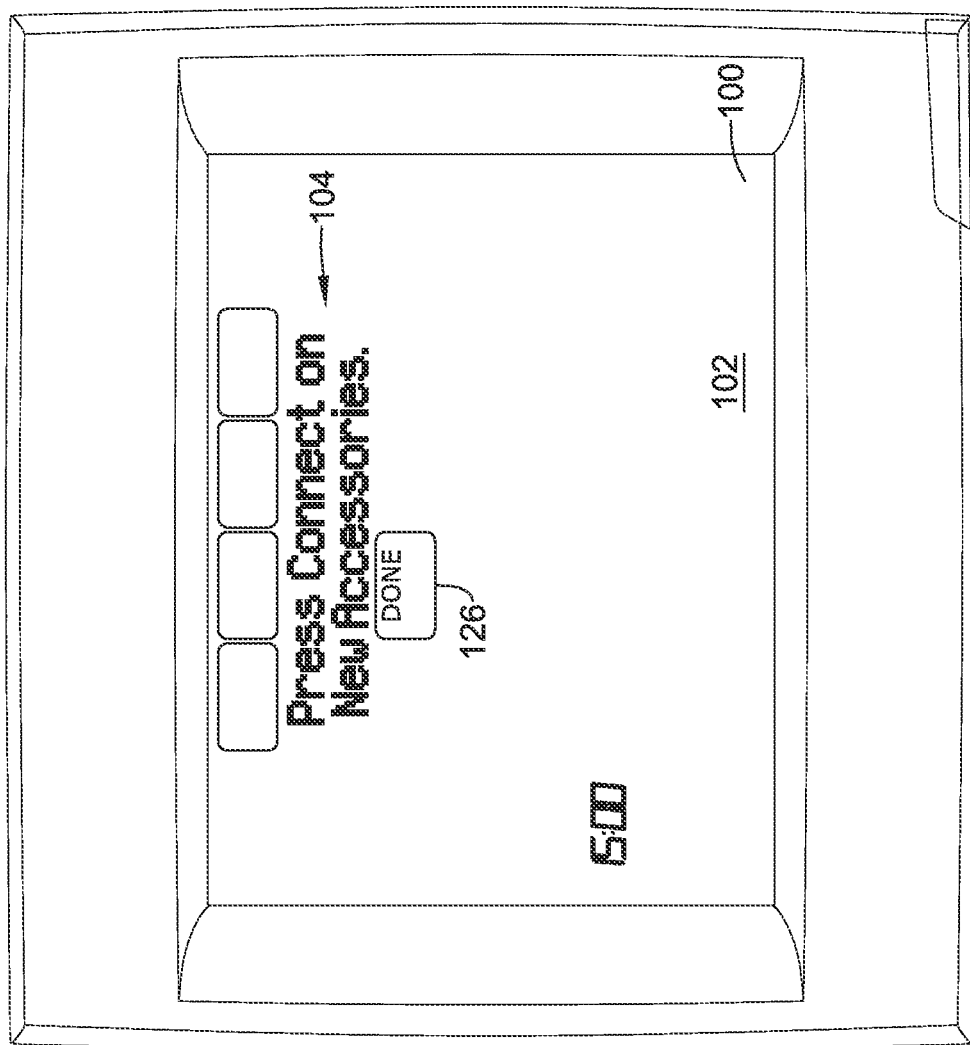

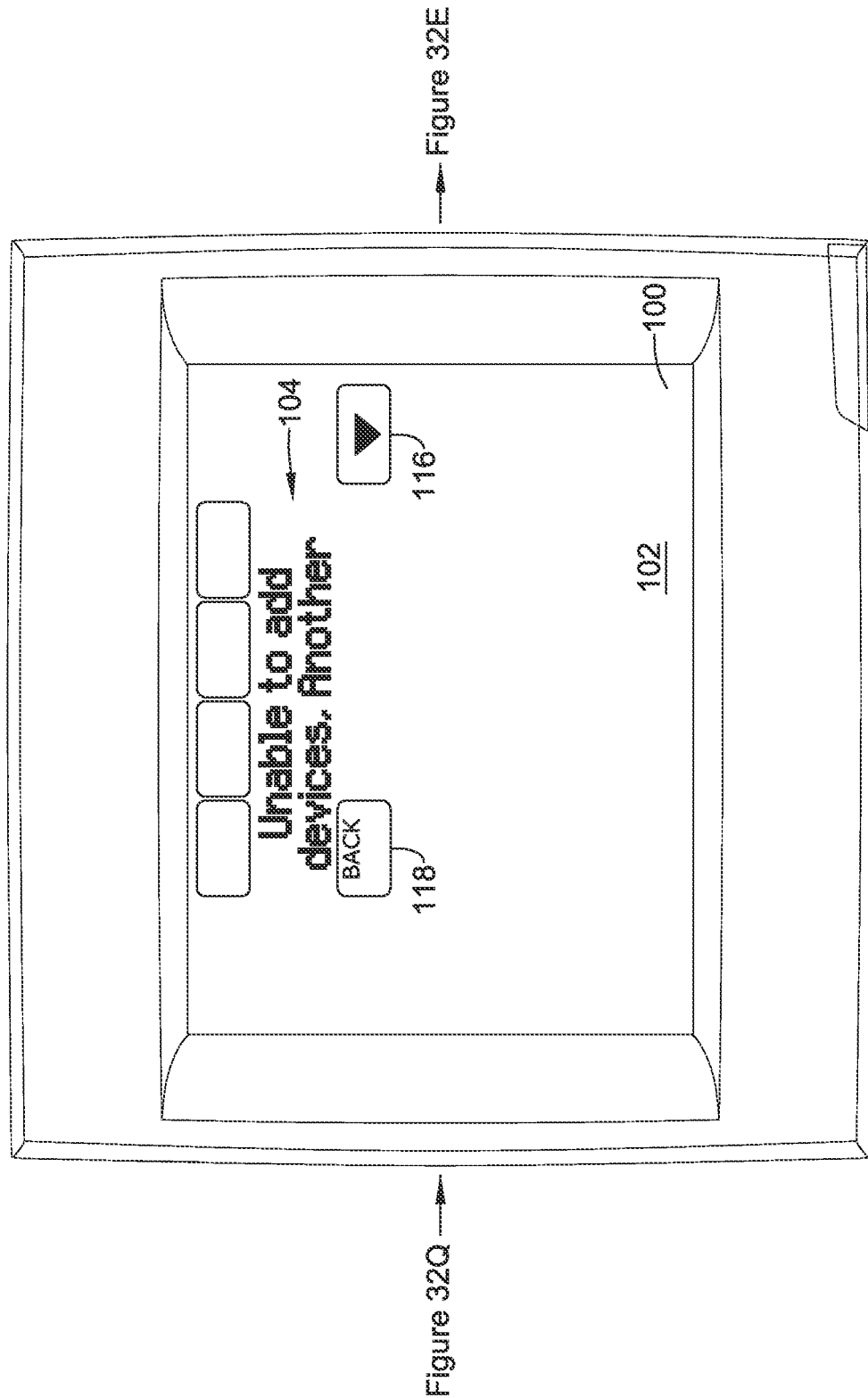

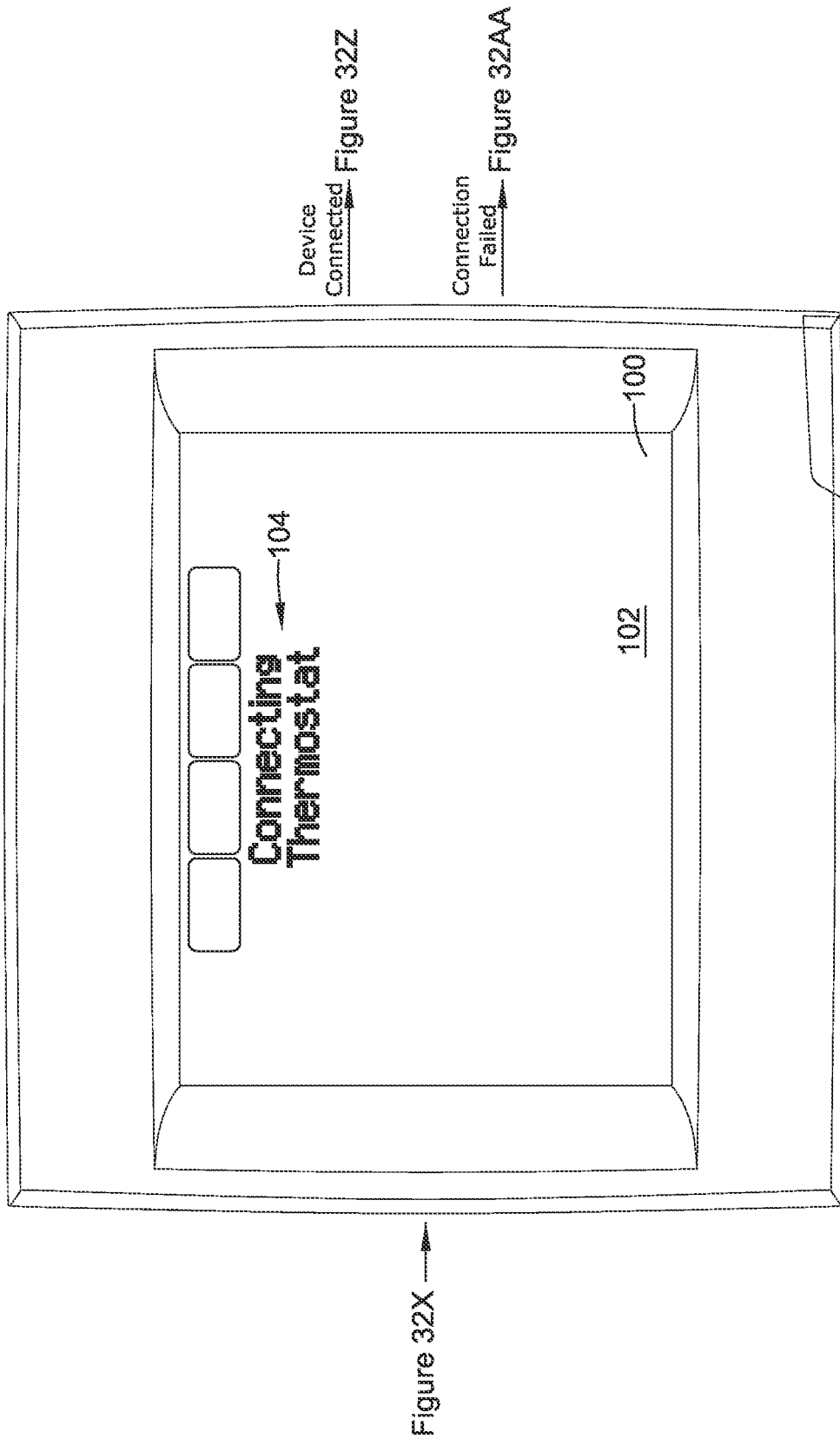

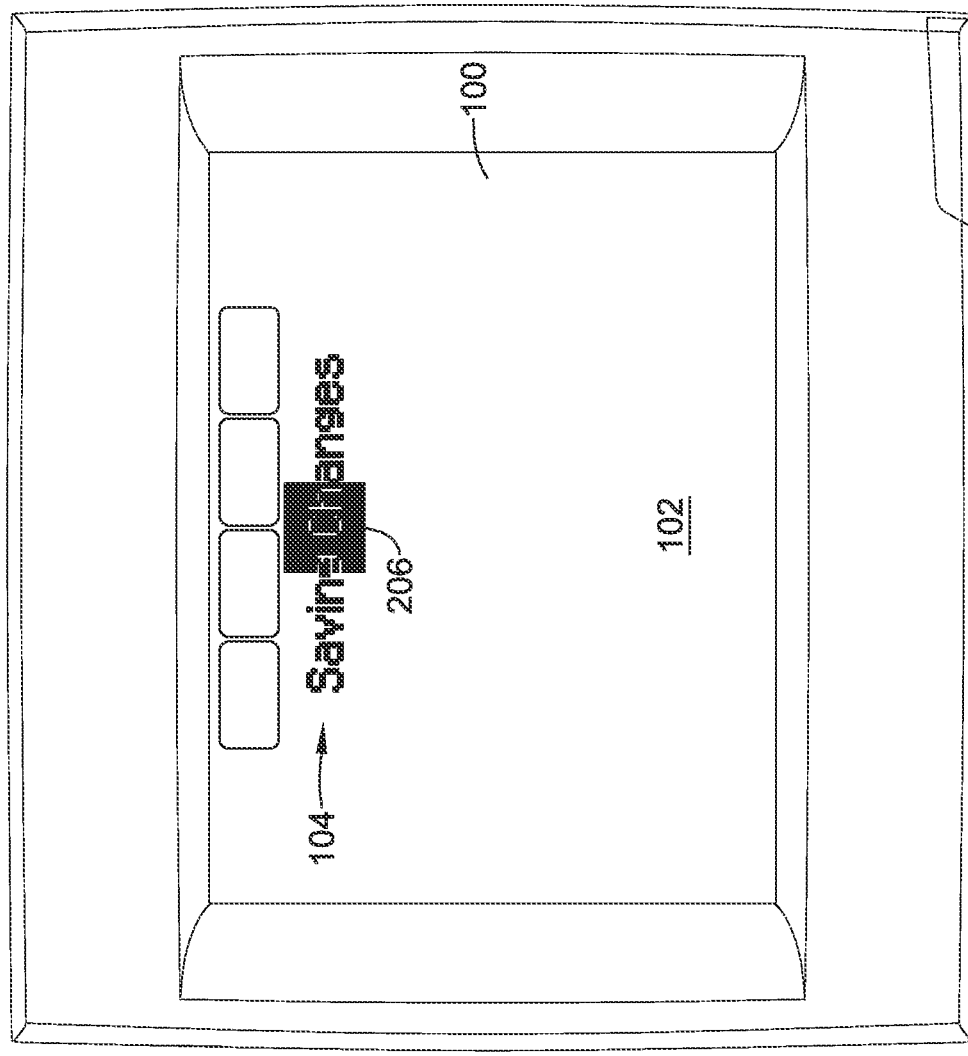

BATTERY COMPARTMENT FOR AN HVAC CONTROLLER

This application is a continuation of U.S. patent application Ser. No. 14/267,672, filed May 1, 2014 and entitled "Battery Compartment For An HVAC Controller", which is a continuation of U.S. patent application Ser. No. 14/266,552, filed Apr. 30, 2014 and entitled "Display Sub-Assembly For An HVAC Controller", which claims the benefit of U.S. Provisional Application Ser. No. 61/817,777, filed Apr. 30, 2013 and entitled "Thermostat Systems and Methods", all of which are incorporated herein by reference.

TECHNICAL FIELD

This disclosure generally relates to electronic devices, and more particularly to improved use, assembly, construction, and reliability of such electronic devices.

BACKGROUND

Electronic devices, such as Heating, Ventilation, and Air Conditioning (HVAC) control panels, security system control panels, lighting control panels, irrigation control panels as well as other electronic devices are commonly used today. What would be desirable is an electronic device that has improved ease of use, ease of assembly, better construction and/or increased reliability over what is available today.

SUMMARY

This disclosure relates to electronic devices such as HVAC controller devices, and more particularly, to improved use, interface, assembly, construction, and reliability of such electronic devices.

In some instances, an HVAC controller sub-assembly may include a housing having a back and a cover, a printed circuit board at least partially enclosed within the housing, and a battery compartment formed in the back of the housing for receiving one or more batteries. In some cases, the battery compartment may include a cup-shaped reservoir configured to collect leakage from one or more batteries in the battery compartment when the HVAC controller sub-assembly is in an upright position.

In one example, an HVAC controller may include a first sub-assembly and a second sub-assembly releasably secured to the first sub-assembly adjacent to a back of the first sub assembly. The first sub-assembly may include a housing having the back and a cover, a printed circuit board at least substantially enclosed by the housing, a battery compartment formed in the back of the housing for receiving one or more batteries, and a display exposed for viewing through an aperture in the cover of the housing for viewing the display by a user. The printed circuit board may include one or more battery terminals that extend from the printed circuit board through the back of the housing and into the battery compartment. In some cases, the battery compartment may define a cup-shaped reservoir that may be configured to collect leakage from one or more of the batteries.

The preceding summary is provided to facilitate an understanding of some of the innovative features unique to the present disclosure and is not intended to be a full description. A full appreciation of the disclosure can be gained by taking the entire specification, claims, drawings, and abstract as a whole.

BRIEF DESCRIPTION OF THE DRAWINGS

The disclosure may be more completely understood in consideration of the following description of various illustrative embodiments in connection with the accompanying drawings, in which:

FIG. 48 show an illustrative saving changes screen; and

Figure 1:
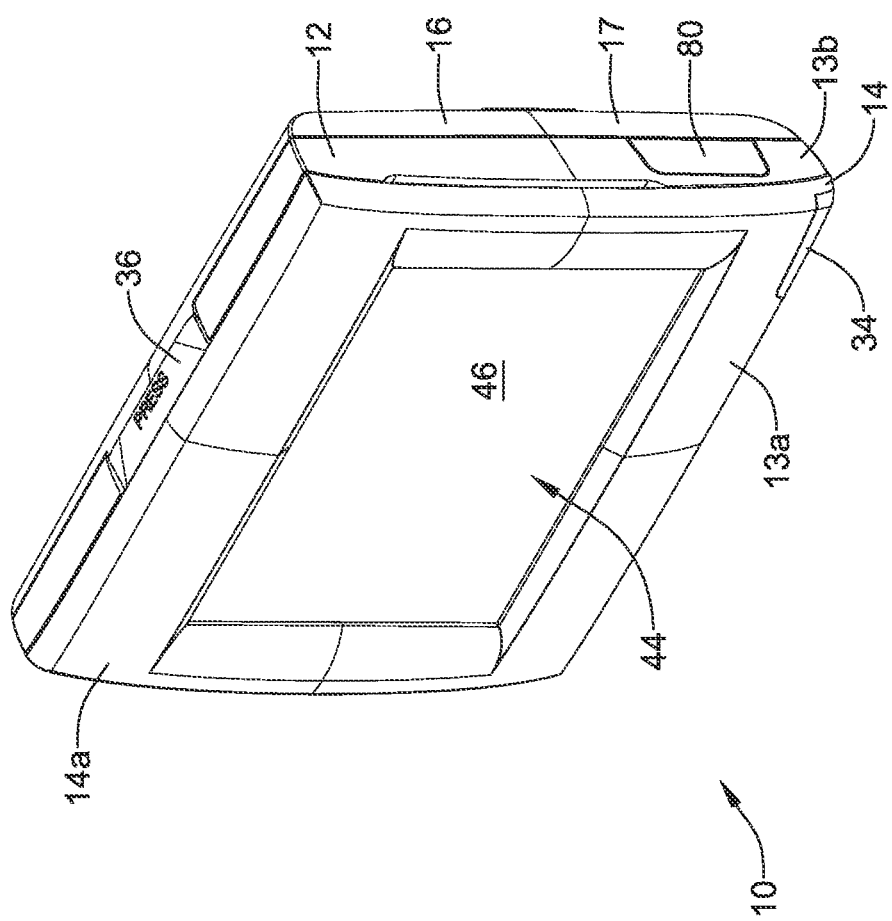
FIG. 1 is a perspective view of an illustrative thermostat assembly.
Figure 2:
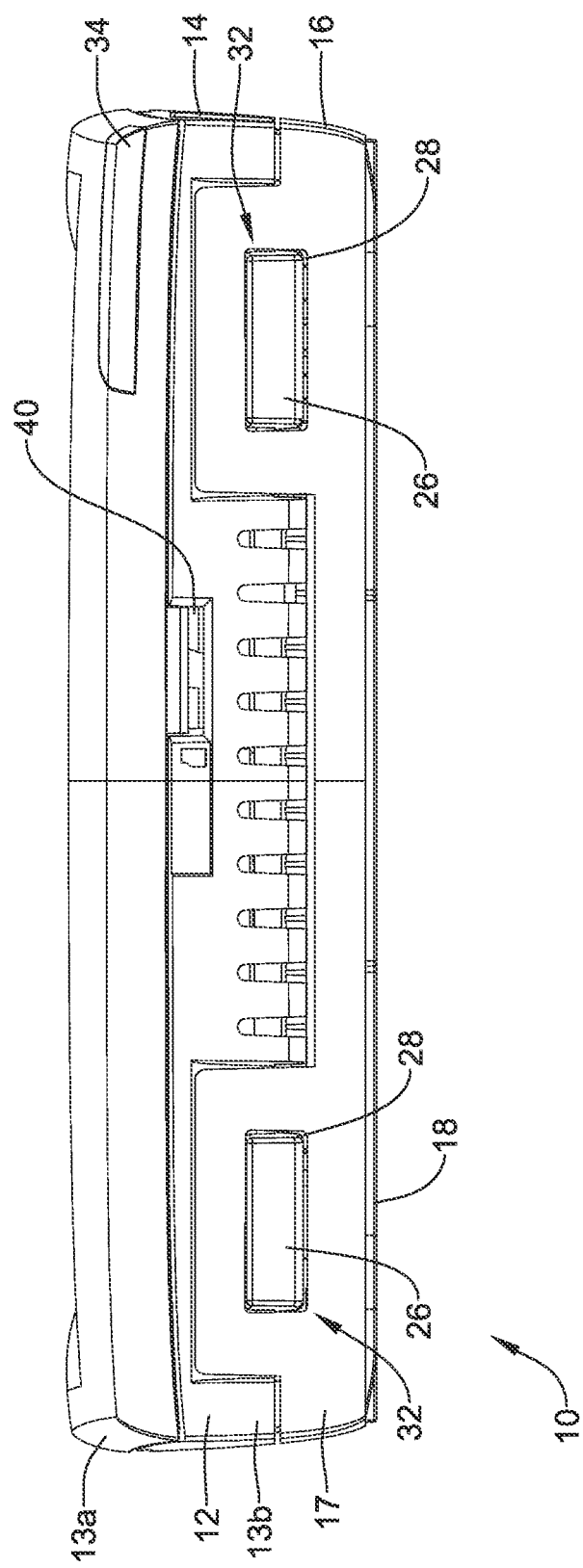
FIG. 2 is a bottom view of the illustrative thermostat assembly of FIG. 1.
Figure 3:
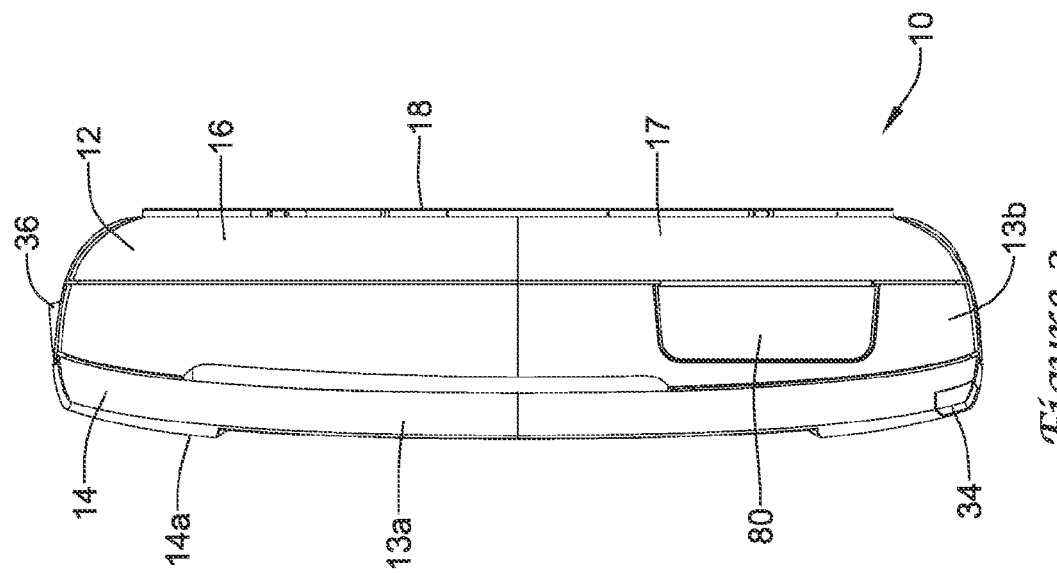
FIG. 3 is a right side view of the illustrative thermostat assembly of FIG. 1.
Figure 4:
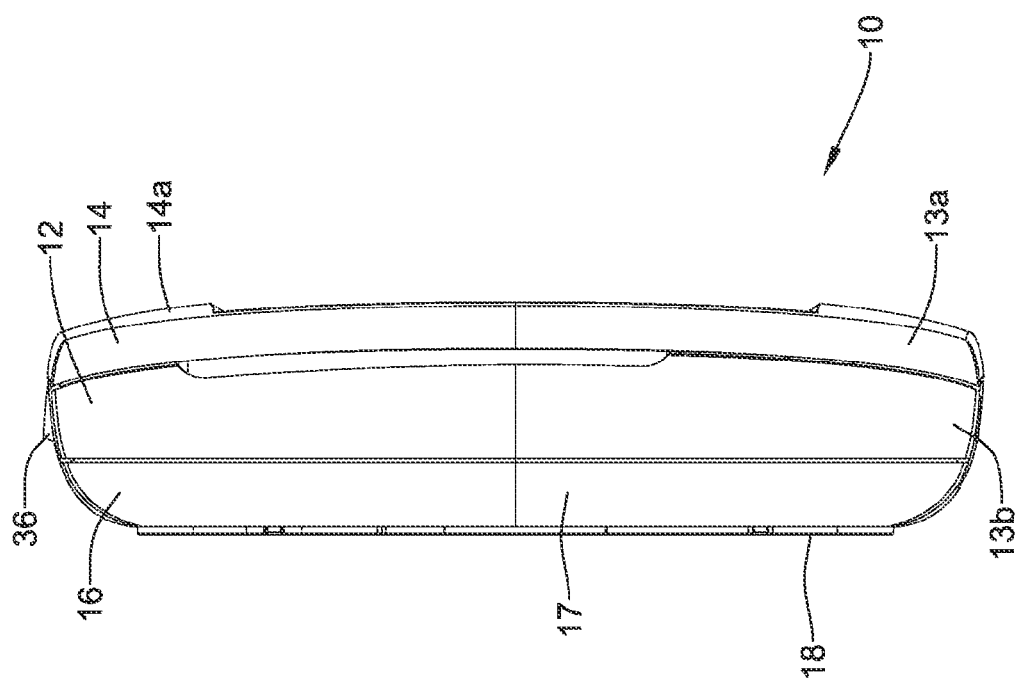
FIG. 4 is a left side view of the illustrative thermostat assembly of FIG. 1.
Figure 5:
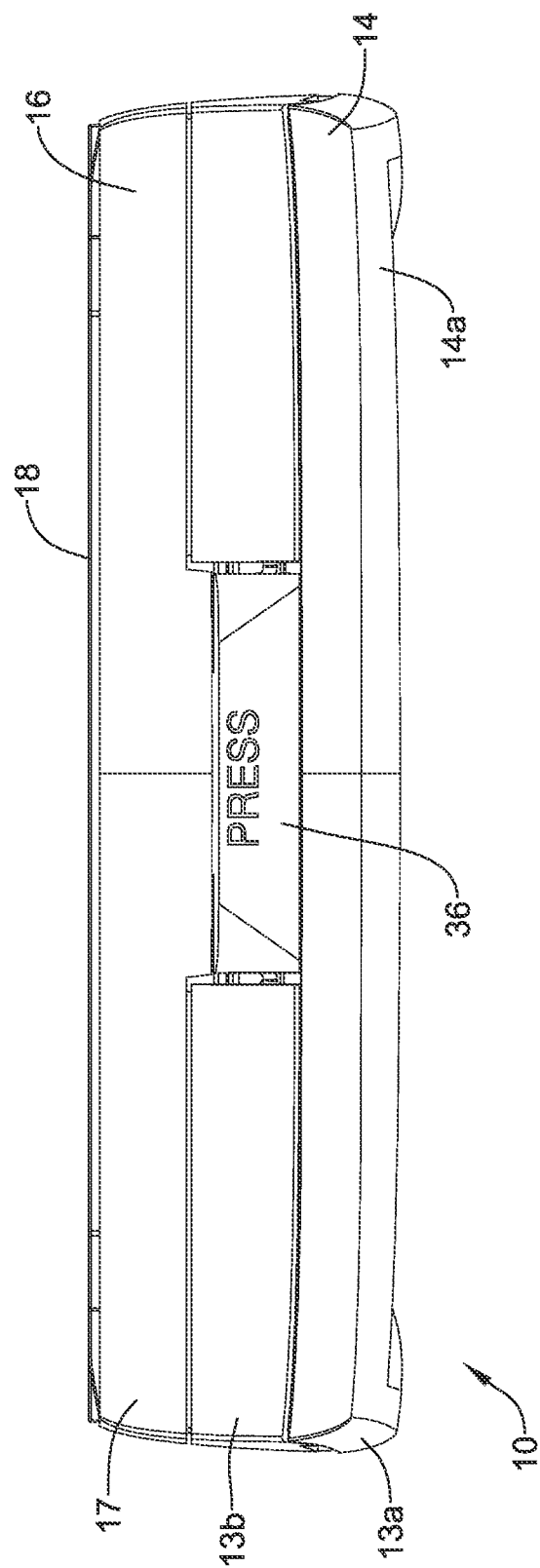
FIG. 5 is a top view of the illustrative thermostat assembly of FIG. 1.
Figure 6:
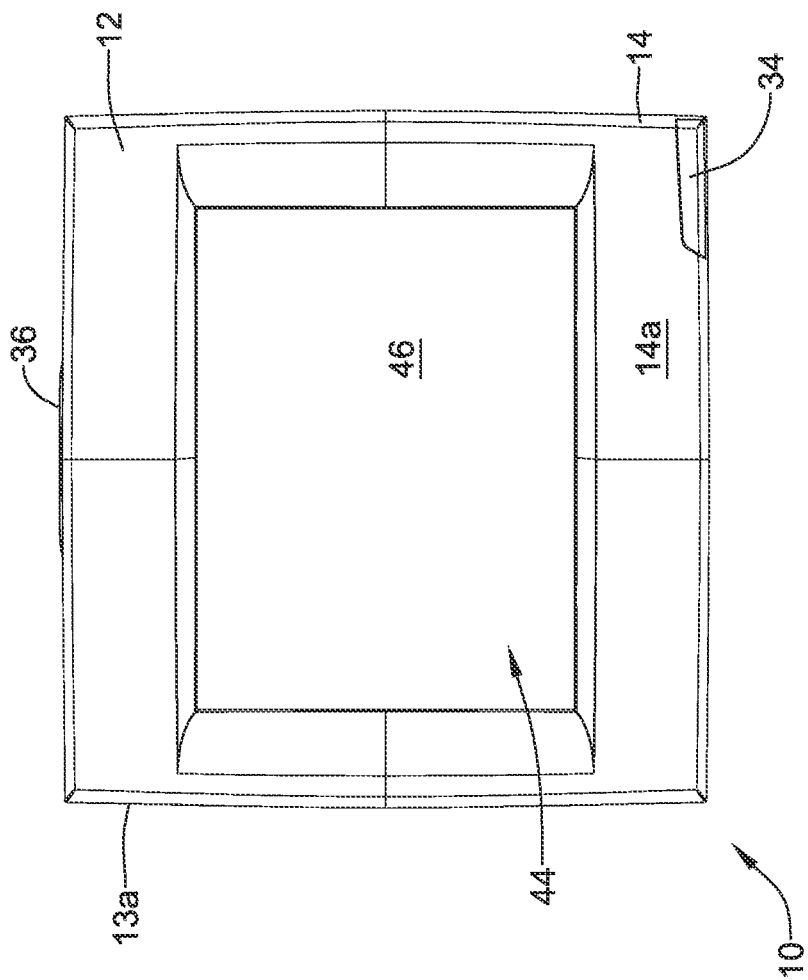
FIG. 6 is a front view of the illustrative thermostat assembly of FIG. 1.
Figure 7:
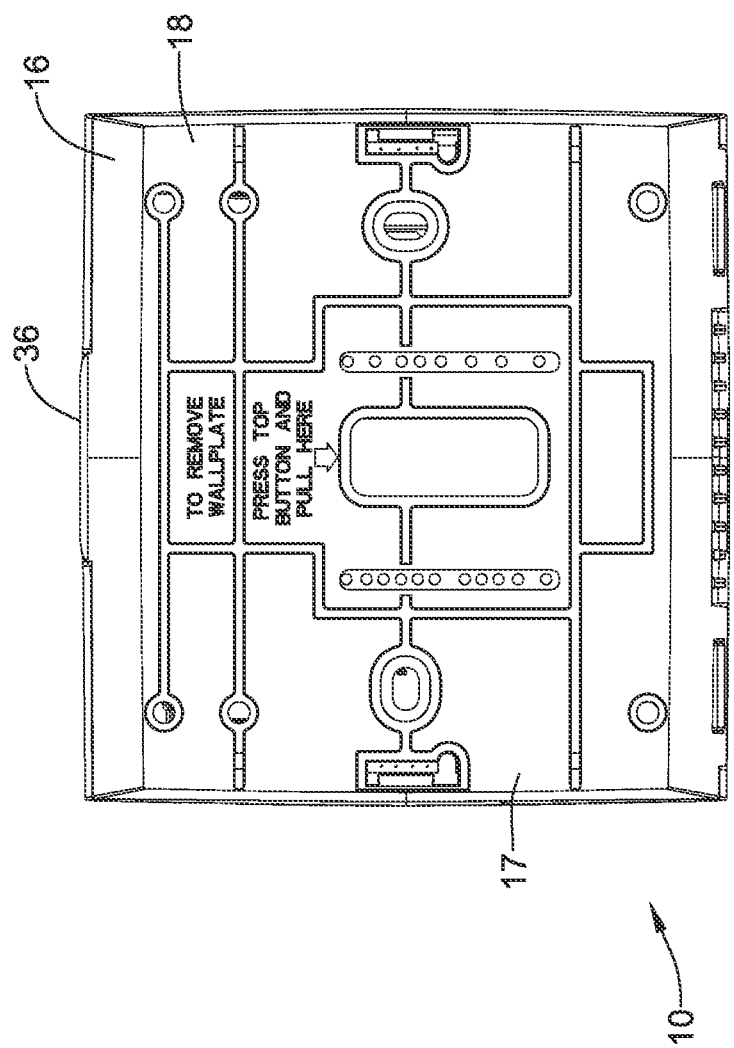
FIG. 7 is a back view of the illustrative thermostat assembly of FIG. 1.

While the disclosure is amenable to various modifications and alternative forms, specifics thereof have been shown by way of example in the drawings and will be described in detail. It should be understood, however, that the intention is not to limit aspects of the disclosure to the particular embodiments described. On the contrary, the intention is to cover all modifications, equivalents, and alternatives falling within the spirit and scope of the disclosure.

DESCRIPTION

The following description should be read with reference to the drawings wherein like reference numerals indicate like elements throughout the several views. The description and drawings show several examples which are meant to be illustrative in nature.

For convenience, the present disclosure may be described using relative terms including, for example, left, right, top, bottom, front, back, upper, lower, up, and down, as well as others. It is to be understood that these terms are merely used for illustrative purposes and are not meant to be limiting in any manner.

As shown in FIGS. 1-15, in one illustrative embodiment, which is not meant to be limiting, a thermostat 10 or other electronic assembly may have a first sub-assembly 14 (e.g., a thermostat body or other sub-assembly) with a housing (e.g., a first housing) and a second sub-assembly 16 (e.g., a wall plate sub-assembly or other sub-assembly) with a housing (e.g., a second housing), where the first sub-assembly 14 and/or the second sub-assembly 16 may be provided individually or in combination. In the example shown, the second sub-assembly 16 may be capable of being mounted on a wall with one or more connectors (e.g., threaded connectors or other connectors, as desired). The first sub-assembly 14 may connect or otherwise be adjustably fixed with respect to the second sub-assembly 16.

Figure 8:
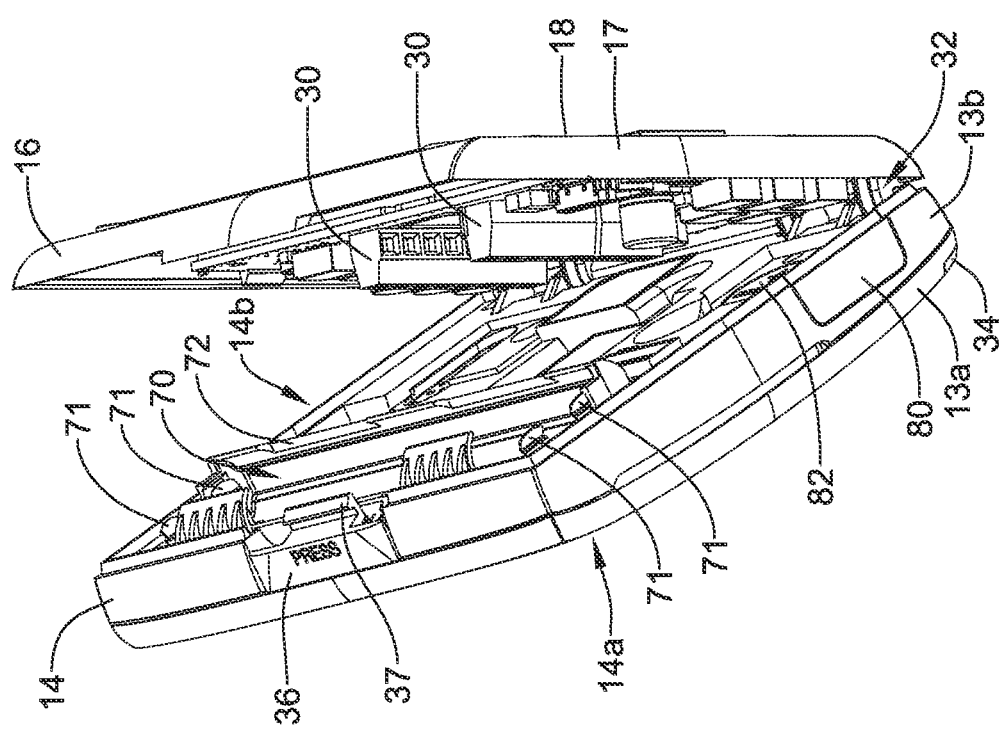
FIG. 8 is a perspective view of a first sub-assembly hingedly opened from a second sub-assembly of the illustrative thermostat assembly of FIG. 1.
Figure 9:
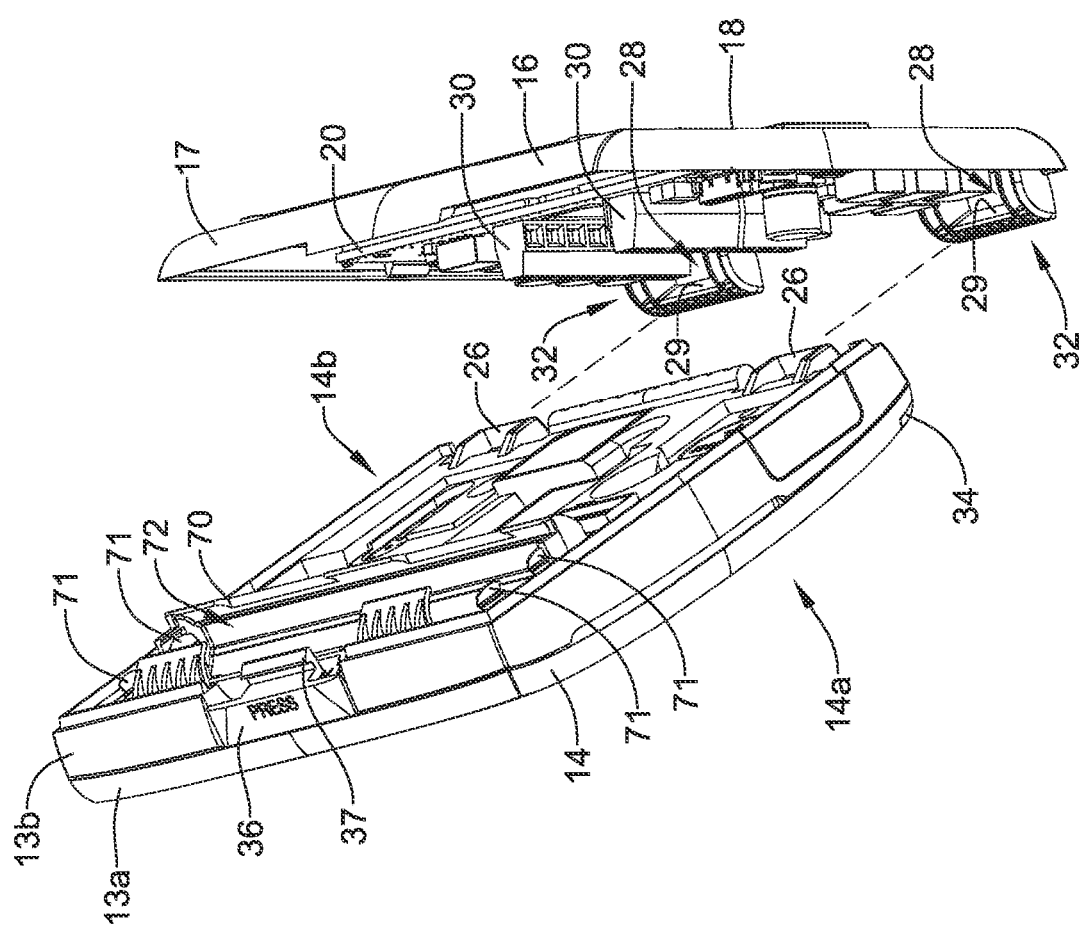
FIG. 9 is an exploded perspective view of the first sub-assembly of FIG. 8 separated from the second sub-assembly.

Illustratively, the first sub-assembly 14 may have extensions 26 capable of engaging openings 28 of the second sub-assembly 16 in a separable manner. The extensions 26 and the openings 28 may engage one another (e.g., at a bottom of the thermostat 10) to create a hinge mechanism capable of supporting the first sub-assembly in an opened position and, optionally, without any further connecting features, as best shown in FIGS. 8 and 9. In one example, the formed hinge mechanism may have a kinematic backstop 29 and a release button or latch. Alternatively, the formed hinge mechanism with a kinematic backstop 29 may omit the button or latch and may be readily separable by lifting up on the first sub-assembly 14, as best shown in FIGS. 8 and 9.

In the example shown, an enclosure 12 may house features of only the first sub-assembly 14, only features of the second sub-assembly 16, or features of the first sub-assembly 14 and features of the second sub-assembly 16. The enclosure 12 may include various latches, extensions, openings, hinges, button, and/or other connecting features that may facilitate connecting or snap together various portions of the enclosure 12 without the need for a separate fastener (e.g., a threaded member such as screw, bolt or other fastener). Alternatively, one or more separate fasteners (e.g., a threaded fastener) may be used to connect one or more portions of the enclosure 12. In one example, first sub-assembly 14 may have a button 36 with a latch 37, as best shown in FIGS. 8 and 9, where the latch 37 may engage the second sub-assembly 16 and the button 36 may be pressed to release the connection between the latch 37 and the second sub-assembly 16.

In some instances, the enclosure 12 may be formed to provide a visually thin or minimalist appearance, as best shown in FIGS. 1-7. For example, when the thermostat 10 is mounted to a wall or other structure, the thermostat may have one or more outer side walls that taper inward and toward the wall or other structure to which the thermostat 10 is mounted. This taper may help create the illusion that the thermostat 10 is thinner than it actually is.

In some instances, the enclosure 12 may include an indicator 34 that may be viewable from a first side 14a of the first sub-assembly 14 (e.g., where the first sub-assembly 14 has a first side 14a and a second side 14b), as best shown in FIGS. 1-3 and 6. In some instances, the indicator 34 may be a warning light, an indicator light indicating an alert is ready to be view, or any other type of light or indicator. In some examples, the indicator 34 may include a semi-transparent plastic material covering a light source (e.g., one or more lights such as an LED) that in some cases may be capable of changing colors. In some instances, the light may be electrically and/or mechanically connected to a first PCB or PWB 19 that is within the enclosure 12.

Figure 10:
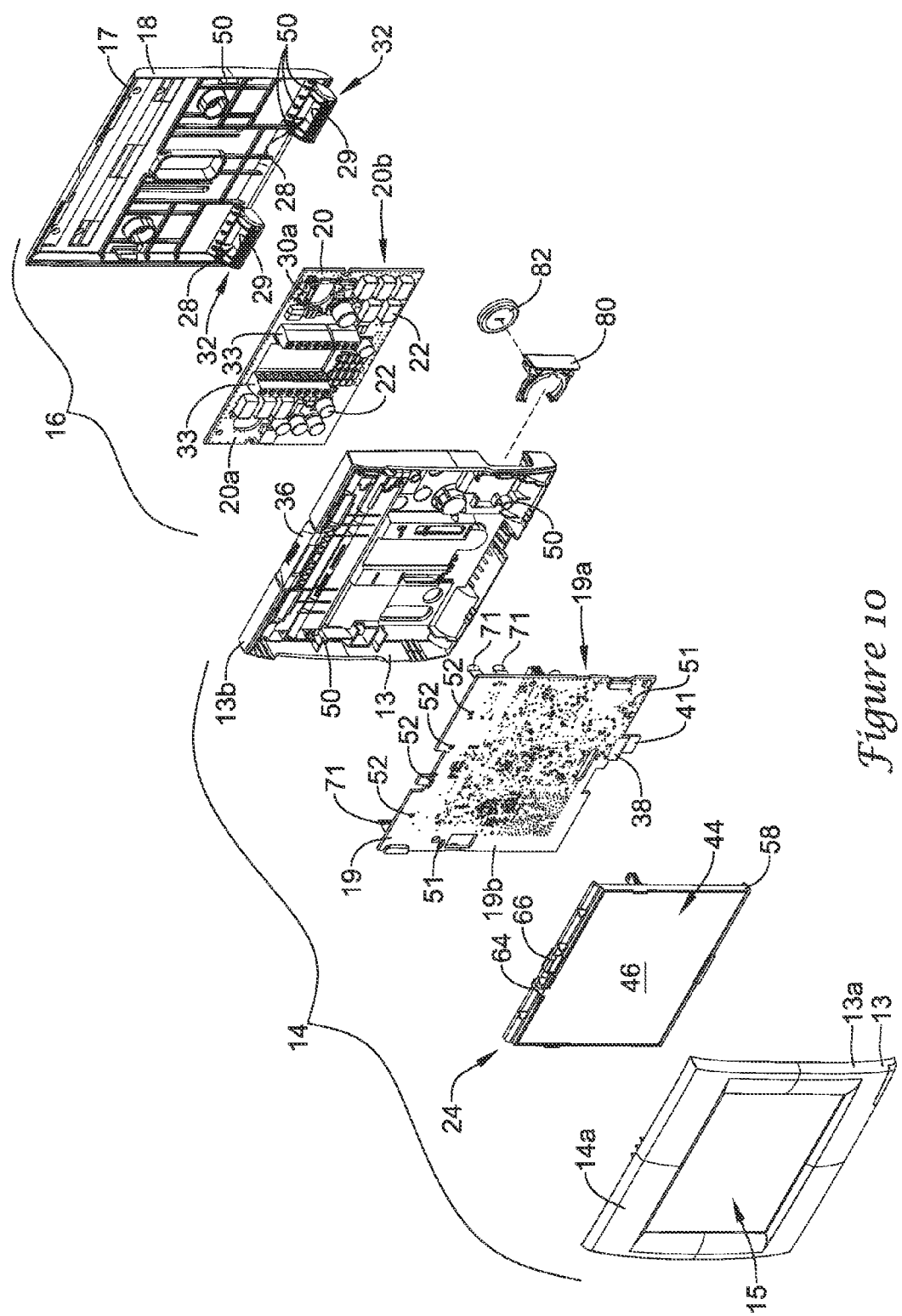
FIG. 10 is an exploded front view of the illustrative thermostat assembly of FIGS. 1-9.

In some cases, the enclosure 12 may provide one or more features that may capture and/or locate the first PCB or PWB 19, a second PCB or PWB 20, and/or other features of the first sub-assembly 14 and/or the second sub-assembly 16. For example, one or more projections 50 may extend from the interior of the enclosure 12, as best shown in FIG. 10, and engage the first PCB or PWB 19 and/or the second PCB or PWB 20, and/or engage openings 51 in either of the first and/or second PCB or PWB 19, 20 to facilitate positioning the PCBs or PWBs 19, 20 and securing the PCB or PWBs 19, 20 in place within the enclosure 12.

The enclosure 12 may be made from any material and by any process, as desired. In one example, the enclosure material may be injection molded with high impact polystyrene, acrylic-plexiglass, and/or any other material.

In some instances, the first sub-assembly 14 may include a housing 13 (e.g., a first housing) of the enclosure 12 (e.g., a plastic housing 13 having a cover 13a and a back 13b or a housing 13 made from any other material and/or with any number of separable parts, if any) and a display sub-assembly 24 (e.g., a touch screen display) that may be positionable substantially within the housing 13. Among other features, the housing 13 may house a processor or controller, a battery compartment 70, a battery power input, a wired power port, wired control port, a wireless interface, and/or any other suitable components. In some cases, the housing 13 may house a first printed circuit board (PCB) or first printed wiring board (PWB) 19 where the cover 13a may be positioned adjacent a first side 19a of the first PCB or PWB 19, and the back 13b may be positioned adjacent a second side 19b of the first PCB or PWB 19. The second sub-assembly 16 may be configured to be releasably secured to the first sub-assembly 14 adjacent to the back 13b of the housing 13 of the first sub-assembly 14.

A wired power port may be capable of receiving power from an optional external wired power source to power the thermostat 10. A battery power input may be capable of receiving power from an optional battery in a battery compartment to power the thermostat 10. In some cases, the battery power input will optionally or automatically cease drawing power from the optional battery when the wired control port senses power from a wired power source. Alternatively, or in addition, the battery power input may be capable of optionally or automatically receiving power from the optional battery inserted into the battery compartment 70 when it is sensed that the wired power port is not receiving power from a wired power source. In some instances, the processor or controller may be capable of determining from which power source power is drawn and/or may be utilized to set optional, customizable, or automatic power draw settings. Illustratively, the processor or controller may be configured to operate under one or more power configurations. For example, the processor or controller may be capable of operating by receiving power form only the battery power input, receiving power from only the wired power port, or receiving power from the battery power input and the wired power port.

The processor or controller may be capable of generating one or more control signals configured to be sent to one or more HVAC components in communication with the thermostat 10 via a wired or wireless interface. In some cases, a wireless interface may be capable of optionally wirelessly connecting the thermostat 10 directly or indirectly to the one or more HVAC components, and may be capable of providing the control signals generated by the processor or controller to the one or more HVAC components via the wireless interface. A wired control port may be capable of optionally connecting the thermostat 10 directly or indirectly to one or more HVAC components via one or more wires, and may be capable of providing the control signals generated by the controller to the one or more HVAC components via the one or more wires.

The processor or controller may be configured to operate under one or more control configuration. For example, the processor or controller may be capable of controlling one or more HVAC component using only the wired control port, using only the wireless interface, or using the wired control port and the wireless interface. In some illustrative instances, the wireless interface and/or the wired control port may be optionally simultaneously or alternatively selected for communicating control signals to HVAC components in communication with the thermostat 10.

Figure 11:
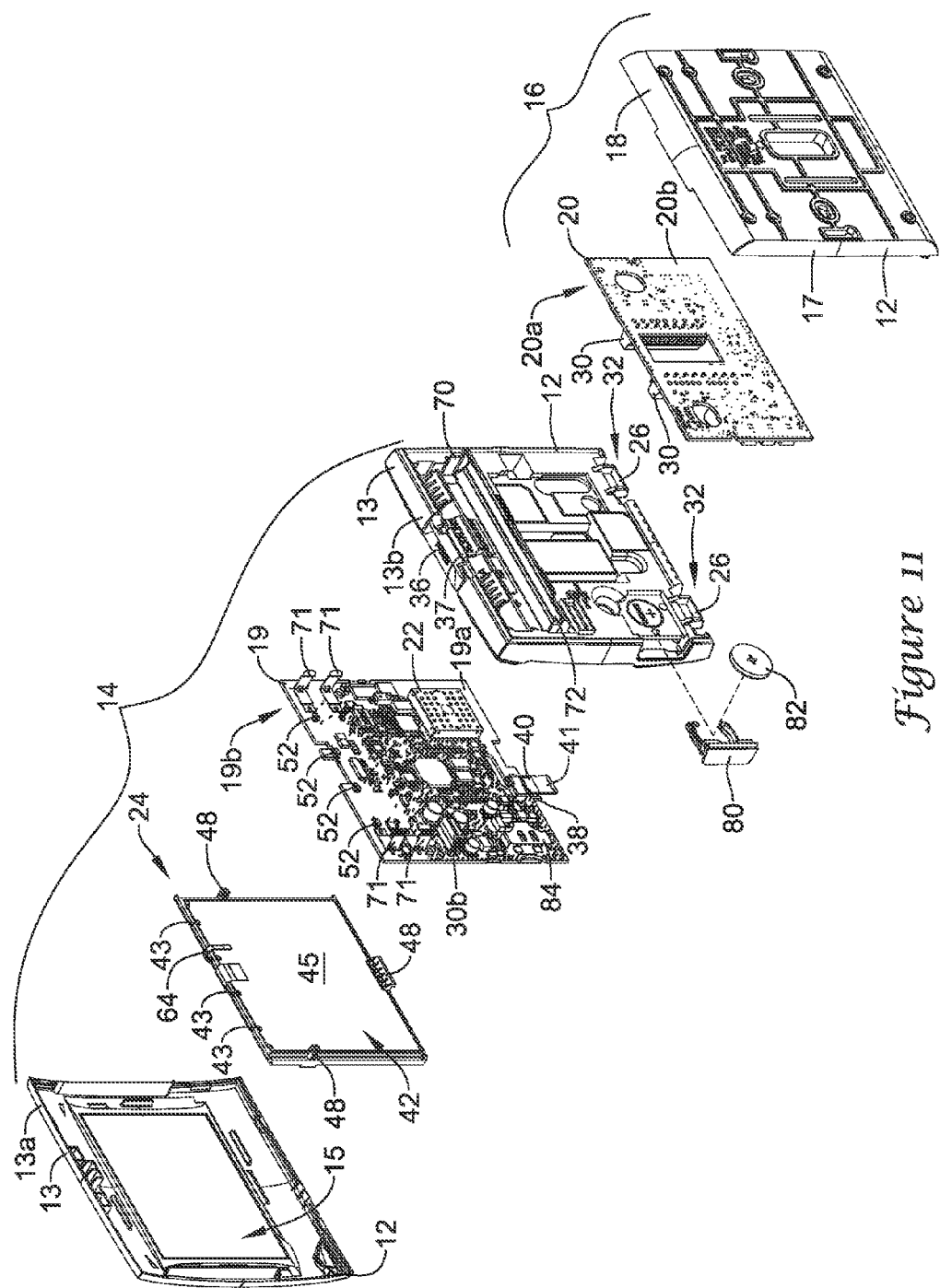
FIG. 11 is an exploded back view of the illustrative thermostat assembly of FIGS. 1-9.
Figure 12:
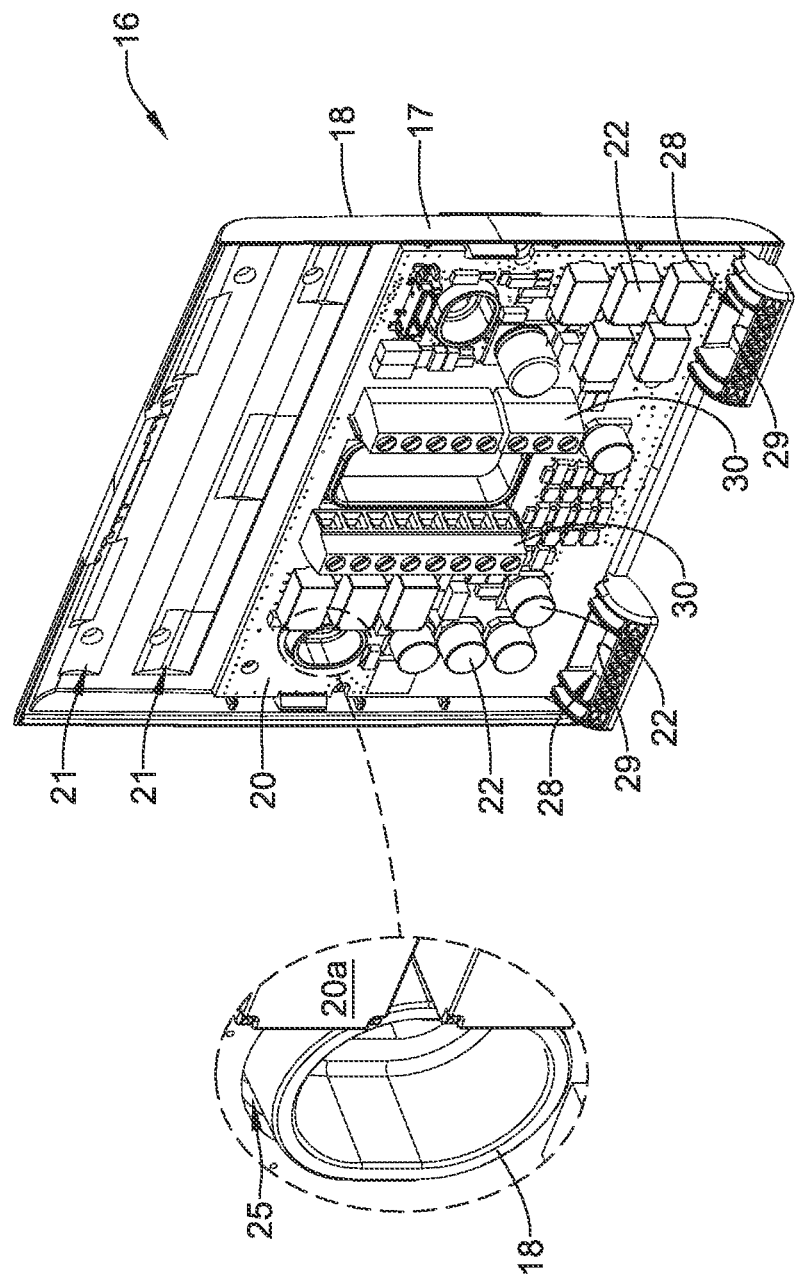
FIG. 12 is a schematic front view of a wall plate sub-assembly of the illustrative thermostat assembly of FIGS. 10-11.
Figure 13:
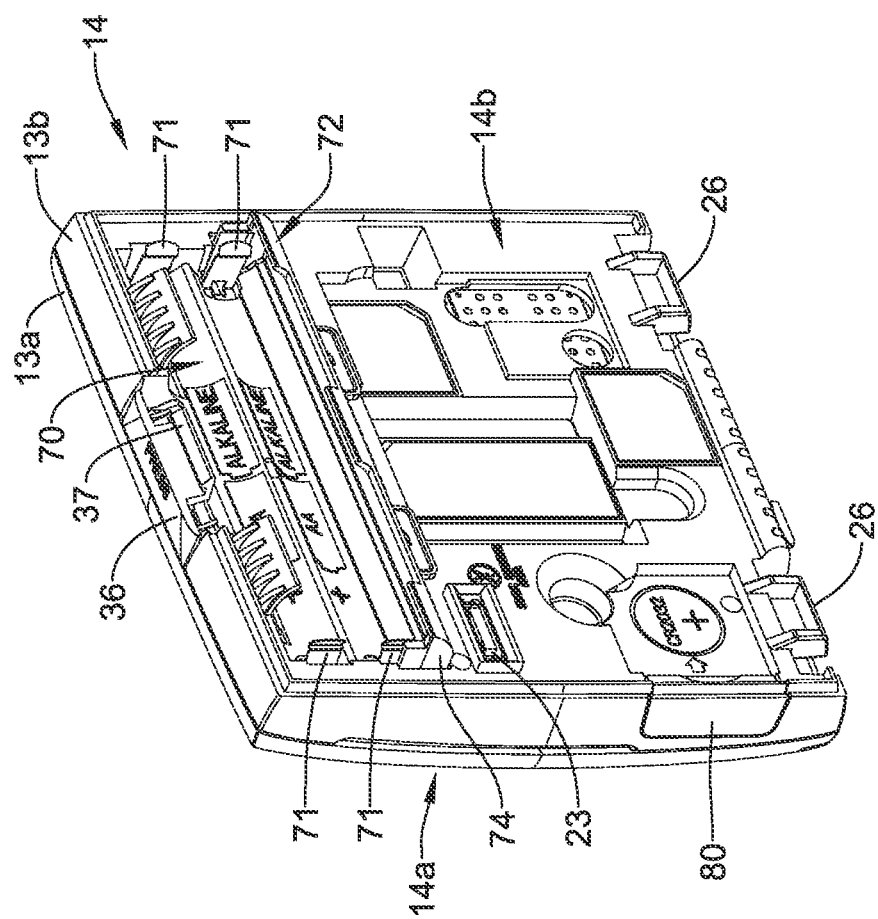
FIG. 13 is perspective back view of a sub-assembly of an illustrative thermostat assembly of FIGS. 10-11.

The first PCB or PWB 19 may have any shape or size, as desired. In some instances, the first PCB or PWB 19 may have a portion 38 that is configured to receive a memory card connector 40, as best shown in FIG. 11. The portion 38 of the first PCB or PWB 19 that is configured to receive a memory card connector 40 may have a perimeter that extends (e.g., juts out) from a main portion of the PCB or PWB 19. In one instance, such extension of the PCB or PWB 19 may facilitate ESD protection of the board (and electronic components mounted on the board) while allowing for the thermostat 10 to receive an external memory card 41.

In some instances, the second sub-assembly 16 may be a wall plate 18, and may include a second PCB or PWB 20 with electronic components 22 (e.g., terminal blocks 33, relays, latching relays, etc., of which only a few are illustratively labeled in the Figures) and/or other features or components. In some cases, one or more wires from a building conditioning system (e.g., a heating, ventilation, and air conditioning (HVAC) system) may connect to a terminal block 33 or other component of the second PCB or PWB 20 of the second sub-assembly 16.

The wall plate 18 may facilitate securing the second PCB or PWB 20 therein in a floating manner. For example, a lateral space or gap may be formed between an edge of the second PCB or PWB 20 and the wall plate 18. In some instances, the floating connection between the wall plate 18 and the second PCB or PWB 20 may facilitate inter-board connection (e.g., with the first PCB or PWB 19) during an installation procedure, such as when connecting the first sub-assembly 14 and the second sub-assembly 16 (e.g., through an electrical connection and/or mechanical connection).

The first PCB or PWB 19 and the second PCB or PWB 20 may structurally complement one another. For example, electronic components 22 may extend from the first PCB or PWB 19 and/or from the second PCB or PWB by varying distances toward the other PCB or PWB. Also, the electronic components 22 may arranged on each of the PCB or PWB 19, 20 such that the electronic components 22 that extend a relatively far distance from one of the PCB or PWB 19, 20 are aligned with either no electronic component of the other PCB or PWB 19, 20, or are aligned with an electronic components 22 that extends a relatively short distance from the other PCB or PWB 19, 20.

As shown in FIGS. 10 and 11, the first side 19*a* of the first PCB or PWB 19 may face the second PCB or PWB 20, and the second side 19*b* may face away from the second PCB or PWB 20. Also, the second PCB or PWB 20 may include a first side 20*a* that faces the first PCB or PWB 19, and a second side 20*b* that faces away from the first PCB or PWB 19, such that the first side 19*a* of the first PCB or PWB 19 is spaced from the first side 20*a* of the second PCB or PWB 20 by a spacing when the first PCB or PWB 19 is releasably engaged relative to the second PCB or PWB 20 via the first sub-assembly 14 and the second sub-assembly 16. In some instances, one or more component (e.g., an electrical or electronic component or any other type of component, including but not limited to an inter-board connector 30A-30B) may be complementarily mounted to each of the first side 19*a* of the first PCB or PWB 19 and the first side 20*a* of the second PCB or PWB 20. In one example of complementary spacing of components, a component mounted on the first side 19*a* of the first PCB or PWB 19 may extend a first distance from the first PCB or PWB 19 toward the second PCB or PWB 20, and a component mounted on the first side 20*a* of the second PCB or PWB 20 may extend a second distance from the second PCB or PWB 20 toward the first PCB or PWB 19 when the first sub-assembly 14 is releasably engaged with the second sub-assembly 16. In some instances, the sum of the first distance and the second distance may be greater than a distance of the spacing between the first PCB or PWB 19 and the second PCB or PWB 20. In some instances, the one or more components mounted to the first PCB or PWB 19 and the one or more components mounted to the second PCB or PWB 20 may be laterally offset relative to one another. In other instances, taller components on the first PCB or PWB 19 may align with or overlap shorter components on the second PCB or PWB 20 to help provide a more compact and thinner overall profile.

One or more of the components mounted on the PCBs or PWBs 19, 20 may include an inter-board connector 30A-30B. As shown in the Figures, the inter-board connector 30A may be mounted on the second PCB or PWB 20, however, additionally or alternatively, the inter-board connector 30B may be mounted on the first PCB or PWB 19. To facilitate electrical communication between the first PCB or PWB 19 and the second PCB or PWB 20 via the inter-board connector(s) 30A-30B, the back 13*b* of the housing 13 may include one or more apertures 23 for accommodating the inter-board connectors 30A-30B. The inter-board connectors 30A-30B may carry one or more signals between the first PCB or PWB 19 and the second PCB or PWB 20. In some instances, the inter-board connectors 30A-30B may be aligned and connected during connection of the first sub-assembly 14 with the second sub-assembly 16, where such positioning may be facilitated by the hinge mechanism 32 and/or one or more other alignment features, as desired.

In some cases, the inter-board connector(s) 30A-30B may be movable or adjustable (e.g., laterally movable or adjustable) up to a predetermined distance with respect to the first and/or second housing. Such an adjustable inter-board connector 30A-30B may accommodate an amount of misalignment of the first PCB or PWB 19 and the second PCB or PWB 20 during connection of the first sub-assembly 14 with the second sub-assembly 16. In one example, the PCB or PWB 19, 20 to which the inter-board connector 30AB is mounted may be movable with respect to the housing of the sub-assembly 16 in which it is secured. In some instances, such adjustability up to a predetermined distance of the inter-board connector 30A-30B and the PCB or PWB 19, 20 may be built into tolerances of the connection of the PCB or PWB 19, 20 with the respective housing, such as shown illustratively by gap 25 in FIG. 12. When so provided, the PCB or PWB 19, 20, and thus the inter-board connector 30A-30B, may be movable so as to better accommodate misalignment of the first PCB or PWB 19 and the second PCB or PWB 20 during connection of the first sub-assembly 14 with the second sub-assembly 16, while still being able to connect the inter-board connector 30A-30B.

The second PCB or PWB 20, when provided, may be any shape or size capable of receiving the electronic components 22, as desired. For example, the second PCB or PWB 20 may have a rectangular shape and a size (e.g., a surface area or other size) that is smaller than the first PCB or PWB 19. In some instances, the second PCB or PWB 20 may be sized smaller than the first PCB or PWB 19, where for example the first PCB or PWB 19 may extend laterally beyond one or more peripheral edges of the second PCB or PWB 20 in at least one direction to result in a non-overlapping region 27, which may provide space to accommodate a battery assembly of the first sub-assembly 14.

In one example, the non-overlapping region of the first PCB or PWB 19 may include one or more battery contacts 71 (e.g., battery terminals) to connect to one or more batteries, and/or an antenna. When batteries are positioned within the battery contacts 71, the batteries may extend away from the first side of the first PCB or PWB 19 toward the second housing of the wall plate 18 by a distance that may be greater than the spacing between the first PCB or PWB 19 and the second PCB or PWB 20.

Figure 14:
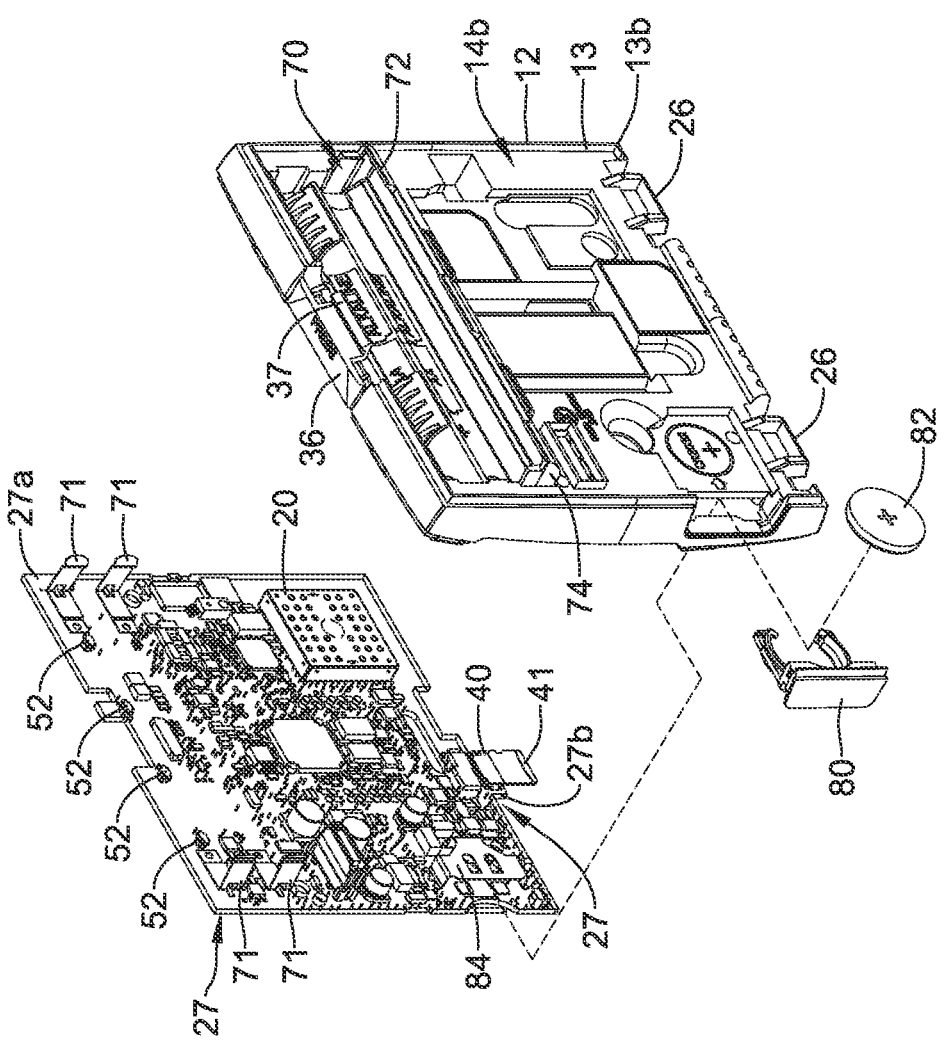
FIG. 14 is a schematic exploded view of the back of a housing or enclosure and the printed circuit board of the illustrative thermostat assembly of FIGS. 1-13.

In some instances, the non-overlapping region 27 of the first PCB or PWB 19 may include a first portion 27a and a second portion 27b (see FIG. 14). The first portion 27a of the non-overlapping region 27 may include or carry one or more batteries within the battery contacts 71, as described above. The second portion 27b may include or carry a connector (e.g., a memory card connector 40 capable of receiving a memory card 41 and/or any other connector).

As best shown in FIGS. 8, 9, 11, and 13, the battery assembly may include a battery compartment 70 that may be at least partially formed in the back 13b of the housing 13 and may be configured to receive one or more batteries. The battery compartment 70 may include the one or more battery contacts 71 extending therein from the first PCB or PWB 19, and may form a cup shaped battery reservoir 72 that is capable of collecting leakage (e.g., leaked electrolytes) from one or more batteries that are inserted into the battery compartment 70. When the first sub-assembly 14, including the battery assembly, is connected to or secured to the second sub-assembly 16, the second sub-assembly 16 may cover at least a portion (e.g., less than half, more than half, substantially all) of the battery assembly (e.g., the battery compartment 70, the battery contacts 71, and/or the battery reservoir 72). The wall plate 18 may include one or more recesses 21 that are configured to accommodate at least part of the one or more batteries received in the battery assembly. The battery reservoir 72 may be configured to collect leakage, if any, from one or more batteries that are received in the battery assembly, and allow it to pool therein without leaking outside the battery compartment, such as onto one or more electrical components of the first sub-assembly 14 and/or the second sub-assembly 16.

In some instances, the battery contacts 71 may extend from the first PCB or PWB 19, through the back 13b of the housing 13 and into the battery compartment 70. In one illustrative example, the battery compartment 70 may be positioned within the thermostat 10 such that it may be located on or adjacent a first side 19a of the first PCB or PWB 19, with a display 44 of the thermostat 10 positioned at or adjacent a second opposite side 19b of the first PCB or PWB 19.

Figure 15:
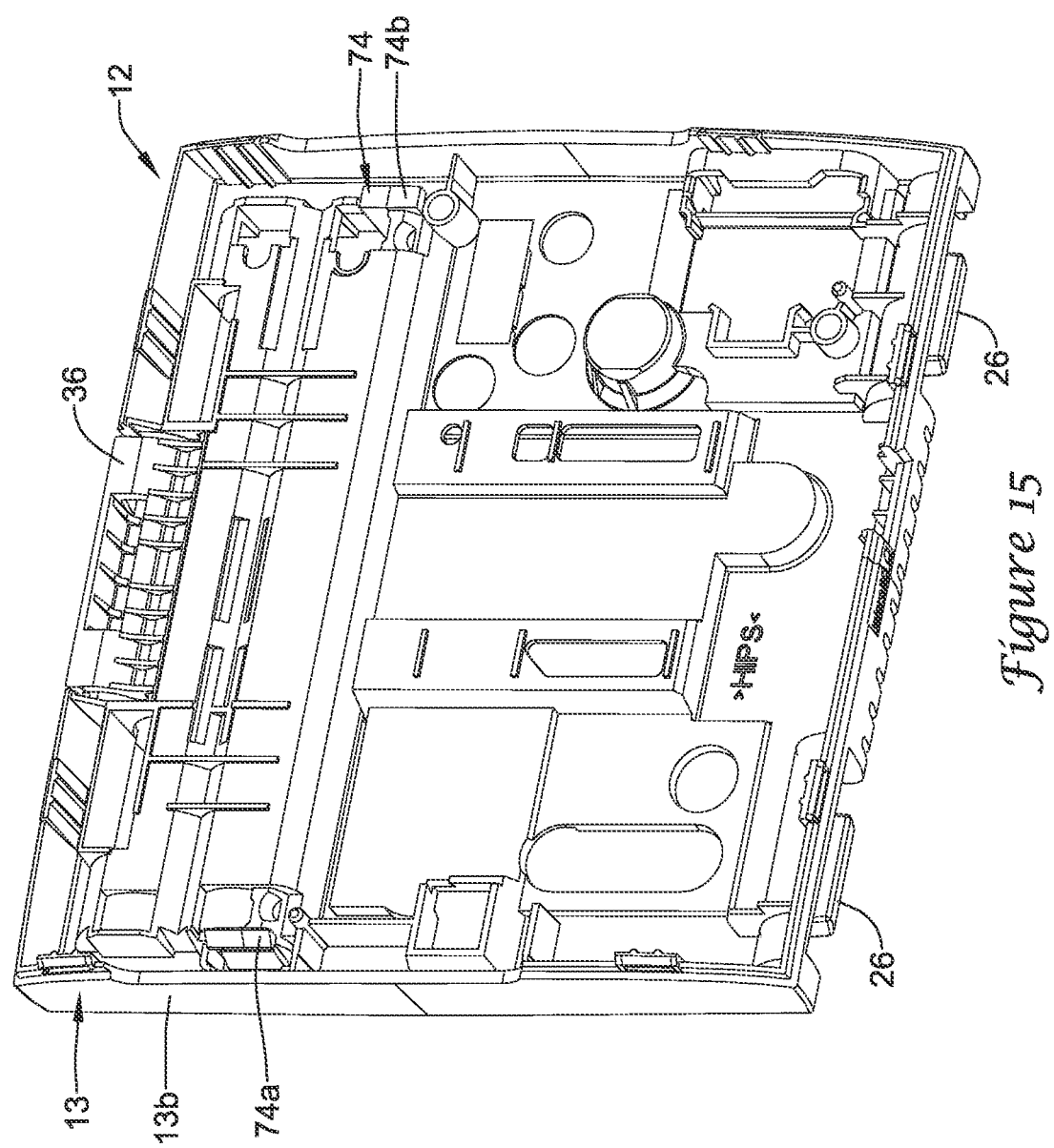
FIG. 15 is a perspective view the back of the housing or enclosure of the illustrative thermostat assembly of FIGS. 1-13.

The battery reservoir 72 may be defined by the battery compartment 70 and may be positioned below or at least partially below the battery contacts 71 when the first sub-assembly 14 is in an upright position. The battery reservoir 72 may have one or more parts or members, and in some cases, may be formed unitarily with the enclosure 12 or may be added and/or connected to the enclosure 12 to collect leakage from the one or more batteries. In some instances, the battery reservoir 72 may be formed at least partially by a releasably securable insert 74 (see FIG. 13) that may be securable to the back 13b of the housing 13 via an interference connection or any other type of connection. As best shown in FIG. 15, clips 74a, 74b formed in the back 13b of the housing 13 may engage corresponding engagement members of the insert 74 to releasable secure the insert 74 to the back 13b of the housing 13 via an interference connection. Alternatively or in addition, the battery reservoir 72 may be entirely or at least partially unitary formed with the back 13b of the housing 13 or other portion of the enclosure 12, as desired.

The battery reservoir 72 and/or the components thereof may take on any shape configured to facilitate reception and maintenance of batteries therein. In some illustrative instances, the battery reservoir may be cup-shaped or other shape that is configured to collect leakage from one or more batteries inserted into the battery compartment 70.

The battery reservoir 72 may provide space for the collection of battery leakage while preventing the leakage from affect sensitive parts and/or areas where such leakage could cause failure of the thermostat 10. In one example, when the first sub-assembly 14 is in an upright position, the battery reservoir 72 may have a crescent, cup, or other shape that extends the length of the batteries, and in some cases, may be shaped much like a hollowed out canoe.

In addition to or as an alternative to the battery assembly discussed above, the first sub-assembly 14 may have a battery receptor 80 for receiving a battery 82 (e.g., a lithium ion battery or other battery). In some instances, the battery receptor 80 may be separable from the first sub-assembly 14, as shown in FIG. 14, to facilitate receiving and/or removing the battery 82 from the first sub-assembly. Illustratively, the battery receptor 80 may be inserted into and/or at least partially removed from a side of the first sub-assembly 14. When the battery receptor 80 is inserted into the first sub-assembly 14, the battery 82 may electrically contact and/or mechanically engage battery contacts such as battery contact 84, which may be electrically and mechanically connected to the first PCB or PWB 19. Such electrical contact between the battery 82, the battery contacts 84, and the first PCB or PWB 19 may facilitate powering one or more features of the thermostat 10.

The first sub-assembly 14 may be powered with one or more received or connected batteries or other power sources (e.g., a first power source). In some cases, the second sub-assembly 16 may be powered with a wired connection to the power of a building (e.g., a second power source). In some instances, the first sub-assembly 14 may be powered by the same power source powering the second sub-assembly 16 through electronic connection(s) between the first sub-assembly 14 and the second sub-assembly 16 (e.g., the first power source and the second power source may be the same power source).

The first sub-assembly 14 and the second sub-assembly 16 may include electronic components 22, which in some cases, may be sensitive to electrostatic discharges (ESDs). The first PCB or PWB 19 of the first sub-assembly 14 may be protected from ESDs by the enclosure 12 and/or through conductors in or about the display 44 and/or touch screen 46, as discussed further below. The second PCB or PWB 20 of the second sub-assembly 16 may be protected from ESDs in a similar manner to the first PCB or PWB 19 and/or configured such that it is substantially insensitive to ESDs due to its remote positioning or location within the enclosure 12 with respect to portions of the thermostat 10 with which users typically interact. In some cases, the second PCB or PWB 20 includes electrical components that are not susceptible, or far less susceptible, to damage caused by ESD, such as terminal blocks, relays, etc.

Figure 16:
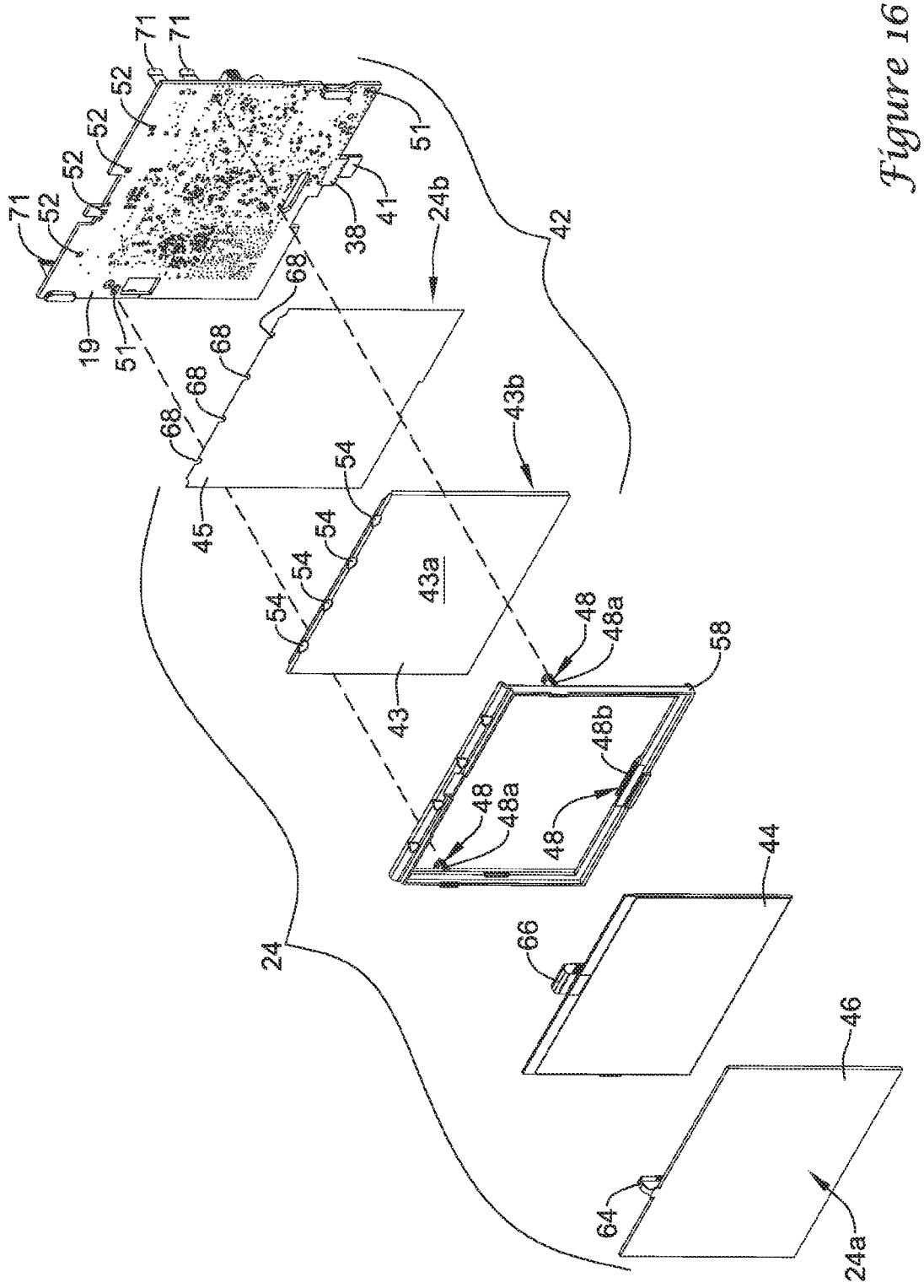
FIG. 16 is an exploded perspective view of an illustrative display sub-assembly.

Illustratively, the first PCB or PWB 19 may be positioned adjacent the back side 24b of a display sub-assembly 24 (e.g., adjacent a reflective layer 45, e.g. reflective foil or other reflective layer). The display sub-assembly 24 (e.g., a touch screen display) of the first sub-assembly 14 may have a front side (e.g., a viewing side) 24a and a back side (e.g., a non-viewing side) 24b, as shown in FIG. 16, and conductive trace(s) 56 (further discussed below) on the front side 24a of the display sub-assembly 24 may be in electrical connection with one or more tails 64 (e.g., a flexible electrical connector or any other type of connector) that may mechanically and/or electrically connect to the first PCB or PWB 19 (and/or the second PCB or PWB 20) to provide an electrical path from the conductive trace(s) 56 to a ground plane or other grounding feature of the PCB or PWB 19, 20. In some instances, the conductive trace(s) 56 may be configured to collect ESD entering between the front side 24a of the display sub-assembly 24 and the housing 13, and to deliver the collected ESD to the grounding plane or other grounding feature of the PCB or PWB 19 via the tail 64 or other electrical connector.

With reference to FIG. 16, the display sub-assembly 24 may include, among other features, a backlight system 42 (e.g., including a backlight guide plate 43 for providing a backlight to the display 44 and a reflective layer 45), a display 44 (e.g., a liquid crystal display (LCD), a light emitting diode (LED) display, or other display), a touch screen 46 (e.g., an indium tin oxide (ITO) touch screen or other type of touch screen), and/or a frame 58 having connectors 48 for aligning and/or connecting features of the display sub-assembly 24 and/or mechanically connecting, releasably connecting, and/or removably fixing the display sub-assembly 24 to the first PCB or PWB 19. Additionally, or alternatively, the frame 58 may include one or more protrusions capable of mating with concave features 54 of the backlight guide plate 43.

In instances where the display sub-assembly 24 may include a touch screen 46, a display 44, a frame 58, a backlight guide plate 43, and a reflective layer 45, the front side 24a may be formed at least partially by the touch screen 46 and the back side 24b may be formed at least partially by the reflective layer 45. Alternatively or in addition, one or more of the features of the display sub-assembly 24 discussed herein or other features added to the display sub-assembly 24 may form the front side 24a and/or the back side 24b thereof, as desired.

Figure 17:
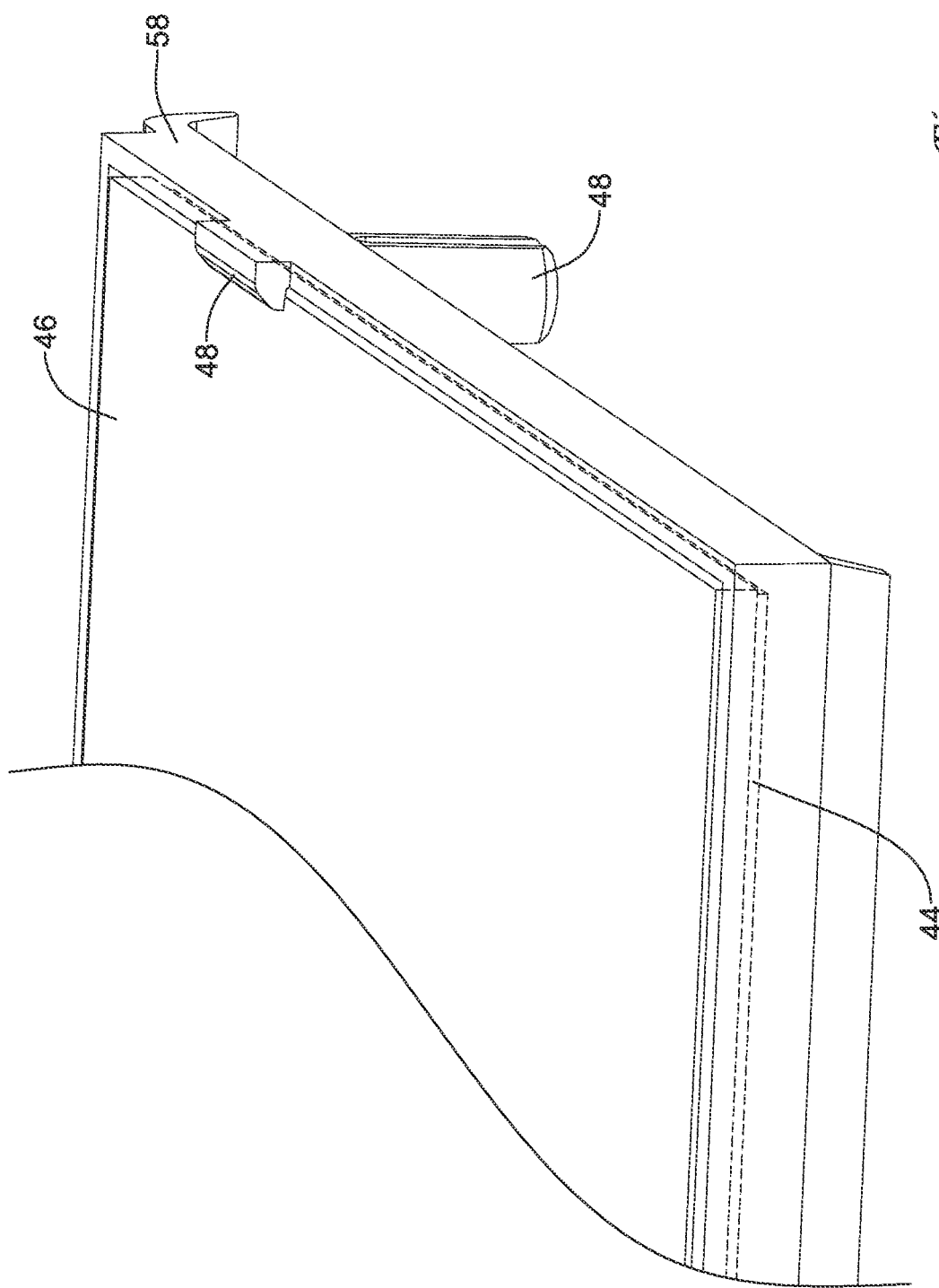
FIG. 17 is a perspective view showing features of the illustrative display sub-assembly of FIG. 16.
Figure 18:
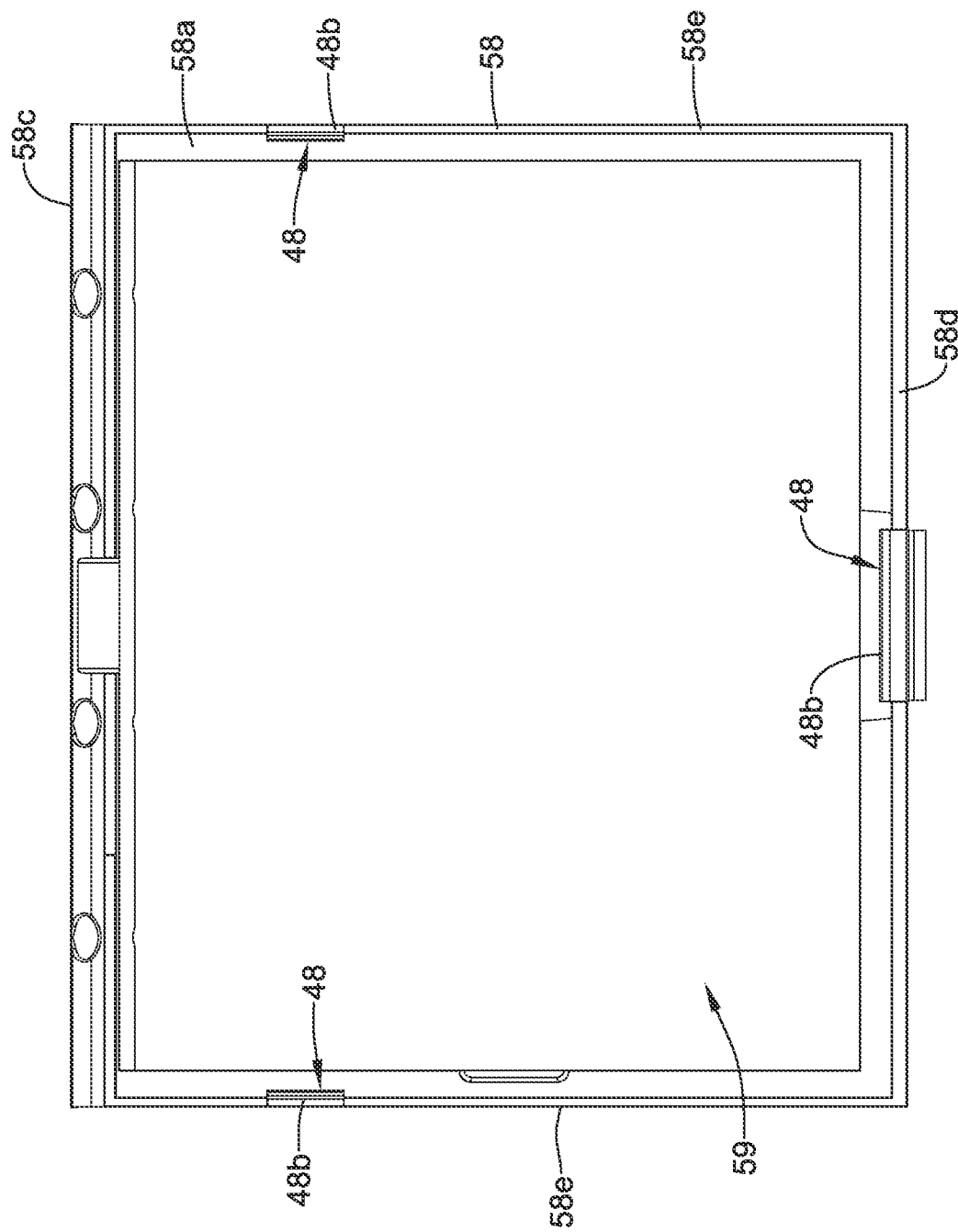
FIG. 18 is a front view of an illustrative frame of the illustrative display sub-assembly.

Illustratively, the frame 58 may be a plastic frame or other type of frame. With reference to FIGS. 16-20, the frame 58 may include a front side 58a, a back side 58b, and side walls (e.g., top side wall 58c, bottom side wall 58d, and lateral side walls 58e) that may extend from the front side 58a to the back side 58b of the frame 58 and form a space 59 therewithin, as best shown in FIGS. 17 and 18. When positioned in the first sub assembly 14, the front side 58a of the frame 58 may face away from the first PCB or PWB 19 and the back side 58b of the frame 58 may face toward the first PCB or PWB 19.

Figure 19:
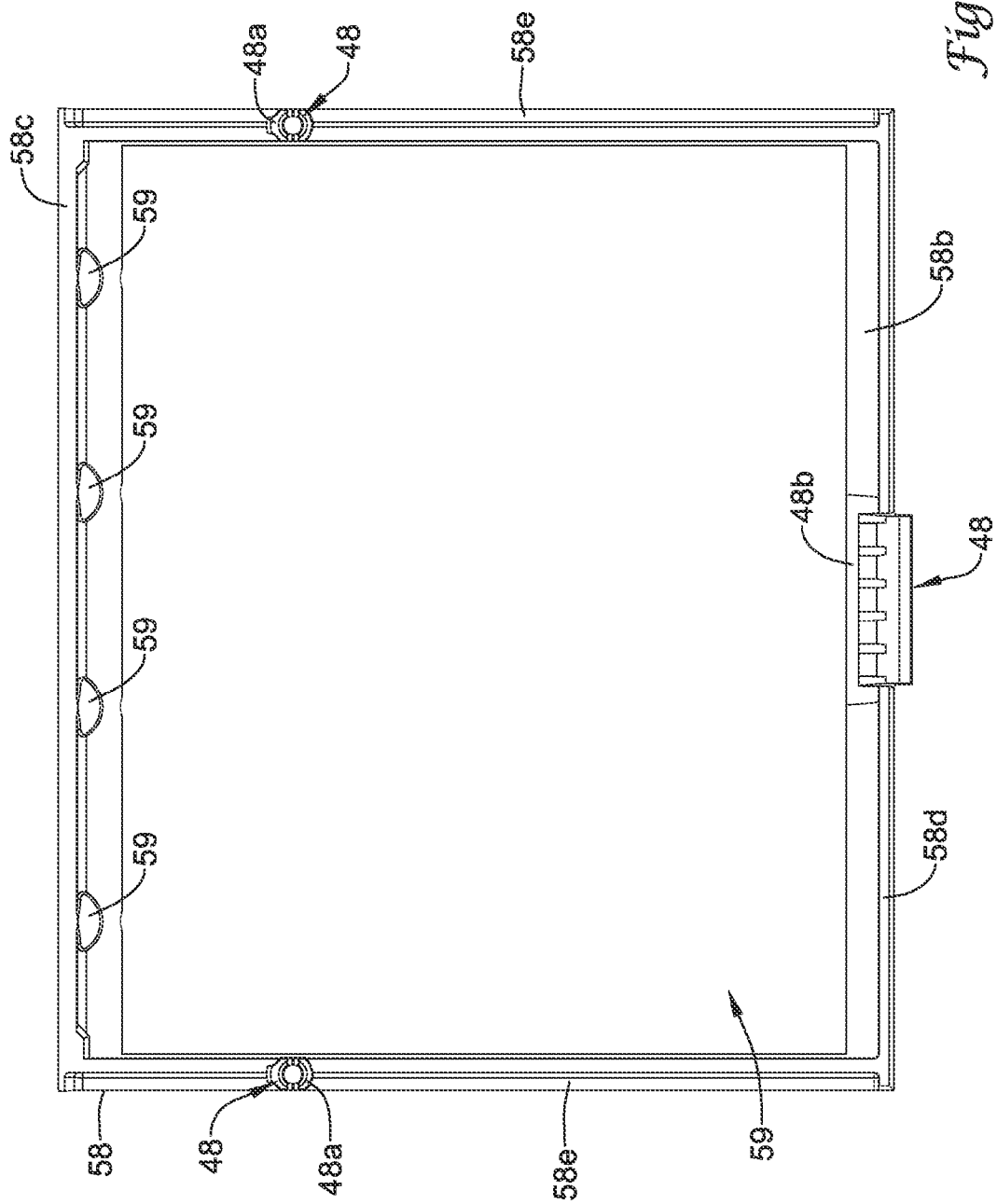
FIG. 19 is a back view of the illustrative frame of the illustrative display sub-assembly.
Figure 20:
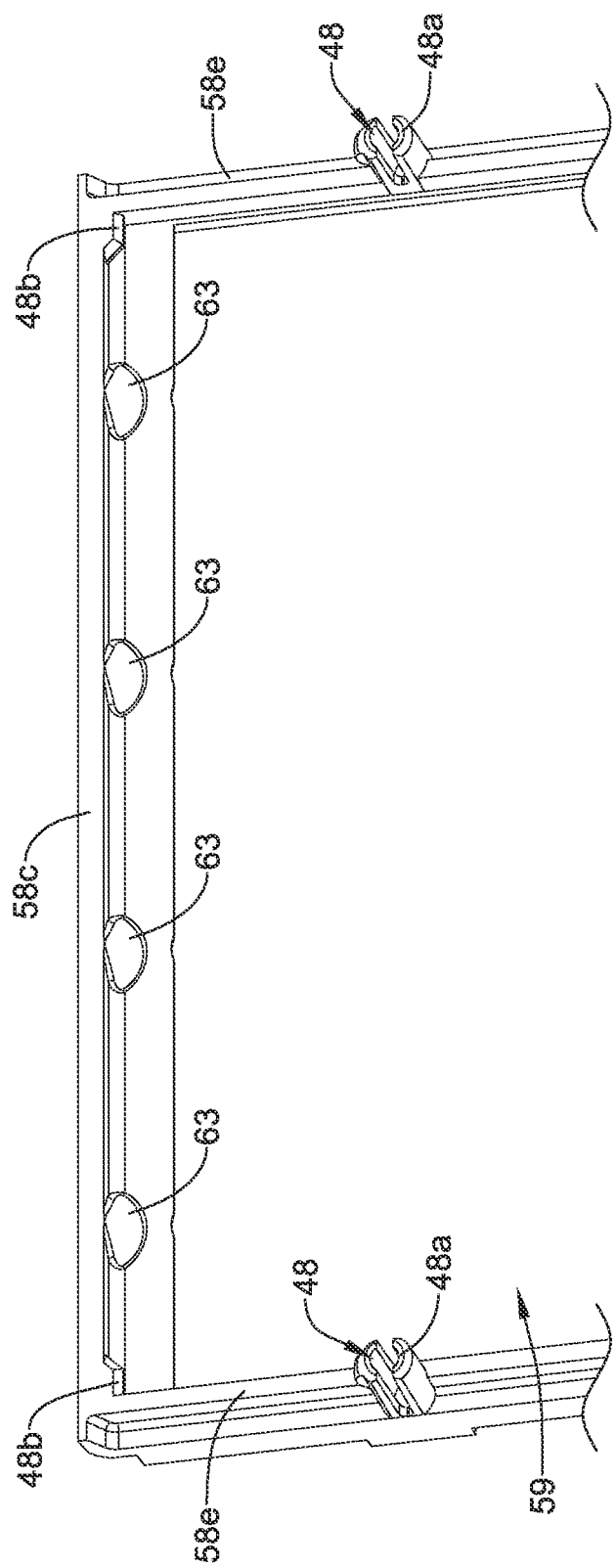
FIG. 20 is a perspective partial back view of the illustrative frame of the illustrative display sub-assembly.

One or more of the side walls of the frame 58 may include one or more reflective features 63, where the reflective features 63 may be shaped to reflect and/or distribute incident light across at least part of the of the backlight guide plate 43, the display 44, and/or the touch screen 46. As best shown in FIGS. 19 and 20, the top side wall 58c of the frame 58 may include a plurality of reflective features 63. In some cases, the reflective features 63, to the extent there are two or more reflective features on the frame 58, may be substantially equally, equally, or irregularly spaced across one or more sides of the display 44 and/or touch screen 46 when the display 44 and/or the touch screen 46 are positioned within the frame 58 to substantially equally spread light across the display and/or focus light on one or more particular locations, as desired.

The reflective features 63 may have any shape and/or may take on any configuration with respect to the frame 58. For example, the reflective features 63 may be formed integrally with the frame 58 or may be separate features connected to the frame 58. The reflective features 63 may have a shape that directs reflected light in a particular manner. In one example, the reflective features 63 may be at least partially cone-shaped and/or may be convex from a back side 58b perspective to spread reflected light about one or more of the touch screen 46, the display 44, and/or the backlight guide plate 43.

Figure 21:
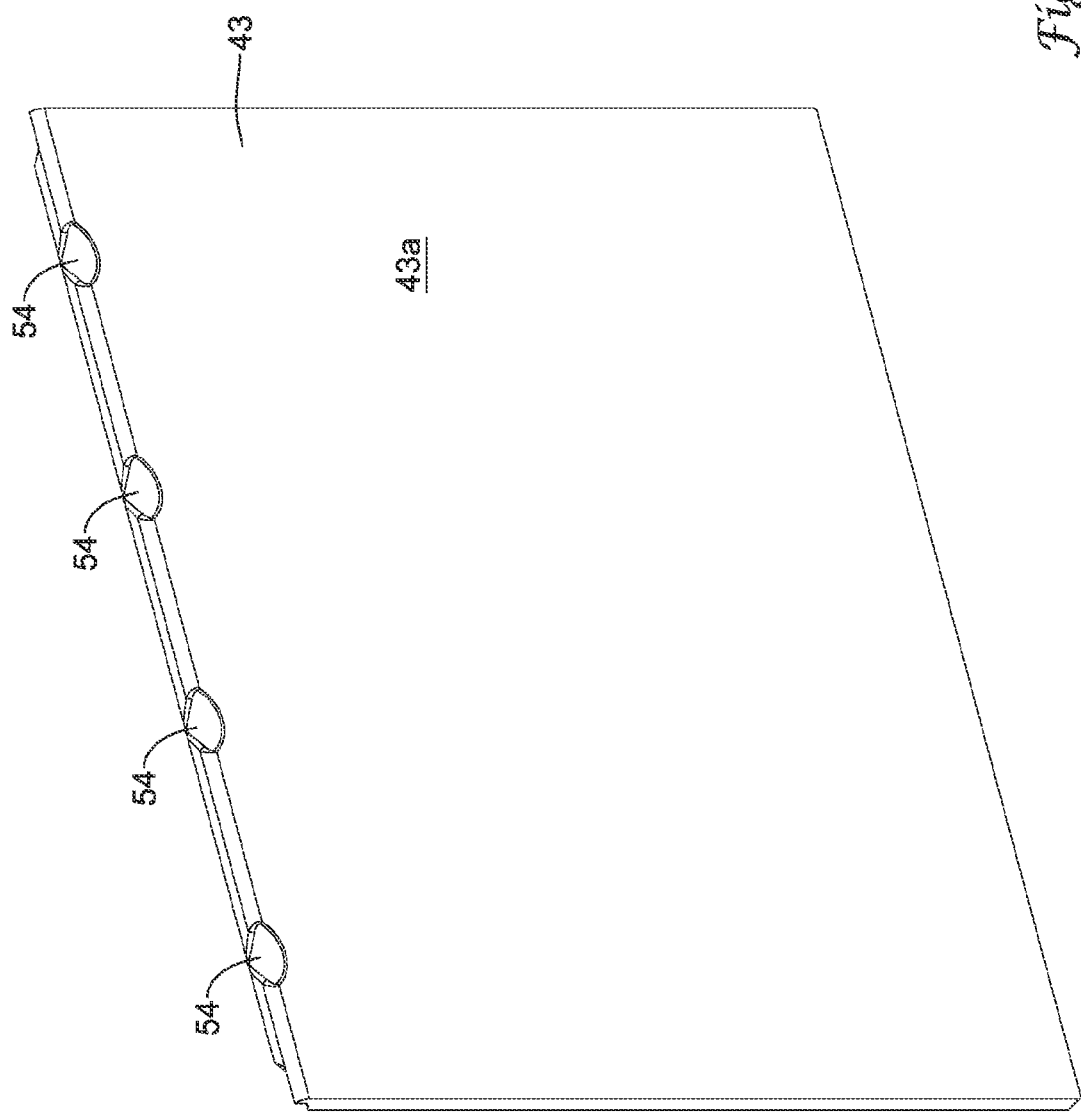
FIG. 21 is a perspective front view of an illustrative light guide plate of the illustrative display sub-assembly.
Figure 22:
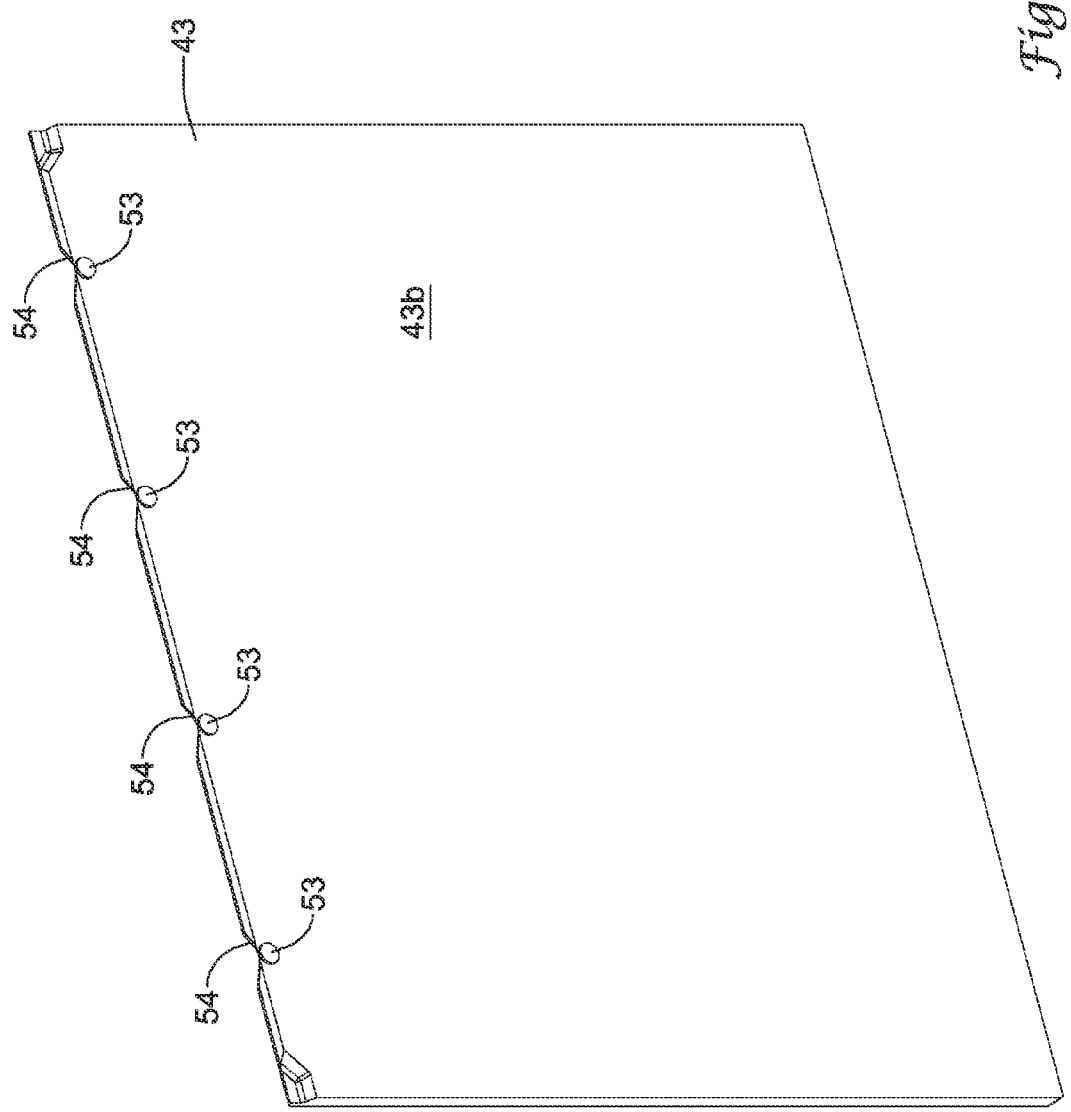
FIG. 22 is a perspective back view of the illustrative guide plate of the illustrative display sub-assembly.

The backlight guide plate 43 may have a front side 43a and a back side 43b, as shown in FIGS. 21 and 22. In some cases, back side 43b of the backlight guide plate 43 may be affixed to the reflective layer 45 with adhesive and/or through other mechanisms.

One or more recesses of the backlight guide plate 43 may correspond or be in registration with one of the one or more reflective features 63 of the frame 58. In some cases, the one or more recesses may have a shape that is configured to mate with a corresponding reflective feature 63 of the frame 58 such that light passing through the one or more recesses may be reflected and spread out by the reflective features 63 of the frame 58.

In some instances, the backlight guide plate 43 may allow light from one or more light sources 52 (e.g., light emitting diodes (LEDs), or other light sources connected to the first PCB or PWB 19 or other light features) to pass through one or more holes or openings 68 in the reflective layer 45, where the holes or openings 68 may be in registration with the one or more recesses of the backlight guide plate 43, so as to allow light from the one or more light sources 52 to reach the one or more recesses or concave features 54 of the backlight guide plate 43. Such light from light sources 52 may be in registration with corresponding one or more protrusions 53 on the back side 43b of the backlight guide plate 43 and/or one or more recesses (e.g., at least partially concave features 54) on the front side 43a of the backlight guide plate 43 to focus light on optimized portions of reflective surfaces of the frame 58, backlight guide plate 43, and/or reflective layer 45. Illustratively, the configuration of the backlight guide plate 43 in communication with light from the light sources 52 may provide light to reflective features 63 of the frame 58 and/or incident light to one or more recesses of the backlight guide plate 43 from the corresponding reflective features 63 in order to distribute the incident light across the backlight guide plate 43, the display 44, and/or the touch screen 46. In some cases, the light is distributed across the display such that the display appears to have an even brightness across the display.

Illustratively, the display 44, the backlight guide plate 43, and/or the touch screen 46 may be positioned at least partially within the frame 58. In one example, the display 44, the backlight guide plate 43, and/or the touch screen 46 may be at least partially positioned within the space 59 defined by the frame 58. In some cases, one or more connectors 48, as best shown in FIGS. 16-20, of the frame 58 (e.g., back stop features adjacent the back side 58b of the frame 58 or front stop features adjacent the front side 58a of the frame 58) may stop the display 44, the backlight guide plate 43, and/or the touch screen 46 from sliding out of the back side 58b and/or the front side 58a of the frame 58.

In some cases, when the display sub-assembly 24 is positioned within the first sub-assembly 14, the backlight guide plate 43 may be positioned at least partially between the display 44 and the first PCB or PWB 19. In one illustrative example of when the display sub-assembly 24 may be positioned within the first sub-assembly 14, some of the features thereof may be positioned in the following order (e.g., from front to back): the touch screen 46 (e.g., a touch screen module 46), the display 44 (e.g., a display module), the backlight guide plate 43, and the reflective layer 45, all secured relative to the frame 58. The frame 58 may then secure the display sub-assembly 24 to the first PCB or PWB 19. In some cases, one or more connectors 48 of the frame 58 (e.g., one or more first interference tabs 48a, as best shown in FIGS. 16, 19, and 18, on the front side 58a and/or the back side 58b of the frame) may engage the first PCB or PWB 19 to releasably secure the display sub-assembly 24 to the first PCB or PWB 19. The one or more connectors 48 may releasably engage the first PCB or PWB 19 through any type of connection including an interference connection where the connectors 48 extend through an opening or hole in the first PCB or PWB 19 to make a releasable connection and/or through any other type of suitable connection.

In some instances, the first sub-assembly 14 may be assembled according to an illustrative method. In one example method, a display 44, a touch screen 46, and/or a backlight guide plate 43 may be connected to the frame 58 with an interference connection or any other type of connection using one or more connectors 48 (e.g., interfering tabs 48b or other connectors on the back side 58b of the frame 58). In some cases, an interference connection may be a snap connection. When in the frame 58, the backlight guide plate 43 may be positioned behind (e.g., toward the back side 58b of the frame 58) the display 44. Illustratively, the method may further include connecting the frame to the first PCB or PWB 19 using an interference connection with one or more connectors (e.g., interfering tabs 48a or any other connectors), such that the backlight guide plate 43 is adjacent to the first PCB or PWB 19, and such that one or more of the reflective features 63 of the frame may align with a corresponding light source 52 on the first PCB or PWB 19.

The touch screen 46 and/or the display 44 of the display sub-assembly 24 may be secured within the enclosure 12 (e.g., within housing 13), as shown for example in FIG. 11, such that an ESD may have a path to a ground pad or grounding feature of the first PCB or PWB 19, such that the ESD does not negatively affect (e.g. damage) the display 44 or other components. In some cases, a conductive trace 56 along, adjacent, or parallel to a perimeter of a touch screen 46 of the display sub-assembly 24 may provide a path for the ESD from the touch screen 46 or other feature to a grounding feature. Illustratively, the conductive trace 56 may extend adjacent or along and spaced from a perimeter of the aperture 15 in the housing that exposes at least part of the front side 24a of the display sub-assembly 24 for viewing by a user. In one example, the conductive trace 56 may be positioned on the first side 24a of the display sub-assembly 24 between the first side 24a and the housing 13 (e.g., the cover 13a of the housing 13).

In some cases, the touch screen 46 may include a conductive trace 56 at, around, adjacent to, spaced from, and/or parallel to a perimeter of the touch screen 46, as best shown in FIGS. 23-28. The conductive trace 56 may form a complete loop (e.g., a closed loop) or may include one or more gaps therein so as to not form a closed loop. In an illustrative example, the conductive trace 56 may form a closed loop or non-closed loop and may be disposed on or adjacent the front side 24a of the display sub-assembly 24, where the conductive trace 56 may be disposed at, around, adjacent to, inward from, and/or parallel to the perimeter of the touch screen 46 forming the first side of the display sub-assembly 24.

Figure 23:
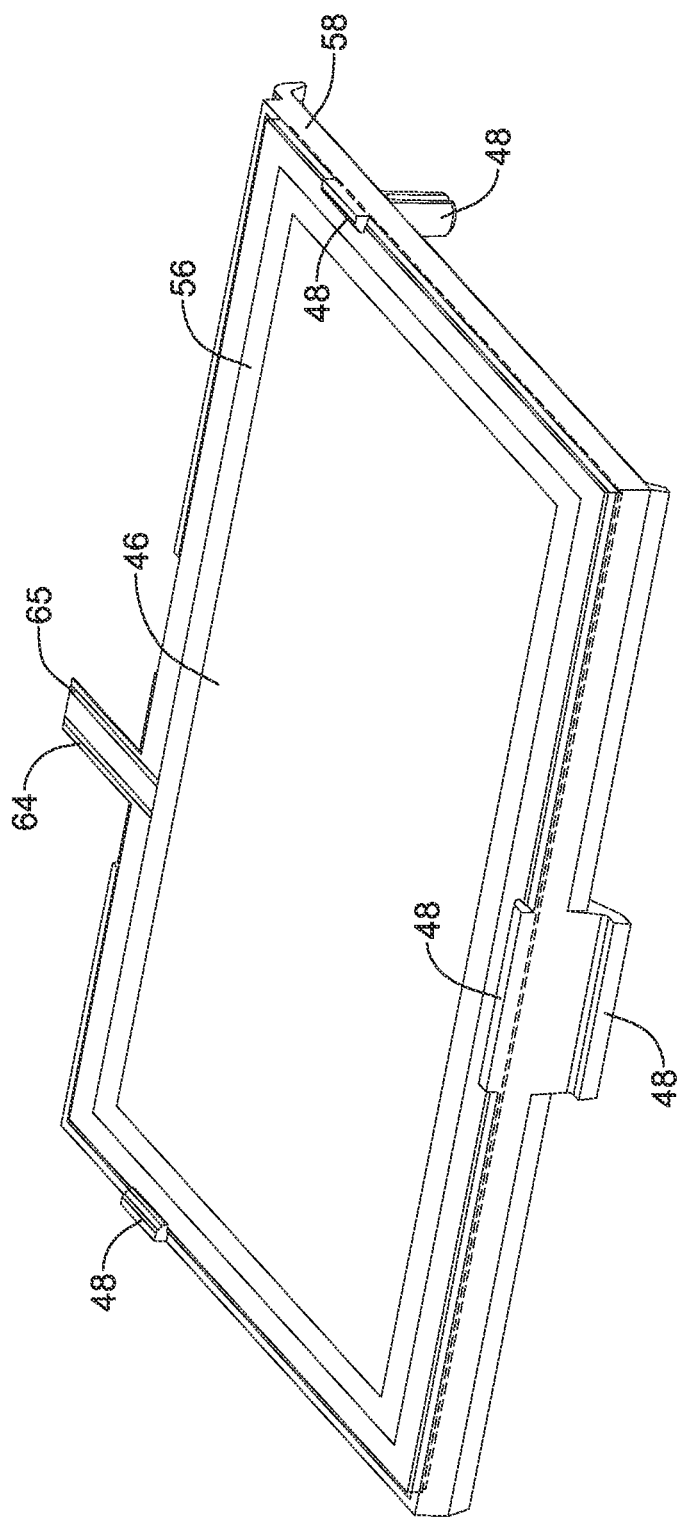
FIGS. 23-28 are perspective top views of different displays mounted in the frame of the illustrative display assembly.
Figure 24:
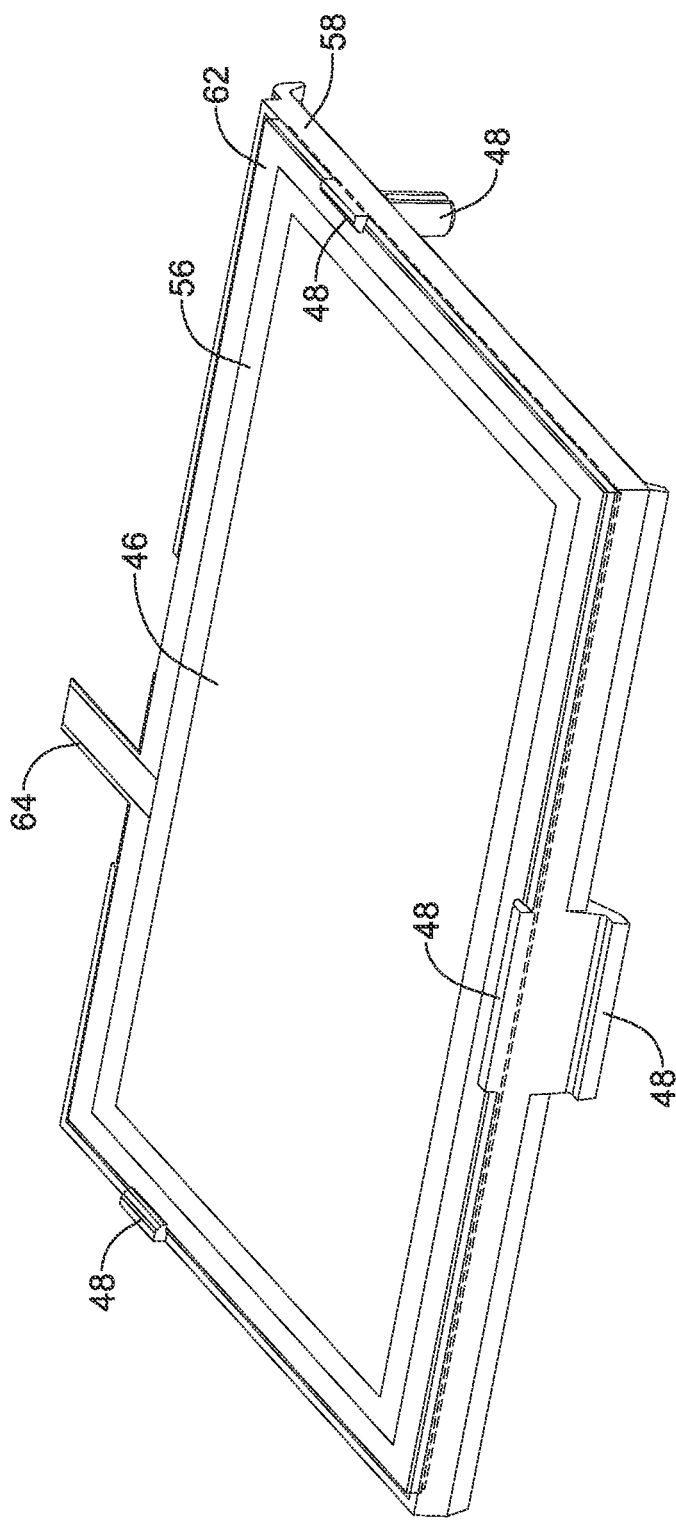
Figure 25:
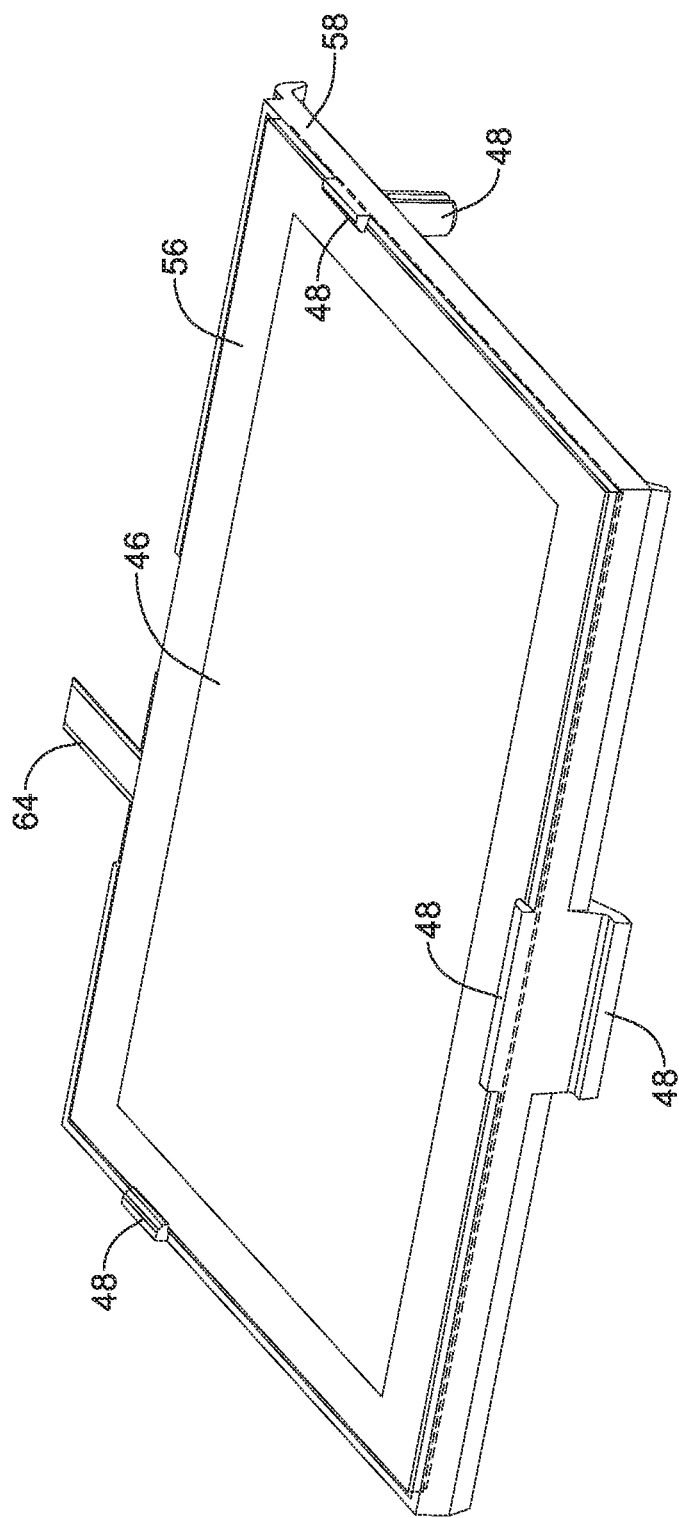

In some instances, no adhesive or glue is used between the conductive trace(s) 56 and an edge of the touch screen 46 to facilitate creating an electrical path that ESD will follow. In FIG. 23, the conductive trace 56 is added on top of the touch screen 46, where new wires or traces 65 on a tail 64 connect the conductive trace 56 to a ground plane or ground feature on the first PCB or PWB 19. Alternatively, or in addition, the conductive trace 56 may be added to the display sub-assembly in any other manner. As shown in FIG. 24, the conductive trace 56 is connected to one of the existing wires on the tail 64. In some illustrative cases, the conductive trace(s) 56 may be spaced inward from an outer edge of the touch screen 46 of the display sub-assembly 24, as shown.

The conductive trace(s) 56 may be implemented in one or more of several different manners to effectively provide a path for the ESD to a grounding feature of or on the PCB or PWB 19, 20. For example, to provide a path for an ESD to a grounding feature of or on the PCB or PWB 19, 20, the conductive trace(s) 56 may extend to an edge of the display 44 (see FIG. 25), strips 60 of a conductive material may be applied to the touch screen 46 that are, or are electrically connected to, the conductive traces 56 and extend to an edge of the touch screen 46 (e.g., thin strips that may be spaced approximately 0.2 inches apart and have a width of 0.02 inches, or other strips configured in any manner as desired) (e.g. see FIG. 26), openings or holes 61 may be placed in the conductive trace (e.g., holes spaced approximately 0.1 inches, 0.2 inches, 0.3 inches, or any other distance apart and having a diameter of approximate 0.01 inches, 0.02 inches, 0.03 inches, 0.04 inches, 0.05 inches, or any other diameter) (e.g. see FIG. 27), one or more portions 57 (represented by the hashed lines in FIG. 28) of a foil layer 62 of the touch screen 46 may be removed from the edge of the touch screen 46 to an outer edge of the conductive trace(s) 56 (e.g., the foil layer 62 may be cut and removed from the touch screen 46) (see FIG.

28), and/or any other configuration may be utilized to use the conductive traces 56 and the tail(s) 64 connected thereto to provide an electrical path to a ground feature of one or more of the first PCB or PWB 19 and the second PCB or PWB 20.

Figure 26:
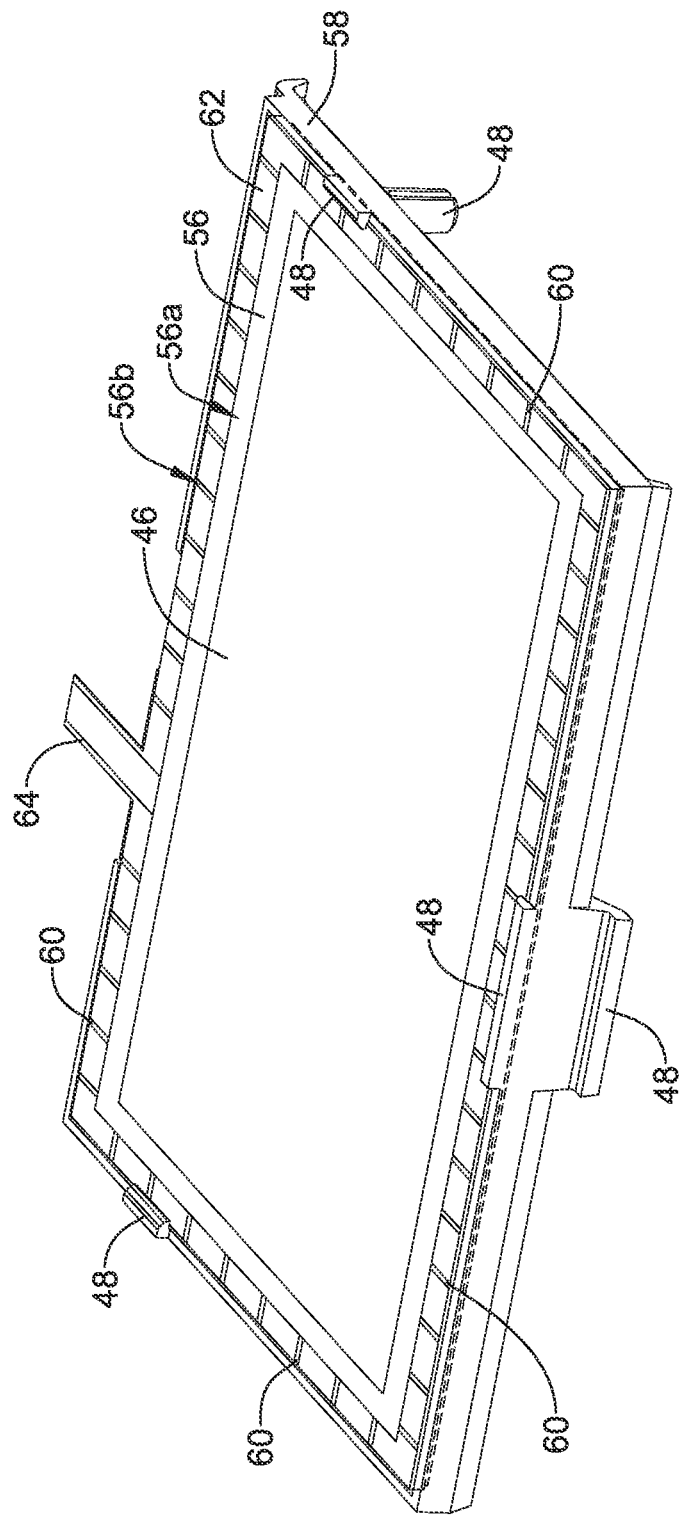
Figure 27:
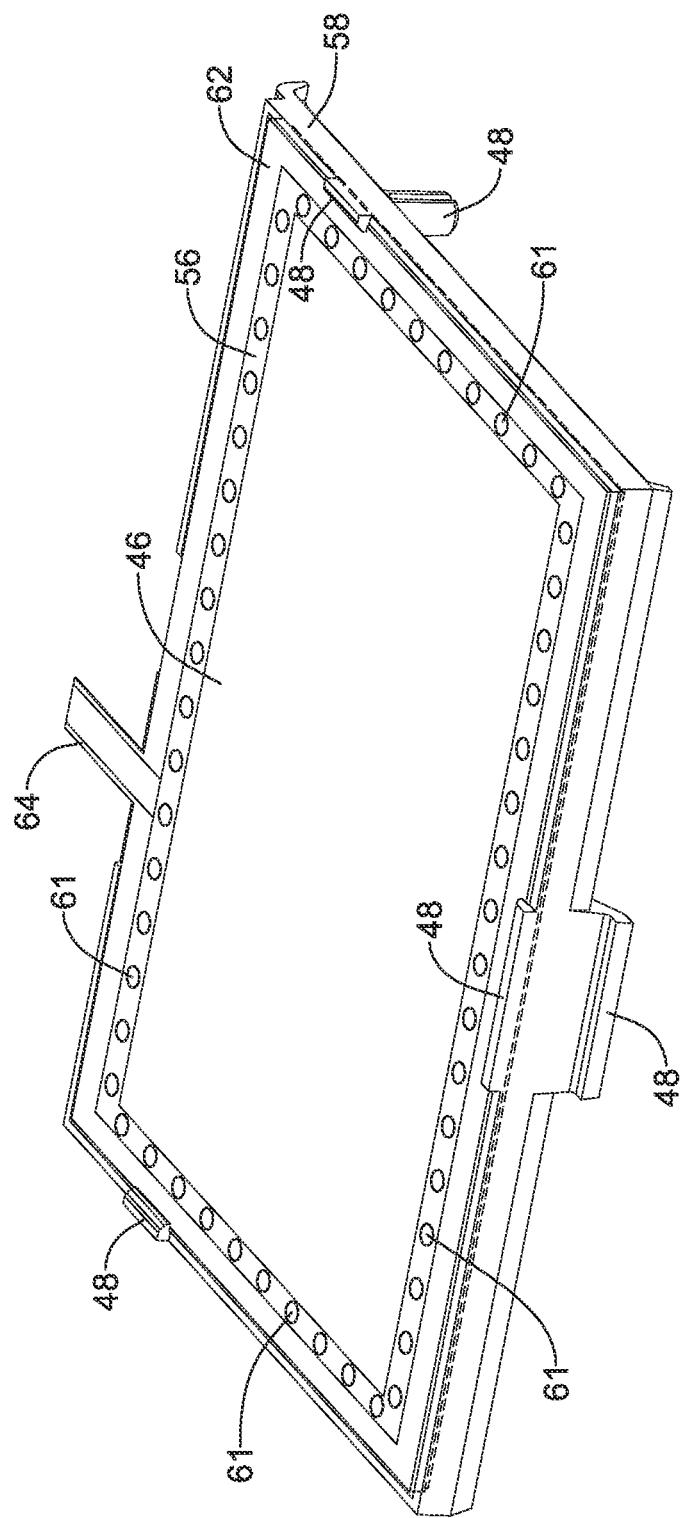
Figure 28:
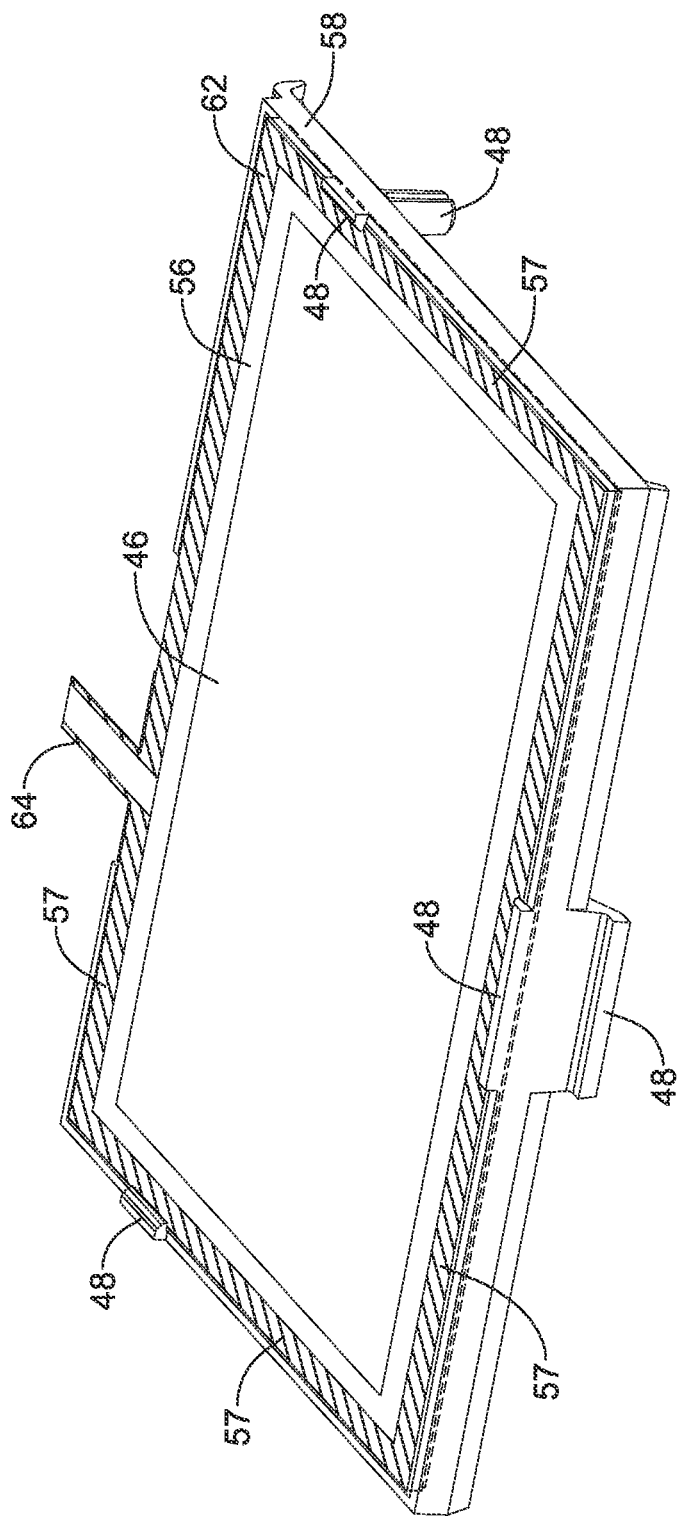

As shown in the example of FIG. 26, the conductive trace 56 may have a first portion 56a and a second portion 56b, where the first portion 56a may extend substantially or entirely around the front side 24a of the display sub-assembly 24 (e.g., at or spaced from the outer edge or perimeter of the display sub-assembly 24). The second portion 56b of the conductive trace 56 may include a plurality of strips 60 spaced from one another and extending from the first portion 56a of the conductive trace 56 toward and/or to the outer edge or perimeter of the display sub-assembly 24 (e.g., the outer edge or perimeter of the touch screen 46 or other feature of the display sub-assembly 24).

In an illustrative method of forming an electrical ESD path between the display sub-assembly 24 and the first PCB or PWB 19, a conductive trace 56 may be provided on a front side 24a of the display sub-assembly 24 (e.g., the touch screen 46) adjacent a perimeter of the display sub-assembly 24. The first PCB or PWB 19 may be positioned adjacent the back side 24b of the display sub-assembly 24 and the conductive trace 56 may be electrically connected to a grounding feature of the first PCB or PWB 19 via an electrical connector (e.g., at tail 64).

In one illustrative instance, the method may include mechanically connecting and/or removably fixing the display sub-assembly 24 to the first PCB or PWB 19. In one example, the touch screen 46, the display 44, the reflective layer 45, and the backlight guide plate 43 may be removably fixed within the frame 58 via connectors 48 and/or other connectors. The display sub-assembly 24 and the frame 58 may then be removably fixed to the first PCB or PWB 19 via connectors 48, tail 64, and/or other connectors to form a connection and an electrical ESD path between the display sub-assembly 24 and the first PCB or PWB 19.

The thermostat 10 may be configured to be used with virtually all heating and cooling systems for both residential and commercial applications. Additionally, or alternatively, the thermostat 10 may be capable of working with one or more accessories (e.g., RedLINK™ accessories or any other accessory), which may allow contractors to reduce inventory costs and/or realize other business advantages. In some instances, the thermostat 10 may be wired directly to, wired indirectly to, and/or wirelessly connected to the accessories and/or power sources.

It is contemplated that the thermostat 10 may be powered at least in part by using one or more batteries (e.g., lithium ion batteries, AA batteries, AAA batteries, etc.), alternating current (AC), and/or direct current (DC). Although the thermostat 10 may be battery powered, it may additionally, or alternatively, be wired for power, as referred to above. In one example, the thermostat 10 may have a direct or indirect wired or wireless connection to HVAC equipment in a non-zoned HVAC system and can be powered with two (2) wires (e.g., a power or hot wire and a common wire) or by battery only. In another example, the thermostat 10 may have a direct or indirect wired or wireless connection to HVAC equipment in a zoned HVAC system and can be powered with two (2) wires (e.g., a power or hot wire and a common wire) or by battery only. In a further example, the thermostat 10 may work with an equipment interface module (EMI) where one or more pieces of HVAC equipment and/or accessories may have a wired and/or wireless connection to the EIM, while the thermostat 10 is powered with two wires (e.g., a power or hot wire and a common wire) or by battery only (e.g., for a completely wireless thermostat or for other reasons). In a further example, the thermostat 10 may work with a TrueZONE™ wireless adapter or other wireless adaptor where one or more pieces of HVAC equipment and/or accessories may have a wired or wireless connection to a TrueZONE™ panel or other zone panel such that the thermostat may control a zone panel via a wireless adapter, while the thermostat 10 may be powered with two (2) wires (e.g., a power or hot wire and a common wire) or by battery only (e.g., for a completely wireless thermostat or for other reasons). In some instances, the processor or controller of the thermostat 10 may be programmable to send control signals for HVAC components through the EIM, the wireless adapter, the zone panel and/or directly or otherwise indirectly to one or more of the HVAC components.

It is contemplated that latching relays may be used to provide control signals from the thermostat 10 and to an HVAC system or the like. Due to their relatively low power consumption, latching relays may be particularly useful when the thermostat 10 is battery powered. Latching relays, however, remain in their last state (latched state) until power is applied to switch the state. Thus, without proper control, the latching relays will tend to stay in their previous latched state when battery (or other) power is disconnected, and/or when becoming disconnected from a controlling microcontroller. This can cause an HVAC system to remain in a non-desirable state if either of these conditions occurs.

As detailed above, the second sub-assembly 16 may include a second PCB or PWB 20 with electronic components 22 (e.g., terminal blocks 33, relays, latching relays, etc., of which only a few are illustratively labeled in the Figures) and/or other features or components. In some cases, one or more wires from a building conditioning system (e.g., a heating, ventilation, and air conditioning (HVAC) system) may connect to the terminal block 33 or other component of the second PCB or PWB 20 of the second sub-assembly 16. A microcontroller of the first PCB or PWB 19 may generate control signals to control the state of one or more latching relays on the second PCB or PWB 20. The one or more latching relays may then provide a corresponding control signal to the HVAC system via wires connected to the terminal blocks 33. If power is disconnected, and/or if the first sub-assembly 14 is separated from the second sub-assembly 16, the latching relays will remain in their previous latched state. This can be undesirable. For example, if the previous latched state corresponds to a furnace "on" state, the furnace will remain "on" until power is restored, and/or until the first sub-assembly 14 is reconnected to the second sub-assembly 16, regardless of the temperature in the building. This can waste energy, create uncomfortable conditions, and in some cases, can cause damage.

Figure 29:
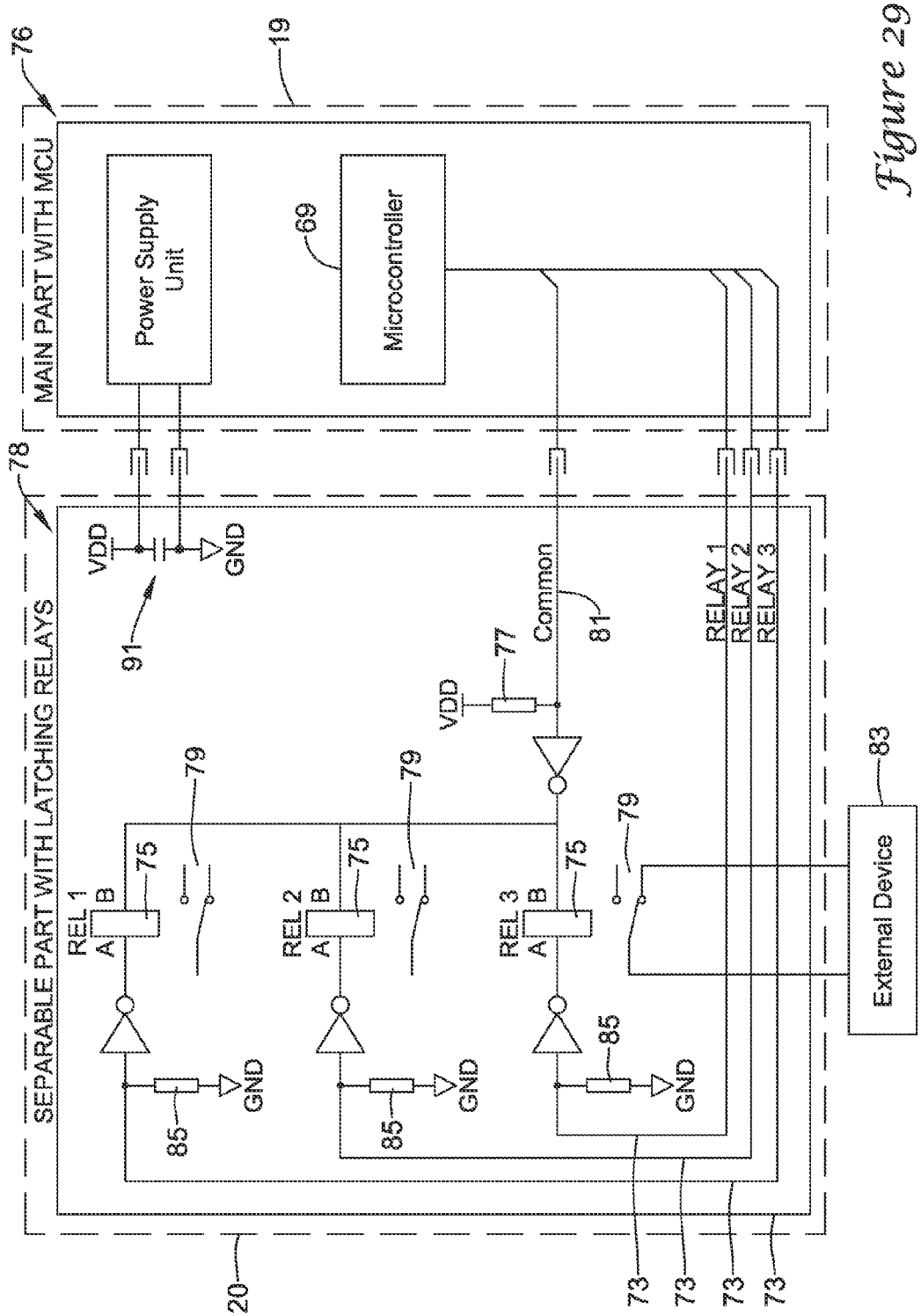
FIG. 29 is a schematic diagram for an illustrative thermostat assembly that is set the wiring terminals of the thermostat assembly to a safe state when a main thermostat sub-assembly is removed from a wall plate sub-assembly.

As seen in FIG. 29, latching relays may be connected to a microprocessor or microcontroller 69 of a thermostat 10, such that a position (e.g., an opened position or a closed position or other position) of the latching relays may be controlled by the microprocessor or microcontroller 69. At times (e.g., when dismounting a portion of the thermostat), it may be desirable to separate the microprocessor portion (first portion 76) of the thermostat 10 from the other portion (e.g., second portion 78) that includes the latching relays. As noted above, this can cause the latching relays to be left in an undesirable or improper position.

In some instances, the microcontroller 69 and/or other processors of the first portion 76 of the thermostat 10, which may or may not include ESD sensitive components, may be located on the first PWB or PCB 19 having a first set of circuitry thereon to which the microcontroller 69 may be connected. The second portion 78 of the thermostat 10 may include the second PWB or PCB 20 secured relative to a second housing 17 of the second sub-assembly 16, where the second portion 78 of the thermostat 10 may be releasably securable to the first portion 76 of the thermostat 10. The second PWB or PCB 20 may include a second set of circuitry (e.g., circuitry that may or may not include ESD sensitive components, but does include at least one or more relays, one or more capacitors, and/or one or more terminal blocks 33) capable of being powered by a power source $V_{DD}$ (e.g., wired power, batteries, etc.), and configured to receive one or more control signals from the first PWB or PCB 19 when the second portion 78 is releasably engaged with the first portion 76. The second PWB or PCB 20 may also provide one or more corresponding control signals to the one or more output terminals of the second portion 78 for control of one or more HVAC component in communication with the thermostat 10. In some cases, the circuitry of the second PWB or PCB 20 may be configured to set one or more output terminals of the second portion 78 to a predetermined state when the first portion 76 is released and/or at least partially disengaged from the second portion 78 (e.g., disengage electrical communication from the first PWB or PCB 19 to the second PWB or PCB 20). In one illustrative example, the circuitry of the second PWB or PCB 20 will automatically set the output terminals of the second portion 78 to a predetermined state when the first sub-assembly 14 ceases electrical communication with (e.g., is released and/or at least partially disengaged from) the second sub-assembly 16.

It is contemplated that latching relays 79, which may be located on the second PCB or PWB 20 of the second sub-assembly 16, may be properly configured (e.g., configured to set the output terminals to the predetermined state) when separated from a microprocessor or microcontroller 69 or the like (e.g., when the first sub-assembly 14 is separated from the second sub-assembly 16). For example, when the first portion 76 and the second portion 78 are engaged (e.g., in electrical communication), the configuration of the latching relays 79 may be controlled by the microcontroller 69, and when the first portion 76 and the second portion 78 become disengaged, the configuration of the latching relays 79 may be set by circuitry on the second portion 78.

In one example of utilizing the second set of circuitry on the second portion 78 to control the position of the latching relays 79 when the first sub-assembly 14 (e.g., first portion 76) becomes disengaged from the second sub-assembly 16 (e.g., second portion 78) (e.g., when the first sub-assembly 14 may be electrically disengaged from the second sub-assembly 16), pre-set logic levels on a control bus or on appropriate terminals may position the one or more latching relays 79 into a configuration that provides one or more corresponding control signals to the one or more output terminals of the second portion 78. In some instances, this may be accomplished through the use of one or more pull-down resistors 85 and/or one or more pull-up resistors 77 of the second set of circuitry on the second PWB or PCB 20. In an illustrative example, the approach used to properly position the latching relays 79 when the first portion 76 is disengaged from the second portion 78 (e.g., position the latching relays 79 so as to turn off connected external devices or position the latching relays 79 in any other predetermined manner) may be preordained for single-coil relays driven by an coil 75. In some examples, the system may include two pull-down resistors 85 and one pull-up resistor 77, or other configurations of resistors and/or electrical components capable of positioning the latching relays in a predetermined position so as to turn off connected external devices when the first portion 76 is at least partially electrically disconnected from the second portion 78.

When the first portion 76 of the thermostat 10, which includes the microcontroller 69 and/or other control circuit, is separated (e.g., at least partially electrically separated) from the second portion 78 of the thermostat 10 that includes the latching relays 79, the logic levels on a control bus 73 or other terminals may no longer be set by the microcontroller 69 as they would be when the first portion 76 of the thermostat 10 is in electrical communication with the second portion 78 of the thermostat 10. With the use of appropriate pull-down 85 and/or pull-up resistors 77 (e.g., one or more pull-down resistors 85 and one or more pull-up resistors 77), the logic levels may be automatically controlled by the pull-down resistor(s) 85 and/or the pull-up resistor(s) 77 in the absence of the control signals from the microcontroller 69. As a result, once separated, the current through the relay coils of the latching relays 79 may automatically flow according to predetermined logic levels in an appropriate direction to set the state of the latching relays 79 such that all of the external devices (e.g. external device 83) are switched off. The particular state (off/on) for any particularly relay may be programmed by choosing an appropriate pull-up or pull-down resistor configuration. In some instances, the configuration utilizing pull-down resistors and pull-up resistor(s) may allow for the elimination of an auxiliary driving circuit, such as a microcontroller, a logic array, etc.

Inputs to a first part (e.g., a first terminal) and/or a second part (e.g., a second terminal) of the coils 75 may be operatively coupled to corresponding one or more control signals from the first set of circuitry of the first portion 76 of the thermostat 10 (e.g., from the microcontroller 69 of the first portion 76) when the first portion 76 and the second portion 78 are engaged (e.g., are electrically communicating). Inputs to the first terminal of the coils 75 may be pulled up by the pull-down resistors 85 through an operative coupling (e.g. inverter) therewith to VDD when the first portion 76 of the thermostat 10 is electrically disengaged from the second portion 78 of the thermostat 10. Inputs to the second terminal of the coils 75 may be pulled down by a pull-up resistor 77 and a power supply $V_{dd}$ through an operative coupling (e.g. inverter) therewith when the first portion 76 of the thermostat 10 is electrically disengaged from the second portion 78 of the thermostat 10. Thus, when the first portion 76 of the thermostat 10, which includes a microcontroller 69 or other controller, is electrically separated from second portion 78 of the thermostat 10 (e.g., electrically separated), the logic levels at the control bus 73 of the second portion 78 of the thermostat 10 may be automatically defined by the pull-down resistors 85, and the pull-up resistor 77 through the operative couplings (e.g. inverters). As a result, current may flow in the same direction through all of the rely coils 75, forcing all latching relays 79 into the same (e.g. closed) state. When the first portion 76 of the thermostat 10 having the microcontroller 69 is reconnected to the second portion 78 of the thermostat 10, the microcontroller 69 (or other circuit) provides a common signal for all of the latching relays 79 to common pin 81 to over-drive the pull-up resistor 77, and the control bus 73 may over-drive the pull-down resistors 85 to pull the relay control terminals to their desired controlled state.

In some cases, a capacitor or other power storage device 91 may be used to provide power to the second portion 78 of the thermostat 10 for a relatively short duration (e.g. less than 1 hour, less than 10 minutes, less than 1 minute, less than 1 second, etc). During this relatively short duration, the latching relays 79 may be set to a state that turns off all external devices 83. Once the latching relays 79 are latched into an appropriate state, power from the power storage device 91 may no longer be needed. The power storage device 91 may be a capacitor, battery or any other power storage device, as desired.

As can be seen, this circuit arrangement on second portion 78 of the thermostat 10 may allow for a simple, reliable, and low cost solution to controlling the state of the relays when the first portion 76 of the thermostat 10 having a microcontroller 69 or other controller is separated from the second portion 78 of the thermostat 10 that includes latching relays.

Figure 30:
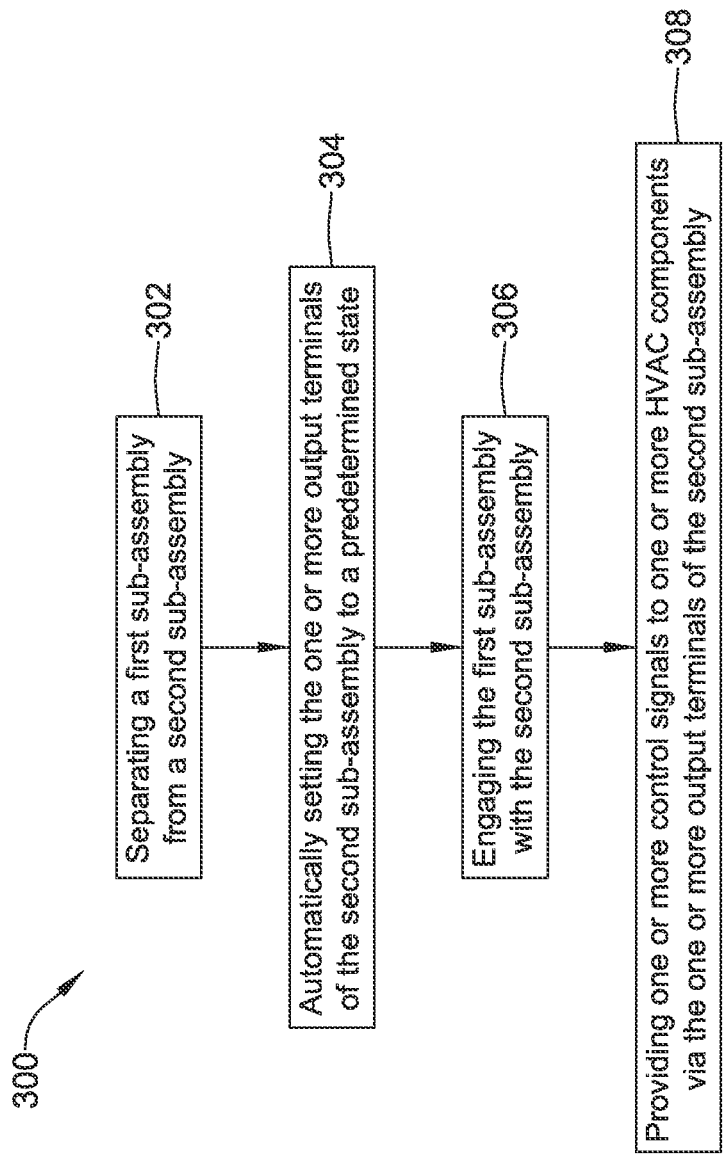
FIG. 30 is a flow diagram of an illustrative method of operating a thermostat assembly.

FIG. 30 is an illustrative method. In method 300, the first sub-assembly 14 may be separated (e.g., electrically separated) from the second sub-assembly 16, as shown at 302. As discussed above, the second sub-assembly 16 may include one or more output terminals connected to one or more external devices (e.g., a furnace, an air conditioning unit, a humidifier, a dehumidifier, etc.). Once the second sub-assembly 16 is electrically separated from the first sub-assembly 14, one or more output terminals of the second sub-assembly 16 may be automatically set to a predetermined state, as shown at 304. In one example, the output terminals of the second sub-assembly 16 may be automatically set to a predetermined state (e.g., such that connected external devices are turned off) by automatically setting one or more latching relays 79 of the second sub-assembly 16 to the predetermined state, where the latching relays 79 are otherwise controlled with control signals from the first sub-assembly 14 when the first sub-assembly 14 and the second sub-assembly 16 are releasably engaged or otherwise in electrical communication with each other. The first sub-assembly 14 and the second sub-assembly 16 may be reengaged 306 such that one or more control signals from first sub-assembly 14 may be provided 308 to the second sub-assembly 16. The one or more control signals may cause the second sub-assembly 16 to provide one or more control signals to one or more external devices (e.g., HVAC components or other components) via the output terminals of the second sub-assembly 16.

In some cases, the second side 20*b* of the second PCB or PWB 20 may include one or more test pads. In one illustrative example, the test pads of the second side 20*b* of the second PCB or PWB 20 may be connected and are suitable for performing functional tests of the microcontroller 69 and/or other circuitry of the first PCB or PWB 19, and/or circuitry of the second PCB or PWB 20, when the first sub-assembly 14 is releasably engaged with the second sub-assembly 16.

The display sub-assembly 24 may create an interface display 100 on the display 44, which a user may interact with in any manner, including, but not limited to, interacting with the interface display 100 through touching a screen, buttons adjacent to or on the interface display 100, a remote device, and/or though some other interaction mechanisms. In some instances, the interface display 100 may be provided by a display 44 that has a 2-dimensional array of pixels that covers the full display area of the display 44. In some instances, the interface display 100 may be provided by a display 44 that is a segmented display, which includes a plurality of predefined segments that can be switched on and off to give the appearance of desired characters, icons or other graphical features. In a segmented display, the predefined segments are not arranged in a full 2-dimensional array of pixels that covers the full display area of the display 44. Rather, at least some of the predefined segments are elongated, define a symbol or icon, or otherwise do not fall into a simple 2-dimensional array of pixels. It is contemplated that the display 44 may be any suitable display panel using any suitable display panel technology including, for example, Eidophor, Electroluminescent display (ELD), Electronic paper (E Ink, Gyricon), Light emitting diode display (LED), Cathode ray tube (CRT) (Monoscope), Liquid-crystal display (LCD) (TFT, LED, Blue Phase, IPS), Plasma display panel (PDP) (ALiS), Digital Light Processing (DLP), Liquid crystal on silicon (LCoS), Organic light-emitting diode (OLED) (AMOLED), Organic light-emitting transistor (OLET), Surface-conduction electron-emitter display (SED), Field emission display (FED), Laser TV (Quantum dot, Liquid crystal), MEMS display (IMoD, TMOS, DMS), Quantum dot display (QD-LED), Ferro liquid display (FLD), Thick-film dielectric electroluminescent technology (TDEL), Telescopic pixel display (TPD), Laser Phosphor Display (LPD).

In some instances, the display 44 may be a segmented display that has predefined segments that: (1) define a 2-dimensional array of pixels in a first region or area 104 of the display 44; and (2) define segments of segmented characters, symbols or icons, or otherwise do not fall into a simple 2-dimensional array of pixels in a second region or area 102 of the display 44. For simplicity, the first region or area 104 may sometimes be referred to as a dot matrix display area, and the second region or area 102 may be referred to as a fixed segment display area, even though in some cases the first region or area 104 may be formed from an array of fixed segments that are configured as a 2-dimensional array of fixed segment pixels. The first region or area 104 may function as a message center that can be used to display text based messages, animations, and/or other information. In some cases, the first region or area 104 may be configured to only display two (2) lines of text, but this is just one example. In some cases, the second region or area 102 may encompass the remainder of the display 44 that is not part of the first region or area 04. In some cases, the display 44 may be an LCD display panel, where each of the plurality of predefined segments in both the first region or area 104 and the second region or area 102 are each layed out on a substrate and independently controllable by the processor or controller of the first sub-assembly 14. Such an LCD panel may consume relatively low power (e.g. suitable for battery powered devices), and may be selectively backlit by the backlight system 42 of the display sub-assembly 24.

The one or more areas (e.g., the second area 102, the first area 104, and/or other areas) may be controllable with software, firmware, and/or other computer executable instructions stored on a non-transitory computer readable medium of the thermostat 10 or other device that is capable of communicating with the thermostat 10. In some instances, the thermostat 10 may include memory and/or a processor that is configured to save, record, and/or operate the software, firmware, or other computer executable instructions.

For purposes of this disclosure, where the interface display 100 is described as having first, second, and so on portions, the numerical indicators (e.g., first, second, third, etc.) are meant for explanatory purposes only and are not meant to be limiting unless otherwise indicated. The numerical indicators may are used for clarity purposes to distinguish between one feature relative to another and the numerical indicators may be switched.

In some cases, the message center (e.g., the first area 104 with a two (2) line dot matrix area) may be capable of displaying up to three full lines of text (e.g., three full lines of text or graphics, two full separate lines of text or graphics and up to two half or partial lines of text or graphics, two partial lines of text or graphics with one or more full lines of texts or graphics, etc.). The full and/or partial lines of text or graphics may be full or partial lines in the vertical and/or horizontal directions. In one example, the first area 104 may simultaneously display in a vertical direction an integer number of options (e.g., on a full line of text or graphics) plus a fraction of an option (e.g., on a partial line of text or graphics, on about a half line of text or graphics, etc.). In a further example, the first area 104 of the interface display 100 may simultaneously display in a vertical direction two options on separate full lines of text plus a fraction of a third option on a partial line of text. The options discussed herein may include, but are not limited to, lists of options, selectable options, installer setup options, sensor control options, program scheduling options, programmable options, menu list items or options, questions or queries, informative messages, directions, alerts, warnings, logs, other options capable of being displayed on a message center, and/or any combinations thereof. Such displayable options may be used together or separate and/or may viewed or obtained by selection of another option.

In some cases, programmable options may be used to set settings of the thermostat 10 that may be used for controlling subsequent operation and/or functionality of the HVAC controller. As such, selection of the options in the first area 104 of the interface display 100 may allow a user to set or change a programmable option that may modify a subsequent operation and/or functionality of the thermostat 10. Illustratively, subsequent operation and/or functionality of the HVAC controller may include, among other features, where temperature and/or humidity is sensed, how temperature and/or humidity is sensed, a schedule for the HVAC components of the HVAC controller, etc. In some cases, menu options may be used to navigate to a menu that may allow a user to change an option that modifies subsequent operation and/or functionality of the thermostat 10.

In some instances, the controller or processor of the thermostat 10 may be programmed such that first area 104 of the user interface display 100 displays one or more captions in a first line of text and a check box or other toggle box or other feature in a second row above or below the row with the one or more captions. An option displayed in the first area 104 with a caption may be selected by touching or pressing a button of the thermostat 10 and/or by touching an active touch area in the first area 104 of the user interface display 100. The button may be an defined button in the second area 102, a hard button that is situated adjacent to the screen, or any other suitable button. The active touch area in the first area 104 may be an active touch area associated with the displayed option and may take up the entire first area 104 or a portion of the first area 104 that is less than the entire first area 104. Once an option displayed in the first area 104 is selected, a check box or toggle box may depict a selection has been made, for example, by displaying a check in a box, an X in a box, by filling in a box, and/or otherwise marking a box or about a box to indicate the displayed option has been selected. Additionally, or alternatively, a previously selected box may be deselected by touching or pressing a button of the thermostat and/or by touching an active touch area of the first area 104 that is associated with the displayed option. Such a display of options with a check box or toggle box may be utilized for selection of days of the week, holidays, and/or vacation days for setting a schedule, for setting which air sensors to use for sensing environmental conditions, and/or for any other option which may be selected and/or deselected. This is just one example of how an option may be selected.

In some instances, the controller or processor of the thermostat 10 may be programmed such that the message center (e.g., first area 104) may provide an instruction, a query, and/or a question or a sequence of instructions, queries, and/or questions (e.g., one or more queries or questions, two or more queries or questions, etc.) to a user viewing and/or using the message center. Additionally, or alternatively, the message center may be capable of accepting responses to queries and/or questions, which may be processed by the processor or controller of the thermostat 10. Illustratively, responses may include a selection of a displayed option, entering text, and/or other responses in the first area 104 and/or the second area 102 of the interface display 100, and/or via one or more hard buttons of the thermostat 10.

In response to the acceptances of responses or answers, the thermostat 10 may configure the processor or controller to operate under one of the three control configurations discussed above, one or more of the two power configurations, and/or may configure the processor or controller of the thermostat 10 in one or more other manners. Illustratively, the questions or queries and/or the accepting of responses or answers may be part of one or more setup processes or other processes to identify one or more HVAC components to be controlled by the thermostat, to identify one or more thermostat settings, to identify one or more configuration settings, to identify one or more power configurations, etc.

Instructions, queries, and/or questions may be utilized for any purpose, for example, for setting up a schedule of operation for the thermostat. In such instances, example instructions, queries, and/or questions may include, but are not limited to: SELECT DAYS WITH SAME SCHEDULE.; PRESS NEXT AFTER SELECTING DAY. (e.g., after selecting a day, this new instruction may be displayed in the first area 104); IS SOMEONE HOME ALL DAY? NO OR YES (e.g., where NO and YES may have separate associated active touch areas and/or may be selectable by selecting a button in communication with a processor or controller of the thermostat 10); WHEN DOES THE FIRST PERSON WAKE UP?; WHEN DOES THE LAST PERSON LEAVE?; WHEN DOES THE FIRST PERSON RETURN?; WHEN DOES THE LAST PERSON GO TO SLEEP?; SET YOUR WAKE TEMPERATURE.; SET YOUR LEAVE TEMPERATURE.; SCHEDULE YOUR FAN TOO?; WAKE FAN SETTING.; LEAVE FAN SETTING; RETURN FAN SETTING; SLEEP FAN SETTING; SCHEDULE MORE DAYS?; REPEAT STEPS IF YOU WANT TO SCHEDULE MORE DAYS.; REVIEW SCHEDULE?; SAVING CHANGES.; and/or any other instructions, queries, and/or questions, as desired.

In some instances, the controller or processor of the thermostat 10 may be programmed or otherwise configured to display one or more options of the thermostat 10 in the first area 104 of the interface display 100 for selection by a user (e.g., selectable options), as referred to above. The processor or controller of the thermostat 10 may allow a user to select one or more options (e.g., select a single displayed option or select between two or more options, etc.), where the options may be displayed in the first area 104 of the thermostat 10.

In one instance, the controller or processor of the thermostat 10 may be configured to display less than all of the two or more options (e.g., display one line of an option and less than a full line of another option) in the first region of the display at any given time. Any of the options or items displayed in the first area 104 may be available for selection by a user by one or more of touching the option and interacting with one or more buttons.

In some cases, the controller or processor of the thermostat 10 may be programmed or otherwise configured to animate one or more options or items displayed in the first area 104. For example, animated options or items may include displayed options or items in the first area 104 that a user may scroll through. In one example, as a user scrolls through the displayed options or items, the options or items may appear to move in a vertical, horizontal, or vertical and horizontal direction, and/or any combination thereof including diagonal directions. Although the options or items may be animated in any manner, in some cases the animation of the one or more options or items may include incrementally moving the one or more options or items so that the one or more of the options or items appear to move in the first area 104 of the interface display.

In some instances, the first area 104 of the interface display 100 may display an option on a full line of text (e.g., an integer option) therein and one or more options on one or more partial lines of text above and/or below the full line of text. Illustratively, the presence of options listed on one or more partial lines of text above and/or below the full line of text may indicate to the user that there are additional available options by scrolling up and/or down, respectively. In instances when an option is displayed on a partial line of text below the full line of text, and no option is displayed above the full line of text, a top of the list may be indicated and further options may be displayed by scrolling down though the options. In instances when an option is displayed on a partial line of text above the full line of text, and no option is displayed below the full line of text, a bottom of the list may be indicated and further options may be displayed by scrolling up though the options.

The options or items displayed in the first area 104 may be scrolled through (e.g., in a direction of a partial line of text) and/or selected by interacting with a button of the thermostat 10 and/or touching the interface display 100 and interacting with the touch screen 46. In some cases, interacting with and/or activation of a button of the thermostat 10 may cause the controller or processor of the thermostat 10 to selectively animate one or more of the options or items displayed in the first area 104. The button(s) of the thermostat 10 may correspond to a physical button that may be offset from the interface display 100 and/or the button(s) of the thermostat 10 may correspond to a button region defined on the interface display 100 in one or more of the first area 104 and the second area 102. In one example, the second area 102 may include one or more predefined touch regions, where each touch region of the second area 102 may correspond to a different button of the thermostat 10. Illustratively, selection of a button (e.g., an arrow 114, 116 or other button) in the second area 102 of the user interface display 100 may cause the processor or controller to highlight a different selectable option in the first region of the user interface display 100 and touching the button multiple times may cause the processor or controller to highlight another selectable option in the first area 104 of the user interface display 100.

In some cases, the options or items displayed on the first area 104 of the interface display 100 may be scrolled through and/or adjusted by touching the touch screen 46. In one example, to scroll through and/or navigate between two or more selectable options, the processor or controller may be configured to recognize when a user touches the interface display 100 and moves along the touch screen 46 (e.g., moves along the touch screen 46 in a swiping manner, such as a dragging or pushing motion). In response to recognizing the movement along the touch screen, the two or more options may be animated and/or scrolled through in a vertical and/or horizontal manner. Additionally, or alternatively, the processor or controller of the thermostat 10 may recognize swiping motions on the touch screen 46 within the first area 104 of the interface display 100 and may display one or more next screens in a sequence of screens (e.g., when setting a schedule, when setting up the thermostat, and/or when using other sequences of screens).

In some cases, the processor or controller may be configured to accept a selection of a displayed option by detecting a user touch of the displayed selectable option via the touch screen 46. In some cases, the processor or controller of the thermostat 10 may define an active touch area for each selectable option (e.g., touch selectable option) displayed on the display 44 of the thermostat 10 (e.g., a touch selectable option displayed on the first area 104 and/or the second area 102 of the interface display 100). The active touch area for each selectable option may or may not be viewable in normal use of the thermostat 10. In one example, when two or more selectable options are displayed simultaneously on the first area 104 of the interface display 100, the processor or controller may define an active touch area for each of the two or more selectable options such that if a user touches the interface display 100 within a defined active touch area the associated selectable option will be selected.

Figure 34:
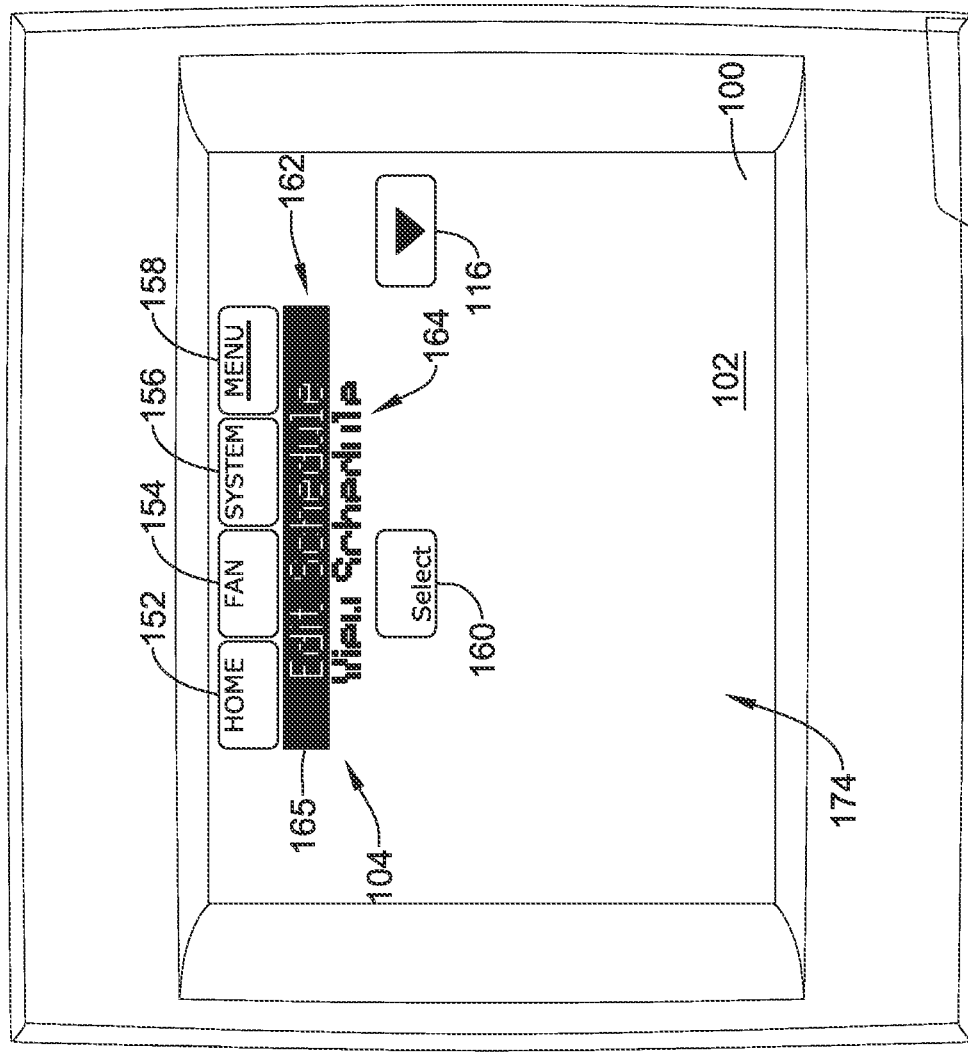
FIG. 34 shows an illustrative menu screen.

In some instances, the processor or controller may highlight a selected selectable option in response to receiving a user touch within an active touch area and/or in response to receiving any other selection signal for a particular selectable option or set of options. The highlighted portion 165 may represent the entirety of the active touch area associated with the selectable option, as best shown in FIG. 34. Alternatively, the highlighted portion may not represent the entirety of the active touch area associated with the selectable option. In one example of highlighting a selectable option, the processor or controller may be configured to highlight a selectable option response to receiving a first user touch at a position of the interface display 100 associated with a selectable option (e.g., within an active touch area) and then selecting the selectable option upon a second touch by a user or by a touch and hold by a user, where selecting the selectable option may include the thermostat 10 (e.g., the controller or processor thereof) performing an action associated with the selected selectable option.

In an illustrative method, a first selectable option may be displayed in the first area 104 of the interface display 100 of the thermostat 10. A user may provide an input and the thermostat 10 may accept they input, where the input may correspond to interacting with the first selectable option. In response to accepting the input from the user, the controller may animate the first selectable option (e.g. move horizontally or vertically off the screen) and animate a second selectable option (e.g. move horizontally or vertically onto the screen) in the first area 104 of the interface display 100 of the thermostat 10. Further, a user may provide an input that relates to the second selectable option, and the controller or processor of the thermostat 10 may accept the input from the user and select the second selectable option. In some instances, the second selectable option may be highlighted and/or a new display may be displayed in response to the selection of the second selectable option.

Figure 32A:
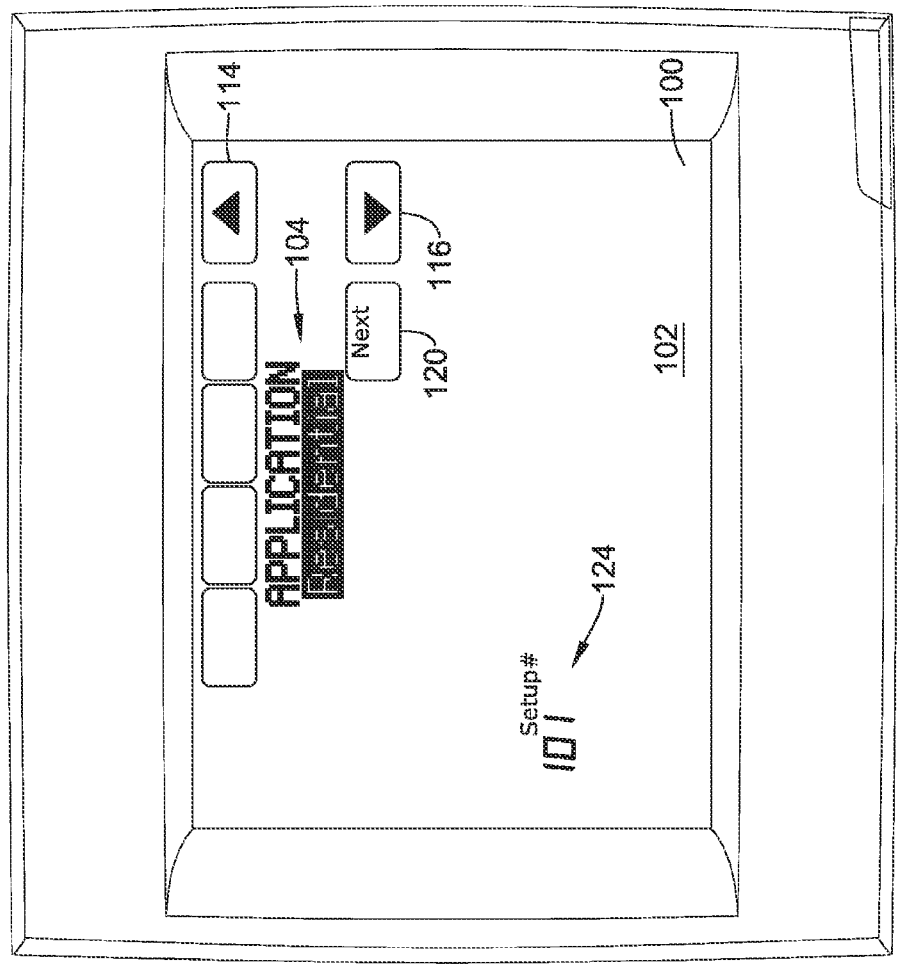
FIGS. 32A-32AA are schematic diagrams showing an initial setup process for an illustrative thermostat.
Figure 32B:
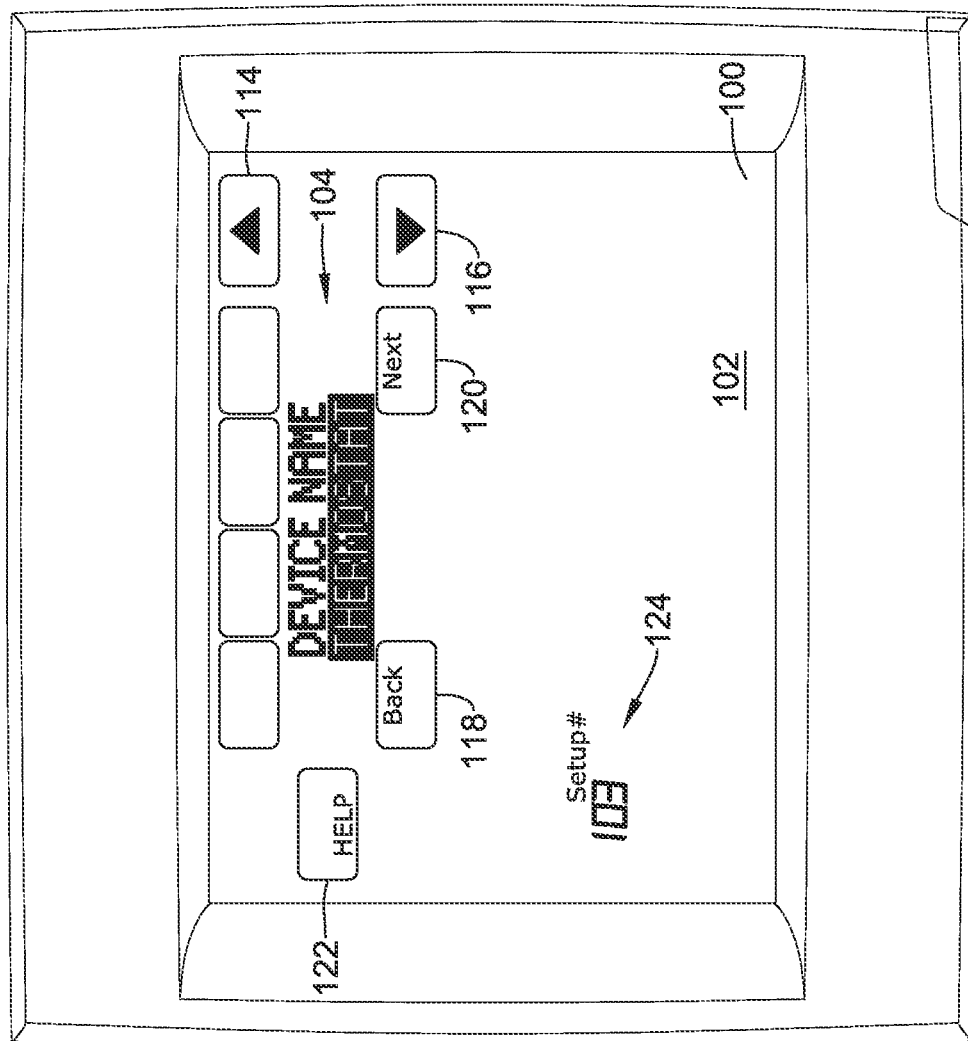
Figure 32C:
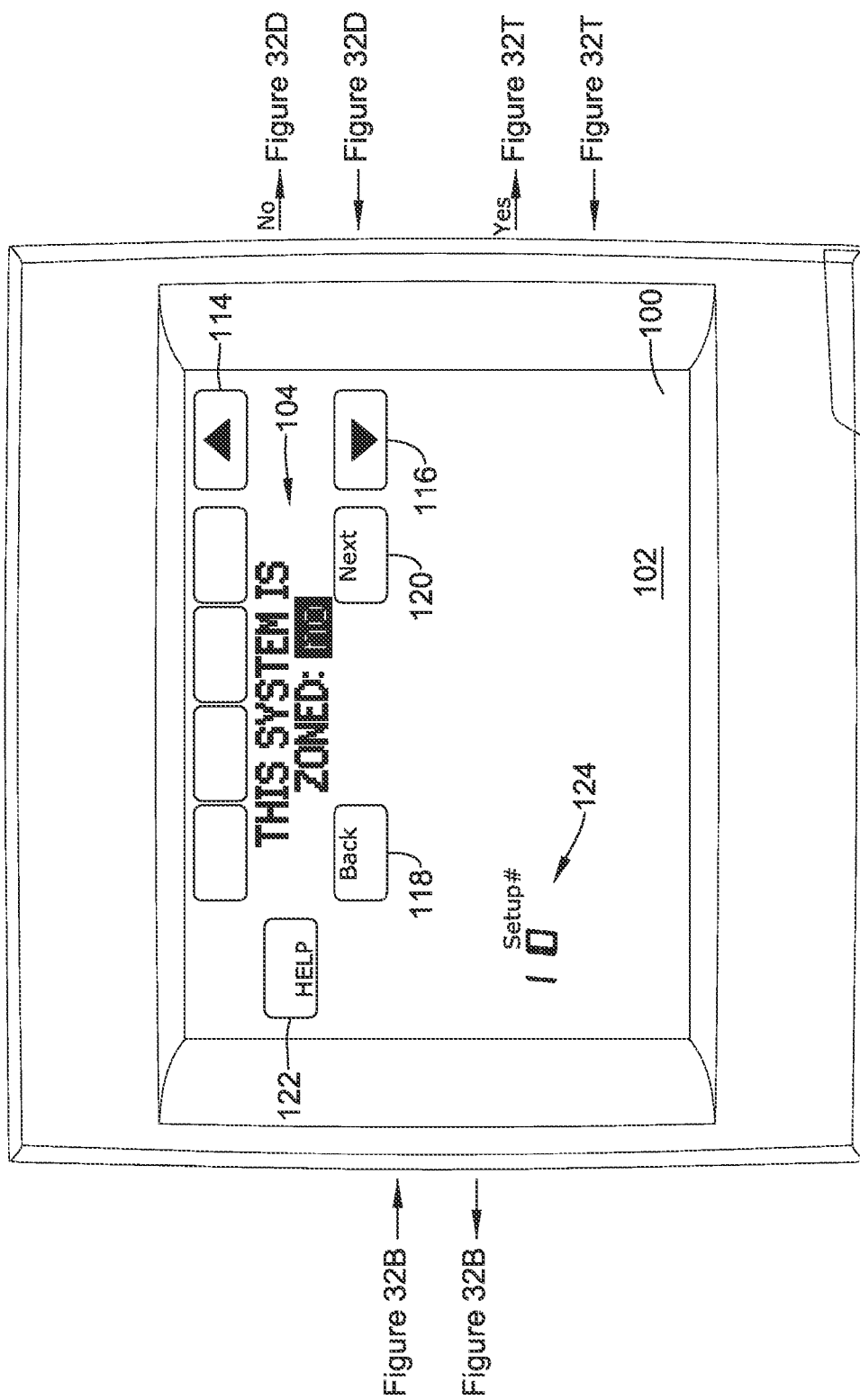
Figure 32D:
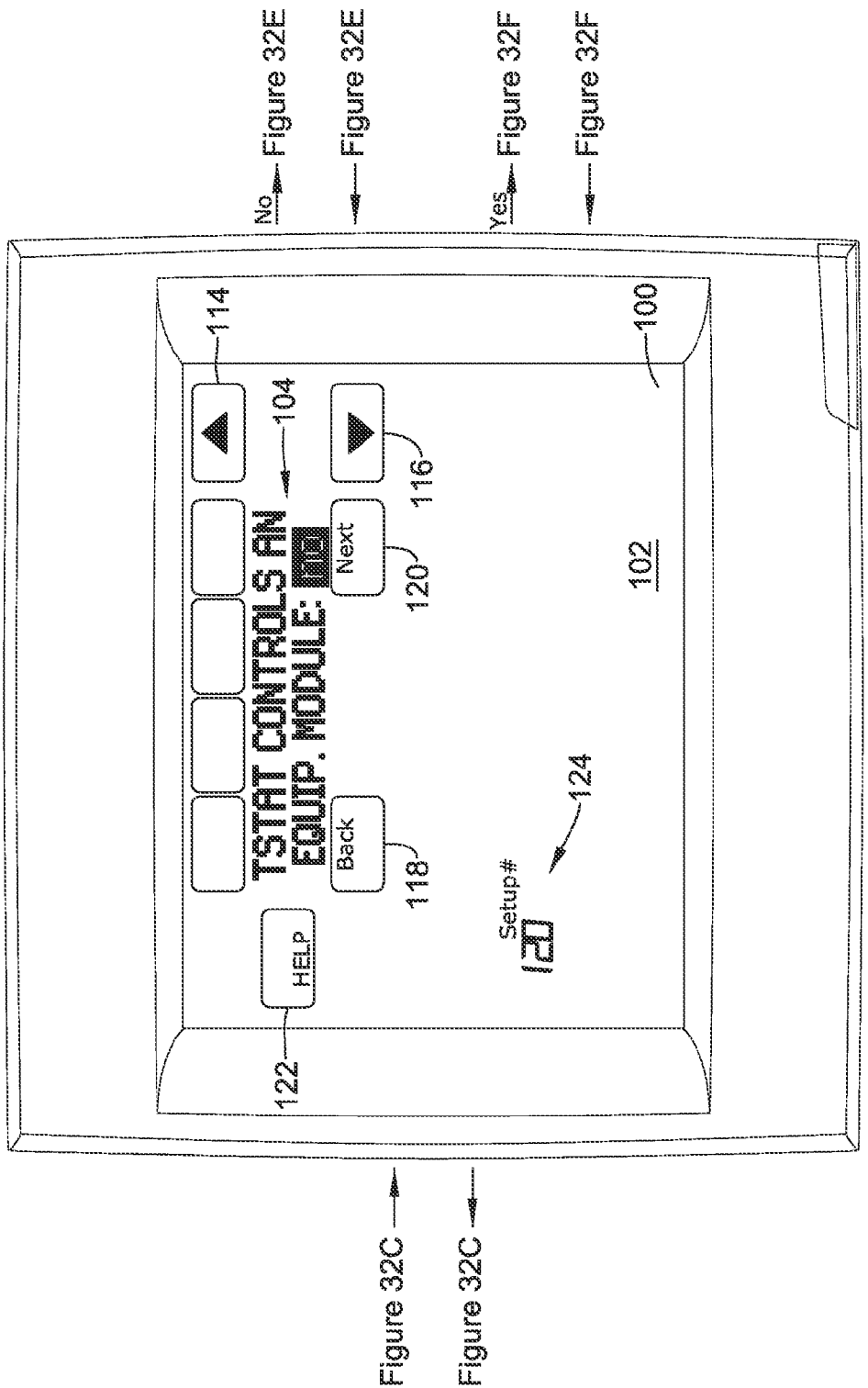
Figure 32E:
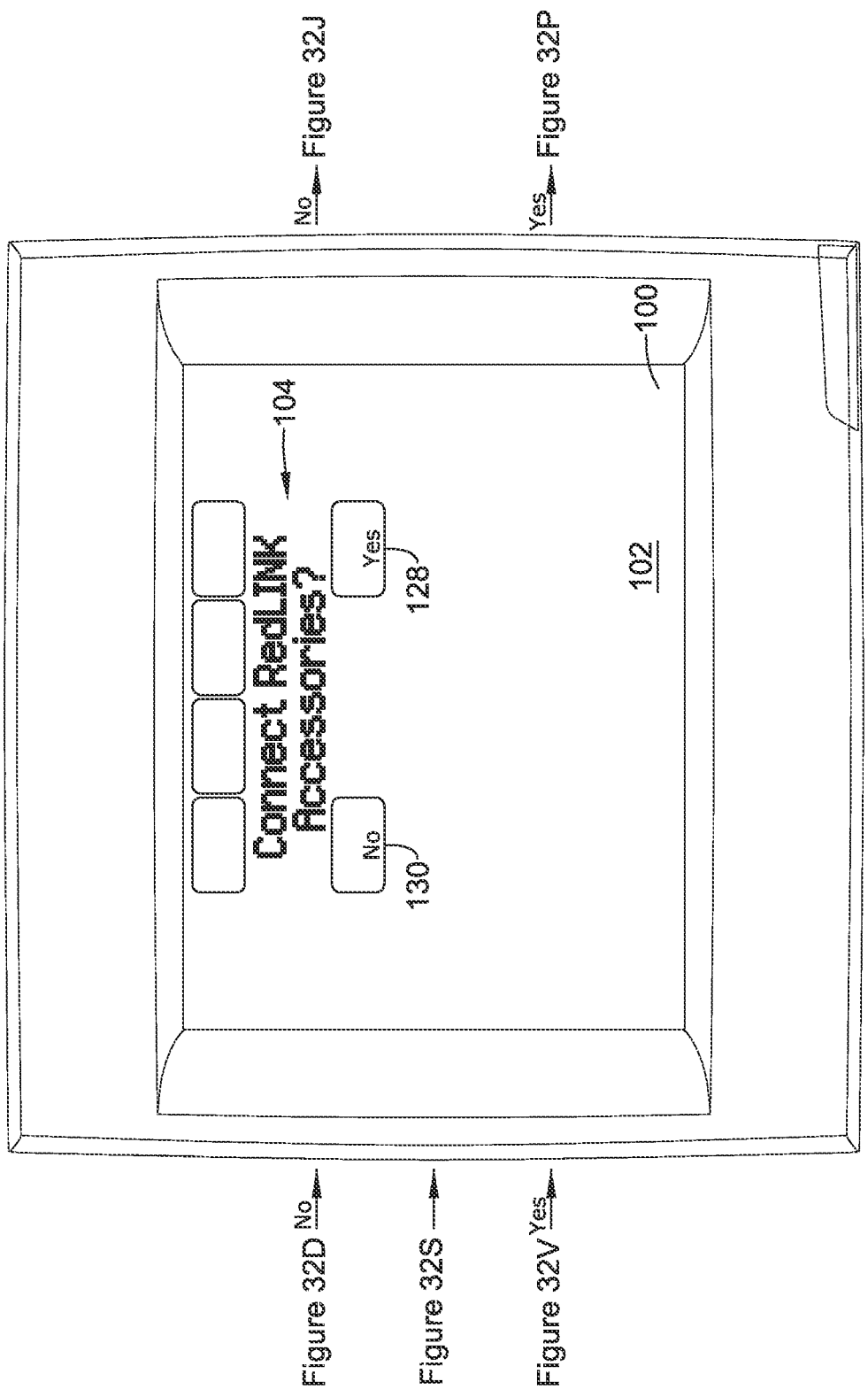
Figure 32F:
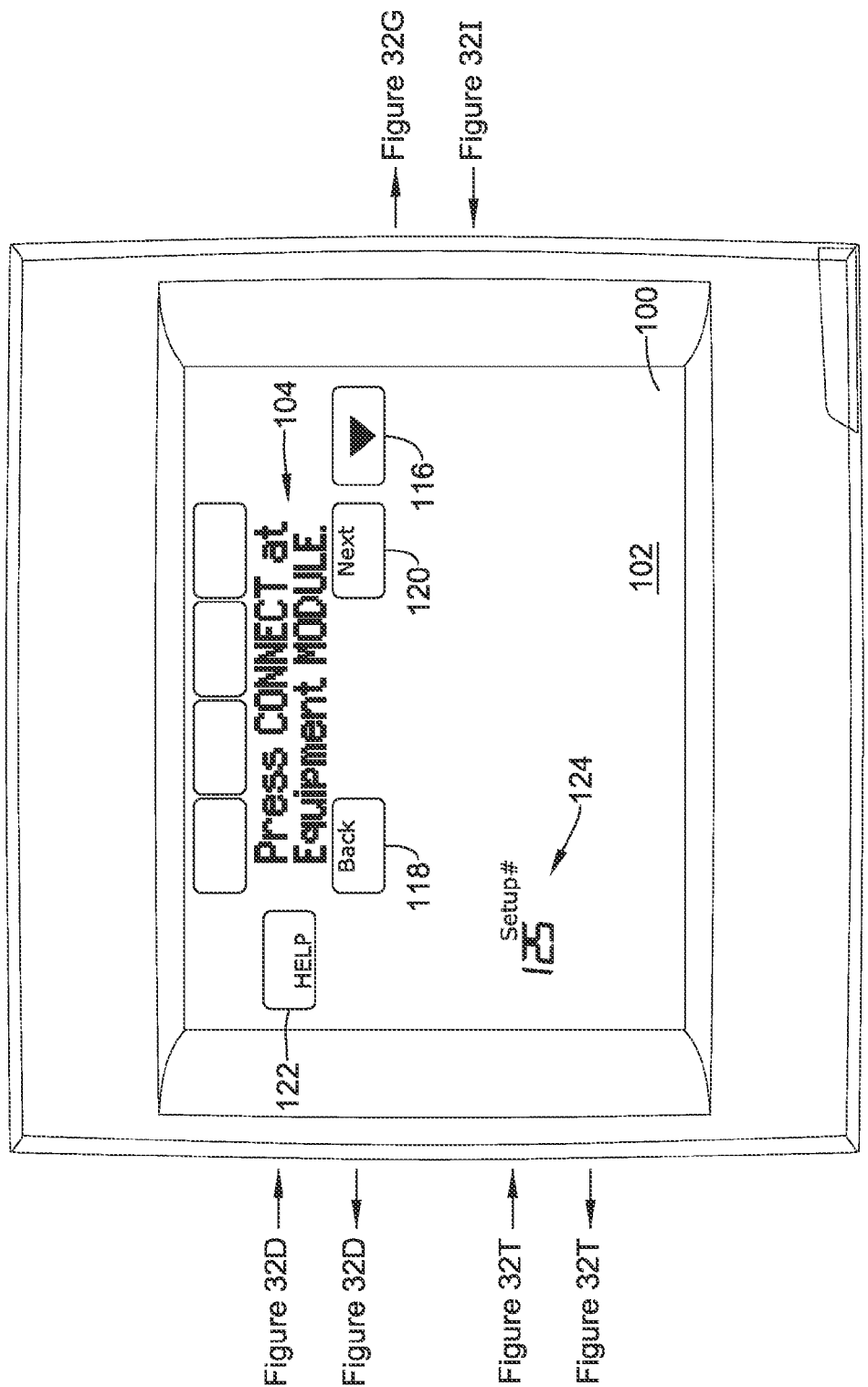
Figure 32G:
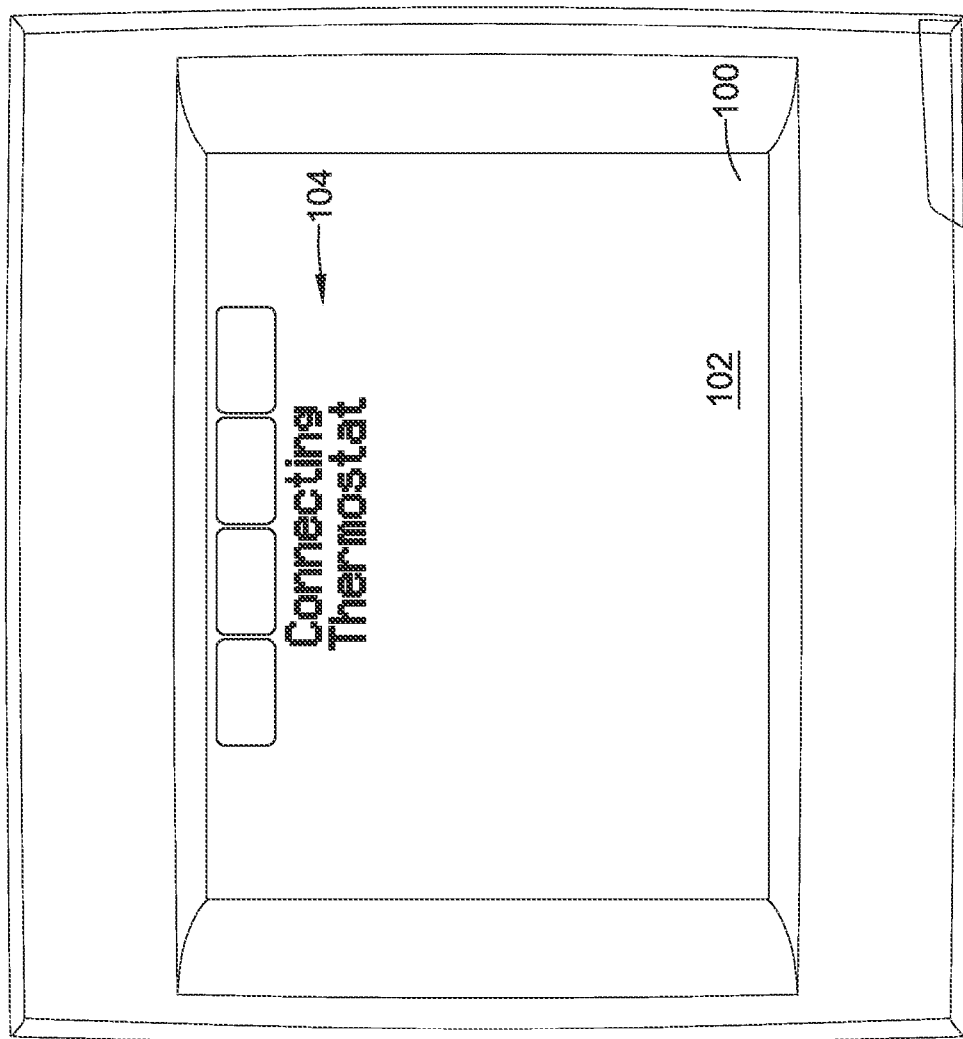
Figure 32H:
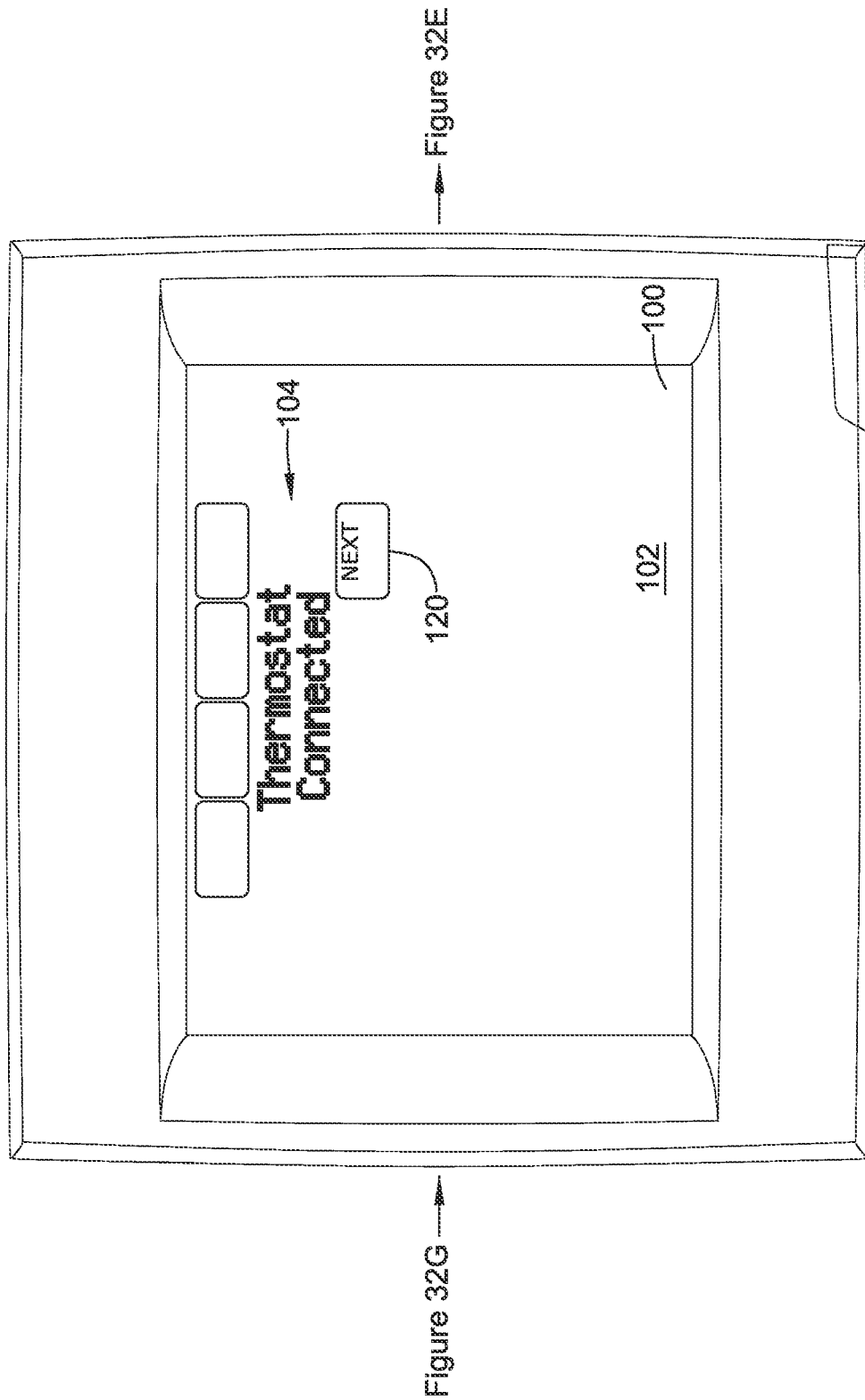
Figure 32I:
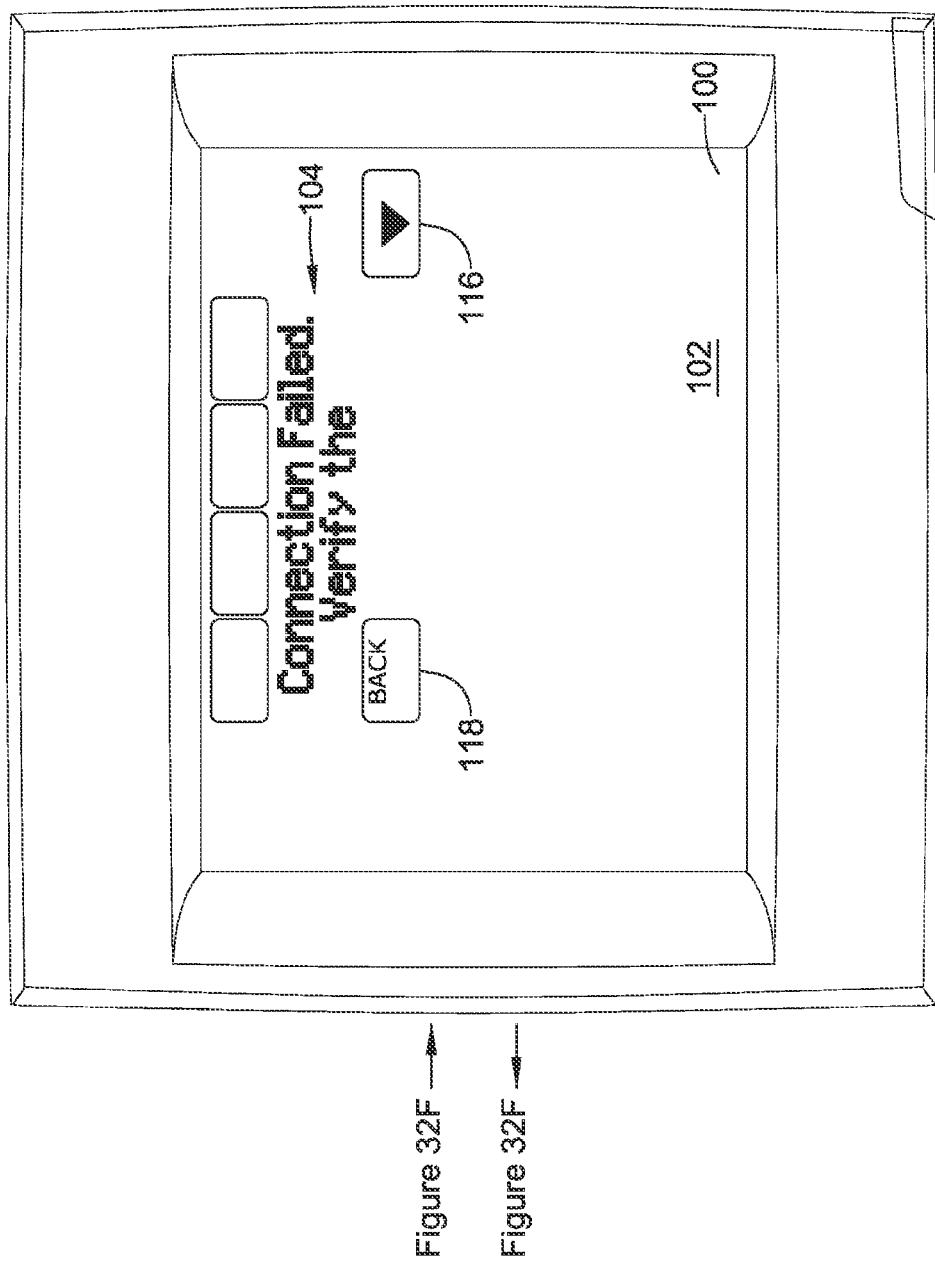
Figure 32J:
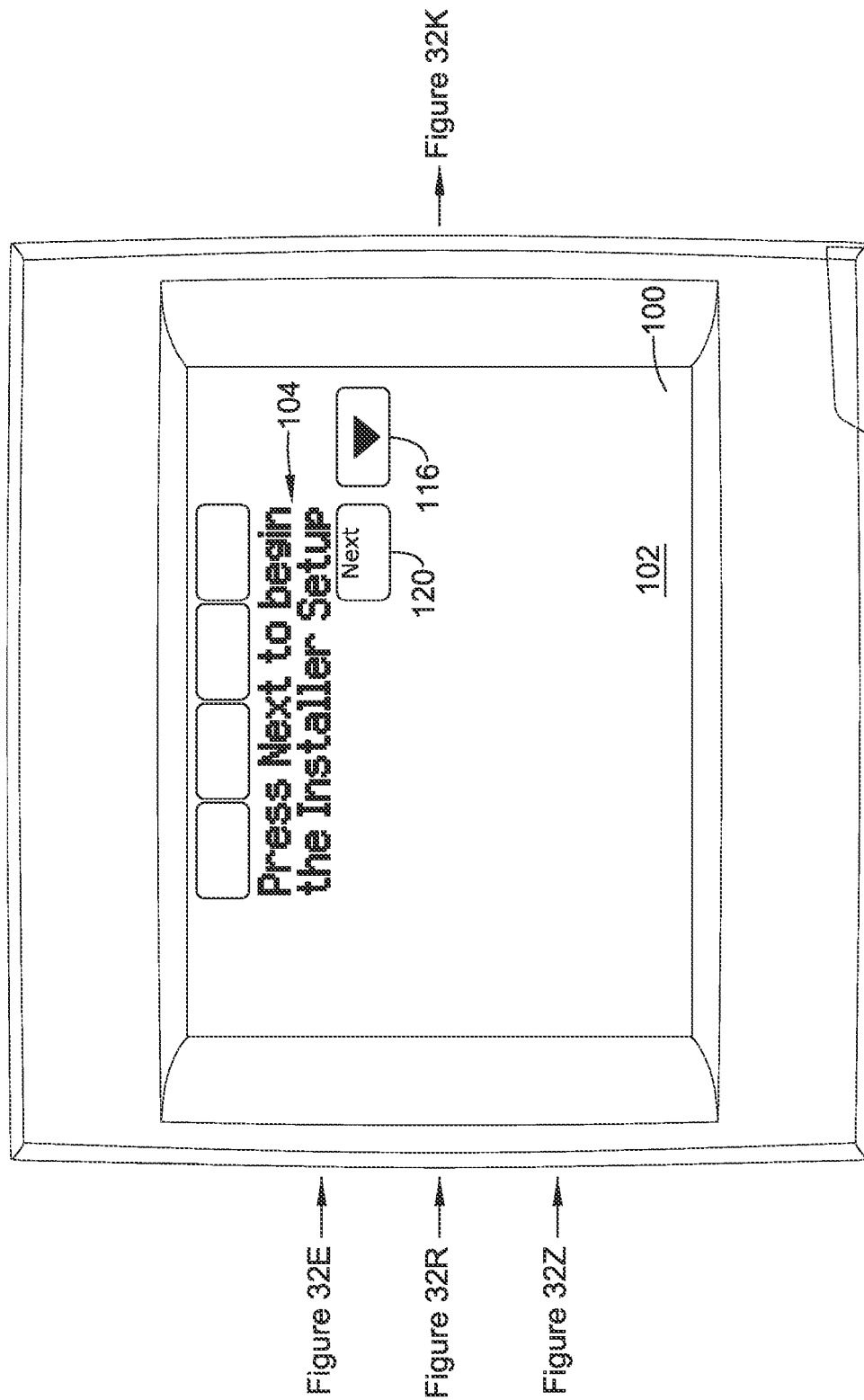
Figure 32L:
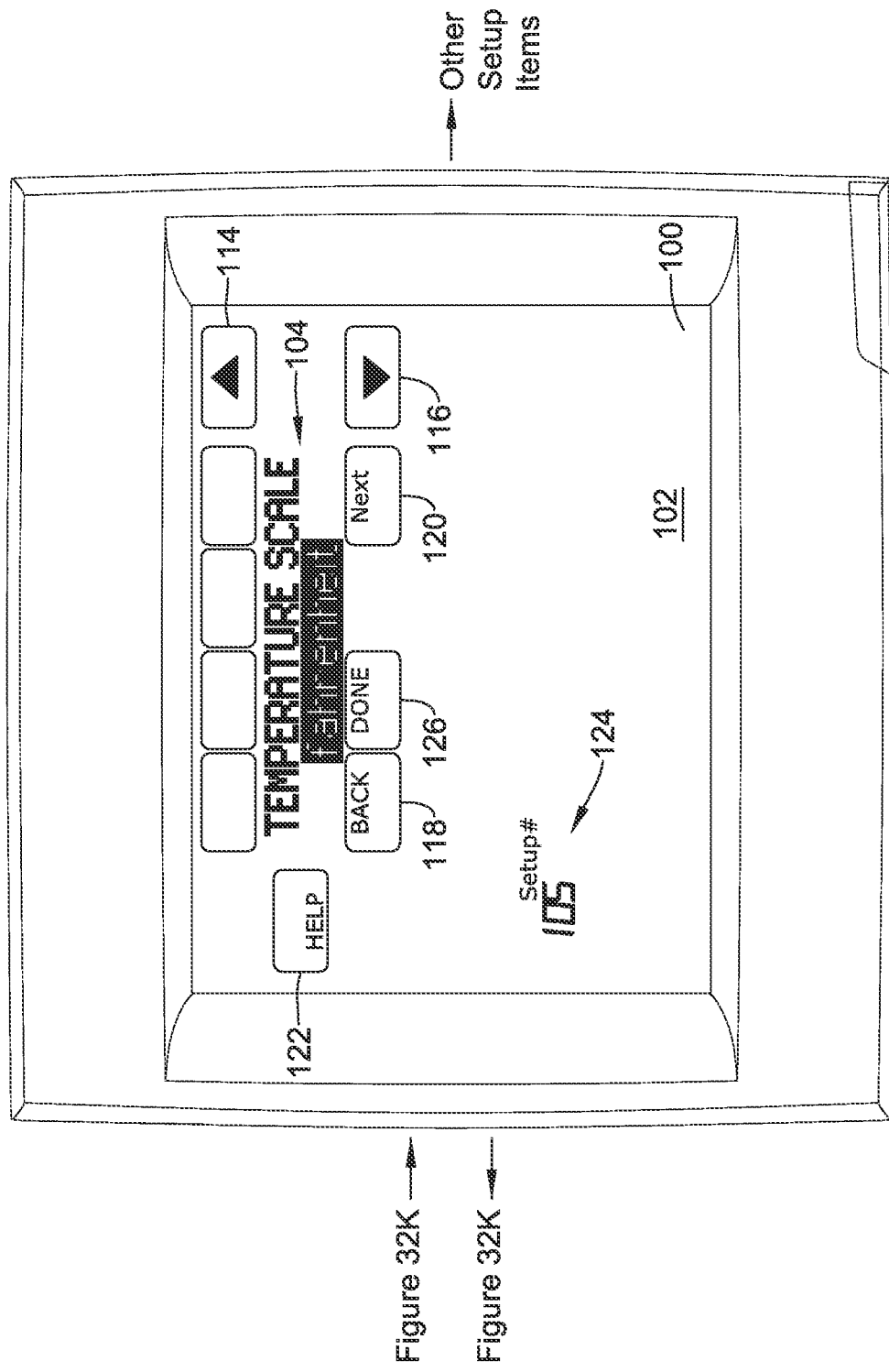
Figure 32M:
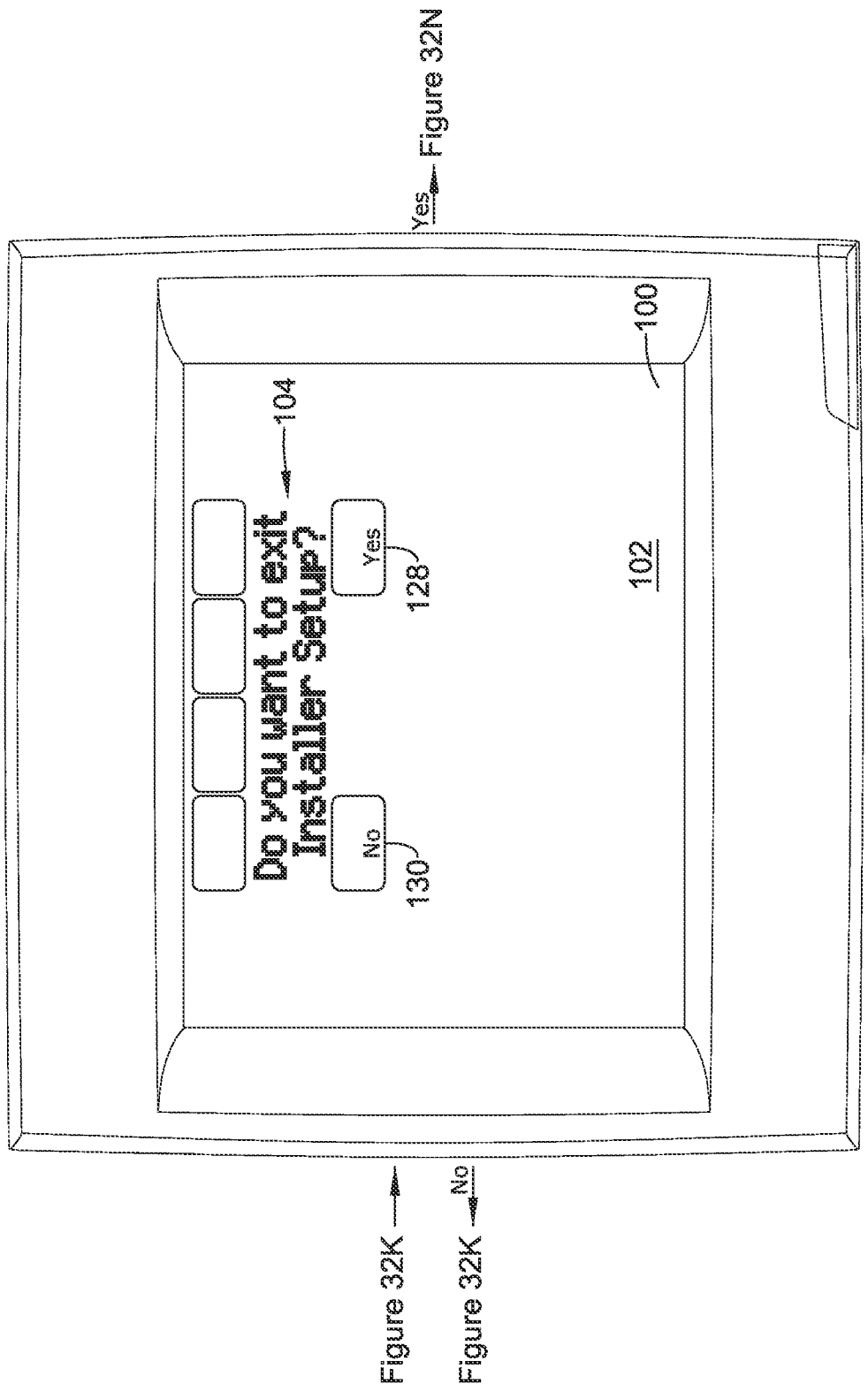
Figure 32O:
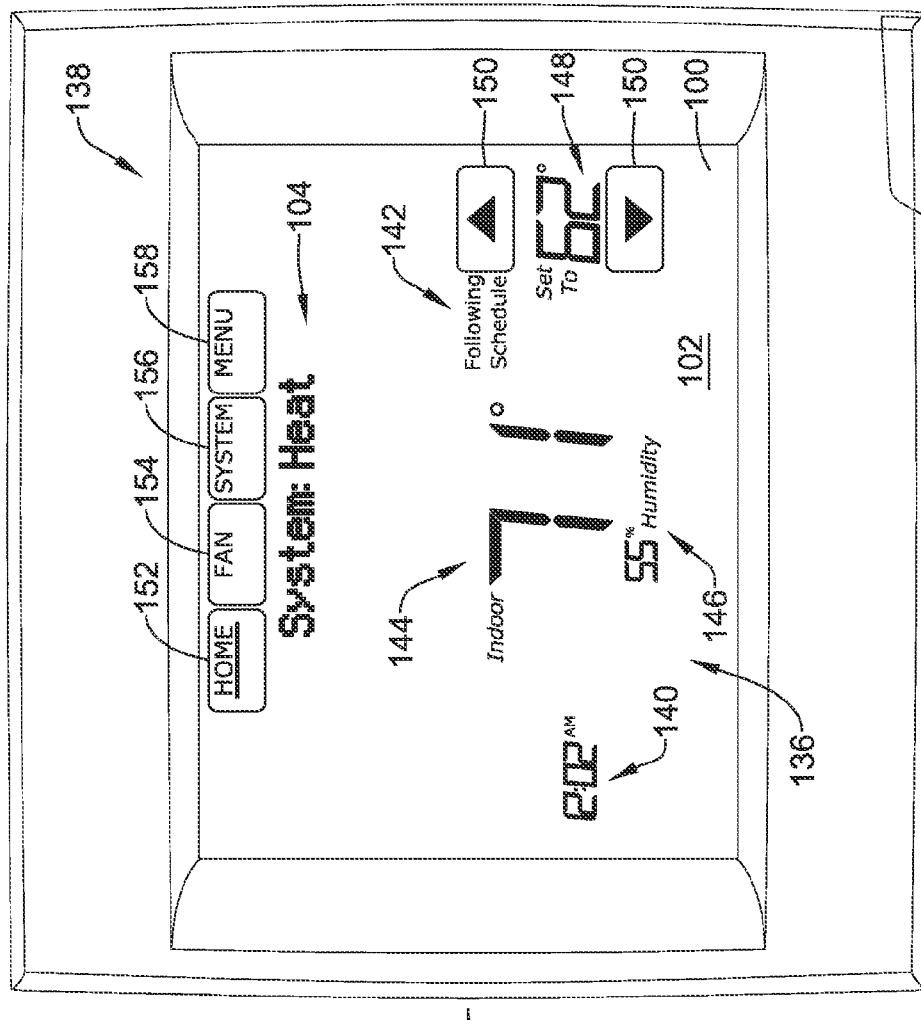
Figure 33:
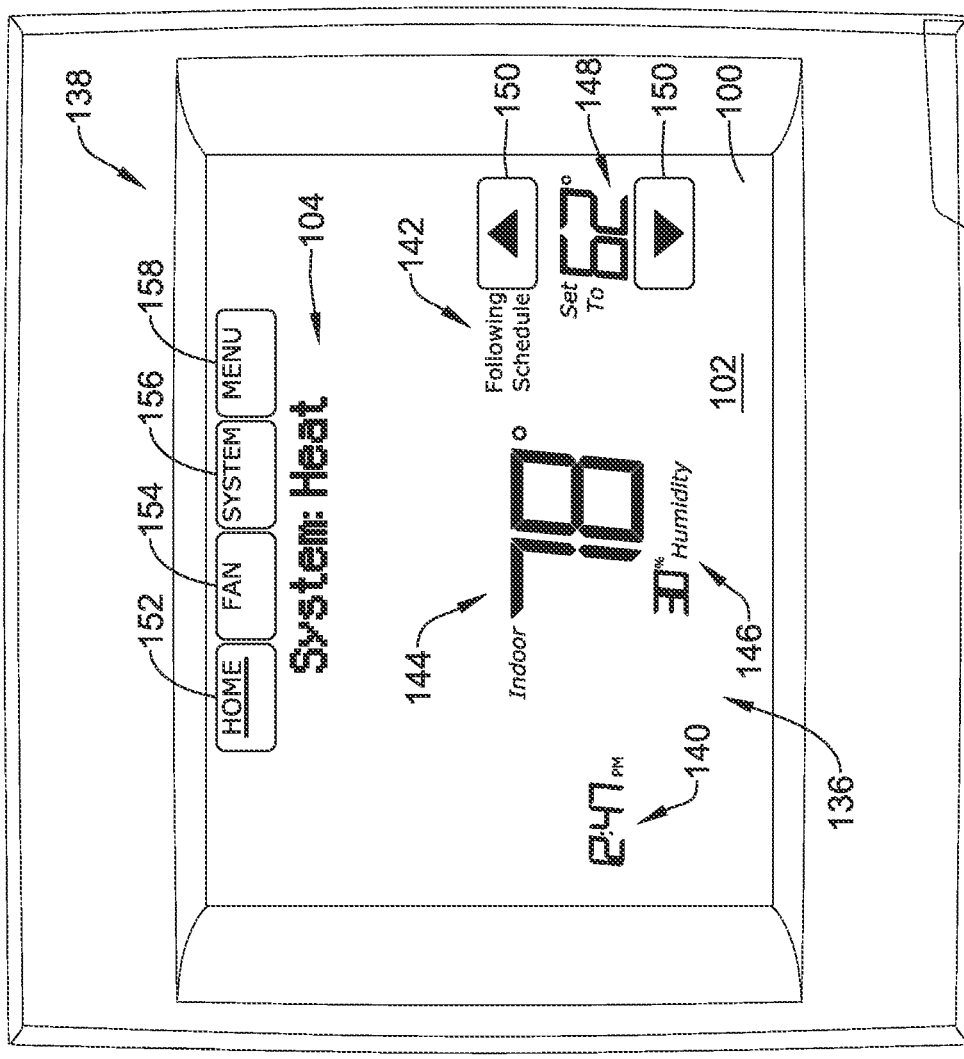
FIG. 33 shows an illustrative home screen for display on the display panel of an illustrative thermostat.

As shown for example in FIG. 33, and similarly shown in FIG. 32O, an illustrative home screen 138 may be displayed on the interface display 100. In the second area 102, several active touch and/or interactive features may be displayed. For example, a time 140, a following schedule indicator 142, a current temperature 144, a current humidity 146, a scheduled temperature 148, temperature setting arrows 150, a home button 152, a fan button 154, a system button 156, a menu button 158, and/or other active and/or interactive features may be displayed in the first area of the interface display 100. In the home screen 138 (see FIG. 32O), the first area 104 may be capable of displaying the active system (e.g., Heat, as shown for example in FIG. 32O) and 33, Cool, Auto, Off, and/or other system) currently being controlled by the thermostat 10.

Figure 35:
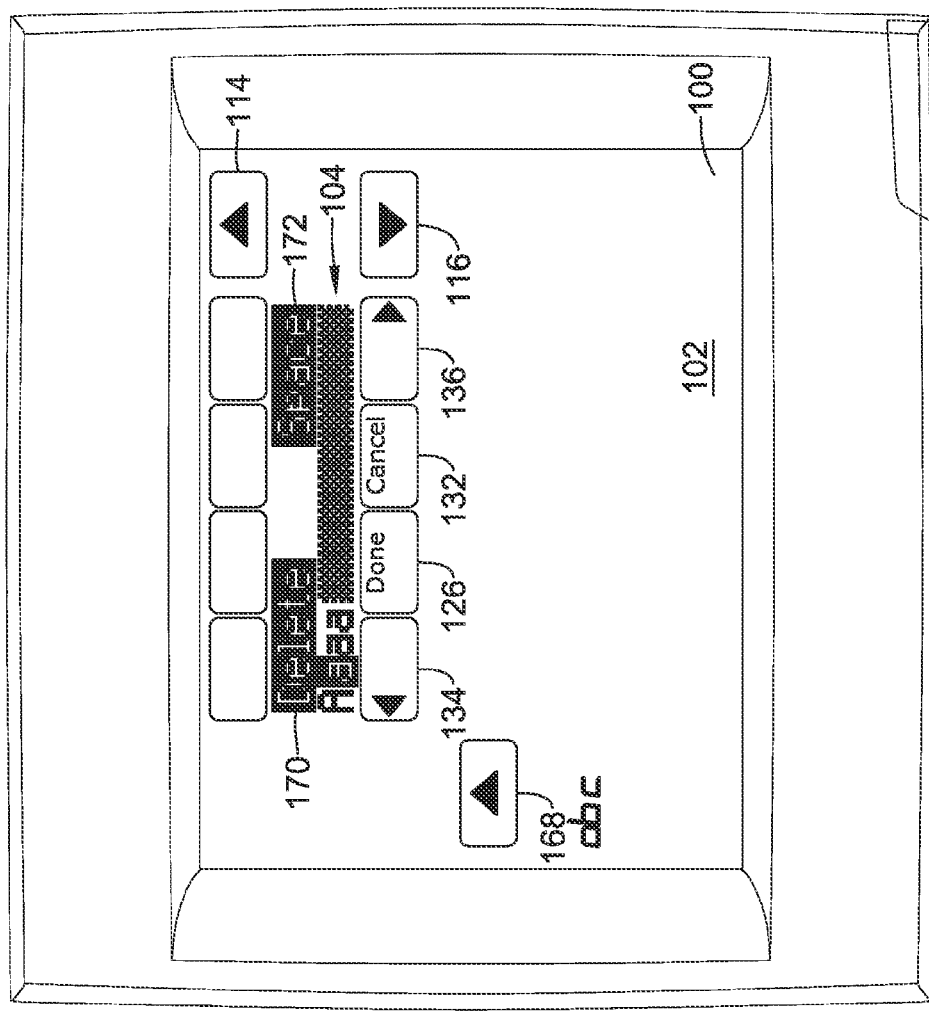
FIGS. 35-36 show an illustrative dealer information entry screen.
Figure 36:
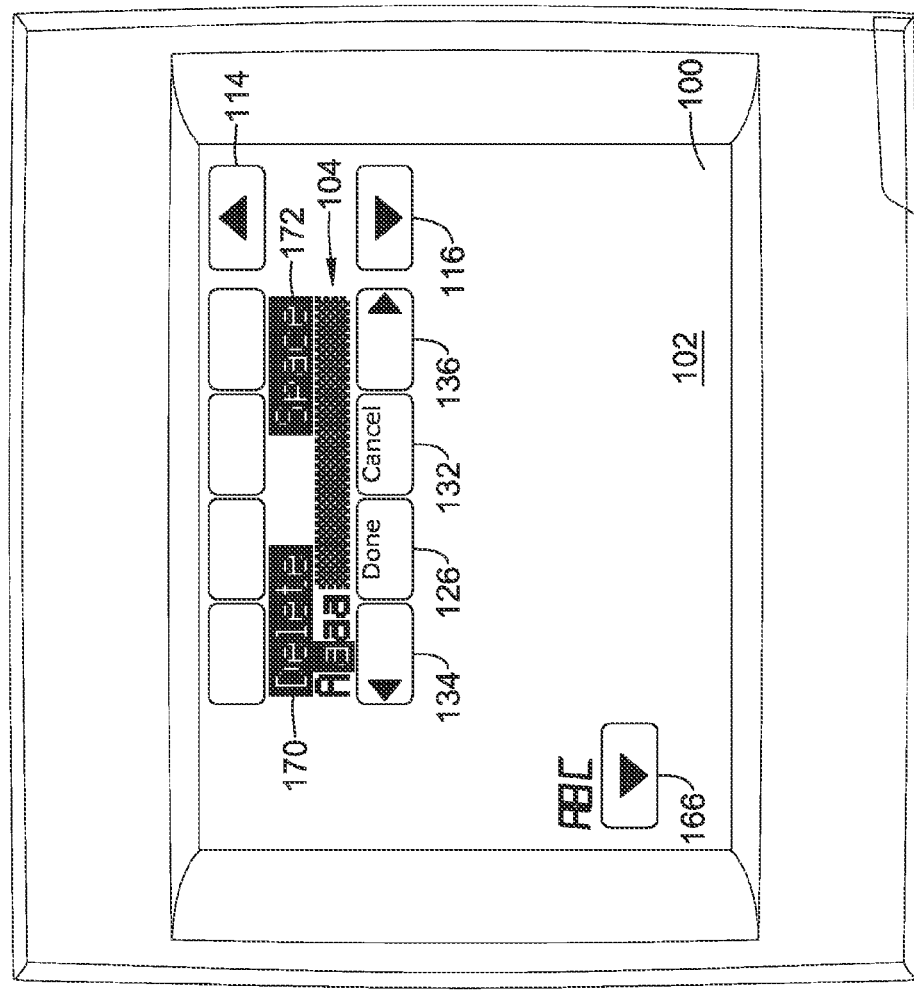

In some instances and on some screens, the interface display 100 may include any number of fixed controls in the second area 102 to facilitate creating and/or modify text characters. For example, the interface display 100 may include 1, 2, 3, 4, 5, 6, 7, 8, 9, 10, etc. fixed controls in the second area 102, as desired. In one example, the interface display 100 may include six (6) fixed controls in the second area 102, as shown in FIGS. 35 and 36 (e.g., with respect to a dealer name screen, but such fixed controls may be used with respect to other screens). The six (6) fixed controls in the second area 102 of FIG. 35-36 may include, but are not limited to, a left arrow 134 and a right arrow 136 below the first area 104 to move within the text, an up arrow 114 and a down arrow 116 on the side of the first area 104 or other area to scroll through characters, and an up arrow 168 to switch from lower case letters to upper case letters (as shown for example in FIG. 35) and a down arrow 166 to switch from upper case letters to lower case letters, (as shown for example in FIG. 36). Alternatively, arrows 166 and 168 may facilitate switching between other types of character sets. In some cases, one or more (e.g., two (2)) buttons (e.g., a delete button 170 and a space button 172) may be positioned within the second area, which may be pressed or selected to create empty spaces before, after, and/or between characters and/or to delete characters.

Returning to FIG. 33, the second area 102 of the interface display 100 may include one or more active touch areas. For example, these active touch areas may include, but are not limited to the time 140 area which may be selected to go directly to a set time/set date screen, the current humidity level 146 area (e.g., a current indoor humidity level or a current outdoor humidity level) to go to a humidification screen, a dehumidification screen, or a menu listing HUMIDIFICATION and DEHUMIDIFICATION, the following schedule text area 142 which may be selected to go directly to a menu screen 174 (see FIG. 34) with the EDIT SCHEDULE item highlighted, a READING AT REMOTE (not shown) text area which may be select to display the question CANCEL READING AT REMOTE? in the first area 104 of the interface display 100, a program time area 194 (see FIG. 47) in the view schedule mode which may be selected to revert the interface display 100 to the edit schedule mode (see FIG. 40) in which the beginning time for time period of an HVAC system schedule may be set, the program temperature areas 178, 180 (see FIG. 47) in the view schedule mode which may be selected to revert the interface display 100 to the edit schedule mode (see FIG. 40) in which a temperature for a time period of an HVAC system schedule may be set, and/or other active touch areas utilized for other purposes, as desired.

In one example, when the thermostat 10 is setup for humidification and not dehumidification and a user presses or selects the current humidity level area 146, the interface display 100 of the thermostat 10 may go directly to a humidification setting screen (not shown) from which a user may be able to adjust all humidification settings. In an example where the thermostat 10 is setup for dehumidification and not humidification and a user presses or selects the current humidity level area 146, the interface display 100 of the thermostat 10 may go directly to a dehumidification setting screen from which a user may be able to adjust all dehumidification settings. In a further example, where the thermostat 10 is setup for humidification and dehumidification and a user presses or selects the current humidity level area 146, the interface display 100 of the thermostat 10 may go directly to the menu screen 174 with a humidification item highlighted in the first area 104 of the interface display 100. A user may then press or select the select button 160 to go to the humidification setting screen or scroll until the dehumidification item is highlighted and then press or selected the select button 160 to go to the dehumidification settings screen.

In some instances as discussed, the first area 104 may be an active touch sensitive area of the interface display 100. Allowing the first area 104 to be an active touch sensitive area may allow for buttons, text, and/or other features in the second area 102 of the interface display 100 to be larger and/or easier for users to interact with. The active touch sensitive area of the interface display 100, may be utilized for the following operations, among others: 1) select a system mode; 2) select a fan mode; 3) pressing on a highlighted item in a menu list in the first area 104 to go to a screen for the highlighted item; 4) pressing PRESS HERE TO START OCCUPANCY in the first area 104 to go to an occupied period when the thermostat is setup for Initiate Occupancy; 5) pressing an hour, a minute, a month, a day, a year numbers to make the pressed item the active item that can be changed by pressing or selecting the up button 114 and/or down button 116 when in a set time/date screen; 6) pressing the day, month, year numbers to make the pressed item the active item that can be changed by pressing or selecting the up button 114 and/or the down button 116 when in vacation mode to change the selected item when in vacation mode setup screens; 7) pressing a message of PRESS HERE TO RESET TIMER in the first area 104 to reset a reminder when reminders are selected from a preferences mode/screen; 8) pressing a message of 1 ALERT ACTIVE. PRESS HERE FOR INFORMATION in the first area 104 when an alert is active to go to more detailed information about the active alert; 9) pressing on a check box in the first area 104 for selecting a holiday when the thermostat is setup for commercial use; 10) pressing a message of PERIOD CANCELED, PRESS TO RESTORE in the first area 104 to restore a program period after it has been canceled when in the change schedule screen 182; 11) pressing a message of PRESS HERE TO EDIT in the first area 104 to enter custom reminder setup and/or dealer information setup during installer setup; and 12) pressing on the word DELETE or SPACE in the first area 104 to delete a letter or add a space, respectively, while in the custom reminder and/or dealer information setup screens.

In some instances, the first area 104 may be navigated with swiping movements and/or direct interaction with features therein. In one example, in addition to or as an alternative to using an up arrow 114, a down arrow 116, a left arrow 134, a right arrow 136, a back button 118, a next button 120, and/or other feature adjacent the first area 104, a user may be able to swipe their finger(s), a stylus or other tool across and/or within the first area 104 to move to a next screen and/or scroll through a list. The list may move in an animated manner, if desired, to help give the visual effect of scrolling through the list the swiped direction. Alternatively, or in addition, a user may be able to highlight and/or select one or more options listed in the first area 104 by touching the one or more desired options within the first area 104 with a finger(s), a stylus and/or other tool.

The thermostat 10 may use one or more of several menus to access user settings and/or installer settings. From the home screen 138 (see FIG. 33) and/or other screens, these menus may be accessed by selecting the menu button 158. Once the menu button 158 has been selected, a list of menus may be displayed in the first area 104 of the interface display 100, which may be scrolled through with the up arrow 114 and/or the down arrow 116 as shown in for example FIG. 34. The list of menus may include, but is not limited to: EDIT SCHEDULE, VIEW SCHEDULE, VACATION MODE, HOLIDAY SCHEDULE, HOLIDAY MODE, EQUIPMENT STATUS, DATE/TIME, PREFERENCES, CLEAN SCREEN, SECU- RITY SETTINGS, DEALER INFORMATION, INSTALLER OPTIONS, MAIN MENU, INSTALLER SETUP, WIRELESS MANAGER and/or other menus.

When a desired menu item is highlighted (e.g., EDIT SCHEDULE, as shown in FIG. 34), a select button 160 positioned in the second area 102 or other area of the interface display 100 may be pressed or selected to go to a screen for the highlighted menu item. Alternatively, or in addition, a user may tap the first area 104 to select the highlighted menu item. Once a menu item has been selected, further sub-menu items or options may be provided that are classified under the selected menu item and/or the interface display 100 may allow for a respective adjustment to thermostat 10 in response to the selection.

The menus of thermostat 10 depicted in the first area 104 of the interface display 100 may have vertical animation that may allow for scrolling through the lists of menus and/or options. Although the first area 104 may only display two (2) lines of text, the first area 104 may display virtually any number of items in a menu list. In some instances, the first area 104 may display the list such that a first item 162 on the list is entirely viewable and a second item 164 on the list is only partially viewable (see FIG. 34). The partially viewable item on the list may indicate to the user that there are further items in the list. The partially viewable item may be below or above the fully viewable item.

The vertical animation may allow the list of menu items to be scrolled through by pressing or selecting the down arrow 116 and/or the up arrow 114, while allowing a user to visually see that they are moving up or down through the menu list. Pushing the down arrow 116 may make the menu list move up, which in turn may make a user think they are heading to the bottom of the menu list. Pushing the up arrow button may make the menu list move down, which in turn may make a user think they are heading to the top of the menu list.

In some instances, the vertical animation may facilitate a user in distinguishing between two similar menu items or menu items that may have the same name. Because the menu item may appear to physically move when the up arrow 114 and/or the down arrow 116 are pressed, the user may be able to see that they have moved onto the next menu item in the list. In one example, when a user is in a WIRELESS MANAGER menu and is viewing connected devices including multiple indoor sensors with the same or similar name, if the first area 104 did not have vertical animation, the user may not be able to tell how many remote indoor sensors are connected to the thermostat because the screen would not change at all when the up arrow 114 and/or the down arrow 116 are pressed or selected in a static screen. Rather than scrolling through the menu items using one or more buttons in the second area 102, it is contemplated that a user may scroll through the items by making a swiping gesture in the first area 104, as further described herein.

Similar to the vertical animation of first area 104 of the interface display 100, the first area 104 may have and/or utilize horizontal animation. The horizontal animation of the first area 104 may be utilized to visually indicate when a user is moving forward or moving backward in a setup process or other process. In one example, when a next button 120 is pressed or selected, the text in the first area 104 may slide to the left and when the back button 118 is pressed or selected, the text in the display may slide to the right. The horizontal animation may be used in, among other places, installer setup, program scheduling (e.g., when using a scheduling assistant), setting a vacation hold, etc.

Figure 31:
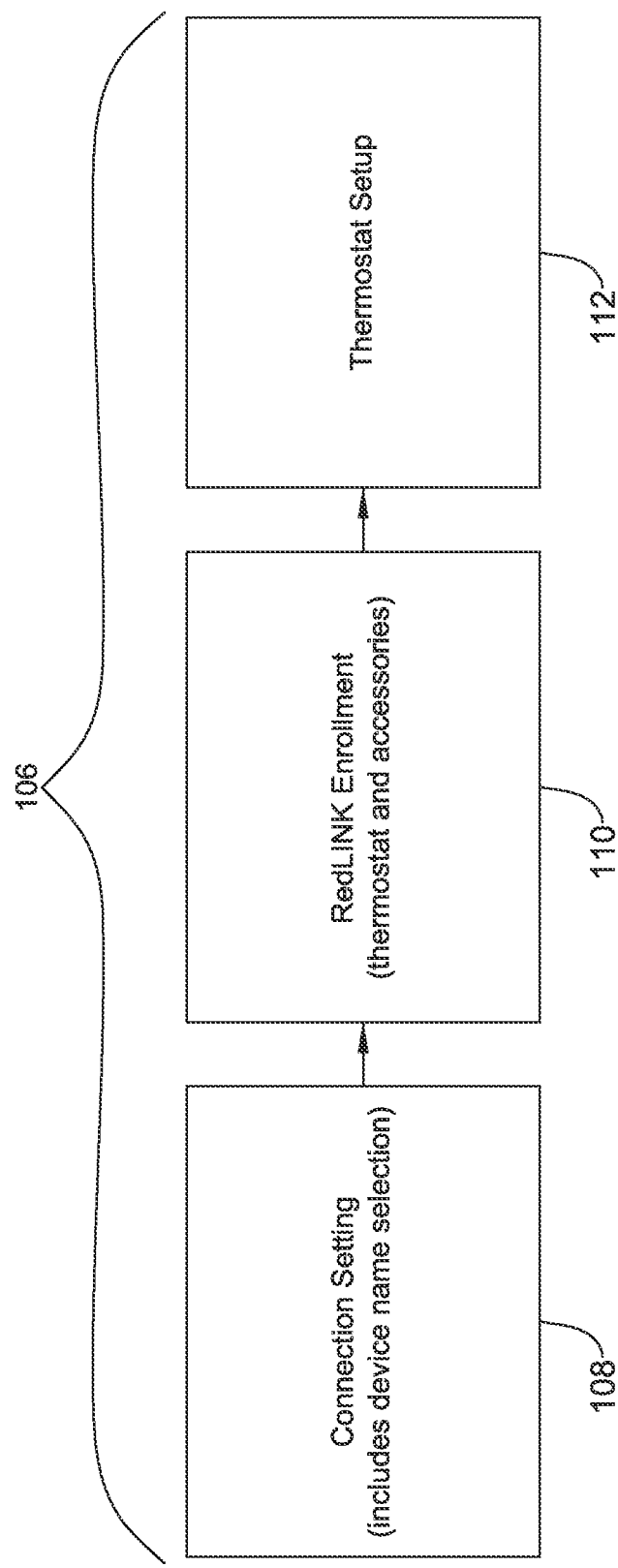
FIG. 31 is a schematic flow diagram of an enrollment scheme for an illustrative thermostat.

Upon initial set up when the thermostat 10 is first powered on and/or at other times, the interface display 100 may take a user (e.g., a contractor or other user) through an enrollment scheme 106. As shown for example in FIG. 31, the enrollment scheme 106 may include a connection setting portion 108, an accessory enrollment portion 110 (e.g., a RedLINK™ enrollment portion that may include identification of the thermostat(s) and/or accessories), and a thermostat setup portion 112.

The connection setting portion 108 may include one or more of several screens depicted on the interface display 100, where each step or screen may have a Setup# area 124. As shown for example in FIG. 32A, one screen may allow a user to select the application in which the thermostat 10 will be primarily used (e.g., residential, commercial, or other use of the thermostat 10) in setup# 101. The application may be selected by scrolling through a list of applications (e.g., residential, commercial, etc.) and when the application is highlighted in the first area 104, a next button 120 (e.g., a button may be a mechanical button or, as shown in the Figures, may be a button on the touch sensitive interface display 100) may be pressed or selected to go to a next screen.

Once an application has been selected, the connection setting portion 108 may ask a user to select a device name for thermostat 10 in Setup# 103, as shown for example in FIG. 32B. One or more device names may be in a list through which a user may scroll with the up arrow 114 and/or down arrow 116. The list may include the following device names, among others: THERMOSTAT 1, THERMOSTAT 2, THERMOSTAT 3, THERMOSTAT 4, THERMOSTAT 5, THERMOSTAT 6, THERMOSTAT 7, THERMOSTAT 8, UPPER LEVEL, UTILITY ROOM, WINE CELLAR, WORKSHOP, ZONE 1, ZONE 2, ZONE 3, ZONE 4, ZONE 5, ZONE 6, ZONE 7, ZONE 8, AHU 1, AHU 2, AHU3, AHU 4, AHU 5, AHU 6, AHU 7, AHU 8, BAR, BASEMENT, BATHROOM, BATHROOM 1, BATHROOM 2, BATHROOM 3, BOAT HOUSE, BOILER 1, BOILER 2, CHAPEL, COMMON ROOM, COMPUTER ROOM, CONFERENCE RM, CRAWL SPACE, DINING ROOM, DINING ROOM 1, DINING ROOM 2, DRESSING ROOM, ENTRANCE, EXERCISE ROOM, FOYER, GAME ROOM, GARAGE, GYM, HALLWAY, KITCHEN, KITCHEN 1, KITCHEN 2, LAUNDRY ROOM, LIBRARY, LOBBY, LOWER LEVEL, MACHINE ROOM, MAIN LEVEL, MAIN OFFICE, MEDIA ROOM, MEETING ROOM, MUSIC ROOM, NURSERY, OFFICE, OFFICE 1, OFFICE 2, OFFICE 3, OFFICE 4, OFFICE 5, OFFICE 6, OFFICE 7, OFFICE 8, OPEN AREA 1, OPEN AREA 2, PLAY ROOM, POOL ROOM, REC ROOM, SERVER 1, SERVER 2, SPA, STOCK ROOM, STORAGE ROOM, STUDIO, SUN ROOM, THEATER, etc. The device name may be selected by scrolling through the list of device names and when the desired device name is highlighted in the first area 104, a next button 120 may be pressed or selected to go to a next screen. Alternatively, if it is desired to go to a previous screen, the back button 118 may be selected. If help is needed in selecting a device name, a help button 122 may be selected whereupon additional help information may be displayed to the user in the first area 104.

Once a device name has been selected, the connection setting portion 108 may ask a user to select whether the HVAC system is zoned in Setup# 110, as shown for example in FIG. 32C. A user may scroll between YES and NO with the up arrow 114 and/or down arrow 116. The YES or NO option may be selected when the desired option is highlighted in the first area 104 and a next button 120 is pressed or selected to go to a next screen. If it is desired to go to a previous screen, the back button 118 may be selected. If help is needed, a help button 122 may be selected.

If the HVAC system is not zoned, the accessory enrollment portion 110 may ask a user to select whether the thermostat 10 controls an equipment module in Setup# 120, as shown for example in FIG. 32D. A user may scroll between YES and NO with the up arrow 114 and/or down arrow 116. The YES or NO option may be selected when the desired option is highlighted in the first area 104 and a next button 120 is pressed or selected to go to a next screen. If it is desired to go to a previous screen, the back button 118 may be selected. If help is needed, a help button 122 may be selected.

If an equipment module system is not used, the accessory enrollment portion 110 may ask a user to select whether to connect accessories to the thermostat 10, as shown for example in FIG. 32E. A user may select a YES button 128 or a NO button 130 in the second area 102.

If no accessories will be connected to the thermostat 10, the thermostat setup portion 112 may ask a user to press or select a NEXT button 120 to begin installer setup, as shown for example in FIG. 32J. In some instances, the interface display 100 may display a message in the first area 104 or any other area indicating PRESS NEXT TO BEGIN THE INSTALLER SETUP OR INSERT A MICROSD CARD NOW TO SETUP THE THERMOSTAT. Alternatively, one or more other messages may be displayed. If a memory card is to be used for thermostat setup, a user may insert a memory card (e.g., a microSD card) to setup the thermostat 10.

Figure 32P:
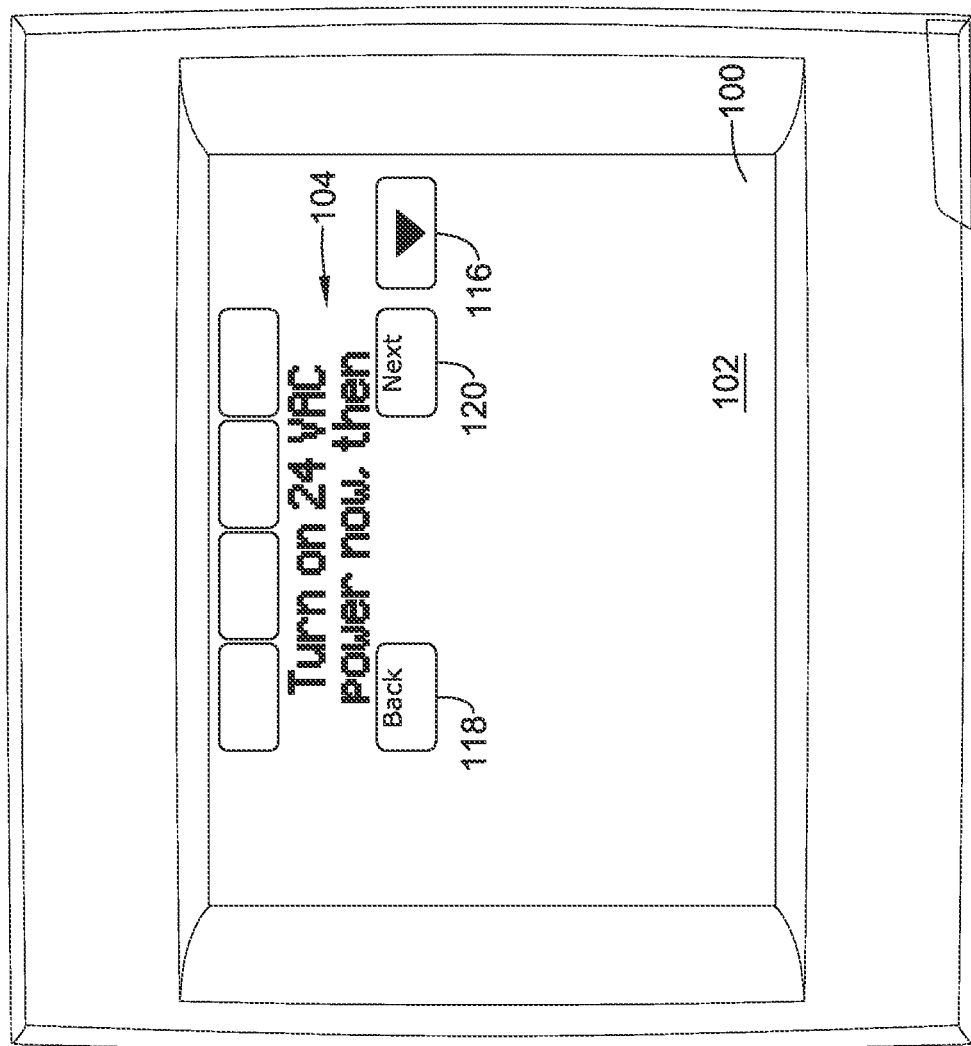

If accessories are to be connected to the thermostat 10, the accessory enrollment portion 110 may ask a user to TURN ON 24 VAC POWER NOW, THEN PRESS NEXT. 24 VAC IS REQUIRED TO CONNECT REDLINK™ ACCESSORIES, as shown for example in FIG. 32P. In some instances, only two (2) lines of the message may be displayed in the first area 104, as shown for example in FIG. 32P, and the down arrow 116 and/or the up arrow 114 may be selected or pressed to scroll through the rest of the message. If it is desired to go to a previous screen, the back button 118 may be selected.

Once the power has been turned on and the next button 120 has been selected or pressed, an enroll mode may be entered and a screen may be displayed indicating the system is preparing to add a device, as shown for example in FIG. 32Q. If it is decided that a device will not be added at this time, a cancel button 132 may be pressed or selected and the system will go to the thermostat setup portion 112. If it is desired to add a device, once the systems has been prepared to add a device, the interface display 100 will be displayed asking a user to press connect a new accessories, as shown for example in FIG. 32R. Once connect, and the new accessories has been pressed, and the system has recognized a connection (e.g., as evidenced by a connection signal on the accessory and/or the thermostat 10 or other device), the done button 126 may be pressed or selected to go to a wireless device manager. Once a user has interacted with the wireless device manager, as desired, to set up the accessory, the interface display 100 may advance to a thermostat setup portion 112.

If the connection between the thermostat 10 and the accessory has failed, a screen may be displayed on the interface display indicating the thermostat 10 is UNABLE TO ADD DEVICES. ANOTHER PRODUCT IS IN THE PROCESS OF ADDING DEVICE. PLEASE TRY AGAIN LATER, as shown for example in FIG. 32S. Alternatively, or in addition, one or more other messages may be displayed indicating a connection has failed. In some instances, only two (2) lines of the message may be displayed in the first area 104 and the down arrow 116 and/or the up arrow 114 may be selected or pressed to scroll through the rest of the message, or the message may scroll automatically (as could any other message that does not entirely fit within the two lines of the first area 104). Once the message has been displayed, the interface display 100 may return to the screen asking if accessories are to be connected, as shown for example in FIG. 32E. If it is desired to go back a screen, the back button 118 may be selected or pressed. Alternatively, pressing or selecting the back button may bring a user to the screen asking if accessories are to be connected, as shown for example in FIG. 32E.

If an equipment module system is to be used, the accessory enrollment portion 110 may ask a user to press or select a next button 120 to begin connecting the thermostat 10 to the equipment module, as shown for example in FIG. 32F. In some instances, the interface display 100 may display a message in the first area 104 or any other area indicating PRESS CONNECT AT EQUIPMENT MODULE THEN PRESS NEXT. Alternatively, one or more other messages may be displayed. If it is desired to go to a previous screen, the back button 118 may be selected. If help is needed, a help button 122 may be selected. Once the next button 120 has been selected to begin connecting the thermostat 10 to the equipment module, a screen may show that the thermostat 10 is being connected to the equipment module, as shown for example in FIG. 32G.

If connecting the thermostat 10 to the equipment module is unsuccessful, a screen may display a message indicating that the connection failed, as shown for example in FIG. 32I. If the connection failed due to a weak signal, the screen may show a message indicating CONNECTION FAILED. VERIFY THE CONNECT LED ON THE EQUIPMENT INTERFACE MODULE IS FLASHING AND YOU ARE AT LEAST 2 FEET AWAY. TRY CONNECTING AGAIN. If the connection failed due to an incompatible host, the screen may show a message indicating CONNECTION FAILED. THE DEVICE YOU ARE ATTEMPTING CONNECT IS NOT COMPATIBLE WITH THIS DEVICE. PLEASE SEE INSTRUCTIONS FOR COMPATIBLE DEVICES. If the connection failed due to an invalid instance, the screen may show a message indicating CONNECTION FAILED. THE THERMOSTAT IS CURRENTLY SETUP TO AN EQUIPMENT INTERFACE MODULE BUT YOU ATTEMPTED TO CONNECT TO A TRUEZONE™ WIRELESS ADAPTER. PRESS AND RELEASE THE CONNECT BUTTON AT THE TRUEZONE™ WIRELESS ADAPTER TO TAKE IT OUT OF THE WIRELESS SETUP MODE. NEXT, PRESS AND RELEASE THE CONNECT BUTTON AT THE EQUIPMENT INTERFACE MODULE AND VERIFY THE CONNECTED led FLASHES GREEN. THEN TRY CONNECTING THE THERMOSTAT AGAIN. If the connection failed due to a non-virgin host, the screen may show a message indicating CONNECTION FAILED. ALL DEVICES MUST BE REMOVED FROM THE EQUIPMENT INTERFACE BEFORE YOU TRY CONNECTING THE THERMOSTAT. TO REMOVE ALL DEVICE, PRESS AND HOLD THE CONNECT BUTTON ON THE EQUIPMENT INTERFACE MODULE UNTIL THE STAT LIGHT GLOWS AMBER (HOLD FOR ABOUT 10 SECONDS). AFTER ALL DEVICES ARE REMOVED, THEN TRY CONNECTING THE THERMOSTAT TO THE EQUIPMENT INTERFACE MODULE. Alternatively, or in addition, one or more other messages may be displayed indicating a connection has failed. In some instances, only two (2) lines of the message may be displayed in the first area 104 and the down arrow 116 and/or the up arrow 114 may be selected or pressed to scroll through the rest of the message. Once the message has been displayed, the interface display 100 may ask a user to press or select a next button 120 to restart connecting the thermostat 10 to the equipment module, as shown for example in FIG. 32F. If it is desired to go to a previous screen, the back button 118 may be selected.

If the connection of the thermostat 10 and the equipment module was successful, a screen may show that the thermostat is connected to the equipment module, as shown for example in FIG. 32H. A user may then be prompted to press or select the next button 120 to go to a screen asking a user to select whether accessories are to be connected to the thermostat 10, as shown for example in FIG. 32E. A user may select whether to connect accessories by selecting a YES button 128 or a NO button 130. If the NO button 130 is selected, the thermostat setup portion 112 may be entered. If the YES button 128 is selected, the user may be brought to an accessory connection screen, as shown for example in FIG. 32P.

Figure 32T:
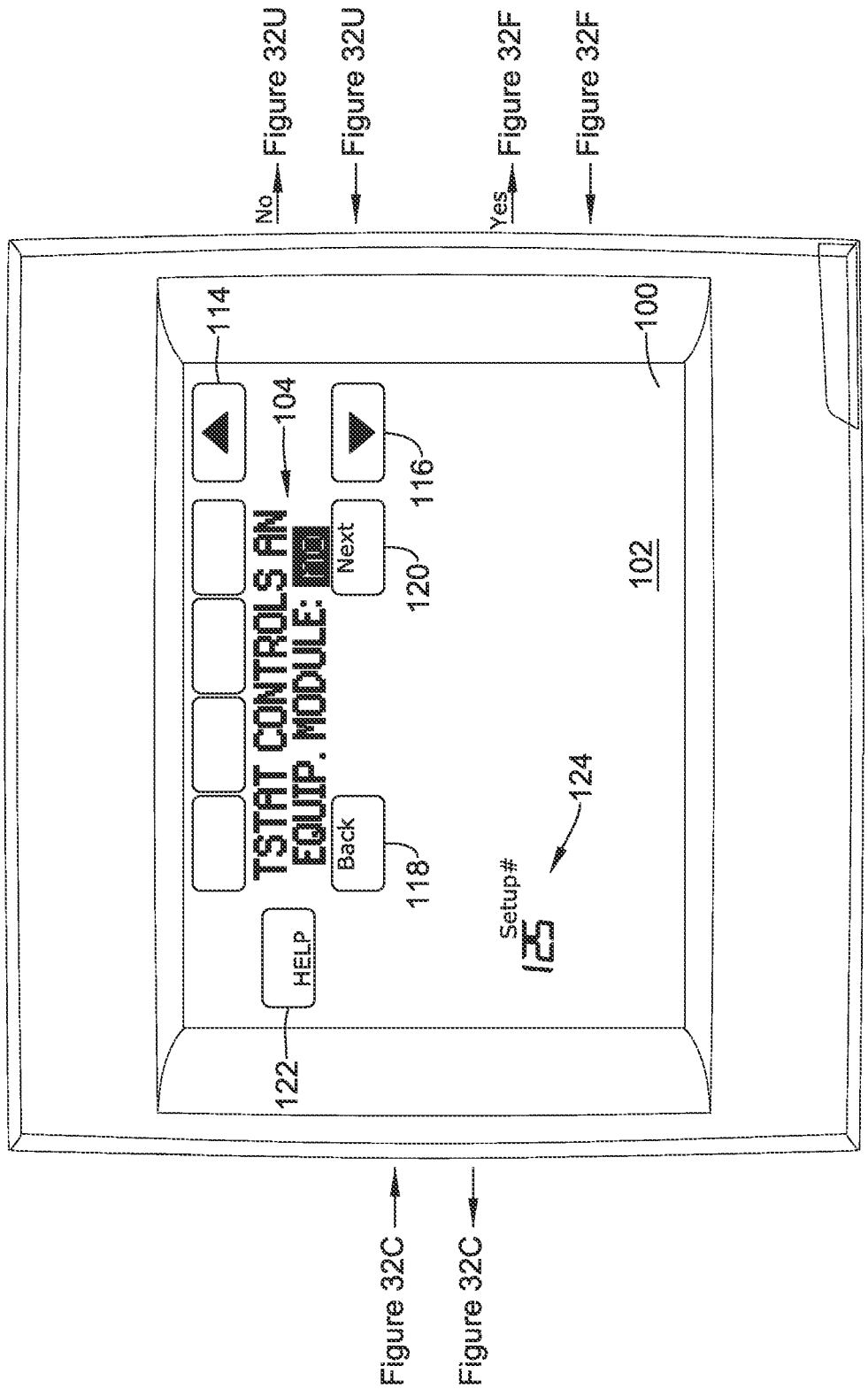

If the HVAC system is a zoned system, the accessory enrollment portion 110 may ask a user to select whether the thermostat 10 controls an equipment module in Setup# 125, as shown for example in FIG. 32T. A user may scroll between YES and NO with the up arrow 114 and/or down arrow 116. The YES or NO option may be selected when the desired option is highlighted in the first area 104 and a next button 120 is pressed or selected to go to a next screen. If it is desired to go to a previous screen, the back button 118 may be selected. If help is needed, a help button 122 may be selected.

Once it has been indicated that the system is zoned, and that the thermostat 10 controls an equipment module system by selecting YES in the screen of FIG. 32T, the accessory enrollment portion 110 may ask a user to press or select a next button 120 to begin connecting the thermostat 10 to the equipment module, as shown for example in and discussed with respect to FIGS. 32F-32I.

In instances where the equipment interface module and a humidity sensor accessory or other accessory are to be used, substantially all or all of the relays and inputs on the interface module may be used. In one example, the thermostat 10 standing alone (e.g., as a host) may only work with a three (3) heat/two (2) cool heat pump system or a two (2) heat/two (2) cool conventional system, but when the thermostat 10 is used with the equipment interface module (e.g., a client), the thermostat 10 may control a four (4) heat/two (2) cool heat pump or a three (3) heat/two (2) cool conventional system. As such, in some cases, the functionality and/or capability of the thermostat 10 may increase once it is linked with an equipment interface module.

In another example, if the thermostat 10 is used as a standalone thermostat, there may only be one (1) input terminal for an indoor sensor, an outdoor sensor, and/or a discharge sensor. When the thermostat 10 is connected with the equipment interface module, the thermostat 10 may service for four (4) input terminals which may be used with an indoor sensor, an outdoor sensor, a discharge sensor, a return sensor, a dry contact device for remote setback, a dry contact device to display alerts, and/or one or more other accessories.

In another example, if the thermostat 10 is used as a standalone thermostat, it may be able to control one of the humidification, dehumidification, or ventilation. When the thermostat 10 is connected with the equipment interface module, however, the thermostat 10 may be setup to control humidification, dehumidification, and/or ventilation.

Figure 32U:
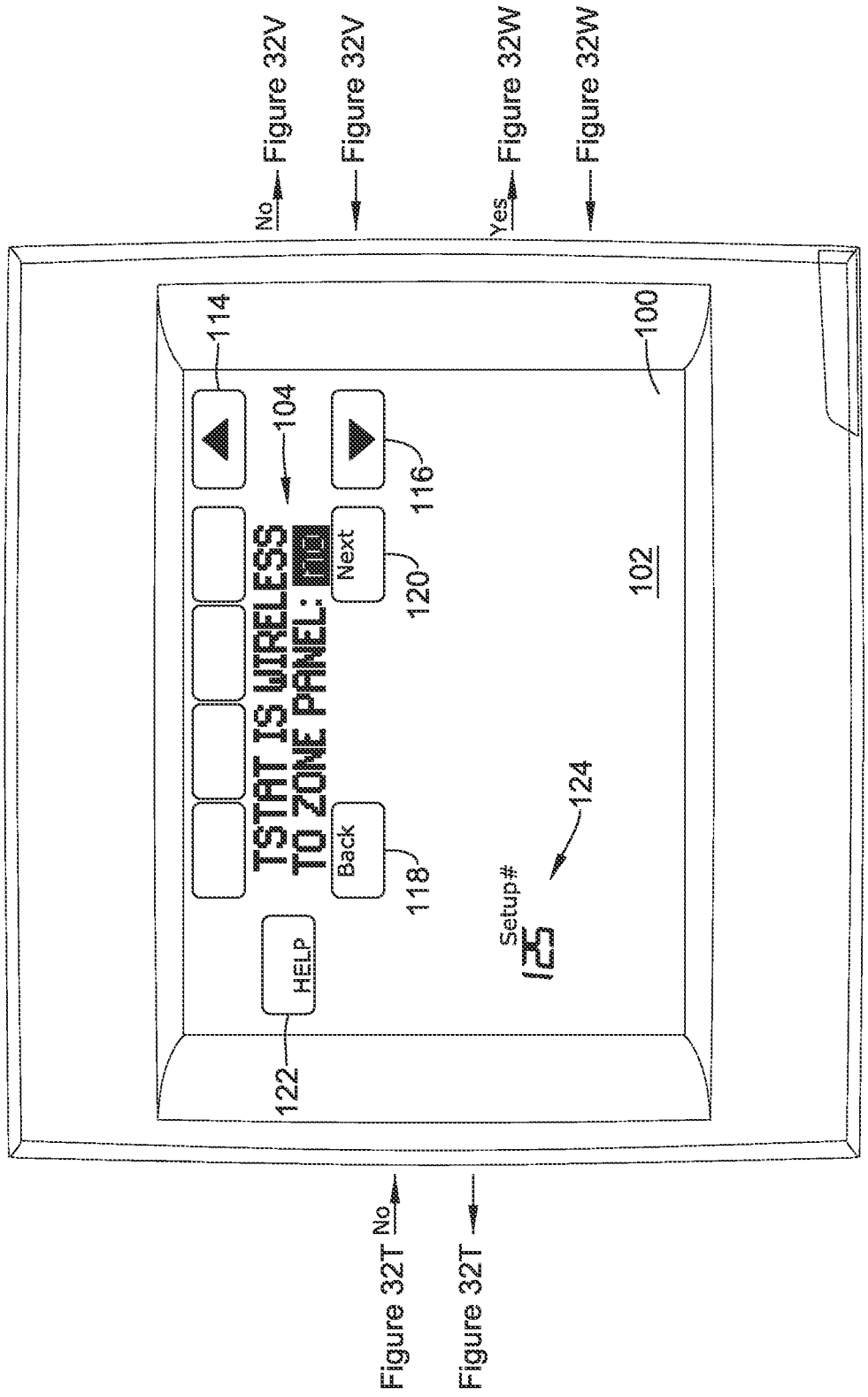

Once it has been indicated that the system is zoned and that the thermostat 10 does not control an equipment interface module system by selecting NO in the screen of FIG. 32T or after the accessory and/or equipment interface module setups are complete, the accessory enrollment portion 110 may ask a user to select whether the thermostat 10 is wirelessly connected to a zone panel in Setup# 125, as shown in FIG. 32U. A user may scroll between YES and NO with the up arrow 114 and/or down arrow 116. The YES or NO option may be selected when the desired option is highlighted in the first area 104 and a next button 120 is pressed or selected to go to a next screen. If it is desired to go to a previous screen, the back button 118 may be selected. If help is needed, a help button 122 may be selected.

Figure 32V:
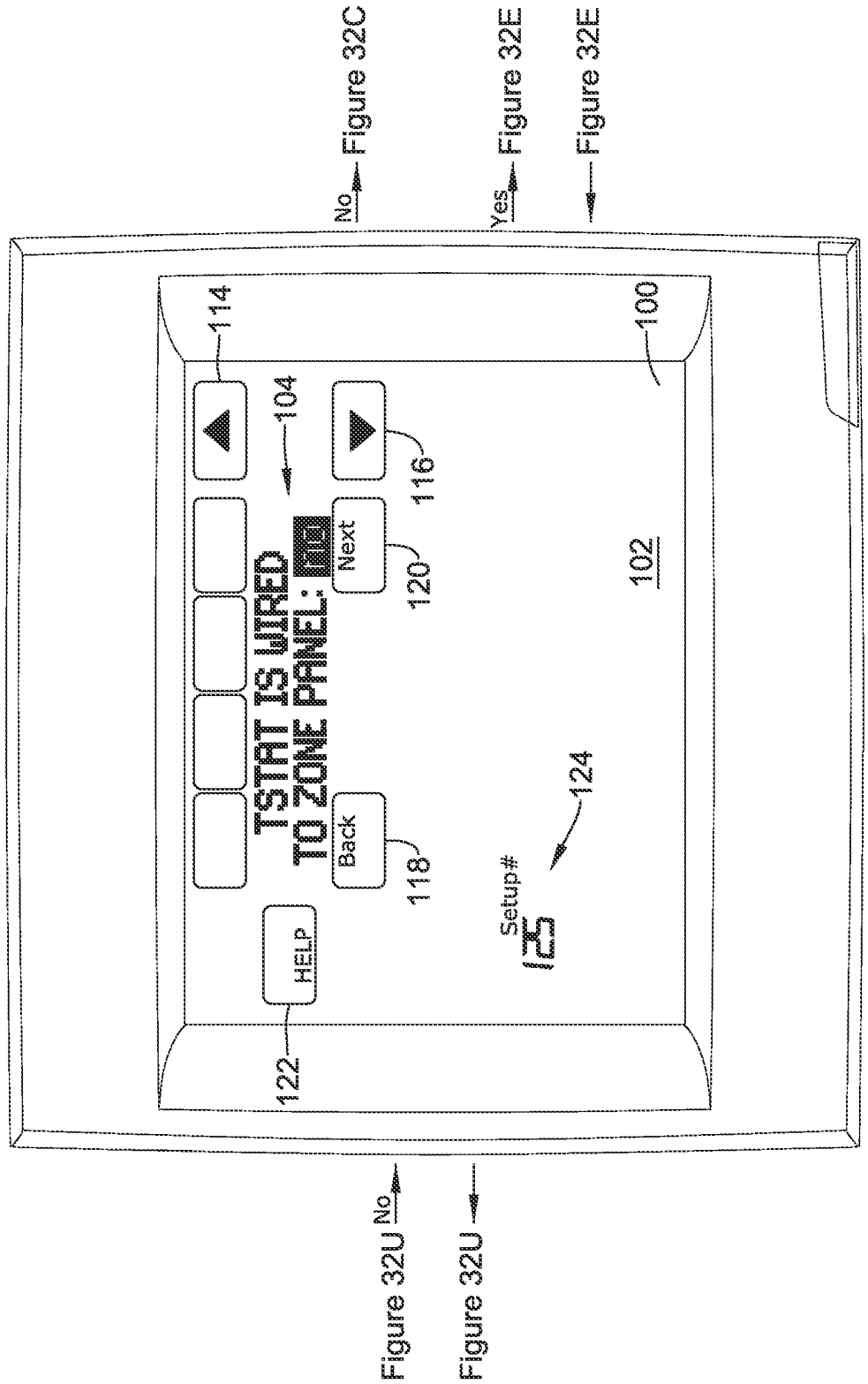
Figure 32W:
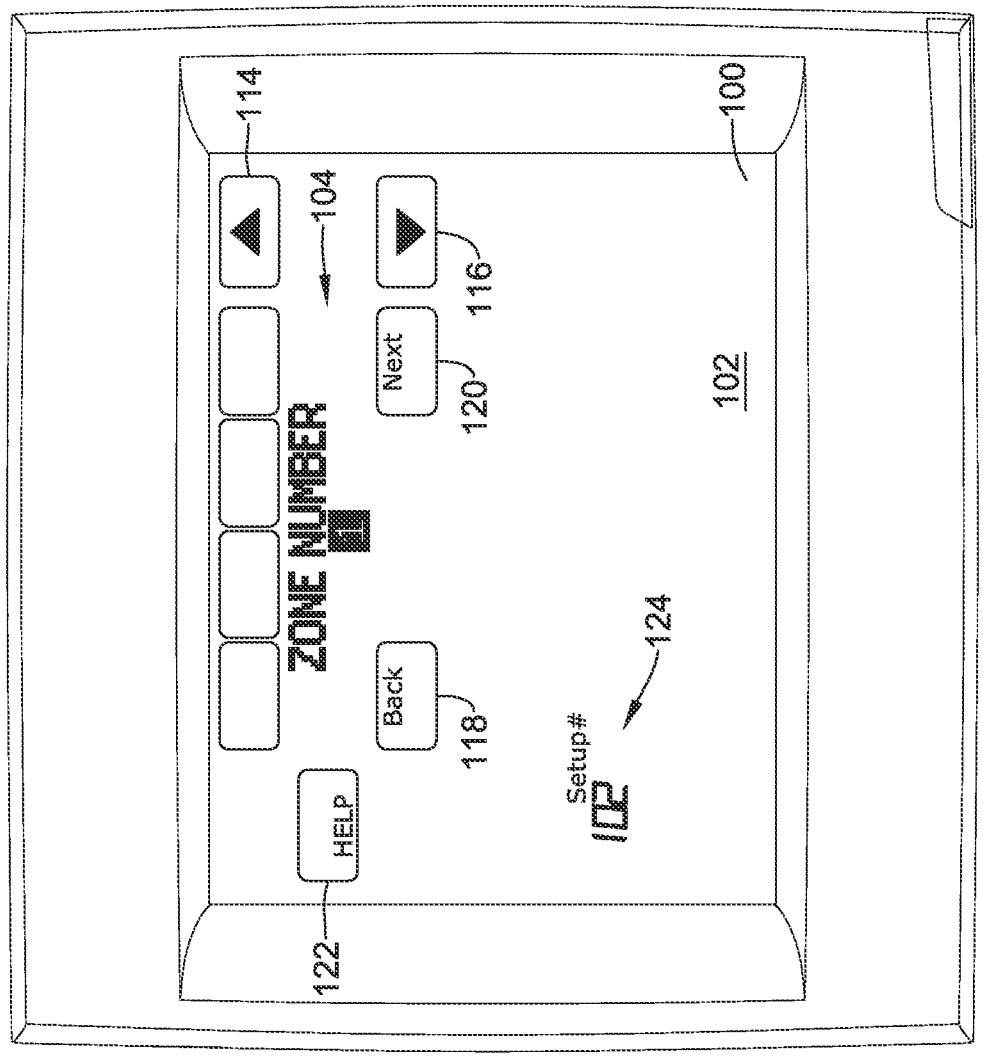

Once it is indicated that the thermostat 10 is wirelessly connected to a zone panel, the accessory enrollment portion 110 may ask for a zone number to setup in Setup# 102, as shown for example in FIG. 32W. In some instances, the interface display 100 may display a message in the first area 104 or any other area indicating ZONE NUMBER followed by a list of numbers. In some cases the list of zone numbers may include 1, 2, 3, 4, 5, 6, 7, 8, 9, 10, 11, 12, 13, 14, 15, 16, and/or any other number of zones, as desired. Alternatively, one or more other messages may be displayed. Once the desired zone number is highlighted, the next button 120 may be selected or pressed to connect the thermostat 10 as the selected zone to the wireless zone panel. If it is desired to go to a previous screen, the back button 118 may be selected. If help is needed, a help button 122 may be selected.

Figure 32X:
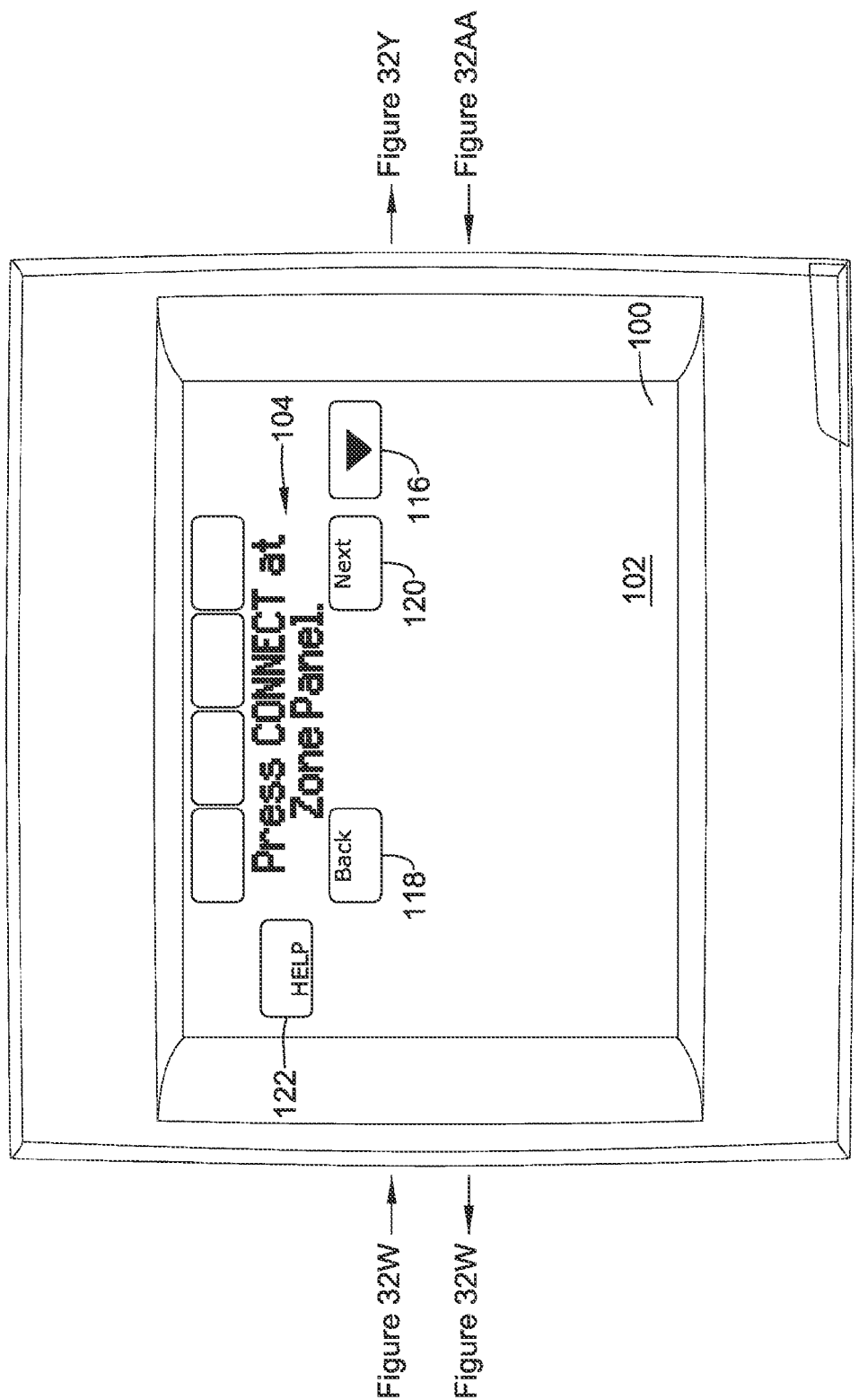

Once the zone number for the thermostat 10 has been selected, interface display 100 may show a message indicating PRESS CONNECT AT ZONE PANEL, THEN PRESS NEXT, as shown for example in FIG. 32X. Alternatively, or in addition, any other message may be displayed. In some instances, only two (2) lines of the message may be displayed in the first area 104 and the down arrow 116 and/or the up arrow 114 may be selected or pressed to scroll through the rest of the message. The next button 120 may be selected to begin connecting the thermostat 10 to the wireless zone panel. If it is desired to go to a previous screen, the back button 118 may be selected. If help is needed, a help button 122 may be selected.

Once the next button 120 has been select to connect the thermostat 10 to the wireless zone panel, the interface display 100 may display a screen indicating that the thermostat is being connected to the wireless zone panel by displaying a message indicating CONNECTING THERMOSTAT in the first area 104 or other area.

If the connection of the thermostat 10 to the wireless zone panel is unsuccessful, a screen may display a message indicating that the connection failed, as shown for example in FIG. 32AA. If the connection failed due to no response or a weak signal, the screen may show a message indicating CONNECTION FAILED. VERIFY THE CONNECT LED ON THE WIRELESS ZONE PANEL IS FLASHING AND YOU ARE AT LEAST 2 FEET AWAY. TRY CONNECTING AGAIN. If the connection failed due to an incompatible instance, the screen may show a message indicating CONNECTION FAILED. THIS ZONE IS CURRENTLY SET TO "WIRED" AT THE ZONE PANEL. PLEASE SET THIS ZONE TO "RF" AND TRY AGAIN. If the connection failed due to an invalid instance, the screen may show a message indicating CONNECTION FAILED FOR ONE OF TWO REASONS. THE ZONE NUMBER SET ON THE THERMOSTAT DOES NOT MATCH THE ZONE NUMBER ON THE TRUEZONE™ PANEL. PLEASE SET THE CORRECT ZONE NUMBER ON THE THERMOSTAT. THE OTHER REASON WHY THE THERMOSTAT MAY NOT HAVE CONNECTED IS BECAUSE THE THERMOSTAT IS CURRENTLY SETUP TO CONNECT TO A TRUEZONE™ WIRELESS ADAPTER BUT YOU ATTEMPTED TO CONNECT TO AN EQUIPMENT INTERFACE MODULE. PRESS AND RELEASE THE CONNECT BUTTON AT THE EQUIPMENT INTERFACE MODULE TO TAKE IT OUT OF THE WIRELESS SETUP MODE. NEXT, PRESS AND RELEASE THE CONNECT BUTTON AT THE TRUEZONE™ WIRELESS ADAPTER AND VERIFY THE CONNECTED LED FLASHES GREEN. THEN TRY CONNECTING THE THERMOSTAT AGAIN. Alternatively, or in addition, one or more other messages may be displayed indicating a connection has failed. In some instances, only two (2) lines of the message may be displayed in the first area 104 and the down arrow 116 and/or the up arrow 114 may be selected or pressed to scroll through the rest of the message. Once the message has been displayed, the interface display 100 may ask a user to select a zone number and press or select a next button 120 to restart connecting the thermostat 10 to the wireless zone panel, as shown for example in FIG. 32W. If it is desired to go to a previous screen, the back button 118 may be selected or pressed. Alternatively, pressing or selecting the back button 118 may bring the interface display to the zone number selection screen depicted in FIG. 32W.

Figure 32Z:
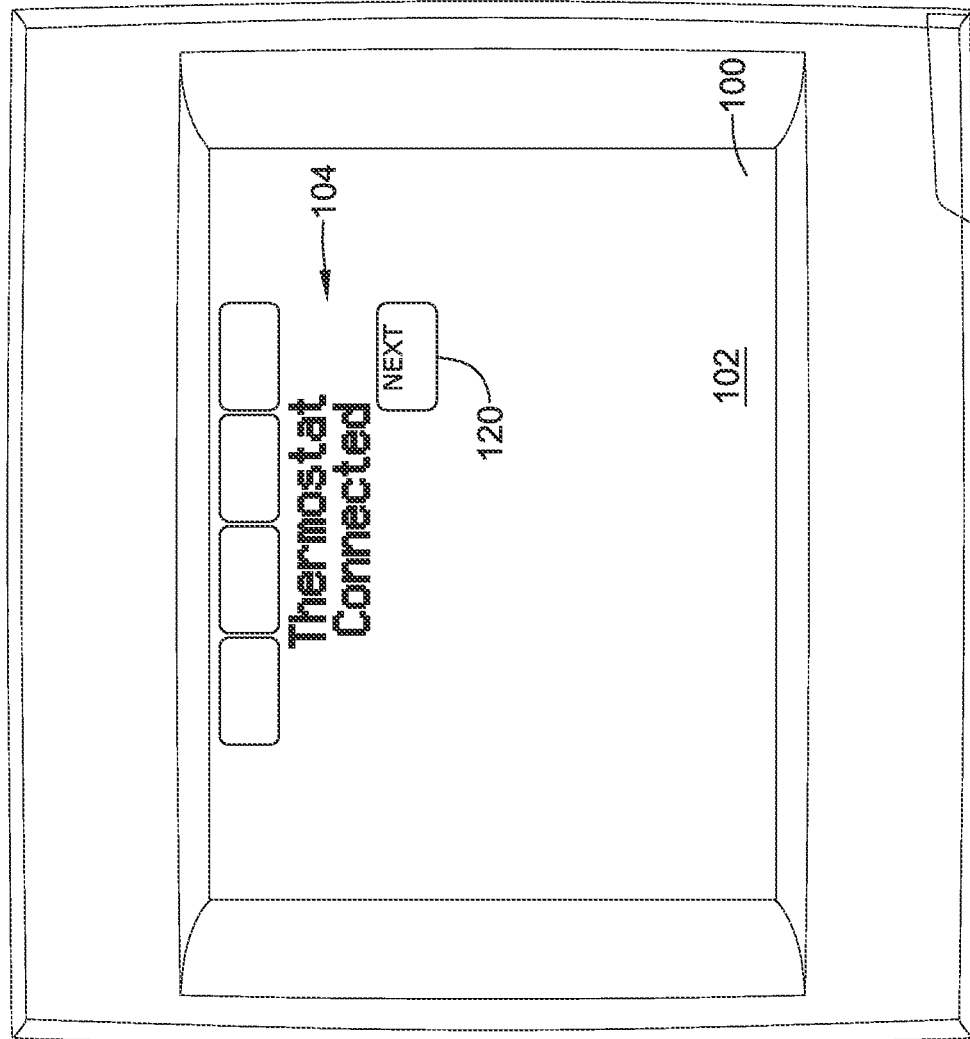
Figure 32A:
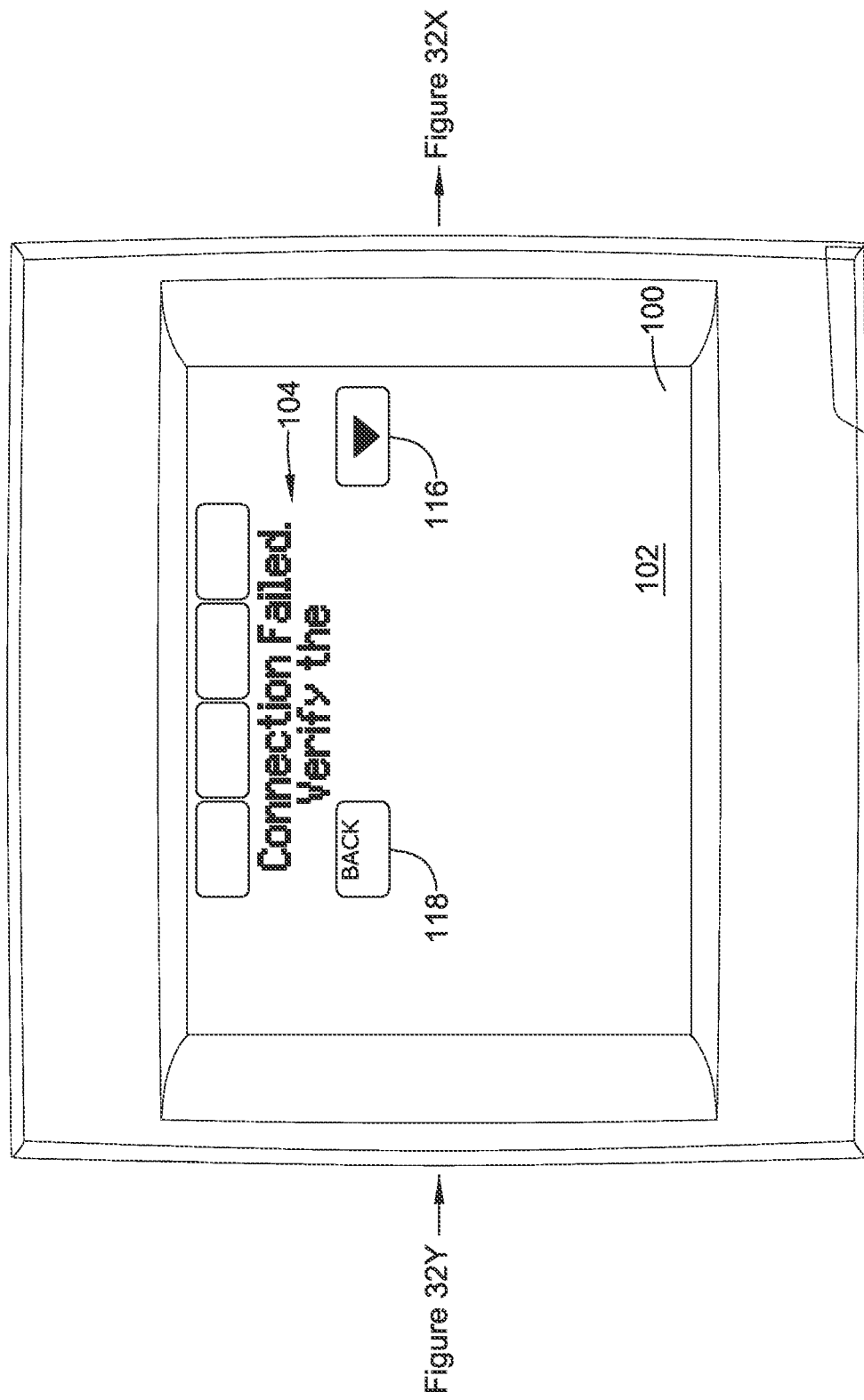

If the connection of the thermostat 10 to the wireless zone panel was successful, a screen may show that the thermostat is connected to the wireless zone panel, as shown for example in FIG. 32Z. A user may then be prompted to press or select the next button 120 to go the thermostat set up portion having an initial screen, as shown for example in FIG. 32J. A user may select whether to connect accessories by selecting a YES button 128 or a NO button 130. If the NO button 130 is selected, the thermostat setup portion 112 may be entered. If the YES button 128 is selected, the user may be brought to an accessory connection screen, as shown for example in FIG. 32P.

If it is indicated that the system is zoned, and that the thermostat 10 does not control an equipment module system by selecting NO in the screen of FIG. 32T, or after the accessory and/or equipment interface module setup is complete, and that the thermostat 10 is not to be connected to a wireless zone panel by selecting NO in the screen of FIG. 32U, the accessory enrollment portion 110 may ask a user to select whether the thermostat 10 is wired to a zone panel in Setup# 125, as shown in FIG. 32V. A user may scroll between YES and NO with the up arrow 114 and/or down arrow 116. The YES or NO option may be selected when the desired option is highlighted in the first area 104 and a next button 120 is pressed or selected to go to a next screen. If it is desired to go to a previous screen, the back button 118 may be selected. If help is needed, a help button 122 may be selected.

If the thermostat 10 is wired to a zone panel, the accessory enrollment portion 110 may ask whether accessories are to be connected to the thermostat 10, as shown for example in, and described with respect to, FIG. 32E. If the thermostat 10 is not to be wired to a zone panel, the system may return to the screen shown for example in FIG. 32C asking whether the system is zoned.

Installer setup may be accessed upon initial setup as discussed above and/or installer setup may be access through the menu screen 174, as depicted in FIG. 34, which may be advanced to by selecting or pressing the menu button 158 in the home screen 138, as shown for example in FIG. 33. The menu list in the menu screen 174 may be scrolled through by pressing or selecting the up arrow 114 and/or the down arrow 116 until an INSTALLER OPTIONS item is highlighted among other menu list items including, but not limited to: EDIT SCHEDULE, VIEW SCHEDULE, VACATION MODE, HOLIDAY SCHEDULE, HOLIDAY MODE, EQUIPMENT STATUS, DATE/TIME, PREFERENCES, CLEAN SCREEN, SECURITY SETTINGS, DEALER INFORMATION, INSTALLER OPTIONS. Once INSTALLER OPTIONS is highlighted, the select button 160 may be pressed or selected and/or the first area 104 may be pressed to go to installer options.

Figure 37:
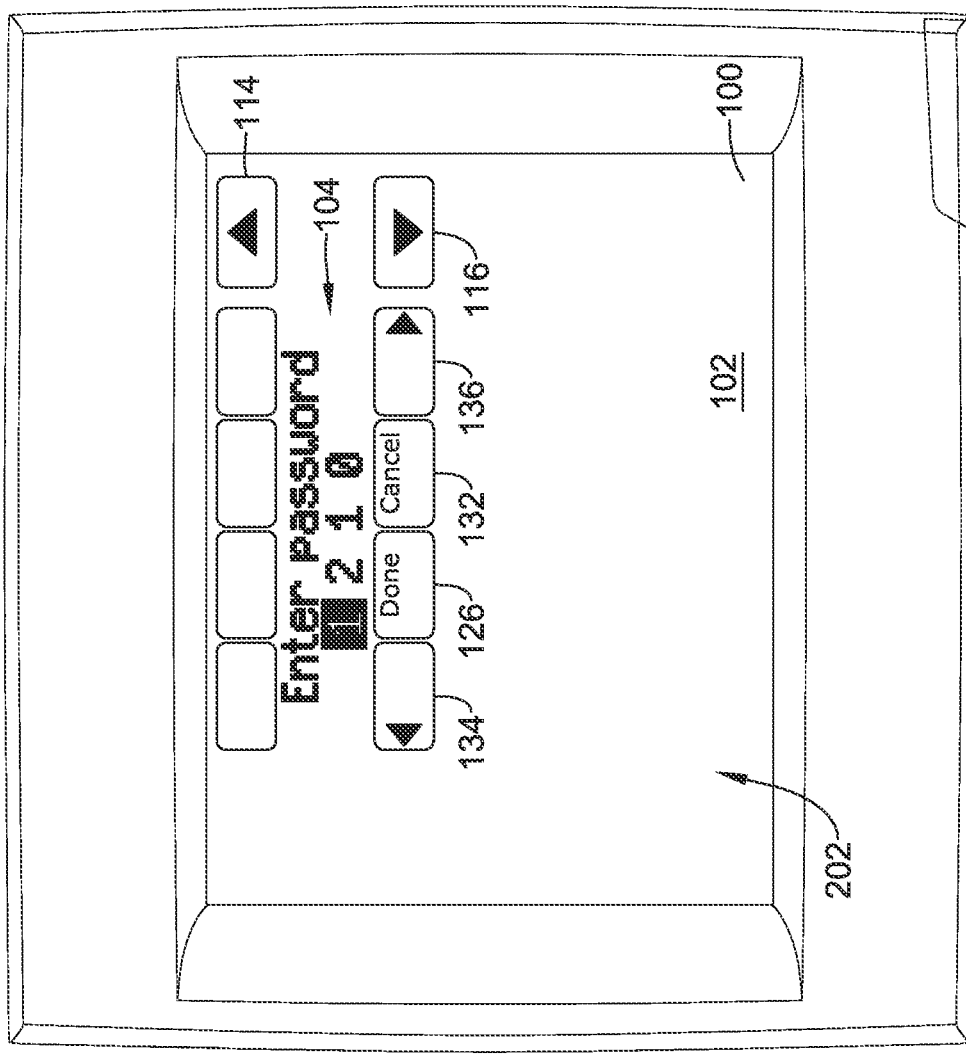
FIG. 37 show an illustrative password entry screen.

Once INSTALLER OPTIONS has been selected, the interface display 100 may prompt a user to enter a password or passcode in a password screen 202, as shown for example in FIG. 37. In one example, a four digit number may be used, where each digit may be any number from 0-9. Each digit may be scrolled between by pressing or selecting the left arrow 134 and/or the right arrow 136. Each number may be chosen by scrolling through the numbers 0-9 with the up arrow 114 and/or the down arrow 116. Once the password or passcode is entered, the done button 126 may be pressed or selected to move onto the next screen. If it is desired to exit from installer options, a cancel button 132 may be selected.

Figure 38:
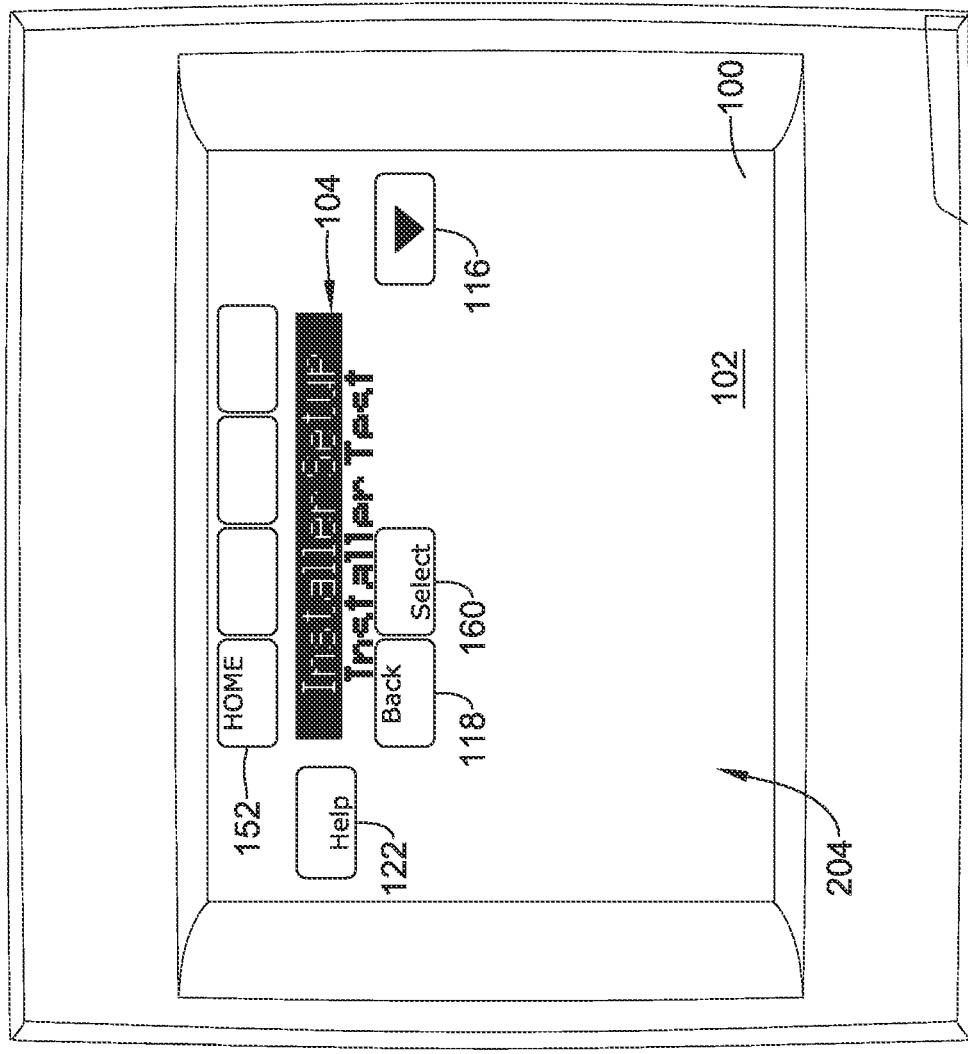
FIG. 38 show an illustrative installer menu screen.

After correctly entering a password or passcode, the interface display 100 may display a list of installer set up items in the first area 104 in an installer menu screen 204, as shown for example in FIG. 38. The installer setup items list may include, but are not limited to, INSTALLER SETUP, INSTALLER TEST, DATA LOSS, WIRELESS MANAGER, RESET TO DEFAULTS, DEVICE INFO, etc. The list of installer setup items may be scrolled through with the up arrow 114 and/or the down arrow 116 and a highlighted item may be selected by pressing the select button 160 or tapping the first area 104. If it is desired to go to a previous screen, the back button 118 may be selected or pressed. If help is needed, the help button 122 may be selected or pressed.

In some instances, one or more (e.g., two or more, three or more, each) of the installer setup items may be displayed in the first area 104 with a name that describes the feature being set and/or value of an effective setting of the particular item. Once an INSTALLER SETUP item is selected, each item or step of the installer setup may have a setup number displayed in a set up number area 124 in the second area 102 of the interface display 100, as shown for example in FIGS. 32A-32C, which may provide a unique identifier of each installer setup item or step.

In some cases, an installer setup item name and value may be display in the first area 104 of the interface display 100. For example, the installer setup item name may be displayed on a first line of text in the first area 104 and the installer setup item value may be displayed on a second line of text in the first area 104.

The processor or controller of the thermostat 10 may be configured to animate the installer setup item name and/or value when these features are optionally simultaneously displayed in the first area 104 of the interface display 100 in a vertical, horizontal, and/or any other direction. In one example of displaying installer setup items, when the installer setup item name is switched between a displayed first installer setup item and a second installer setup item (which may or may not be simultaneously displayed with the first installer setup item), the processor or controller may be configured to animate the installer setup items in a horizontal direction or a vertical direction to display the second installer setup item name. In another example, when switching between a displayed first predefined installer setup item value and a second predefined installer setup item value (which may or may not be simultaneously displayed with the first predefined installer setup item value), the processor or controller may be configured to animate the predefined installer setup item values in a vertical and/or horizontal direction to display the second predefined installer setup item value. Illustratively, switching installer setup item names and/or values (e.g., predefined installer setup item values) in an animated manner may be effected through touching and/or swiping an active touch area associated with the installer setup items in the first area 104 of the interface display 100, touching a button offset from the interface display 100 (e.g. a hard button), and/or touching an active touch area of one or more buttons (e.g., predefined buttons such as arrows 114, 116 or other buttons) in the second area 102 of the interface display 100.

The animation of the installer setup items may be utilized to dynamically adjust which installer setup items from a plurality of predefined installer setup items are displayed (e.g., displayed in a sequential manner). Illustratively, dynamic adjustment of installer setup item names and/or values may include adjusting the displayed installer setup item names and/or values for an installer setup item based on one or more installer setup item values selected for a previous setup item.

In an illustrative method of setting up an HVAC controller, two or more installer setup items may be sequentially displayed on the interface display 100 (e.g., in the first area 104 of the interface display 100). In some cases, each of the sequentially displayed installer setup items may include an installer setup item name and value that may be displayed in the first area 104 of the interface display 100. Further, the method may include accepting a selection of a predefined fixed segment icon of a first button in the second area 102 of the interface display 100. Selection of the predefined fixed segment icon in the second area 102 may include touching the first button therein, which may cause the processor or controller of the thermostat 10 to display a predefined installer setup item name and/or value that was not previously displayed in the first region of the interface display 100. Illustratively, with each selection of a button in the second area 102 of the interface display and the display of the installer setup item name and/or value in the first area 104, a setup item number that is associated with the displayed installer setup item name and/or value may be displayed in the second area 102 of the interface display 100. Additionally, or alternatively, the method may include dynamically adjusting which installer setup items from a plurality of predefined installer setup items are sequentially display, where the dynamically adjusting of the displayed predefined installer setup items may be in response to, and may depend upon, a previously selected installer setup item or other selection of any other option.

As discussed herein, the installer setup may be dynamically adjusted to fit the system capabilities in view of previous settings and may allow for a reduced number of setup items shown to a user because only those settings that are relevant are displayed based on previous selections. For example, if a previous selection indicates that no humidification system is present, settings related to a humidification are not displayed. As discussed throughout this disclosure, the up arrow 114 and/or the down arrow 116 in the second area 102 to the side of the first area 104 may be used to adjust values and navigating between setup items may be facilitated by using the back button 118 and/or the next button 120.

Once the installer setup of the thermostat setup portion 112 has been entered and a screen, as shown for example in FIG. 32J, is depicted on the interface display 100 displaying the message PRESS NEXT TO BEGIN THE INSTALLER SETUP OR INSERT A MICROSD CARD NOW TO SETUP THE THERMOSTAT. Alternatively, or in addition, one or more other messages may be displayed. If a memory card is to be used for thermostat setup, a user may insert a memory card (e.g., a microSD card) to setup the thermostat 10, wherein the thermostat setting may be downloaded from the memory card rather than entered/selected manually by the user.

Once installer set up has begun, the thermostat setup portion 112 may ask a user to select the thermostat type for thermostat 10 in Setup# 104, as shown in FIG. 32K. One or more thermostat types may be in a list through which a user may scroll with the up arrow 114 and/or down arrow 116. The list may include, among other options, PROGRAMMABLE and NON-PROGRAMMABLE. The thermostat type may be selected by scrolling through the list of thermostat types and when the desired thermostat type is highlighted in the first area 104, a next button 120 may be pressed or selected to go to a next screen. If it is desired to go to a previous screen, the back button 118 may be selected. If help is needed, a help button 122 may be selected.

Once a thermostat type has been selected, the thermostat setup portion 112 may ask a user to select the temperature scale for thermostat 10 in Setup# 105, as shown in FIG. 32L. One or more temperature scales may be in a list through which a user may scroll with the up arrow 114 and/or down arrow 116. The list may include, among other options, FAHRENHEIT, CELSIUS, etc. The temperature scale type may be selected by scrolling through the list of temperature scales and when the desired thermostat type is highlighted in the first area 104, a next button 120 may be pressed or selected to go to a next screen. If it is desired to go to a previous screen, the back button 118 may be selected. If help is needed, a help button 122 may be selected.

Installer setup and the interface display 100 may be used to set up one or more sensors internal to the thermostat 10 and/or one or more remote indoor temperature sensors for temperature control, as shown for example in FIG. 39A-39D depicting Setup# 504. In some instances, the first area 104 of the interface display 100 may display YES/NO questions that may allow a user to setup the thermostat 10 to sense a temperature only at the thermostat 10 for temperature control, sense at one of one or more remote indoor sensors (e.g., 1, 2, 3, 4, 5, 6, 7, 8, 9, etc.) for temperature control, where any connected indoor temperature sensor may be selected, or average any or all of the temperature sensors (e.g., the temperature sensor(s) internal to the thermostat 10 and/or the remote indoor temperature sensors) for temperature control. When multiple remote indoor sensors are connected to the thermostat 10, the first area 104 of the interface display 100 may display the name provided to each of the remote indoor sensors.

Figure 39A:
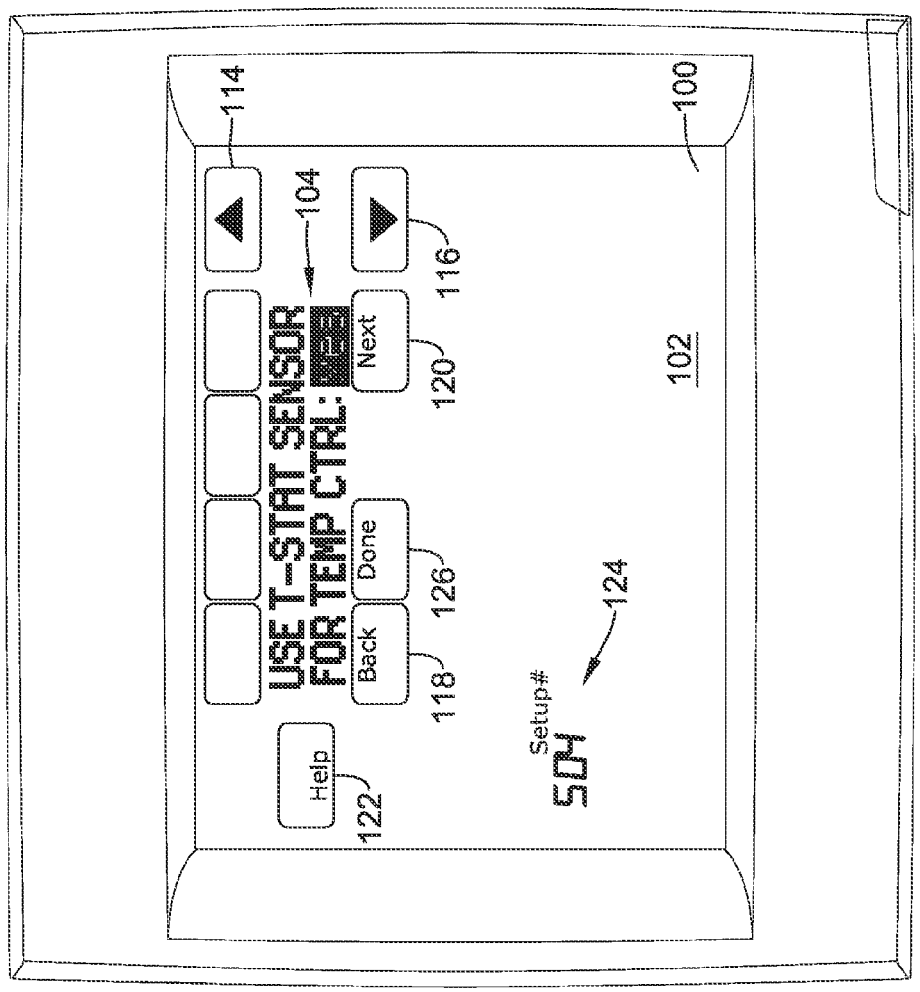
FIGS. 39A-39D show illustrative sensor setup screens.
Figure 39B:
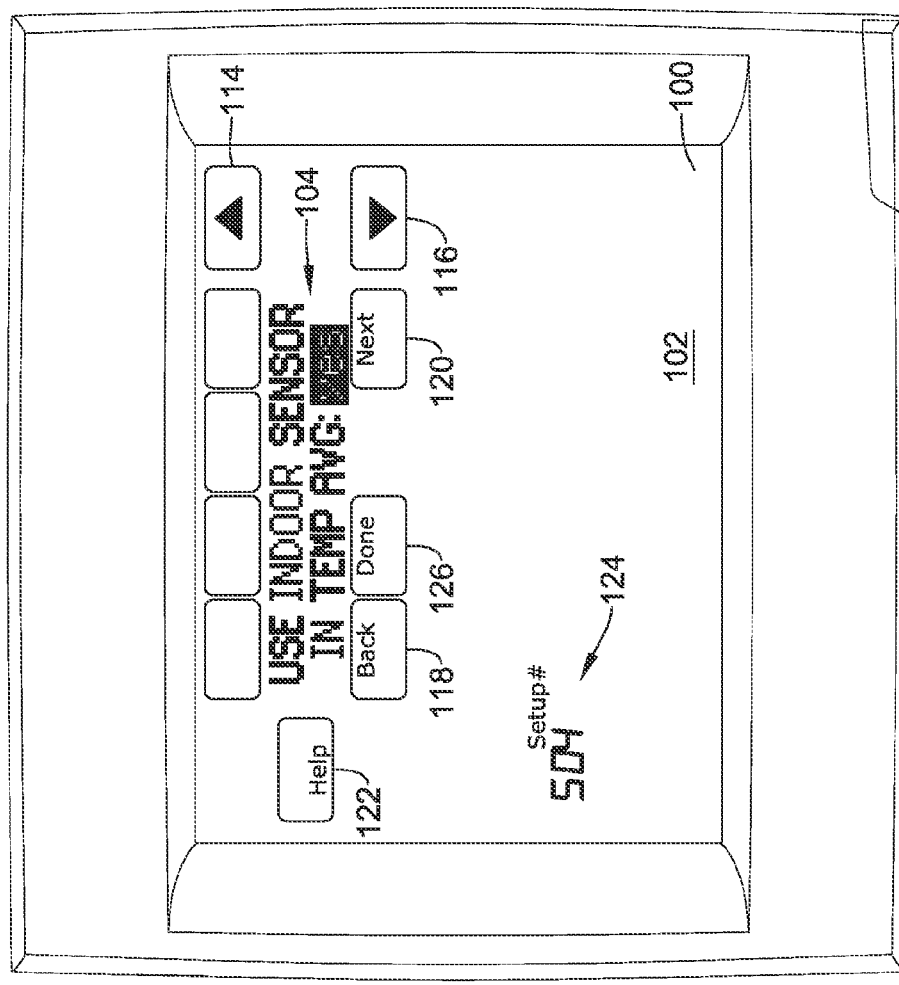
Figure 39C:
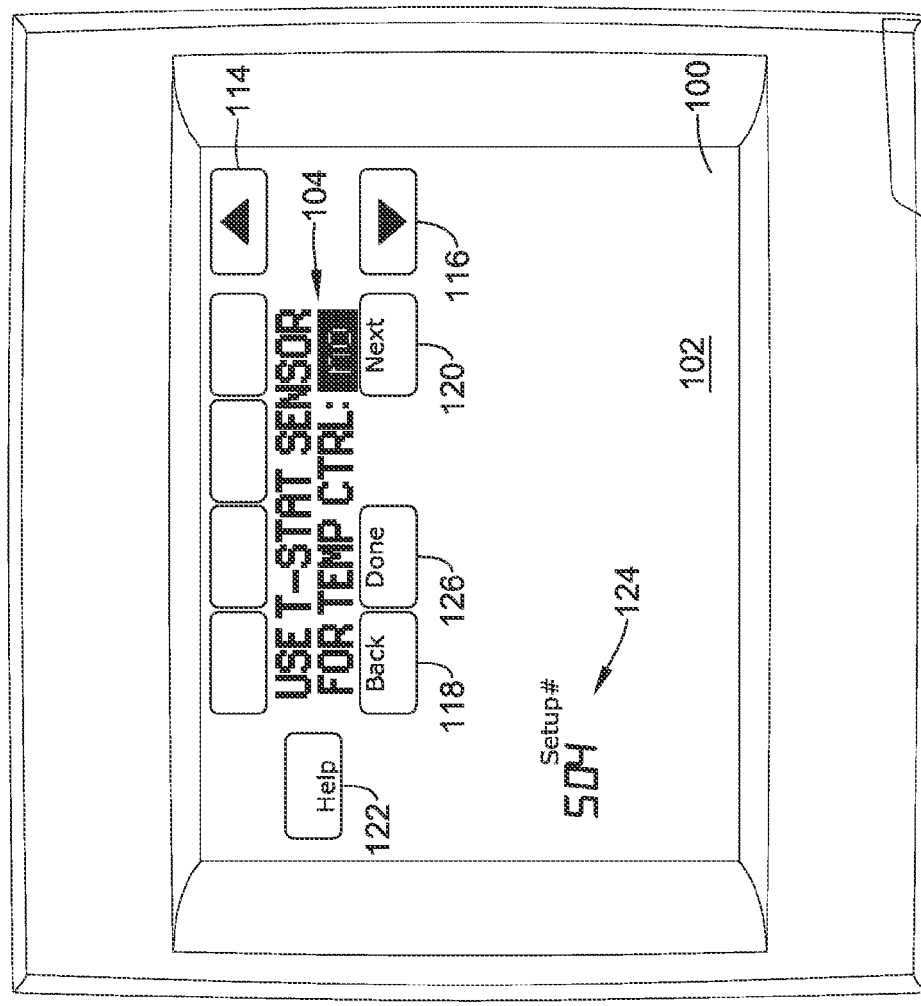
Figure 39D:
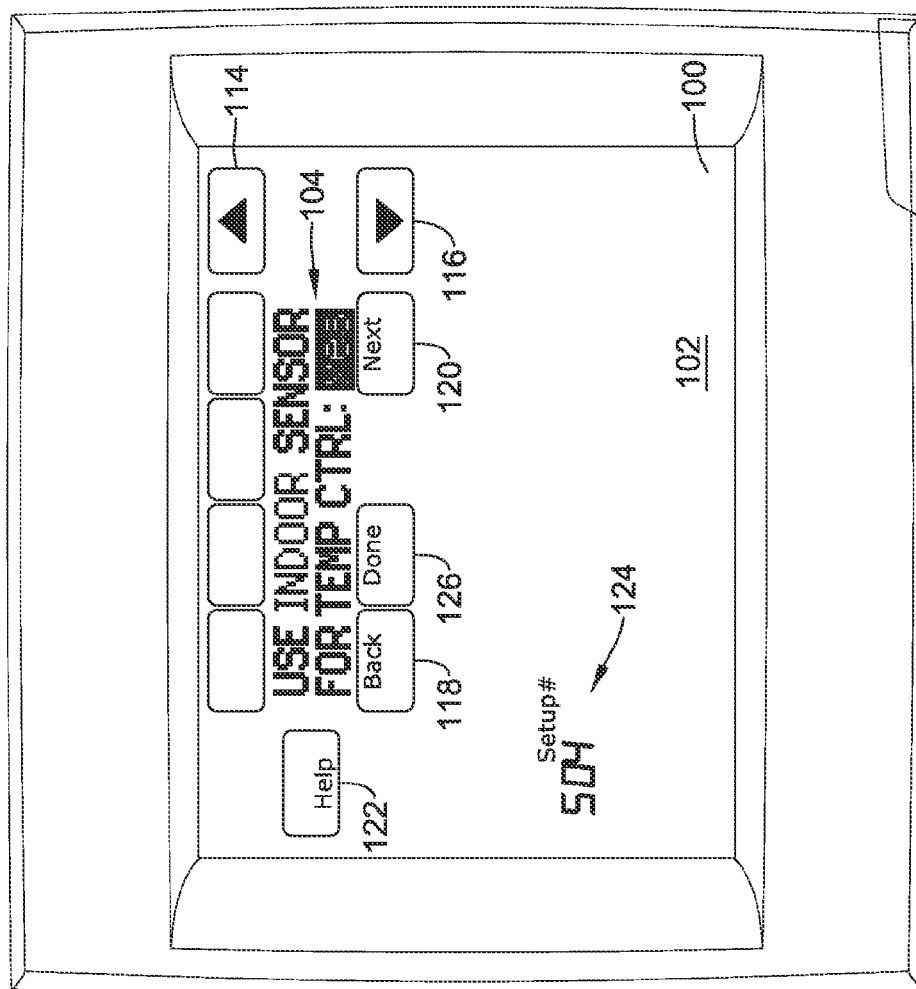

As shown for example in FIG. 39A, when setting up the temperature sensor for temperature control, the first area 104 of the interface display 100 may display USE T-STAT SENSOR TEMP CONTROL and allow a user to select YES or NO. If NO is selected, the first area 104 of the interface display 100 may display USE INDOOR SENSOR [or other sensor name] FOR TEMP CTRL and allow a user to select YES or NO, as shown for example in FIG. 39D. The thermostat 10 may continue to display messages in the first area 104 of the interface display 100 inquiring which temperature sensor(s) to use for temperature control. Once a temperature sensor has been selected for temperature control, the first area 104 of the interface display 100 may display USE INDOOR SENSOR [or other sensor name] IN TEMP AVG and allow a user to select YES or NO, as shown for example in FIGS. 39B and 39C. If yes is selected, the temperature sensor may be used by the thermostat 10 in averaging temperatures from one or more temperatures sensors for temperature control. If NO is selected, the measurements from the temperature sensor will not be used in the temperature average utilized by the thermostat 10 for temperature control. If NO is selected for all of the temperature sensors, the thermostat 10 may remove the next button 120 and/or the done button 126 from the second area 102 of the interface display 100 at the last question, which may force a user to go back and select a temperature sensor for temperature control by the thermostat 10. Alternatively, the thermostat 10 may automatically select a temperature sensor to use for temperature control if one is not chosen (e.g., the temperature sensor internal to the thermostat 10). Similar selection of temperature sensors connected to the thermostat 10 may be utilized by thermostat 10 for humidification control, dehumidification control, and/or controlling of other features. Allowing for the optional selection of temperature sensors connected to the thermostat 10 for controlling different system, may allow a user to determine which sensor will be used to control which systems or features of an HVAC system.

When it is desired to exit the installer setup of the thermostat setup portion 112, the done button 126 depicted in some or all of the screens of the installer setup may be selected or pressed. After selecting the done button 126, a screen may display a message asking DO YOU WANT TO EXIST INSTALLER SETUP?, as shown for example in FIG. 32M. In response to this question, a YES button 128 or a NO button 130 may be selected. If the NO button 130 is selected, the last presented screen of the installer setup may be displayed on the interface display 100.

Figure 41:
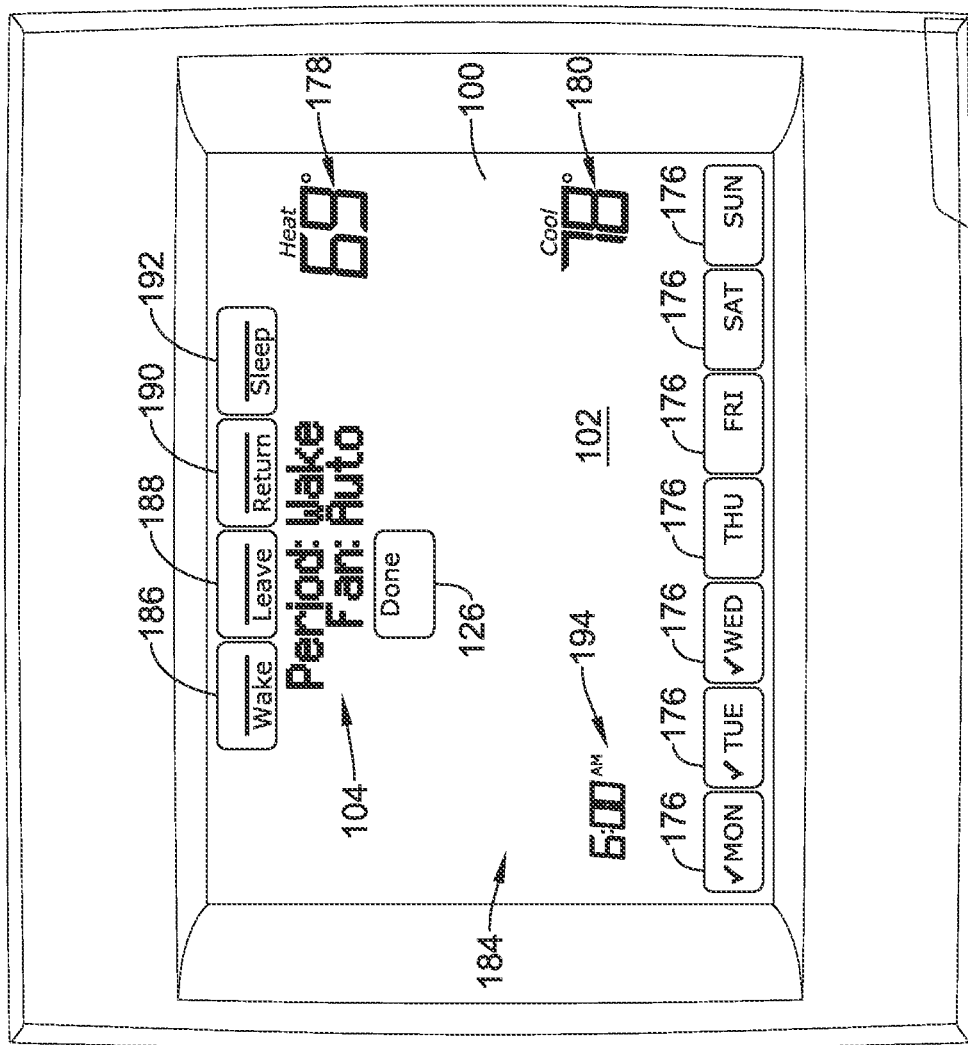
Figure 42:
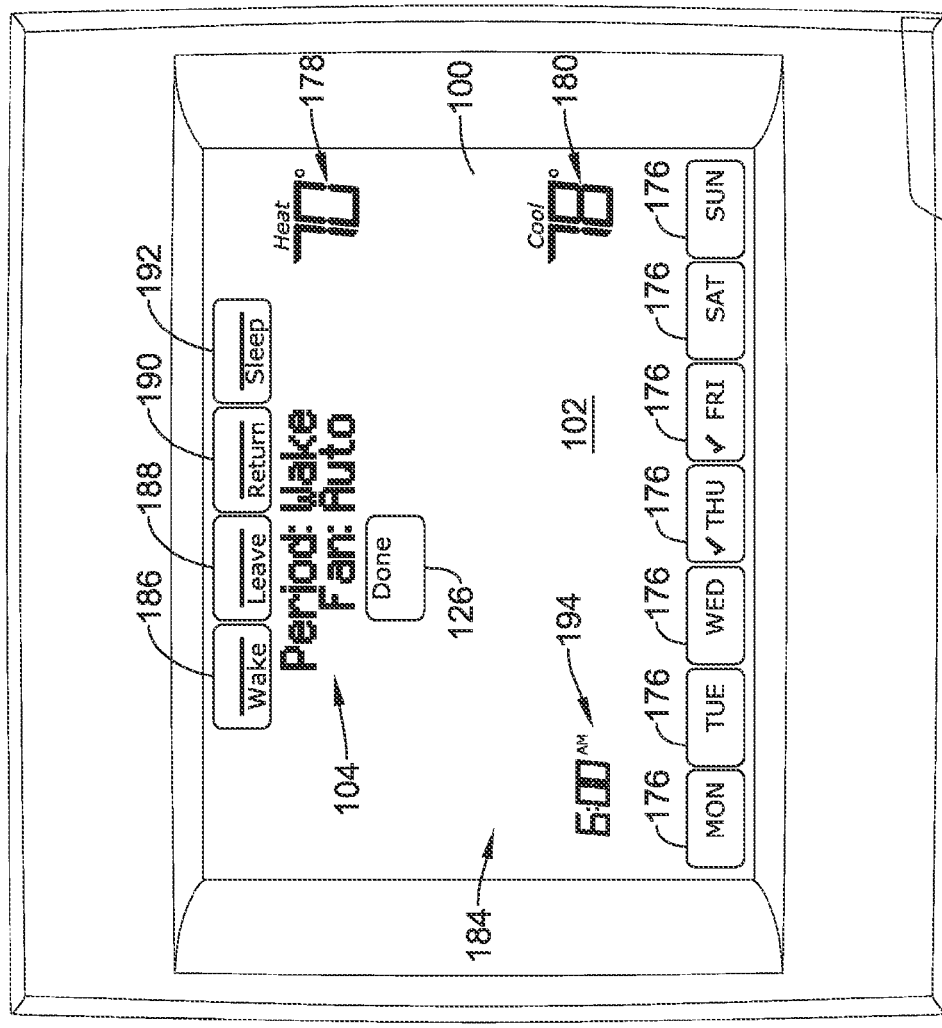
Figure 43:
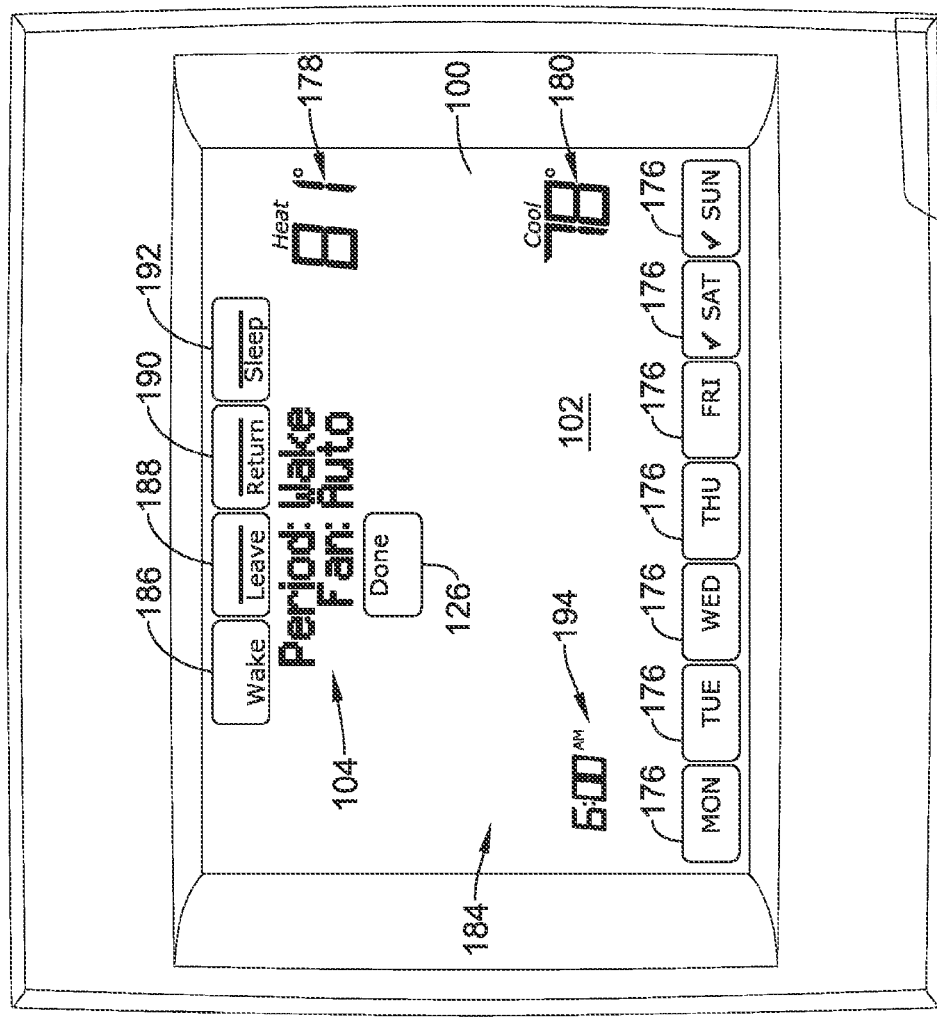

If the YES button 128 is selected, in the first area 104 an animated screen displaying a SAVING CHANGES message with an animation 206 (e.g., a bar or other feature(s)) sliding from left to right, right to left, and/or any other animation indicating the thermostat is actively saving the changes, as shown for example in FIGS. 32N and 41. Alternatively, or in addition, a different message may be displayed in the first area 104, if at all, and/or a different animation may be utilized, if at all. Once the changes to the installer setup of thermostat 10 have been saved, a home screen as depicted in FIG. 32O may be displayed on the interface display 100. In some instances, the saving changes functionality of the thermostat 10 may apply to features of thermostat 10 that involve making changes to the thermostat 10 other than features related to the installer setup.

In some cases, the thermostat 10 may include an edit schedule mode that may be entered to allow a user to set, edit and/or modify an HVAC system schedule. The edit schedule mode may be accessed from the menu screen 174, as shown for example in FIG. 47A. Once the EDIT SCHEDULE item is highlight in the menu list on the menu screen 174, the select button 160 is pressed to enter the edit schedule mode. As shown for example in FIG. 47B, the first area 104 of the interface display 100 may display a message asking USE SCHEDULING ASSISTANT?, or display any other message. If the scheduling assistant will not be used, a user may select the NO button 130 and enter an HVAC system schedule without the scheduling assistant.

If the YES button 128 is pressed or selected, the user will use the scheduling assistant to set the HVAC system schedule. As shown for example in FIG. 47C, the first area 104 of the interface display 100 may display a message of SELECT DAYS WITH SAME SCHEDULE. A user may then select which days will have the same schedule by pressing or selecting day buttons 176. Once one or more days have been selected, the first area 104 of the interface display 100 displays a message of PRESS NEXT AFTER SELECTING DAYS, as shown for example in FIG. 47D. Once the days having the same schedule have been selected, the next button 120 may pressed or selected to go to the next screen. After selecting the next button 120, the first area 104 of the interface display 100 may display a message asking IS SOMEONE HOME ALL DAY?, as shown for example in FIG. 47E. If someone is expected to home all day, the YES button 128 is selected and the scheduling assistant will skip the LEAVE and RETURN time periods. If someone will not be home all day, the user will select the NO button 130.

After indicating if someone will be home all day, the scheduling assistant will ask the user to set a beginning time for each time period of the HVAC system schedule. In the first area 104 of the interface display 100, a message asking WHEN DOES THE FIRST PERSON WAKE UP? may be displayed, as shown for example in FIG. 47F. After a time is set, the next button 120 may be pressed or selected to go onto the next screen.

Figure 47A:
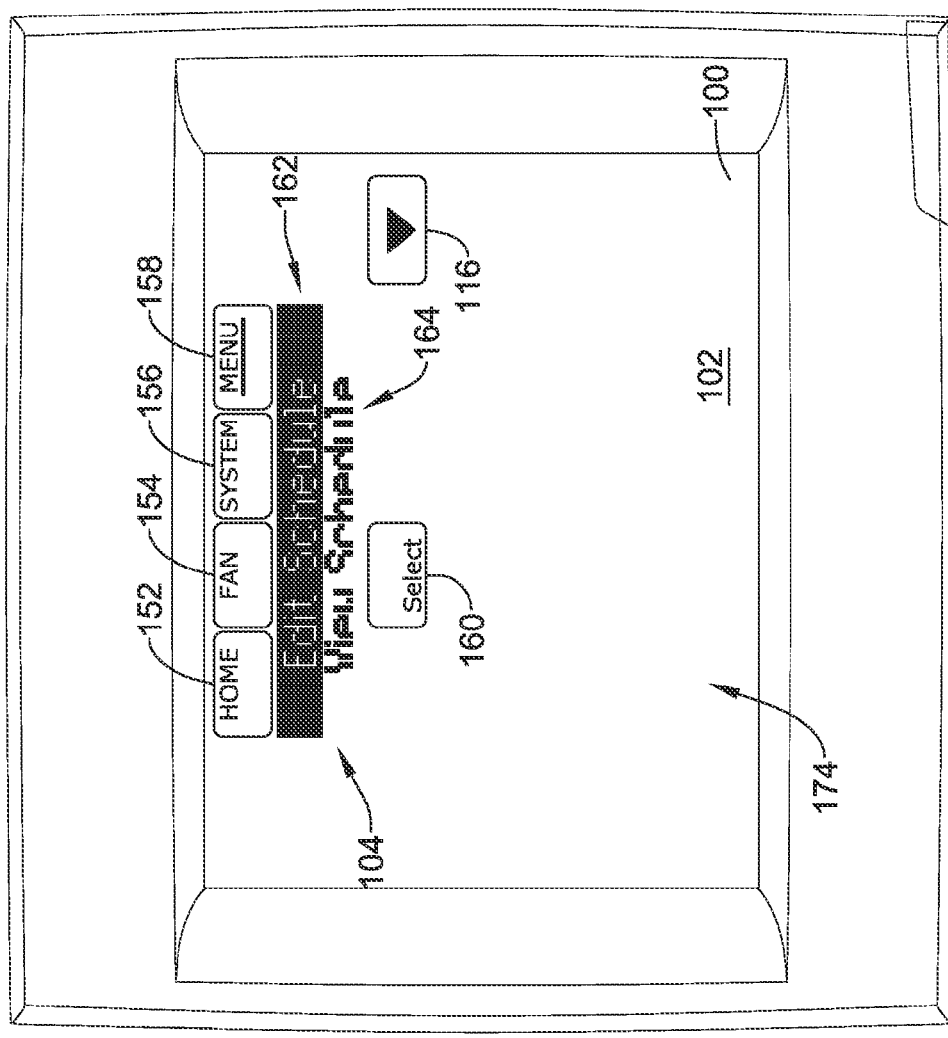
FIGS. 47A-47U show illustrative edit schedule screens that use an illustrative scheduling assistant routine.
Figure 47B:
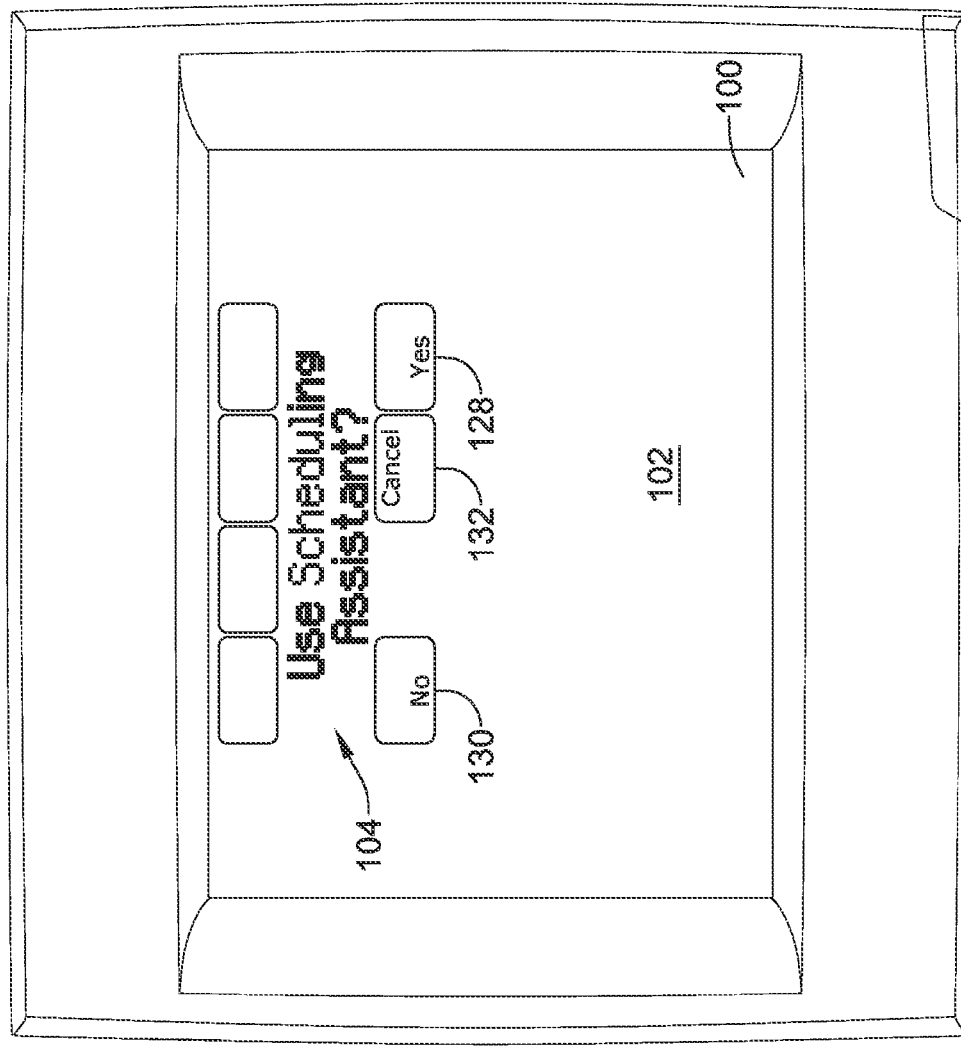
Figure 47C:
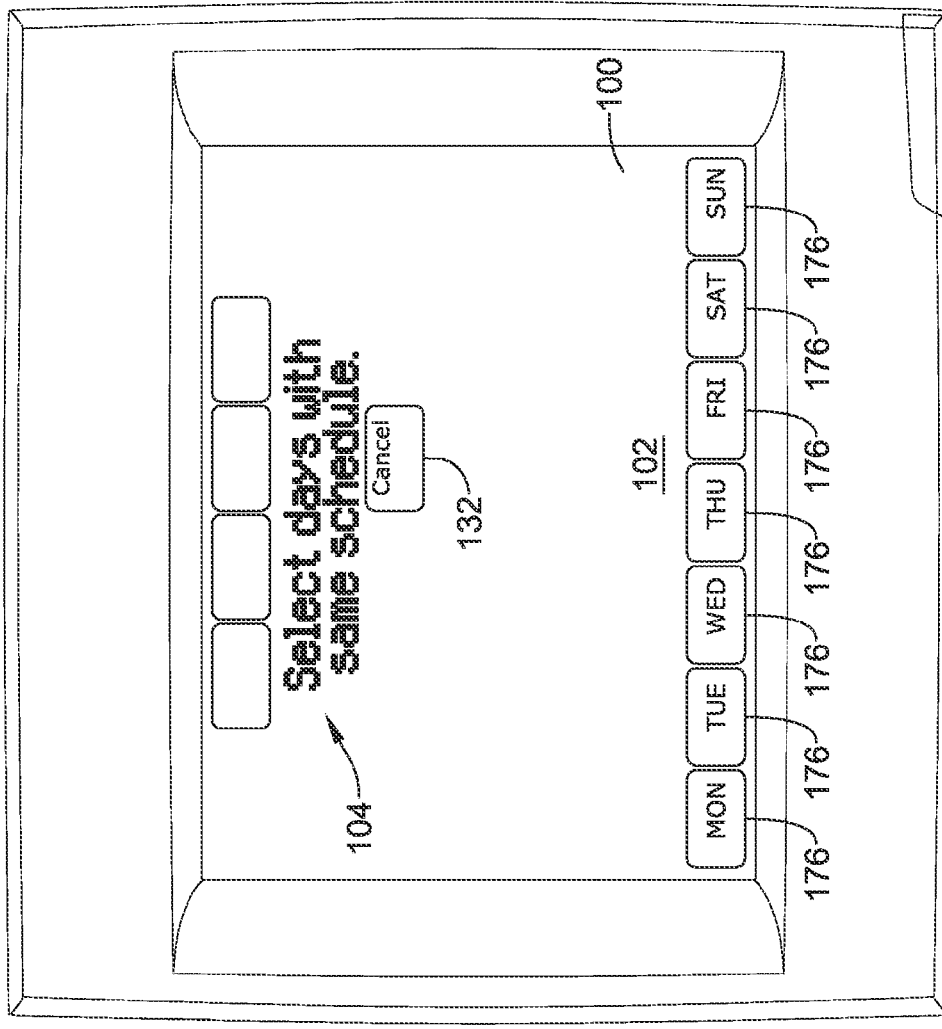
Figure 47D:
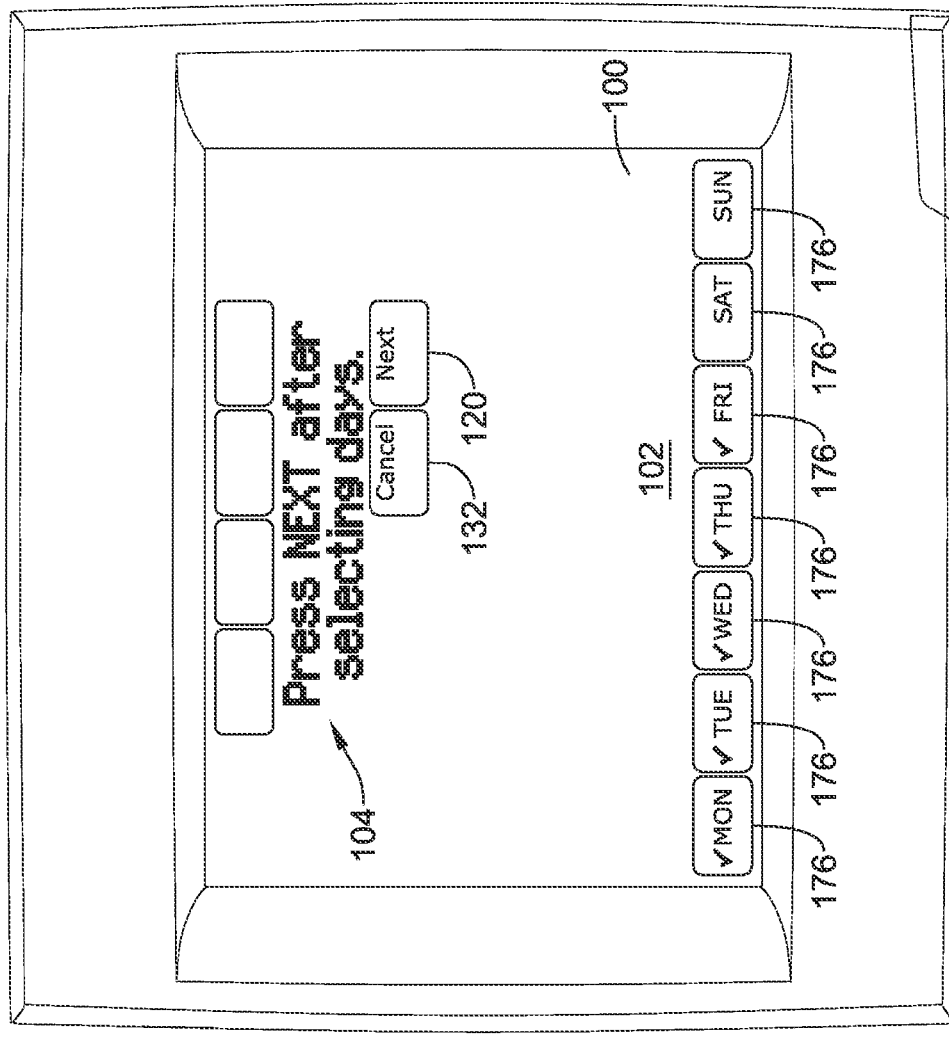
Figure 47E:
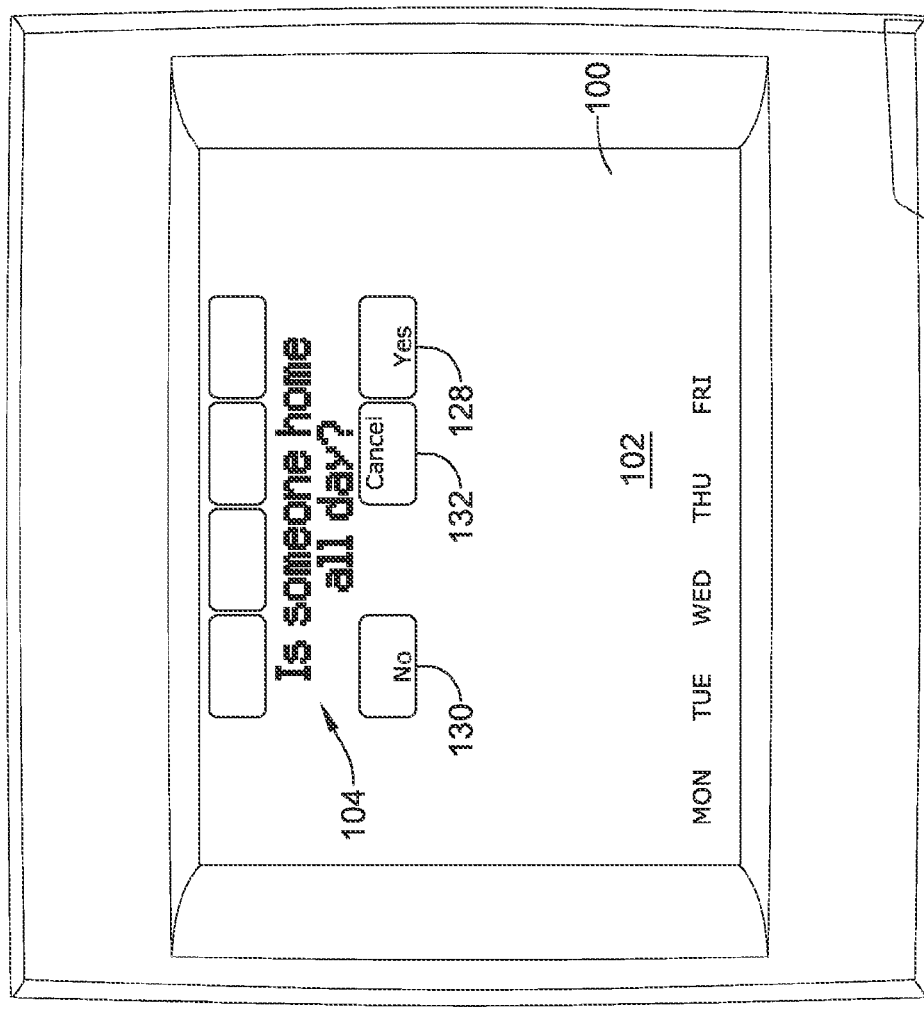
Figure 47F:
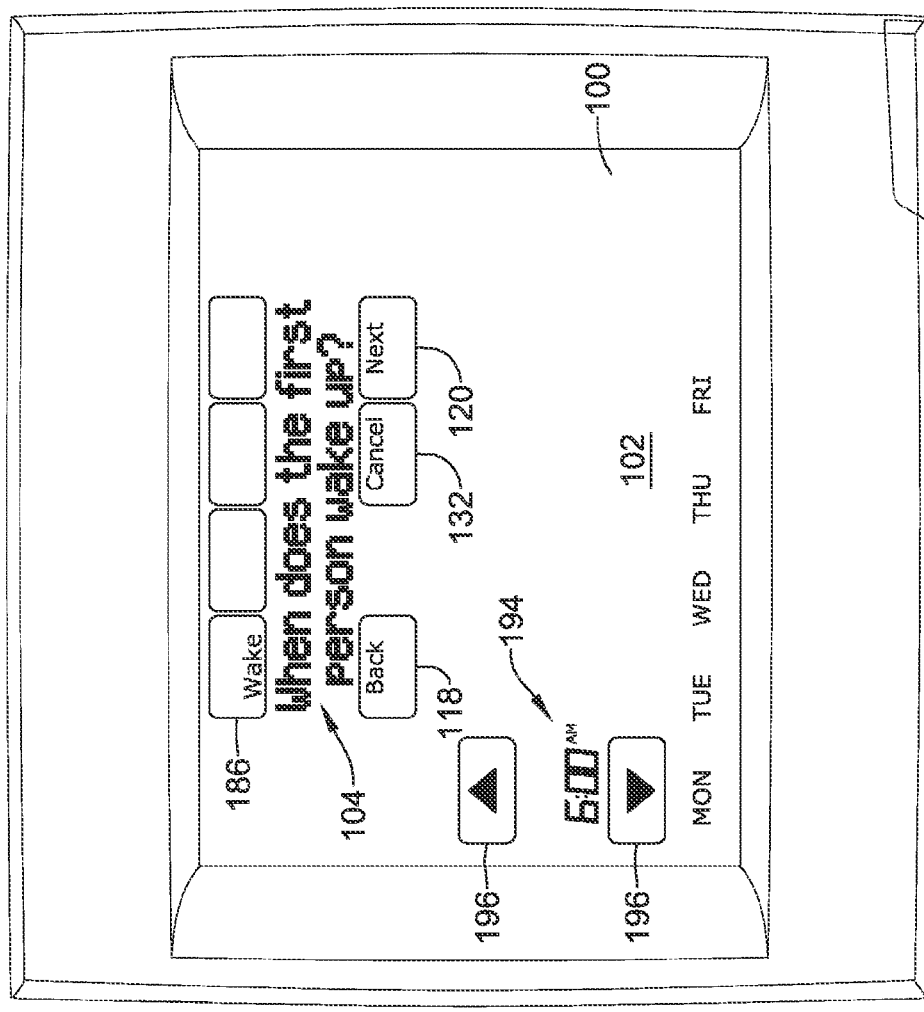
Figure 47G:
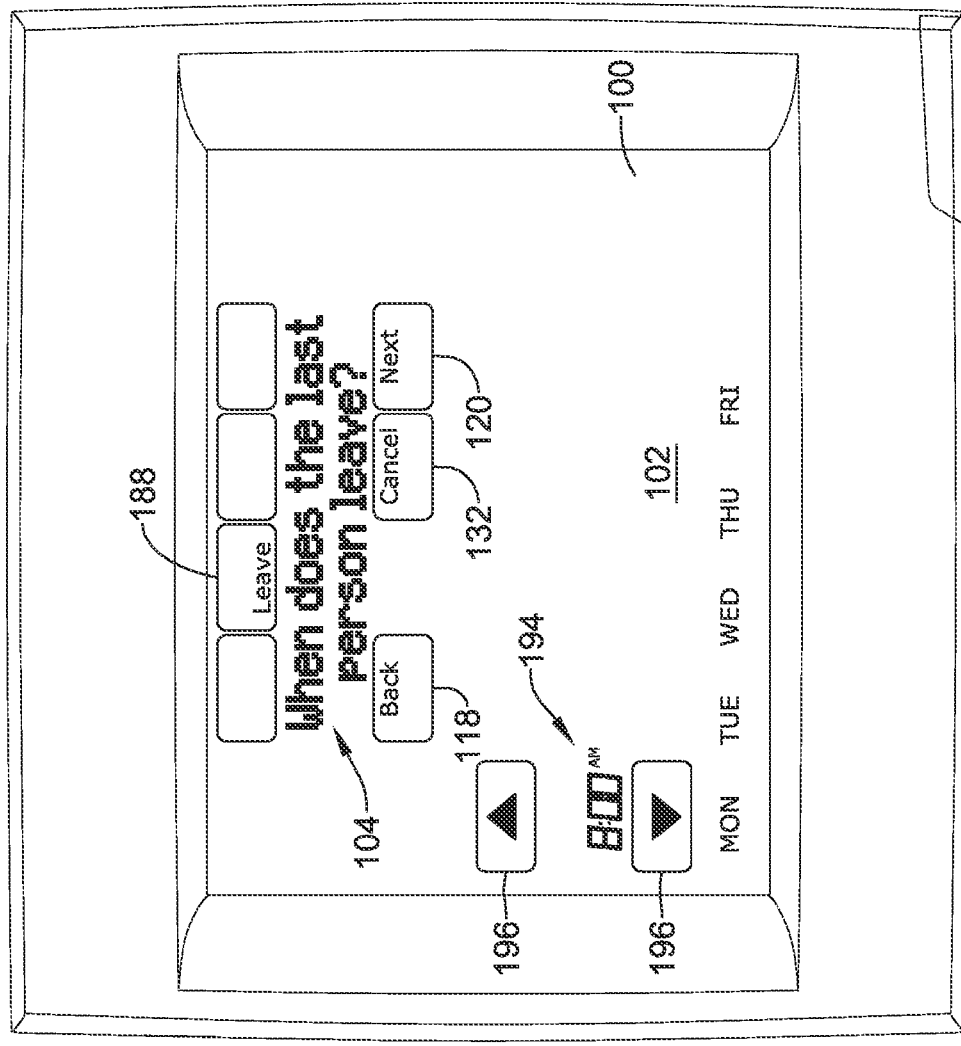

In the first area 104 of the interface display 100, a message asking WHEN DOES THE LAST PERSON LEAVE? may be displayed, as shown for example in FIG. 47G. After a time is set, the next button 120 may be pressed or selected to go onto the next screen.

Figure 47H:
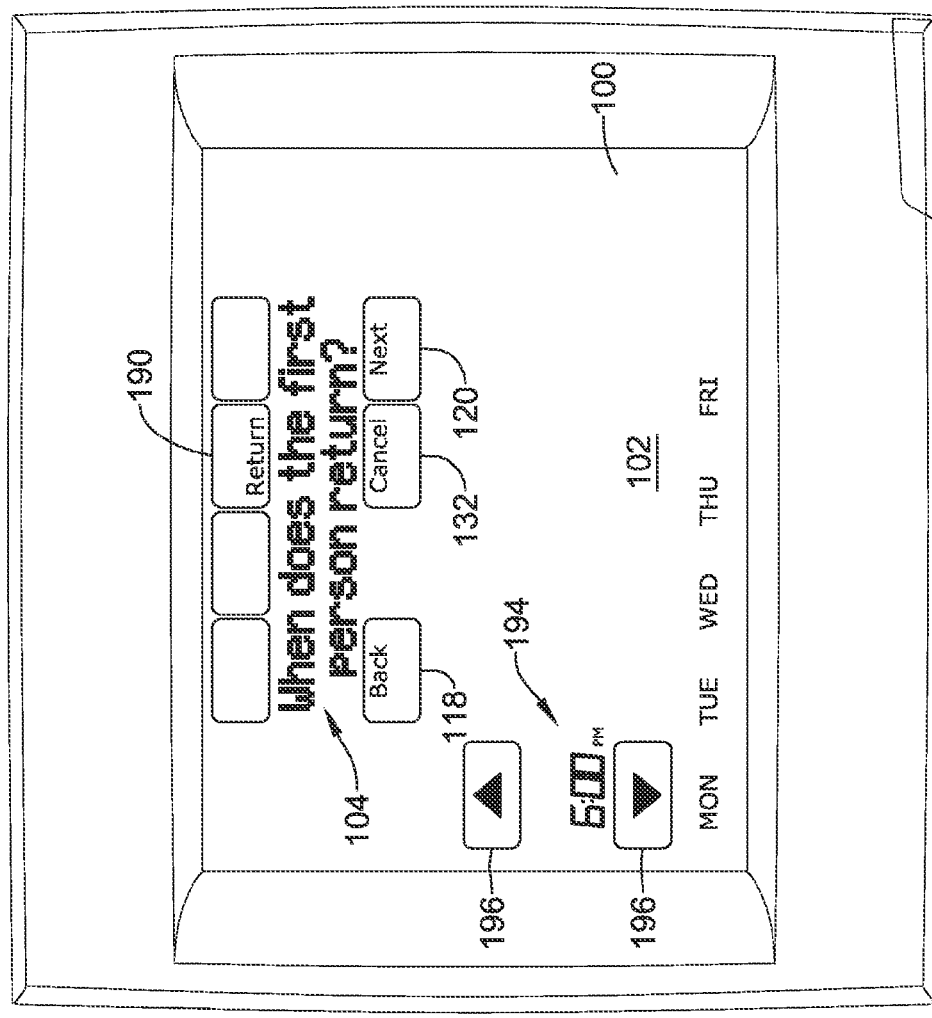

In the first area 104 of the interface display 100, a message asking WHEN DOES THE FIRST PERSON RETURN? may be displayed, as shown for example in FIG. 47H. After a time is set, the next button 120 may be pressed or selected to go onto the next screen.

Figure 47I:
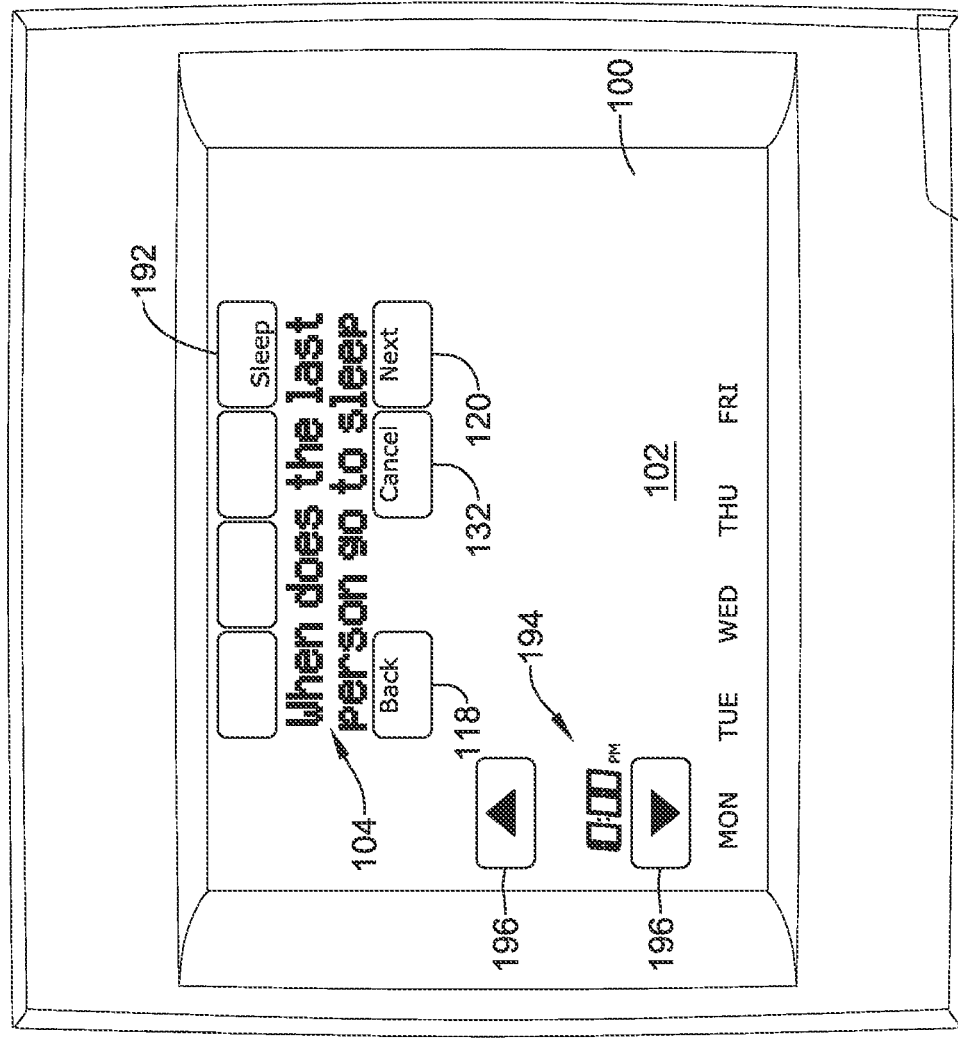

In the first area 104 of the interface display 100, a message asking WHEN DOES THE LAST PERSON GO TO SLEEP? may be displayed, as shown for example in FIG. 47I. After a time is set, the next button 120 may be pressed or selected to go onto the next screen.

Figure 47J:
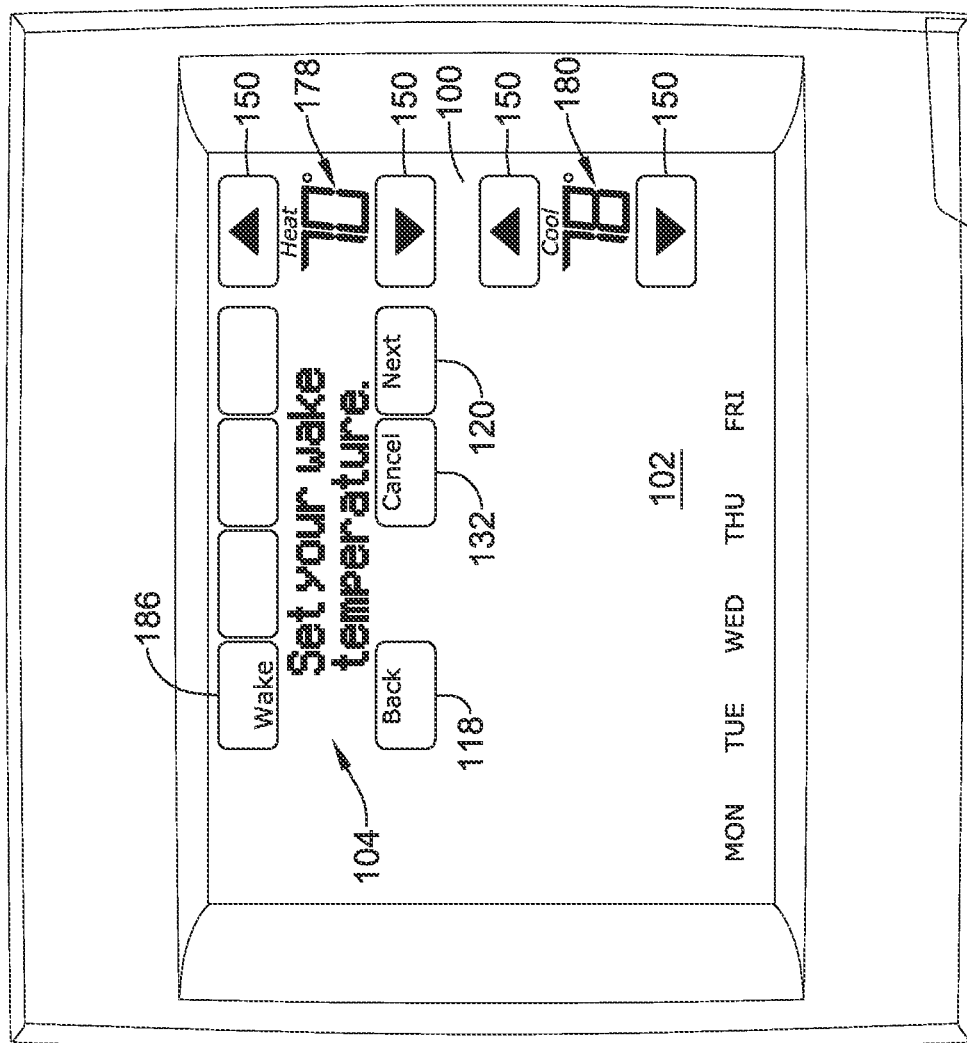

In the first area 104 of the interface display 100, a message indicating SET YOUR WAKE TEMPERATURE may be displayed, as shown for example in FIG. 47J. After a heat temperature 178 and/or a cool temperature 180 have been set, the next button 120 may be pressed or selected to go onto the next screen.

Figure 47K:
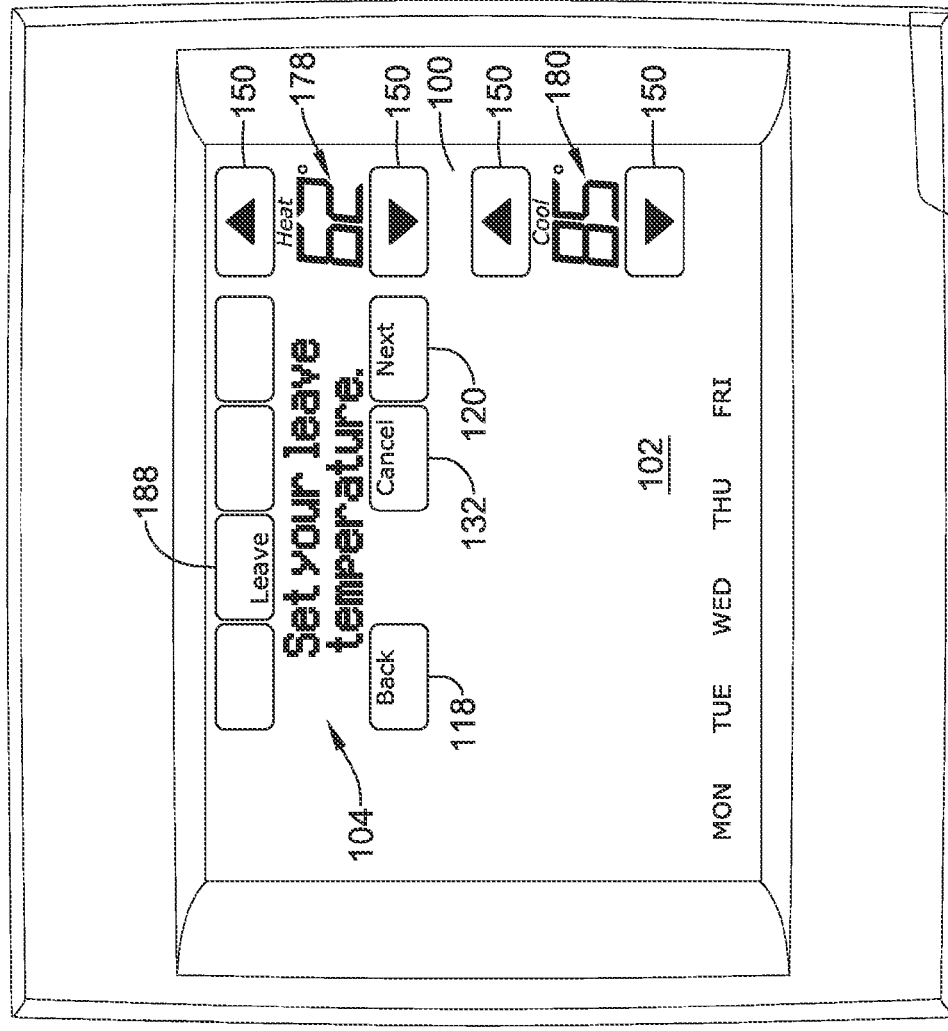

In the first area 104 of the interface display 100, a message indicating SET YOUR LEAVE TEMPERATURE may be displayed, as shown for example in FIG. 47K. After a heat temperature 178 and/or a cool temperature 180 have been set, the next button 120 may be pressed or selected to go onto the next screen.

Figure 47L:
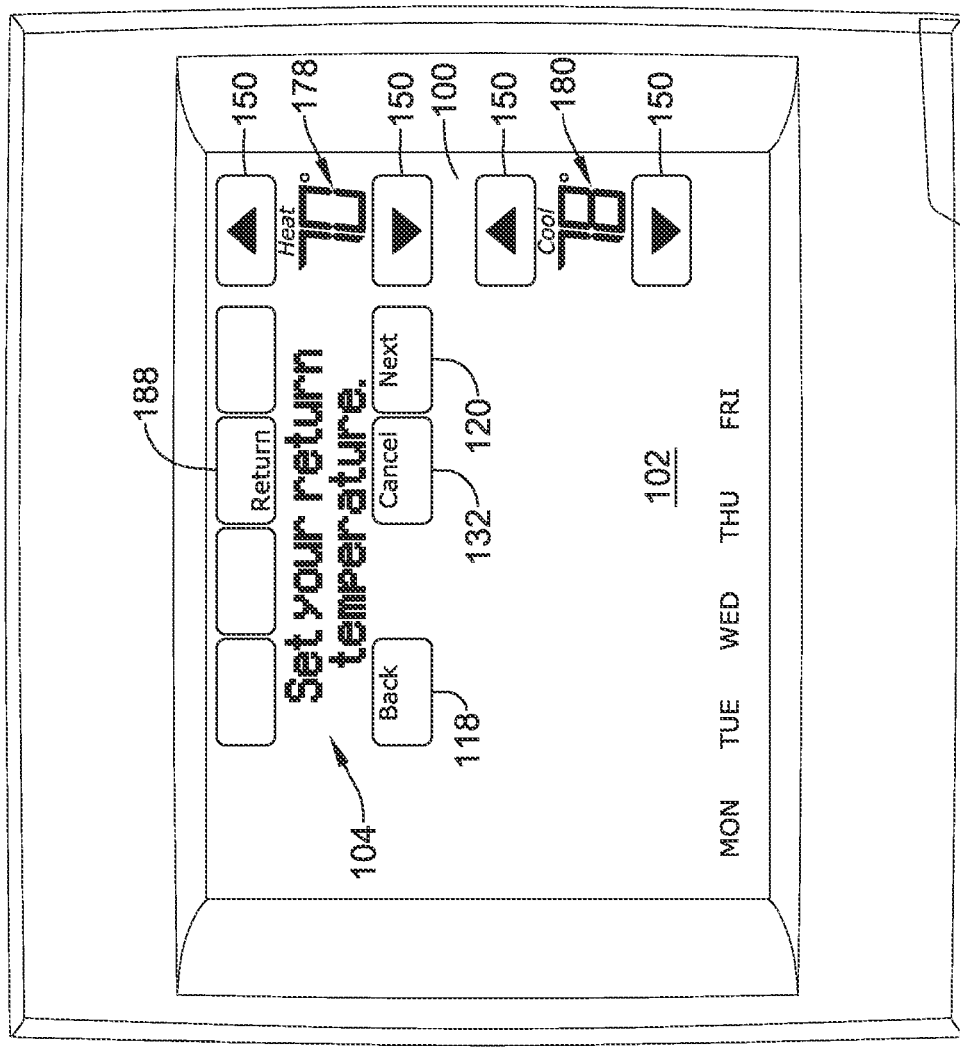

In the first area 104 of the interface display 100, a message indicating SET YOUR RETURN TEMPERATURE may be displayed, as shown for example in FIG. 47L. After a heat temperature 178 and/or a cool temperature 180 have been set, the next button 120 may be pressed or selected to go onto the next screen.

Figure 47M:
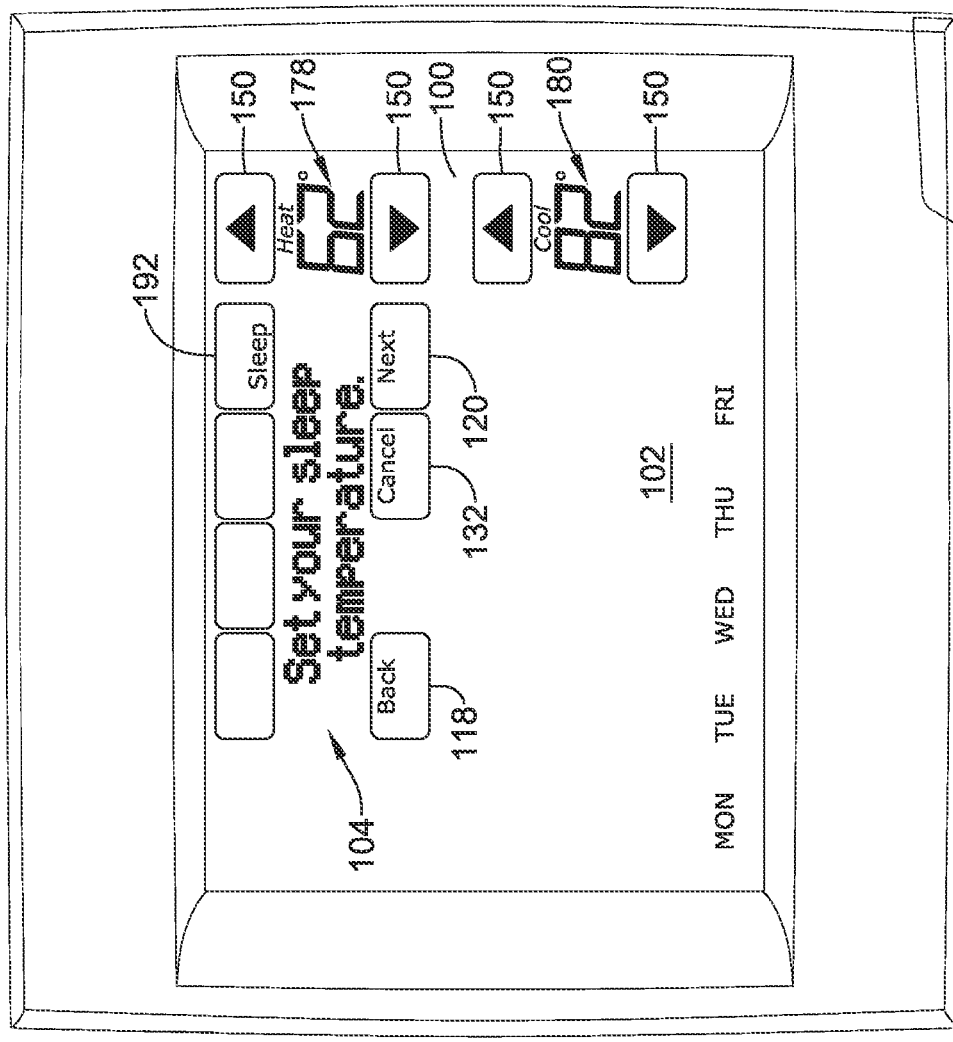

In the first area 104 of the interface display 100, a message indicating SET YOUR SLEEP TEMPERATURE may be displayed, as shown for example in FIG. 47M. After a heat temperature 178 and/or a cool temperature 180 have been set, the next button 120 may be pressed or selected to go onto the next screen.

Figure 47N:
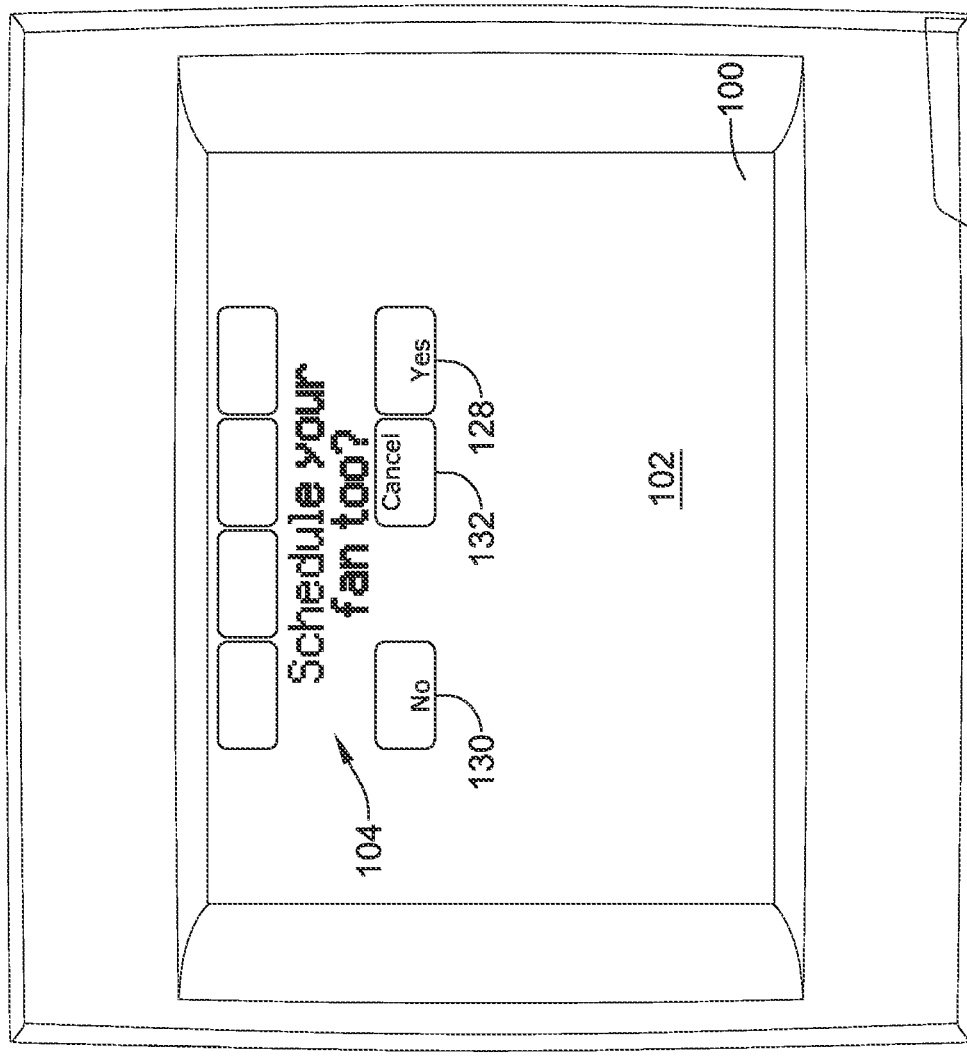
Figure 470:
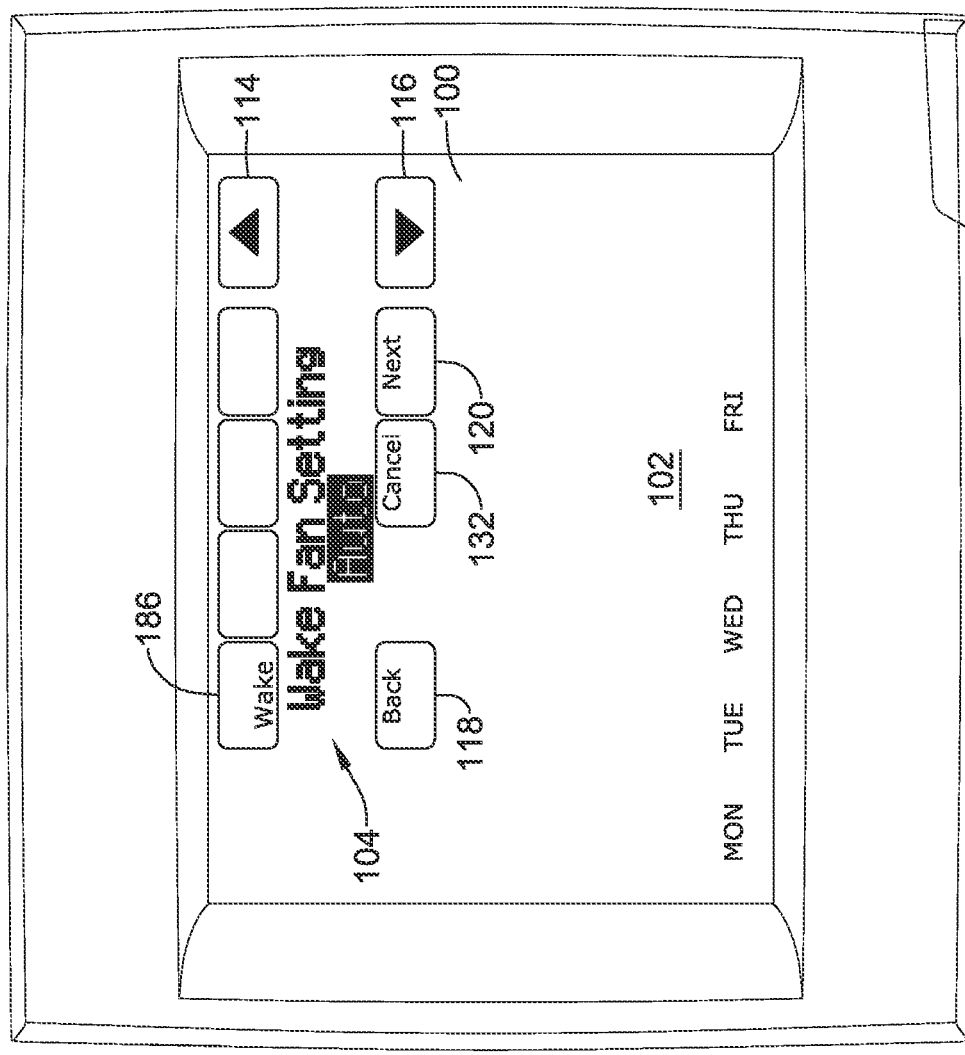

In the first area 104 of the interface display 100, a message asking SCHEDULE YOUR FAN TOO? may be displayed, as shown for example in FIG. 47N. If fan schedule will not be set at this time, the user selects the NO button 130 to go to a screen asking SCHEDULE MORE DAYS? in the first area 104 of the interface display 100, as shown for example in FIG. 47S. If more days are to be scheduled, the user selects the YES button 128 and the above steps will be repeated for the other days. If no more days are to be scheduled, the user selects the NO button 130 to go to the next screen. The next screen asks REVIEW SCHEDULE? in the first area 104 of the interface display 100, as shown for example in FIG. 47T. If the schedule is not to be reviewed, the user selects the NO button 130 and the thermostat 10 will display saving changes as shown in FIG. 48. If the schedule is to be reviewed, the user selects the YES button 128 to review the schedule and go to a review schedule screen on the interface display 100, as shown in FIG. 47U.

If the fan schedule will be set at this time, the user selects the YES button 128 to go to the next screen. In the first area 104 of the interface display 100, a message indicating WAKE FAN SETTING with a list of fan settings may be displayed, as shown for example in FIG. 47O. The list of fan settings may include AUTO, ON, CIRC, and/or other fan settings. A fan setting may be selected by highlighting a desired setting in the list of fan settings, and then selecting the next button 120 to move onto the next screen.

Figure 47P:
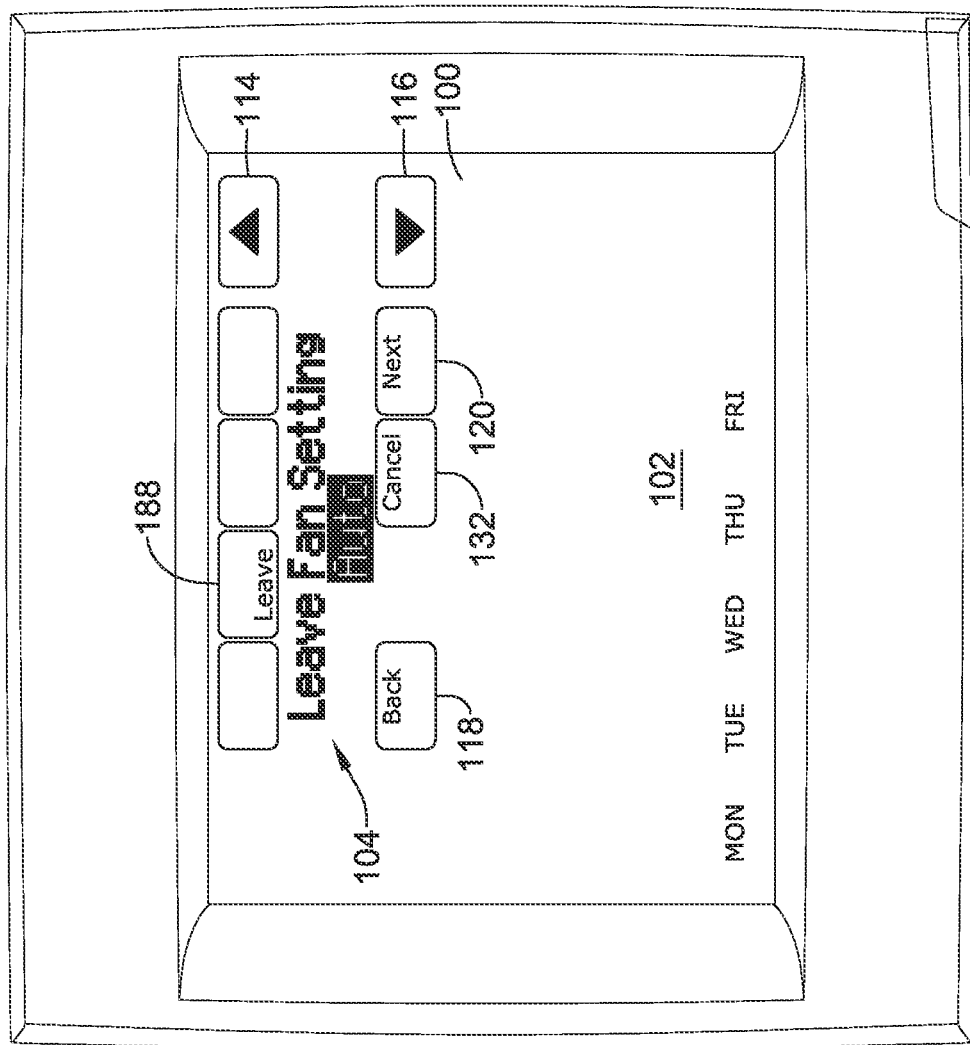
Figure 472:
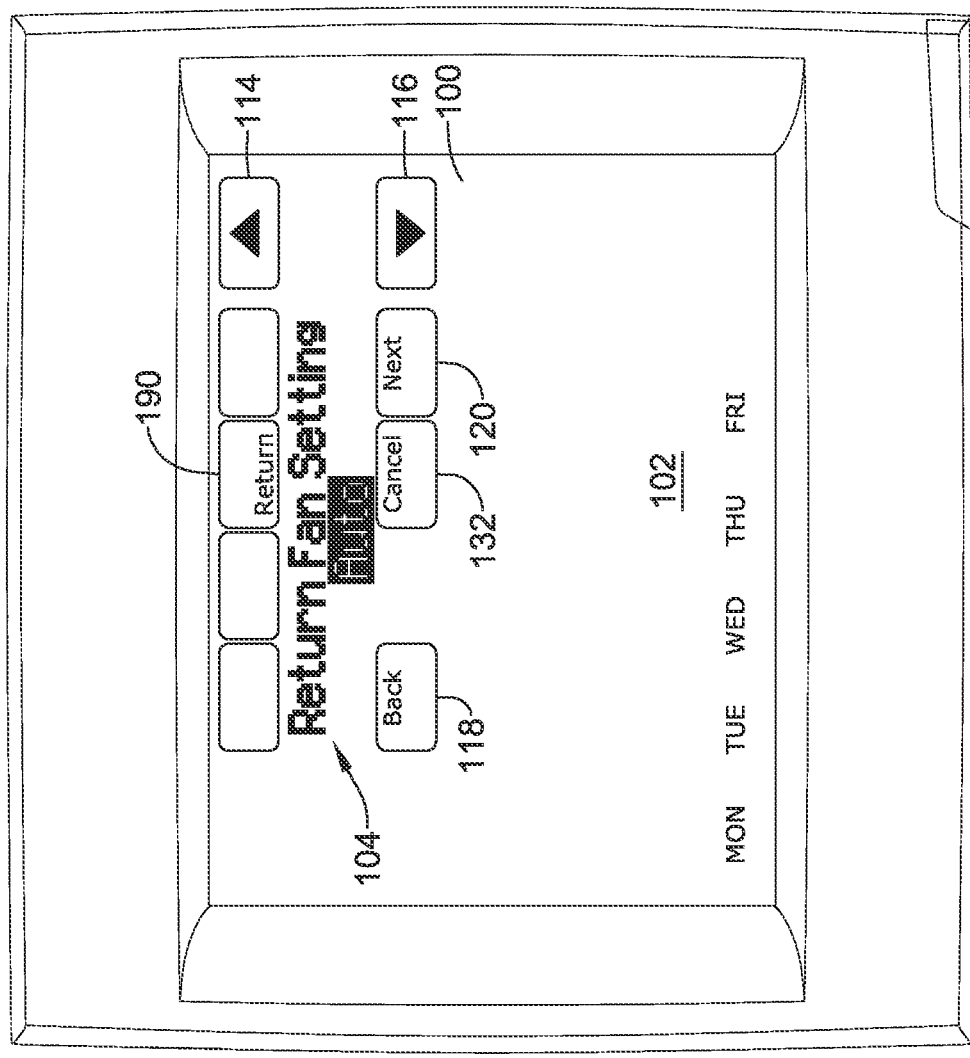
Figure 47R:
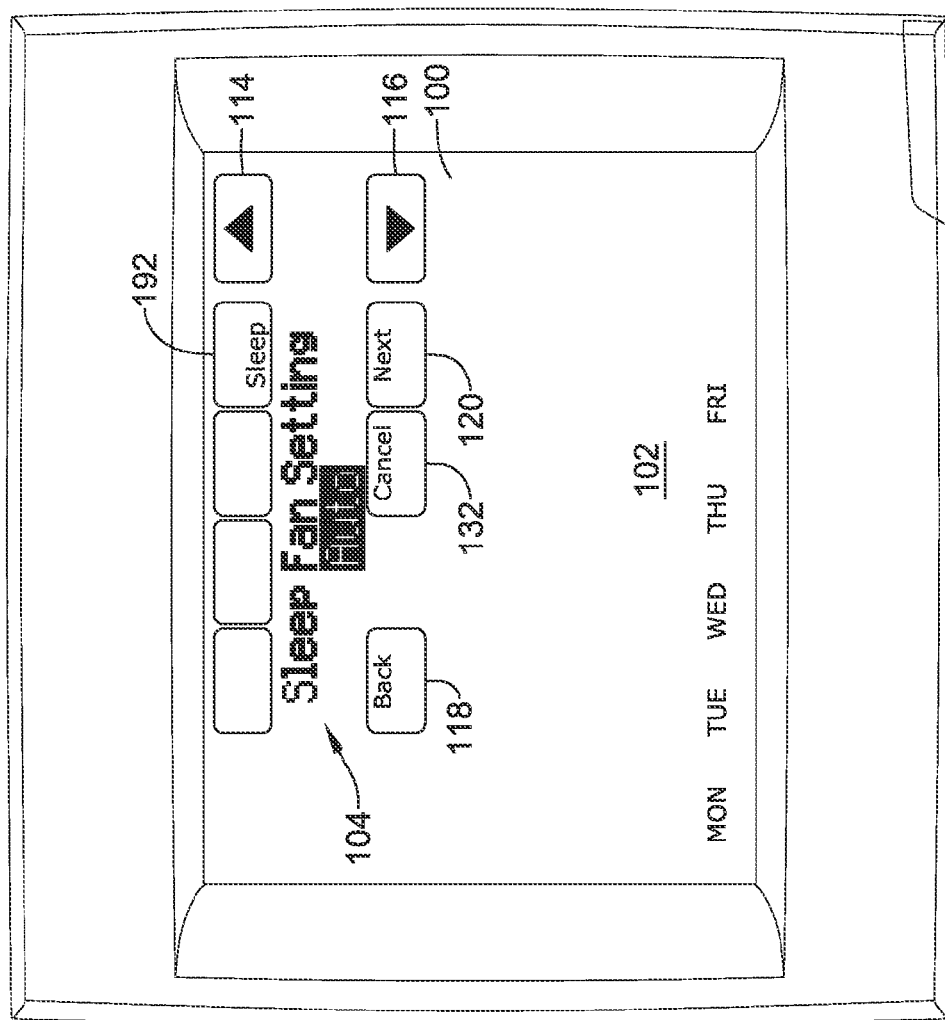

In the first area 104 of the interface display 100, a message indicating LEAVE FAN SETTING with a list of fan settings may be displayed, as shown in for example in FIG. 47P. The list of fan settings may include AUTO, ON, CIRC, and/or other fan settings. A fan setting may be selected by highlighting a desired setting in the list of fan settings, and then selecting the next button 120 to move onto the next screen.

In the first area 104 of the interface display 100, a message indicating RETURN FAN SETTING with a list of fan settings may be displayed, as shown in for example in FIG. 47Q. The list of fan settings may include AUTO, ON, CIRC, and/or other fan settings. A fan setting may be selected by highlighting a desired setting in the list of fan settings, and then selecting the next button 120 to move onto the next screen.

Figure 47S:
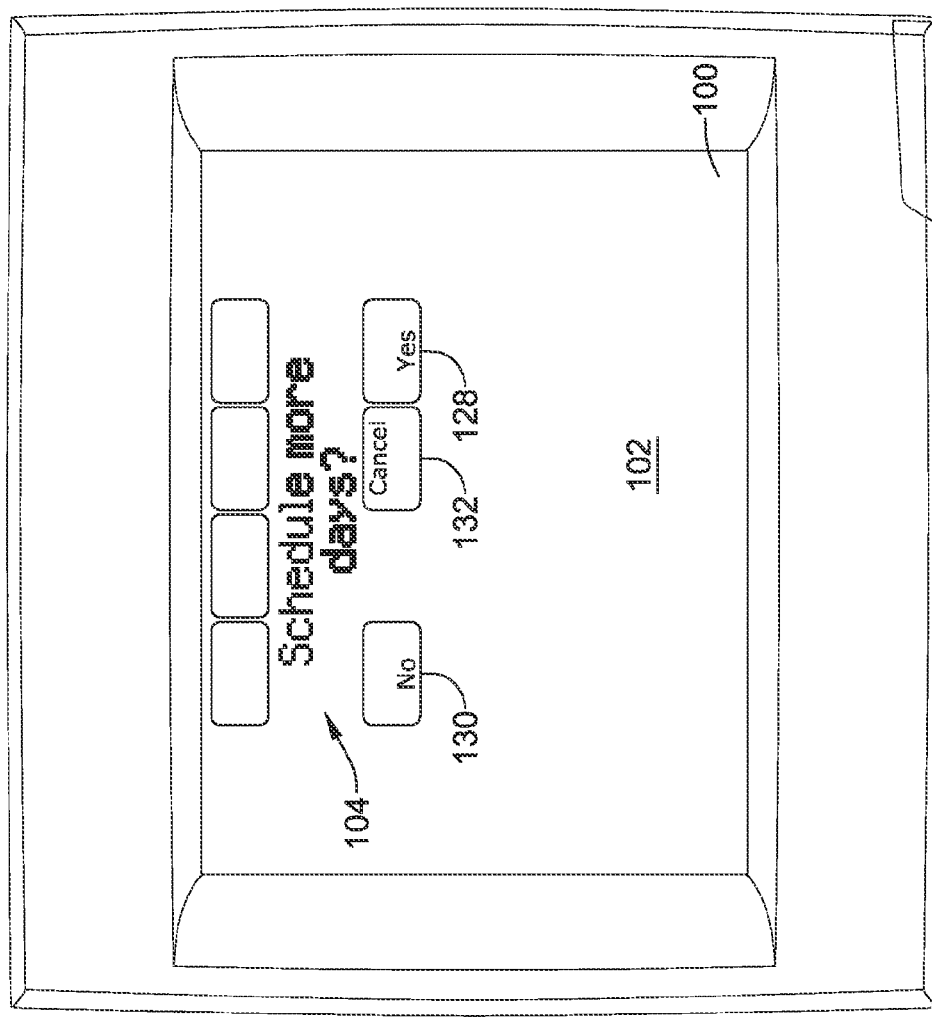
Figure 47T:
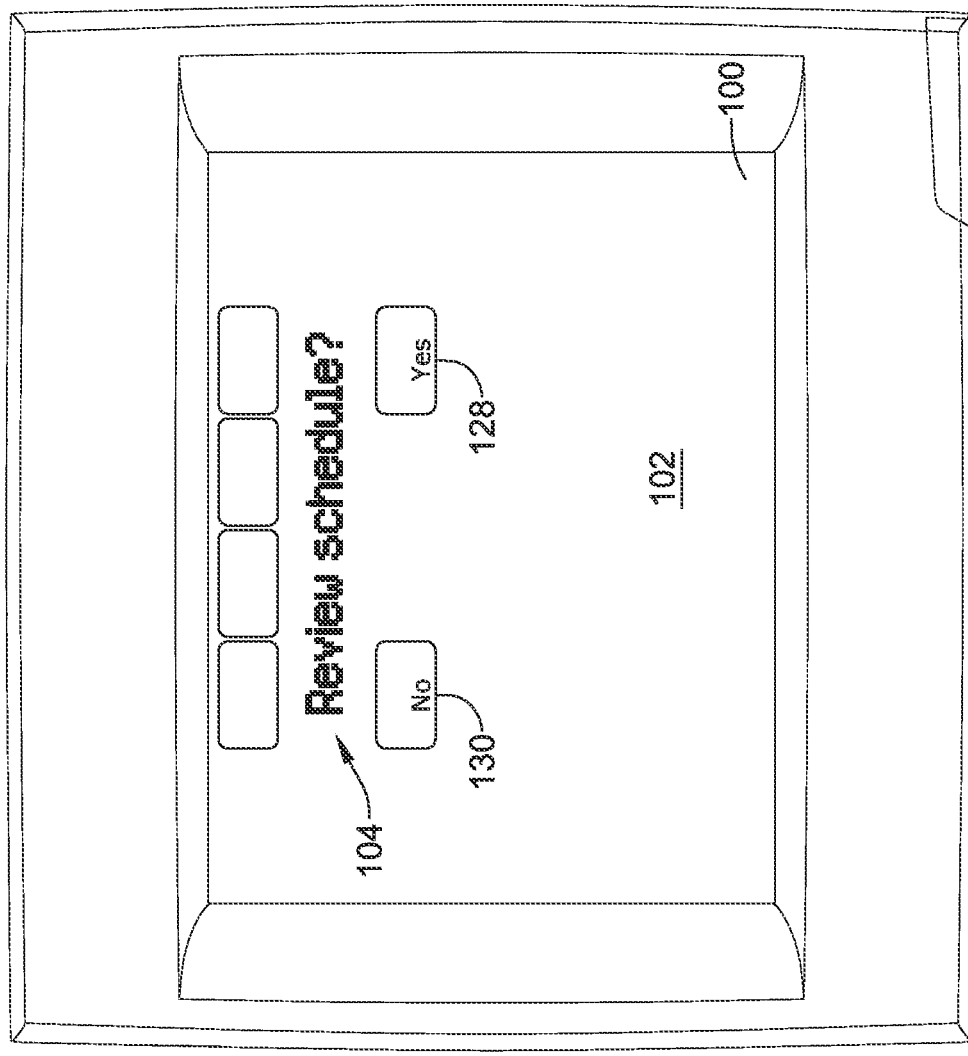
Figure 47U:
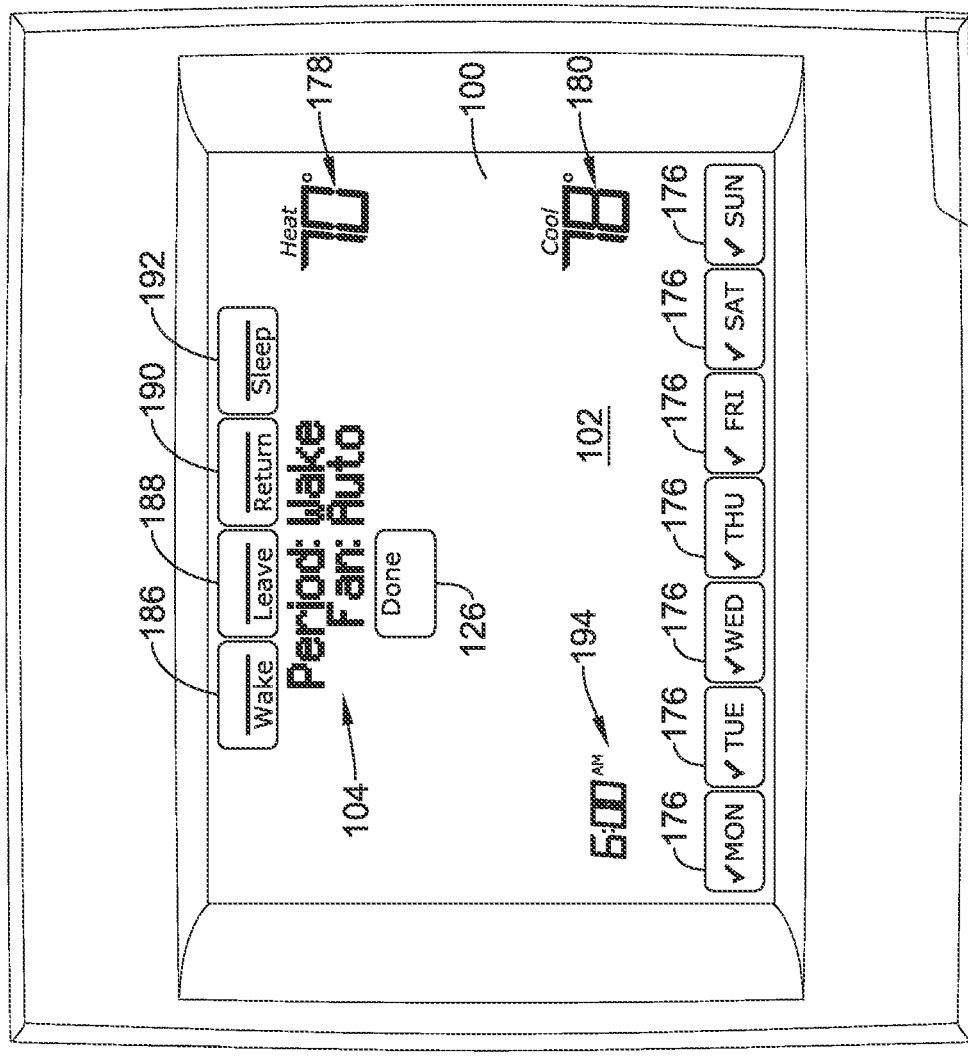

In the first area 104 of the interface display 100, a message indicating SLEEP FAN SETTING with a list of fan settings may be displayed, as shown in for example in FIG. 47S. The list of fan settings may include AUTO, ON, CIRC, and/or other fan settings. A fan setting may be selected by highlighting a desired setting in the list of fan settings, and then selecting the next button 120 to move onto the next screen.

Once the next button 120 has been selected or pressed after the fan setting has been selected for the last time period (e.g., the RETURN time period), a screen asking SCHEDULE MORE DAYS? in the first area 104 of the interface display 100 may be displayed, as shown for example in FIG. 47S. If more days are to be scheduled, the user selects the YES button 128 and the above steps will be repeated for the other days. If no more days are to be scheduled, the user selects the NO button 130 to go to the next screen. The next screen may ask REVIEW SCHEDULE? in the first area 104 of the interface display 100, as shown for example in FIG. 47T. If the schedule is not to be reviewed, the user selects the NO button 130 and the thermostat 10 will display saving changes as shown in FIG. 48. If the schedule is to be reviewed, the user selects the YES button to review the schedule and go to a review schedule screen on the interface display 100, as shown in FIG. 47U. Any time the edit schedule mode is exited, changes to the HVAC system schedule will be implemented.

As noted above, the thermostat 10 may include a view schedule mode that may be entered to allow a user to view and/or verify their HVAC system schedule. The view schedule mode may be accessed from the menu screen 174, as shown for example in FIG. 34 or viewed after a schedule is setup. The view schedule mode may be offered regardless of whether the HVAC schedule is setup with use of a scheduling assistant, setup manually by a user, or downloaded from a memory card. From the home screen 138, the view schedule mode may be selected by selecting the menu button 158 and entering the menu screen 174. A view schedule mode may be selected by scrolling through the menu list displayed in the first area 104 of the interface display 100 of the menu screen 174 until VIEW SCHEDULE is highlighted, and then pressing or selecting the select button 160 or tapping within the first area 104.

A view schedule screen 184, as shown for example in FIGS. 40-43, may display several buttons in the second area 102 of the interface display 100 and may display several pieces of information in the second area 102 and the first area 104 of the interface display 100. For example, the view schedule screen 184 may include one or more of a wake button 186, a leave button 188, return button 190, a sleep button 192, and/or a done button 126 in the second area 102 adjacent the first area 104 of the interface display. The wake button 186, the leave button 188, the return button 190, and the sleep button 192, when pressed, may allow a user to view the HVAC system schedule for the time period of the schedule associated with the button (e.g., the wake time period, the leave time period, the return time period, and/or the sleep time period). In some cases, while in the view schedule mode, the first area 104 may display the time period of the schedule, the fan setting for the time period, and/or other information, and the second area 102 may display the time a time period begins 194, a heat setting 178, a cool setting 180 and/or other information.

Figure 40:
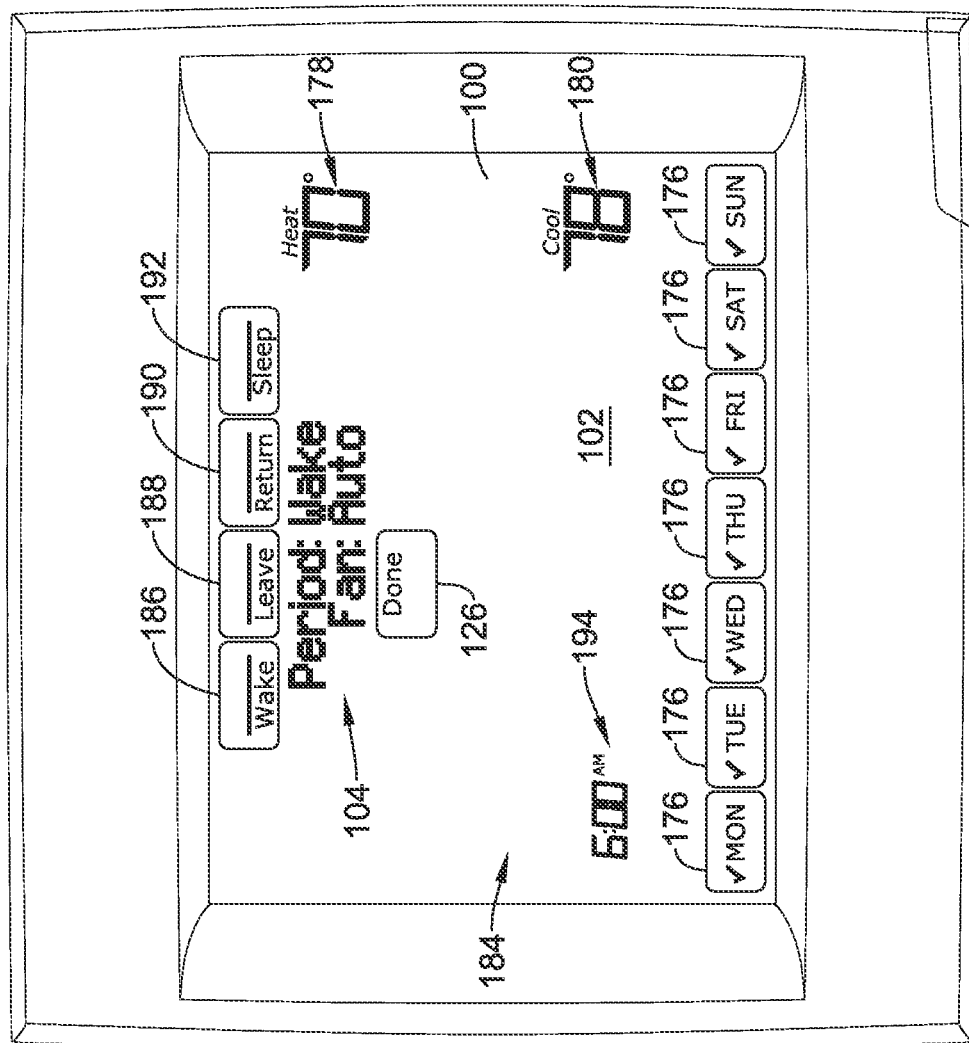
FIGS. 40-43 show illustrative view schedule screens.

When the thermostat 10 is in a view schedule mode, the interface display 100 of the thermostat 10 may automatically group the days that have the same schedule by showing a check mark or other marking in or about the day buttons 176 (e.g., Mon, Tue, Wed, Thu, Fri, Sat, Sun) displayed in the second area 102 of the interface display 100, as shown for example in FIG. 40. In one example, if Monday, Tuesday, and Wednesday have the same HVAC system schedule, Thursday and Friday have the same HVAC system schedule, and Saturday and Sunday have the same HVAC schedule, the interface display will show check marks or other markings in the day buttons 176 for Monday (Mon), Tuesday (Tue), and Wednesday (Wed) indicating these days have the same HVAC system schedule, as shown for example in FIG. 41. If a user presses on either of the day buttons 176 for Thursday (Thu) or Friday (Fri), the second area 102 of the interface display 100 will show check marks or other markings in the day buttons 176 for both Thursday (Thu) and Friday (Fri) indicating these days have the same HVAC system schedule, as shown for example in FIG. 42. If a user presses on either of the day buttons 176 for Saturday (Sat) or Sunday (Sun), the second area 102 of the interface display 100 will show check marks or other markings in the day buttons 176 for both Saturday (Sat) and Sunday (Sun) indicating these days have the same HVAC system schedule, as shown for example in FIG. 43.

Figure 44:
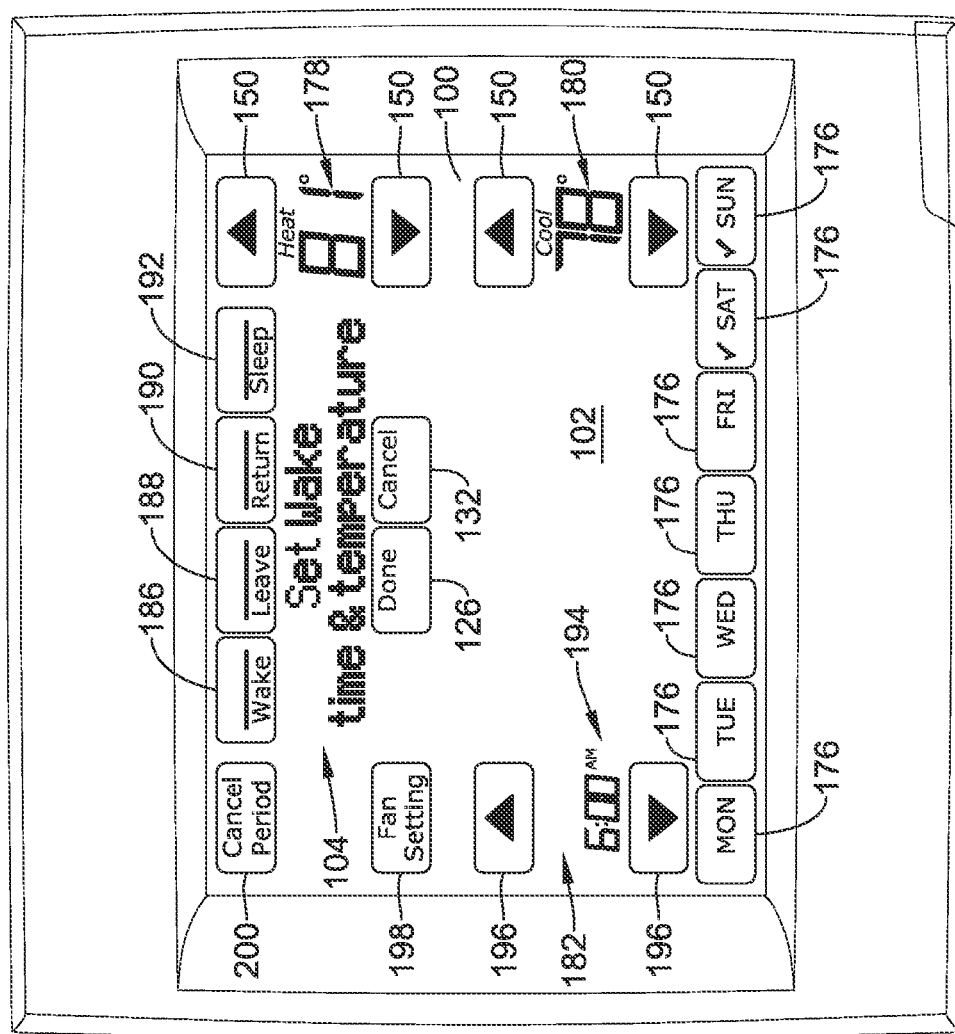
FIG. 44-46 show illustrative edit schedule screens.
Figure 45:
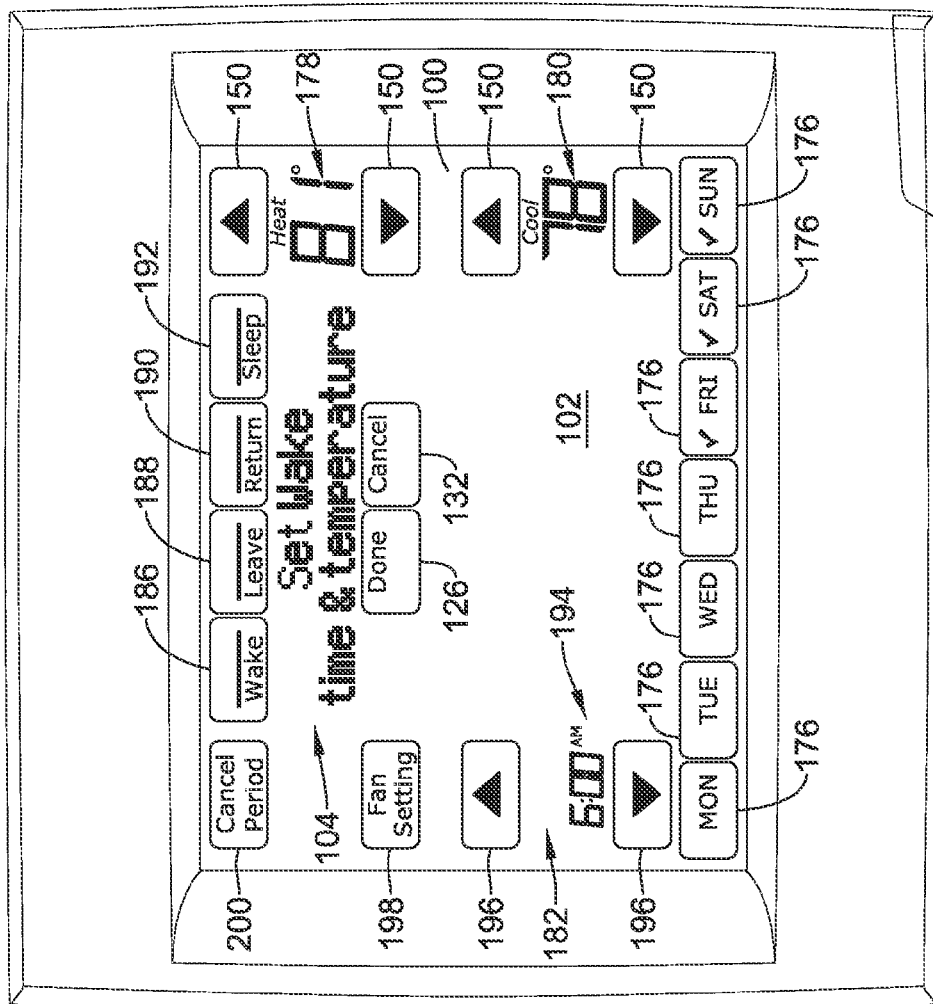
Figure 46:
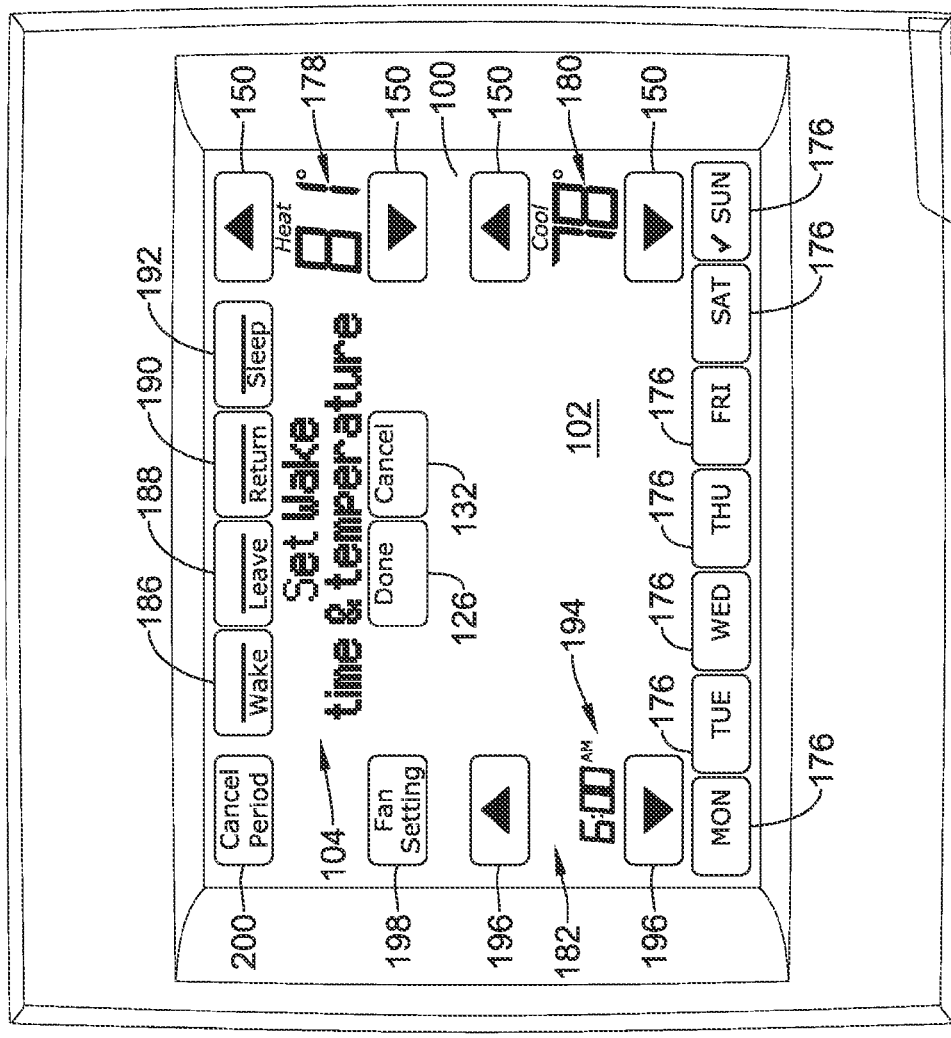

While verifying a schedule, if a user would like to make a change, the user may interact with the first area 104 of the interface display 100, a heat temperature 178, a cool temperature 180, or other feature displayed on the interface display 100 to view and/or interact with a change schedule screen 182, as shown in for example FIG. 44. From the change schedule screen 182, the day buttons 176 may be selected to add and/or delete a day from a schedule (e.g., see FIGS. 44, 45, 46), change temperature settings for heating and/or cooling by selecting or pressing the temperature setting arrows 150, change a time associated with a Wake setting by selecting or pressing time setting arrows 196, change a time associated with a Leave setting by selecting or pressing time setting arrows 196, change a time associated with a Return setting by selecting or pressing time setting arrows 196, change a time associated with a Sleep setting by selecting or pressing time setting arrows 196, modify a fan setting by selecting or pressing a fan setting button 198, and/or cancel time period for the schedule by selecting or pressing the cancel period button 200. In some instances, the first area 104 of the interface display 100 may indicate which setting is being modified. For example, the first area 104 of the interface display 100 in the change schedule screen may display which time period settings are being changed (e.g., SET WAKE TIME & TEMPERATURE, as shown for example in FIGS. 44-46). When the HVAC system settings have been modified, selecting the done button 126 may save the modifications and return the thermostat 10 to a view schedule mode, and interface display 100 may display the view schedule mode screen 184. Alternatively, the thermostat 10 may display a different screen on the interface display 100 after selecting the done button 126, such as the home screen 138 or other screen.

FIGS. 49A-49F depicts an illustrative flow 400 of screens for the interface display 100 when interacting with a weather mode of the thermostat 10 accessible from the menu screen 174 when weather information is available. FIG. 49G depicts an illustrative flow 500 when interacting with a weather mode of the thermostat 10 accessible from the menu screen 174 when weather information is not available. Although FIGS. 49A-49G depict illustrative flows of the weather mode of the thermostat 10, other flows may be available, as desired, for navigating the weather mode.

The weather mode of the thermostat 10 may display weather related information about today's forecast, todays actual weather readings (e.g., temperature, humidity, dew point, wind chill, wind direction, wind speed, weather warnings, weather watches, etc.), today's forecast description, forecasts for future time periods, and/or forecast descriptions for future time periods. Illustratively, forecast descriptions may include, but are not limited to, SUNNY, MOSTLY SUNNY, PARTLY SUNNY, PARTLY CLOUDY, HAZY SUNSHINE, MOSTLY CLOUDY, CLOUDY, DREARY, FOGGY, SHOWERS, THUNDERSTORMS, THUNDER SHOWERS, RAIN, FLURRIES, SNOW, ICE, SLEET, FREEZING RAIN, RAIN AND SNOW, HOT, COLD, AND/OR WINDY.

Figure 49A:
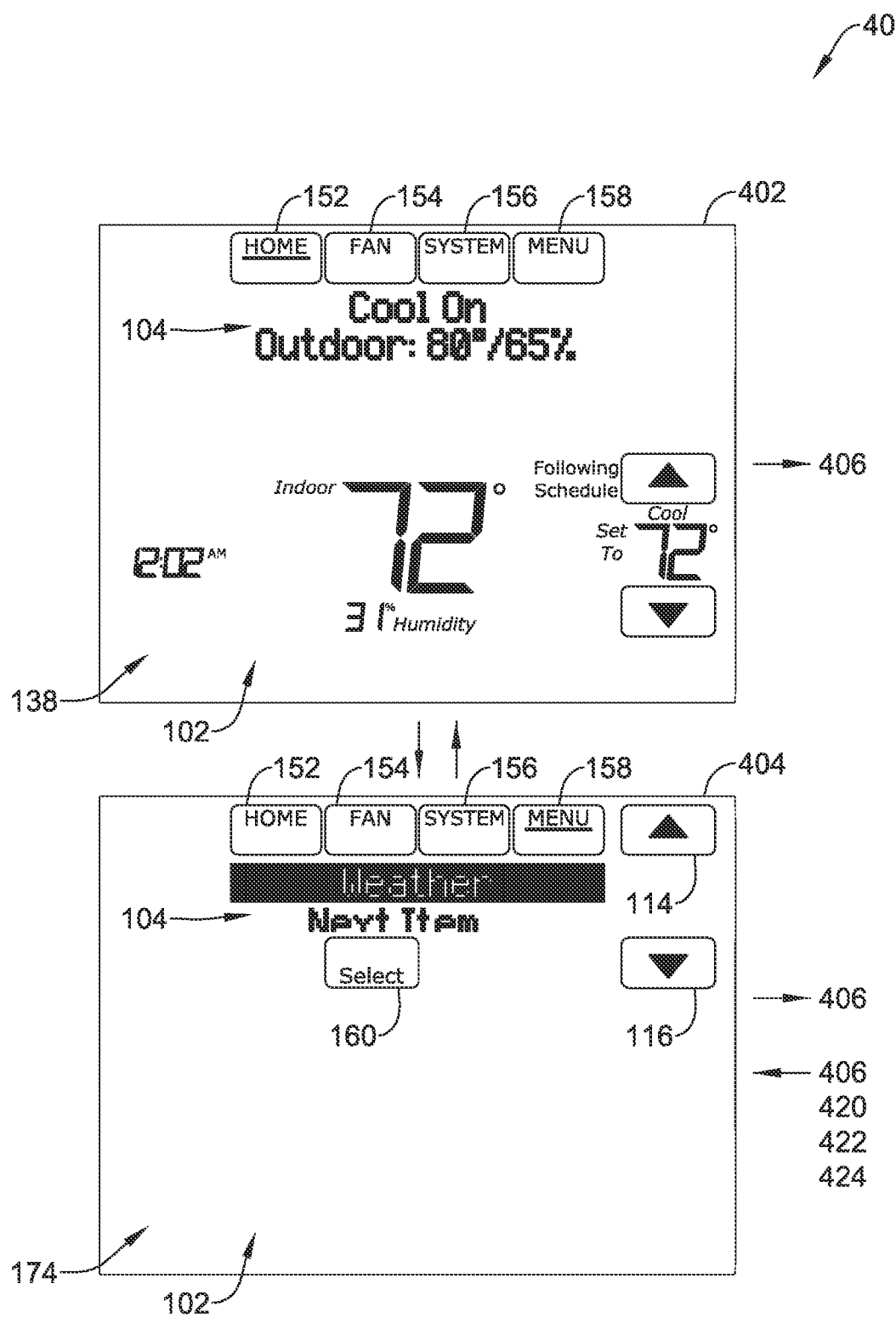
FIGS. 49A-49G show illustrative weather screens.
Figure 49B:
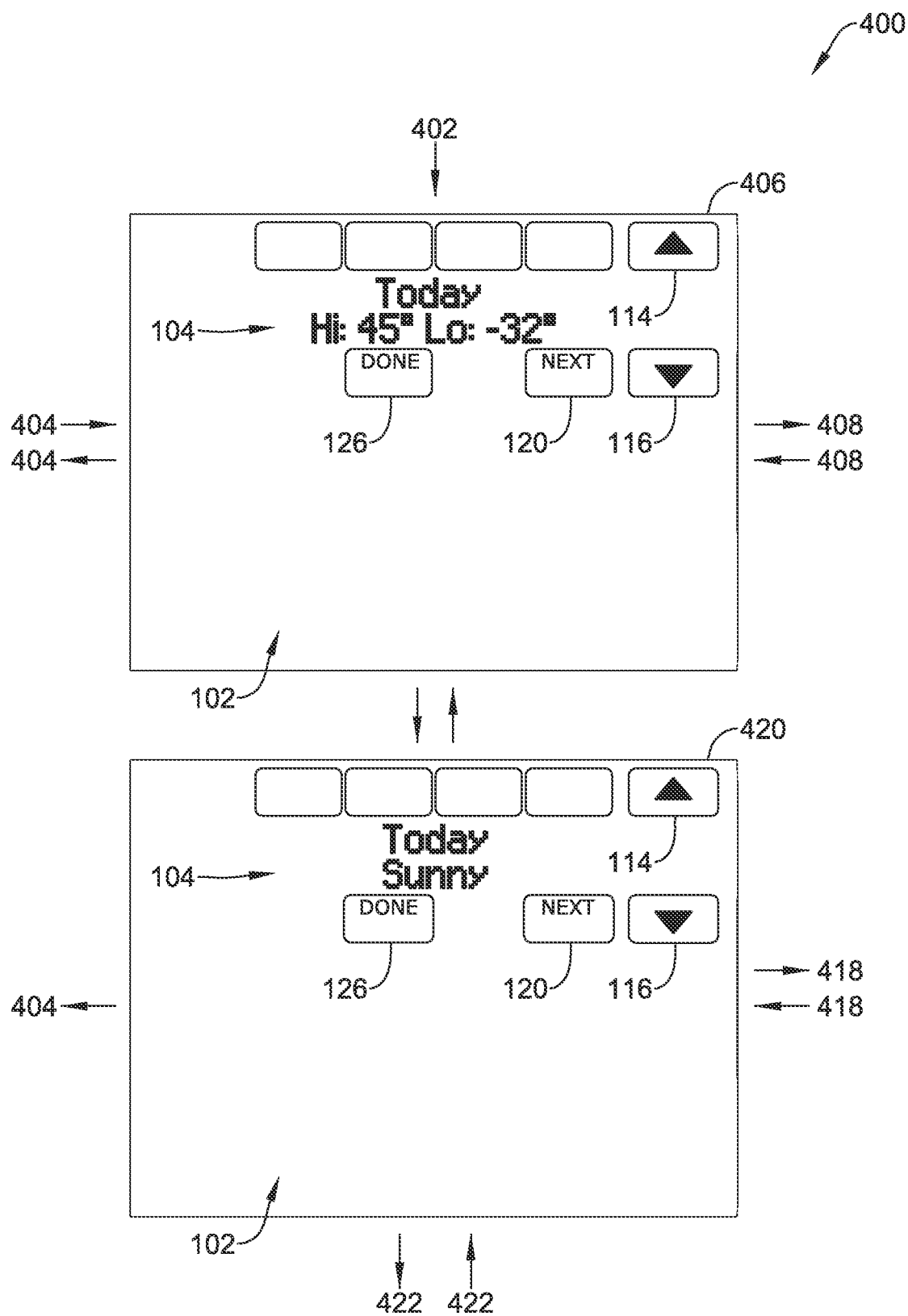
Figure 49C:
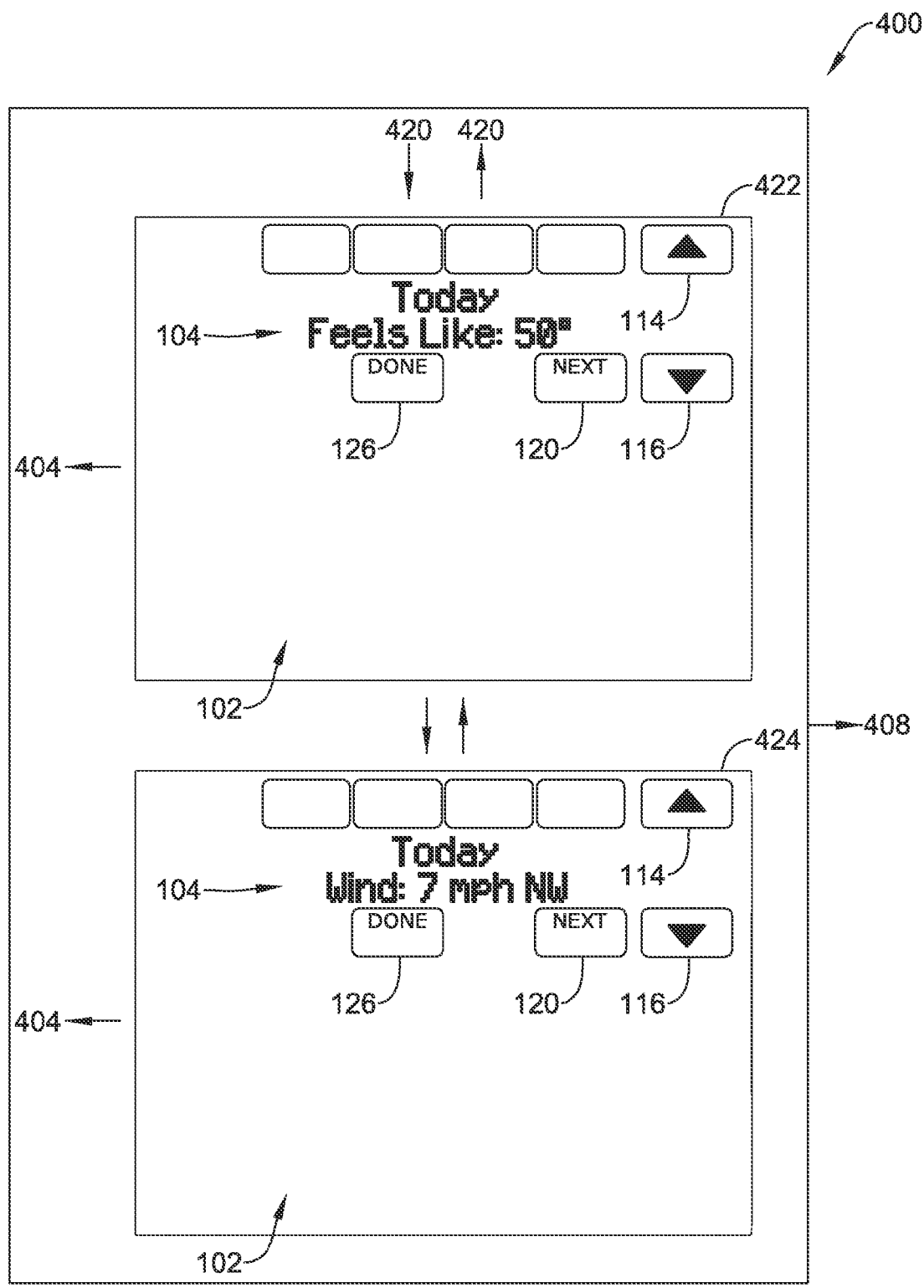

As shown in FIG. 49A, screen 402 depicts a home screen 138 as described herein. From the home screen 138, a menu button 158 may be selected to move to screen 404. In screen 404, a list of menu options may be displayed in the first area 104. The list of menu options may be scrolled through by swiping within the first area 104 and/or by selecting the up arrow 114 and/or the down arrow 116. A user may scroll until the menu option WEATHER is highlighted. By touching either the highlighted menu option or by touching the select button 160, today's weather and/or weather forecast may be displayed in the first area 104 of the interface display 100 in screen 406, as shown in FIG. 49B. To view further forecast and/or weather information for today, a user may select the up arrow 114 and/or down arrow 116 and view the complete forecast in the first area 104, as shown in screens 420 (FIG. 49B), 422 (FIG. 49C), and 424 (FIG. 49C), which depict current weather readings. In some instances, a weather icon may be displayed in the second area 102, which when touched, may cause the weather information to be displayed in the first area 104.

Figure 49D:
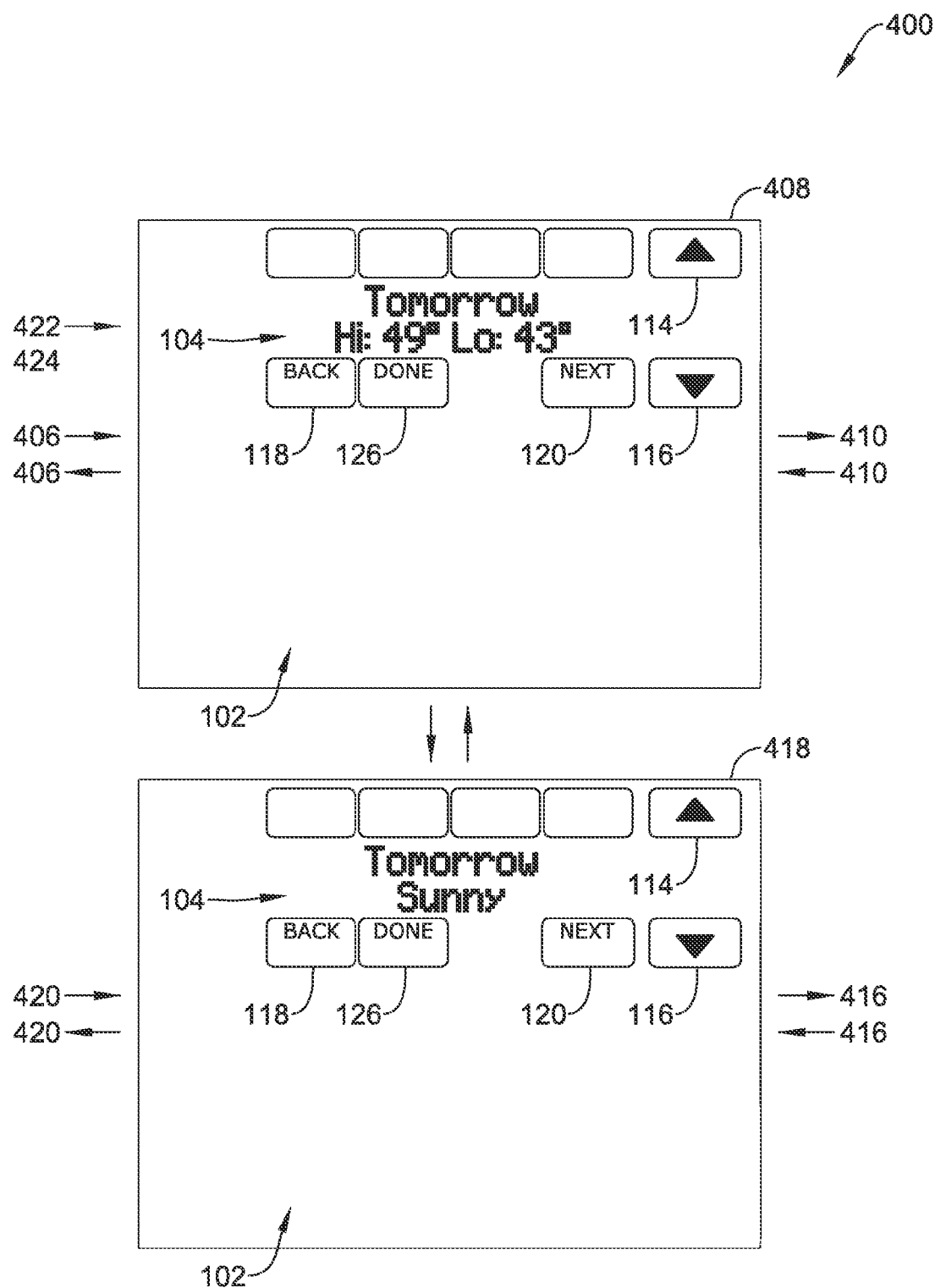
Figure 49E:
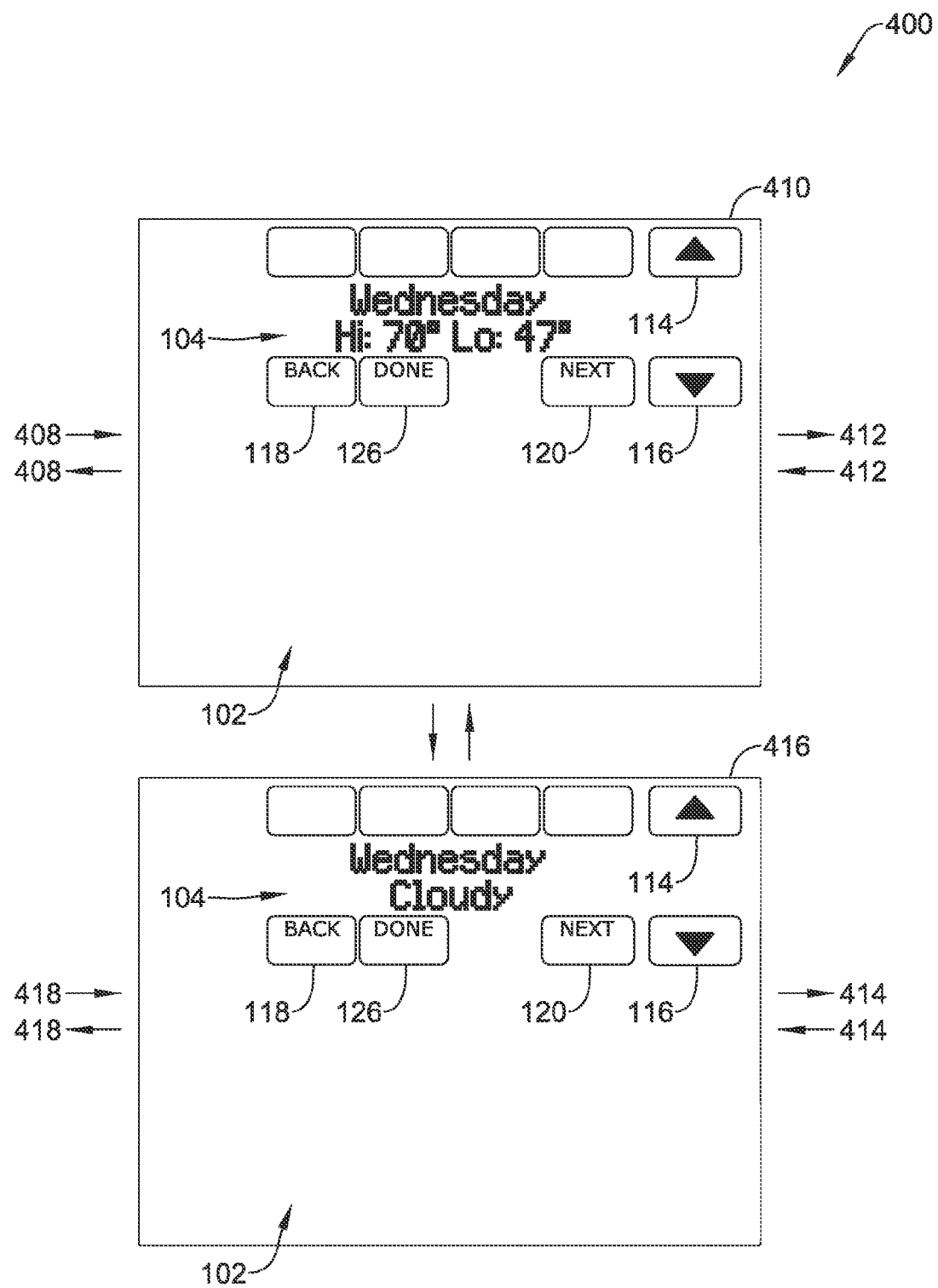
Figure 49F:
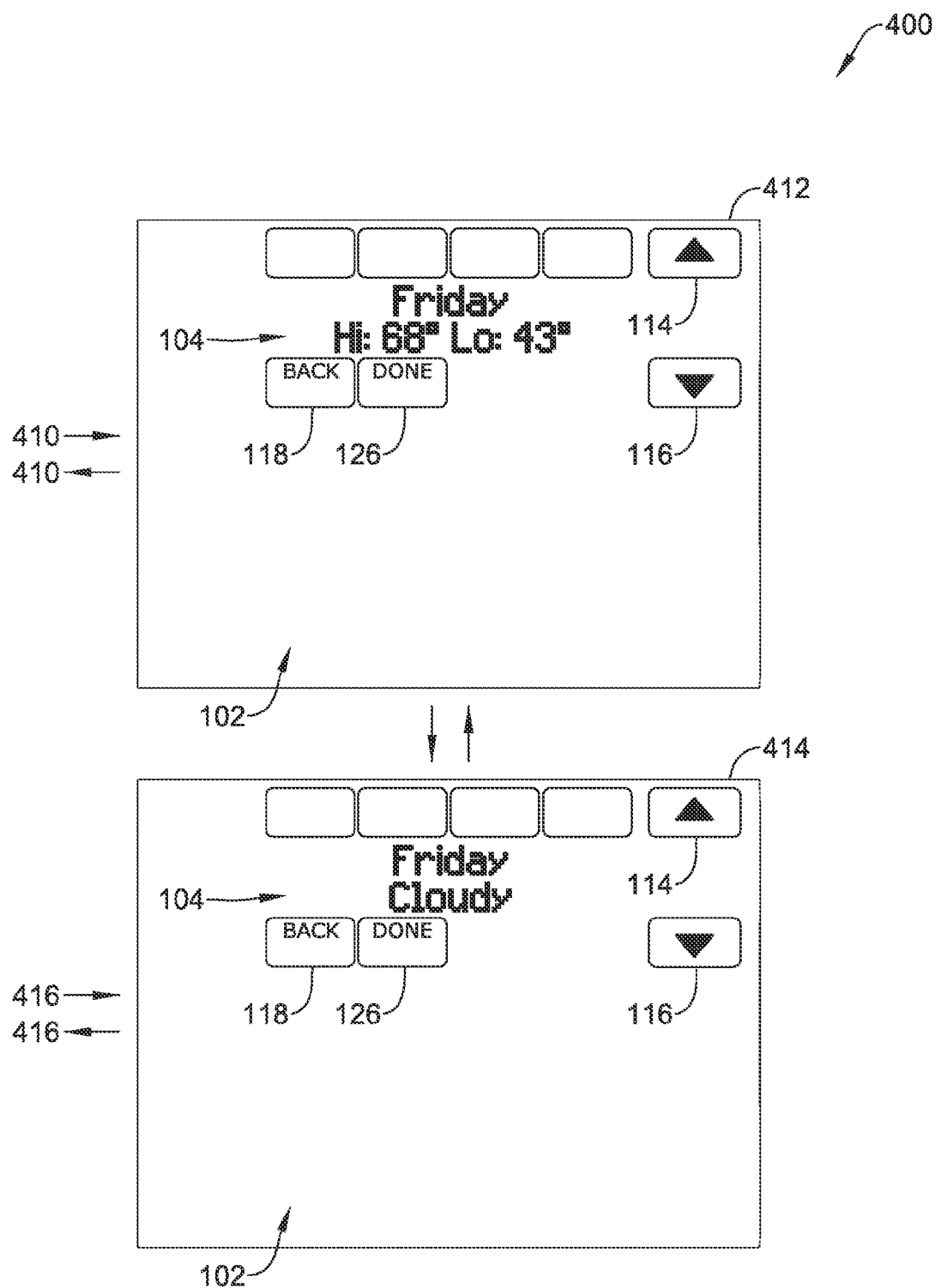
Figure 49G:
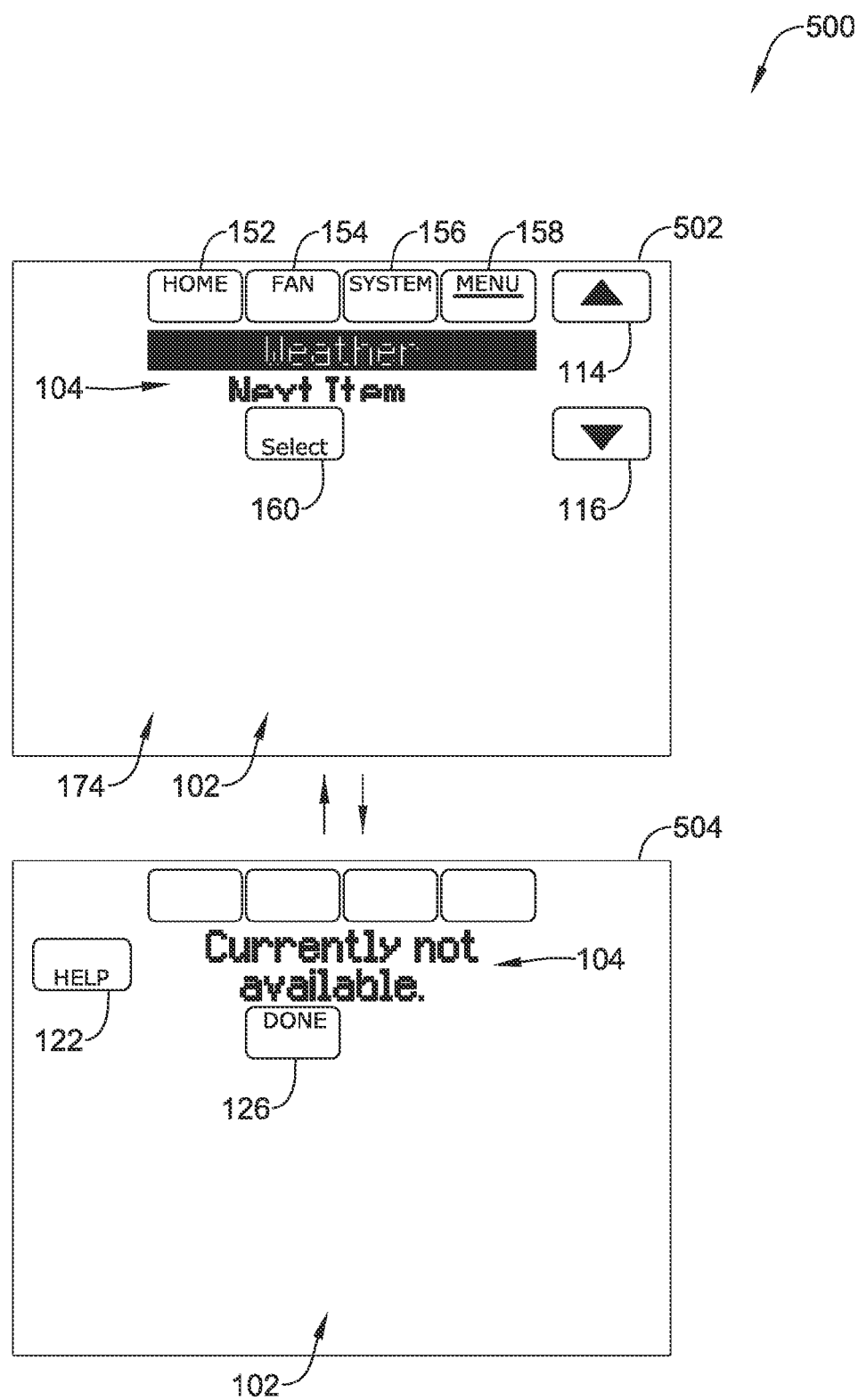

In some instances, weather forecasts and forecast descriptions for future days or time periods may be shown. The number of future days or time period for which forecasts may be viewed may be any number, for example, the thermostat 10 may be able to display weather forecasts for up to one day, two days, three days, four days, five days, six days, seven days, and so on. To view weather forecasts for future days, the next button 120 may be selected in any one of screens 406, 408, 410, 416, 418, 420, 422, and/or 424. If a user selects the next button 120 from one or more of screens 422 and 424, a user is brought to screen 408 depicting the weather forecast for tomorrow, as shown in FIG. 49D. When a user gets to a screen depicting the last day for which a weather forecast is available, such as in screens 412, 414 (FIG. 44F), the next button 120 may be removed from the interface display 100 and/or may not be an active touch area. To view a previous day's forecast, a user may touch the back button 118. When a user is finished viewing the weather and weather forecast information in the weather mode, the user may select the done button 126 to return to the menu in screen 404 or return to the home screen 138 in screen 402.

FIG. 49G depicts a flow 500 of entering a weather mode when weather information is unavailable to the thermostat 10. From the menu screen 502, weather may be selected in the first area 104 of the interface display 100. When the weather mode is selected from the first area 104 and weather information is unavailable, screen 504 may be displayed and the first area 104 may indicate weather information is CURRENTLY NOT AVAILABLE. A user may then select the done button 126 to return to the menu screen 175 or the home screen 138.

Screens, buttons, and/or other features of the interface display 100 that are not particularly described, but appear to be similar to screens, buttons, and/or other features of the interface display 100 that are particularly described, are to be interpreted in the same manner as the similarly appearing screens, buttons, and/or other features particularly described with respect to the interface display 100. Additionally, if a feature is shown in one screen, but not another screen, such omitting of the feature does not mean it cannot or is not included in another screen. The highlighted (e.g., grayed) buttons depicted in the illustrative screens are pressed or selected to move onto a next screen (e.g., a next screen may moving forward in the flow, moving backward in the flow, or jumping out of order in the flow). If more than one button is highlighted in a single screen of the interface display 100, the flow diagram is depicting which screen of the interface display 100 is next for each button selection.

Those skilled in the art will recognize that the present disclosure may be manifested in a variety of forms other than the examples described herein. Accordingly, departure in form and detail may be made without departing from the scope and spirit of the present disclosure and as described in the appended claims.

What is claimed is:

1. A thermostat for controlling an HVAC system, comprising:
   a first sub-assembly having a front side and a back side, the first sub-assembly comprising:
   a housing including a back cover facing toward the back side of the first sub-assembly and a front cover facing toward the front side of the first sub-assembly, wherein the back cover is secured relative to the front cover;
   a printed circuit board housed by the housing, the printed circuit board having a front side facing toward the front cover and a back side facing toward the back cover;
   a display positioned adjacent the front side of the printed circuit board and electrically connected to the printed circuit board via a display connector, the front cover comprising a viewing aperture that exposes at least part of the display for viewing the display from the front side of the first sub-assembly;
   the back cover having a front side facing toward the front cover and a back side facing toward the back side of the first sub-assembly, the back cover defining a hole in the back side of the back cover that extends inward toward the printed circuit board for optionally receiving at least part of one or more batteries;
   a first sub-assembly electrical connector extending from the back side of the printed circuit board and accessible through the back cover;

a second sub-assembly having a front side and a back side, wherein the second sub-assembly and the first sub-assembly are configured to be releasably secured together with the front side of the second sub-assembly facing toward the back side of the first sub-assembly, the second sub-assembly comprising:

a plate that has a front side facing toward the front side of the second sub-assembly and a back side facing toward the back side of the second sub-assembly, the front side of the plate having a raised ridge around a perimeter of the plate that extends toward the front side of the second sub-assembly;

the plate further defining a hole in the front side of the plate that extends inward toward the back side of the second sub-assembly, the hole defined by the plate is positioned to be in registration with the hole defined in the back side of the back cover of the first sub-assembly when the second sub-assembly is secured to the first sub-assembly, the hole defined by the plate is sized to optionally receive at least part of one or more batteries;

a second sub-assembly electrical connector configured to electrically connect with the first sub-assembly electrical connector of the first sub-assembly when the second sub-assembly is secured to the first sub-assembly; and one or more terminals accessible from the front side of the second sub-assembly, the one or more terminals configured to receive one or more control wires; and a control wire aperture for allowing one or more control wires to pass from the back side of the second sub-assembly to the one or more terminals on the front side of the second sub-assembly.

2. The thermostat of claim 1, wherein the hole defined in the back side of the back cover of the first sub-assembly is defined at least in part by an upper side wall and a lower side wall both extend inward toward the printed circuit board, at least part of the lower side wall curving up toward the upper side wall.

3. The thermostat of claim 1, wherein the back side of the plate of the second sub-assembly does not extend out in a manner that mirrors the shape of the hole in the front side of the plate.

4. The thermostat of claim 1, wherein the printed circuit board comprises one or more battery terminals that extend from the printed circuit board through the back cover and into the hole defined in the back side of the back cover of the first sub-assembly.

5. The thermostat of claim 1, further comprising a wireless interface for wirelessly receiving control signals from a remote location.

6. The thermostat of claim 1 configured to be powered by one or more batteries if present.

7. The thermostat of claim 1 configured to be powered by a power wire in combination with a common wire.

8. The thermostat of claim 1 configured to be selectively powered by one or more batteries and/or a power wire in combination with a common wire.

* * * * *